(12) United States Patent
Schäfer et al.

(10) Patent No.: US 8,445,630 B2
(45) Date of Patent: *May 21, 2013

(54) POLYMERS

(75) Inventors: Thomas Schäfer, Liestal (CH); Beat Schmidhalter, Bubendorf (CH); Peter Murer, Oberwil (CH); Kristina Bardon, Waldshut (DE); Tobias Hintermann, Therwil (CH)

(73) Assignee: BASF SE, Ludwigshafen (DE)

( * ) Notice: Subject to any disclaimer, the term of this patent is extended or adjusted under 35 U.S.C. 154(b) by 1094 days.

This patent is subject to a terminal disclaimer.

(21) Appl. No.: 11/886,138

(22) PCT Filed: Mar. 8, 2006

(86) PCT No.: PCT/EP2006/060538
§ 371 (c)(1),
(2), (4) Date: Sep. 11, 2007

(87) PCT Pub. No.: WO2006/097419
PCT Pub. Date: Sep. 21, 2006

(65) Prior Publication Data
US 2009/0105447 A1     Apr. 23, 2009

(30) Foreign Application Priority Data

Mar. 14, 2005  (EP) .................................. 05101936
May 2, 2005    (EP) .................................. 05103648

(51) Int. Cl.
| | |
|---|---|
| C08L 65/00 | (2006.01) |
| C07D 235/02 | (2006.01) |
| C07D 235/04 | (2006.01) |
| C09K 11/06 | (2006.01) |
| H01L 27/28 | (2006.01) |
| H01L 29/786 | (2006.01) |
| H01L 51/50 | (2006.01) |

(52) U.S. Cl.
USPC ... 528/423; 257/40; 252/301.16; 252/301.35; 528/394; 528/397; 528/403; 313/504

(58) Field of Classification Search .................. 428/690, 428/917; 257/40; 252/301.16, 301.35
See application file for complete search history.

(56) References Cited

U.S. PATENT DOCUMENTS

| | | | |
|---|---|---|---|
| 4,215,135 A | 7/1980 | Cherkofsky et al. | |
| 5,281,489 A * | 1/1994 | Mori et al. ................ | 428/690 |
| 6,399,224 B1 * | 6/2002 | Li ............................ | 428/690 |
| 6,723,445 B2 * | 4/2004 | Li et al. ................... | 428/490 |
| 2001/0008711 A1 | 7/2001 | Igarashi ................... | 428/690 |
| 2004/0028944 A1 | 2/2004 | Mori et al. ............... | 428/691 |
| 2004/0202892 A1 * | 10/2004 | Yasuda et al. ........... | 428/690 |
| 2004/0209117 A1 * | 10/2004 | Aziz et al. ............... | 428/690 |
| 2004/0234809 A1 | 11/2004 | Chen et al. | |
| 2005/0014017 A1 | 1/2005 | Hosokawa et al. ...... | 428/690 |
| 2005/0067951 A1 | 3/2005 | Richter et al. ........... | 313/504 |
| 2006/0163562 A1 | 7/2006 | Boerner | |
| 2007/0043204 A1 * | 2/2007 | Rogers et al. ........... | 528/314 |
| 2007/0060736 A1 | 3/2007 | Becker et al. ........... | 528/86 |
| 2007/0205714 A1 | 9/2007 | Busing et al. | |
| 2009/0026919 A1 | 1/2009 | Stossel et al. | |
| 2009/0105447 A1 | 4/2009 | Schafer et al. | |

FOREIGN PATENT DOCUMENTS

| | | |
|---|---|---|
| EP | 0 757 035 | 2/1997 |
| EP | 1 440 959 | 7/2004 |
| JP | 2-134644 | 5/1990 |
| JP | 5-273618 | 10/1993 |
| JP | 09013025 A | 1/1997 |
| JP | 11-251063 | 9/1999 |
| JP | 2000-323278 | 11/2000 |
| JP | 2001-23777 | 1/2001 |
| JP | 2001-118683 | 4/2001 |
| JP | 2002-50473 | 2/2002 |
| JP | 2002-367786 | 12/2002 |
| JP | 2003-59670 | 2/2003 |
| SU | 1001855 A3 | 2/1983 |
| WO | 03/064373 | 8/2003 |

(Continued)

OTHER PUBLICATIONS

Nurulla et al, Preparation and properties of new pi-conjugated polyquinoxalines with aromatic fused rings in the side chain, Polymer Bulletin 44, 231-238 (2000).*
Sircar et al, Dyes derived from phenanthraquinone. I.Phenanthranaphthazines; Journal of the Chemical Society, Transactions (1922), 121, 1944-51.*
West et al, Absorption and Emission Spectra and Triplet Decay of some Aromatic and N-Heterocyclic Compounds in Polymethylmethacrylate; Transactions of the Faraday Society (1970), 66(Pt. 9), 2135-47.*
Sircar et al., "Dyes derived from phenantraquinone," Part III, J. Chem. Soc., vol. 123, (1923), pp. 1559-1656.

(Continued)

*Primary Examiner* — Randy Gulakowski
*Assistant Examiner* — Rachel Kahn
(74) *Attorney, Agent, or Firm* — Shiela A. Loggins

(57) ABSTRACT

The present invention relates to polymers comprising a repeating unit of the formula (I), and their use in electronic devices. The polymers according to the invention have excellent 5 solubility in organic solvents and excellent film-forming properties. In addition, high charge carrier mobilities and high temperature stability of the emission color are observed, if the polymers according to the invention are used in polymer light emitting diodes (PLEDs).

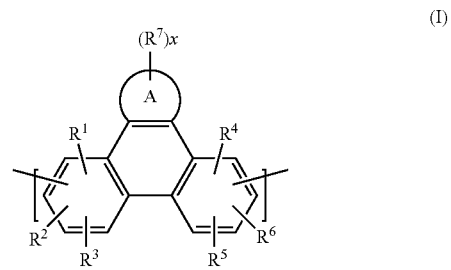

(I)

12 Claims, No Drawings

FOREIGN PATENT DOCUMENTS

| | | |
|---|---|---|
| WO | 2004/005288 | 1/2004 |
| WO | 2004/030029 | 4/2004 |
| WO | WO 2005/004251 A1 | 1/2005 |
| WO | 2005/014689 | 2/2005 |
| WO | WO 2005/104264 A1 | 11/2005 |
| WO | WO 2005/123737 A2 | 12/2005 |
| WO | WO 2006/039982 A1 | 4/2006 |
| WO | WO 2006/063466 A1 | 6/2006 |
| WO | WO 2006/130598 A2 | 12/2006 |
| WO | WO 2007/059610 A1 | 5/2007 |
| WO | WO 2007/095753 A1 | 8/2007 |

OTHER PUBLICATIONS

Gautrot et al., "Poly(dibenzo[a,c]phenazine-2-7-diyl)s—Synthesis and charactisation of a new family of electron-accepting conjugated polymers," Polymer, vol. 48, (1997), pp. 7065-7077.

Extended European Search Report issued Nov. 26, 2007, in EP 07 10 5221.

Copending U.S. Appl. No. 12/223,139, filed Jan. 31, 2007.
Copending U.S. Appl. No. 12/309,379, filed Jul. 18, 2007.
Copending U.S. Appl. No. 12/310,737, filed Mar. 9, 2009.

* cited by examiner

POLYMERS

The present invention relates to novel polymers comprising a repeating unit of the formula (I) and their use in electronic devices. The polymers according to the invention have excellent solubility in organic solvents and excellent film-forming properties. In addition, high charge carrier mobilities and high temperature stability of the emission color can be observed, if the polymers according to the invention are used in polymer light emitting diodes (PLEDs).

JP05273618 discloses phenanthroimidazole compounds which where used as antiinflammants. WO04016086 relates to the preparation of 2,4,5-trisubstituted imidazoles and their use as antibacterial and/or antifungal agents. Among others the following compound is explicitly mentioned in WO04016086:

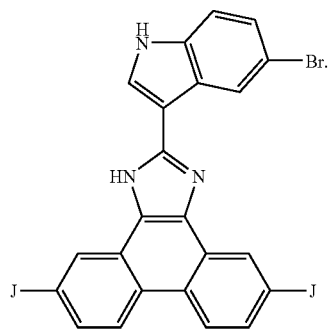

U.S. Pat. No. 4,215,135 relates to 2-substituted-1H-phenanthro[9,10-d]-imidazoles, which are useful as antiinflammatory agents. Among others the following compound is explicitly mentioned in U.S. Pat. No. 4,215,135:

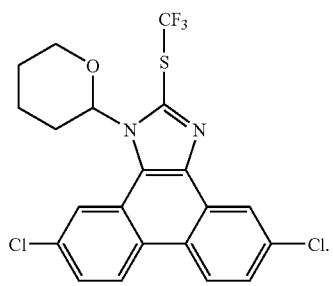 [SMILES: FC(F)(F)Sc1nc2c3cc(Cl)ccc3c3ccc(Cl)cc3c2n1C1CCCCO1]

U.S. Pat. No. 3,635,544 relates to a photochromic polymer matrix, comprising the following compound

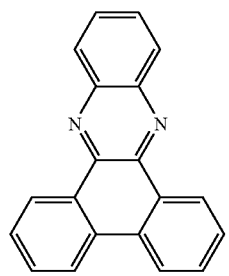 [SMILES: c1ccc2nc3c4ccccc4c4ccccc4c3nc2c1]

as light absorbing compound. JP09188874, JP09013025, JP07026255, JP06207169, US2004076853, WO2004043937, U.S. Pat. No. 6,713,781, WO2004006352, WO2003058667 and WO2004006355 disclose phenanthrene-fused or phenathroline-fused phenazines and their use in EL devices.

US2004209117 relates to an EL device, comprising an azole compound of the formula

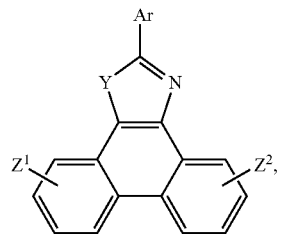

wherein Y is an atom or a group selected from the group consisting of O, S, and —N(R)—, wherein R is a hydrocarbyl group of from 1 to about 30 carbons; $Z^1$ and $Z^2$ are each a substituent selected from the group consisting of hydrogen, an alkyl group of from 1 to about 25 carbon atoms, an aryl group of about 6 to about 30 carbon atoms, an alkoxy group of from 1 to about 25 carbon atoms, a halogen, and a cyano group; and Ar is an aromatic component. JP2004161892, JP2002050473 and JP2001023777 disclose phenanthroimidazol compounds and their use in EL devices.

WO04/030029 relates to a photovoltaic EL cell, comprising polymers containing groups:

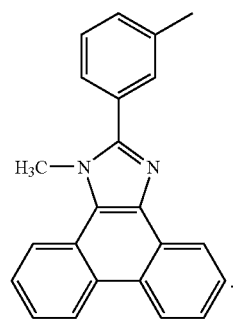 [SMILES: Cc1cccc(-c2nc3c4ccccc4c4ccccc4c3n2C)c1 ; "."]

WO03/020790 relates to conjugated polymers comprising spirobifluorene units. The polymers can comprise repeating units derived from the following compound

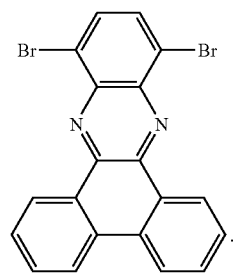

EP0757035A1 relates to phenanthrylenediamine derivatives represented by the general formula

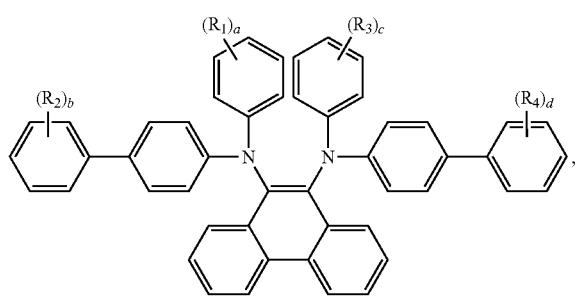

which are excellent in the electric charge transferring capability, the compatibility with a binding resin and the stability, thereby providing a photosensitive material which is highly sensitive and excellent in the durability.

US2001008711 relates to an organic light-emitting device comprising a light-emitting layer or a plurality of organic compound thin layers including a light-emitting layer formed between a pair of electrodes, wherein at least one layer comprises at least one kind of compound represented by the following formula $NR_{11}R_{12}R_{13}$: wherein $R_{11}$, $R_{12}$ and $R_{13}$ each represents a group having a cyclocondensed polycyclic hydrocarbon structure in which three or more rings are cyclocondensed; and a novel cyclocondensed polycyclic hydrocarbon compound.

US2004/0028944 relates to organic electroluminescent devices comprising a triarylamine derivative represented by the general formula $N(Ar_1)(Ar_2)(Ar_3)$, wherein $Ar_1$ to $Ar_3$ are substituted or unsubstituted aryl groups and at least one of $Ar_1$ to $Ar_3$ is a 9-phenanthryl group.

EP1440959A1 relates to a novel soluble compound of formula

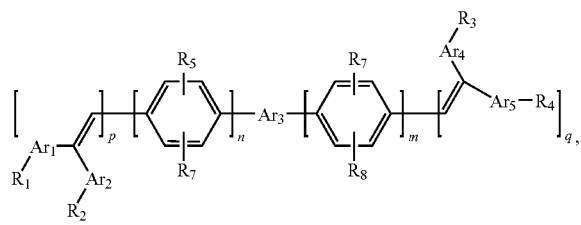

wherein $Ar_3$ represents a substituted or unsubstituted anthracendiyl group, or a substituted or unsubstituted fluorendiyl group and to its use in an electroluminescent device.

WO03/064373 relates to triarylamine derivatives and the use thereof as hole transport material in organic electroluminescent and electrophotographic devices.

WO04/005288 relates to charge transport compositions comprising a phenanthroline derivative having formula

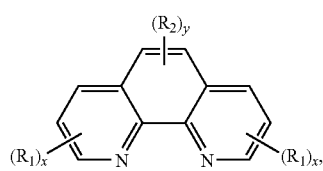

wherein: $R_1$ and $R_2$ are the same or different at each occurrence and are selected from H, F, Cl, Br, alkyl, heteroalkyl, alkenyl, alkynyl, aryl, heteroaryl, $C_nH_aF_b$, $OC_nH_aF_b$, $C_6H_cF_d$, and $OC_6H_cF_d$; a, b, c, and d are 0 or an integer such that $a+b=2n+1$, and $c+d=5$, n is an integer; x is 0 or an integer from 1 through 3; y is 0, 1 or 2; with the proviso that there is at least one substituent on an aromatic group selected from F, $C_nH_aF_b$, $OC_nH_aF_b$, $C_9H_cF_d$, and $OC_6H_cF_d$.

WO05/014689 relates to conjugated polymers containing dihydrophenanthrene units of formula

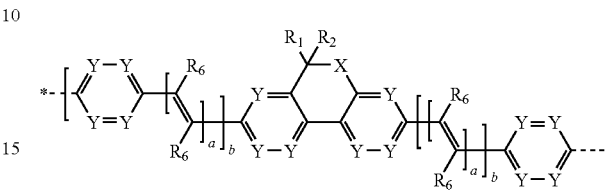

and their use in polymer organic light emitting diodes.

WO05/104264, which enjoys an earlier priority date than the present invention, but has been published after the priority date of the present invention, relates to polymers comprising structural units of formula

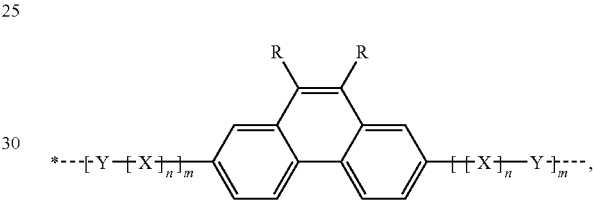

wherein both groups R among others can form together a mono- or polycyclic, aliphatic ring system.

There are a number of challenges faced with the introduction of organic EL displays when their performance is compared with existing technologies. Obtaining the exact color coordinates required by specific guidelines (i.e. NTSC) has been problematic. The operational lifetime of the EL device is still lower when contrasted to the existing inorganic technology for cathode ray tubes (CRTs) and liquid crystal displays (LCDs). In addition, producing a material with a pure blue color and a long lifetime is one of the greatest problems for this industry.

Accordingly, it is the object of the present invention to provide novel materials, which show significant advantages in color purity, device efficiency and/or operational lifetime, when incorporated in electro-optical devices.

Said object is solved by the polymers of the present invention comprising repeating units of formula I. Organic light emitting devices (OLEDs), comprising the polymers of the present invention, can show significant advantages in color purity, device efficiency and/or operational lifetime. In addition, the polymers can have good solubility characteristics and relatively high glass transition temperatures, which facilitates their fabrication into coatings and thin films, that are thermally and mechanically stable and relatively free of defects. If the polymers contain end groups which are capable of being crosslinked, the crosslinking of such groups after the films or coating is formed increases the solvent resistance thereof, which is beneficial in applications wherein one or more solvent-based layers of material are deposited thereon.

Hence, the present invention relates to polymers comprising a repeating unit(s) of the formula

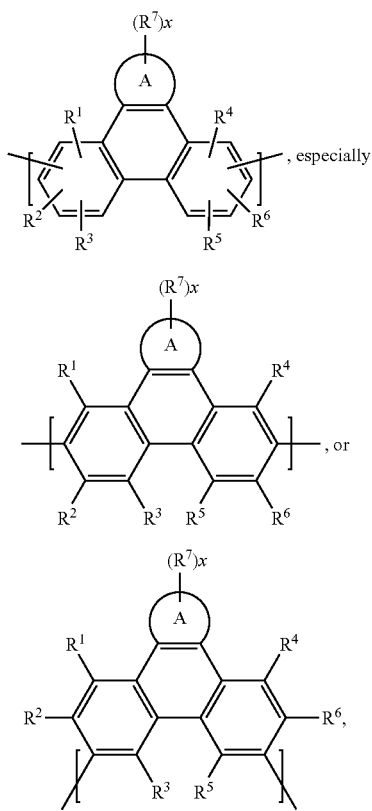

especially (Ia), or (Ib)

wherein A is a 5-, 6-, or 7-membered heteroaromatic ring, containing at least one heteroatom selected from nitrogen, oxygen and sulfur, especially one nitrogen atom and at least one further heteroatom selected from nitrogen, substituted nitrogen, oxygen and sulfur, $R^1$, $R^2$, $R^3$, $R^4$, $R^5$ and $R^6$ are independently of each other hydrogen, halogen, or an organic substituent, or $R^1$ and $R^2$, $R^4$ and $R^6$, $R^2$ and $R^3$, $R^5$ and $R^3$ and/or $R^5$ and $R^6$, which are adjacent to each other, together form an aromatic, or heteroaromatic ring, or ring system, which can optionally be substituted, $R^7$ is an organic substituent, wherein two or more substituents $R^7$ in the same molecule may have different meanings, or can form together an aromatic, or heteroaromatic ring, or ring system, and x is 0, or an integer of 1 to 5.

A is a 5-, 6-, or 7-membered heteroaromatic ring, containing one heteroatom selected from nitrogen, oxygen and sulphur, which can be substituted and/or can be part of a fused aromatic or heteroaromatic ring system. Non-limiting examples of A are:

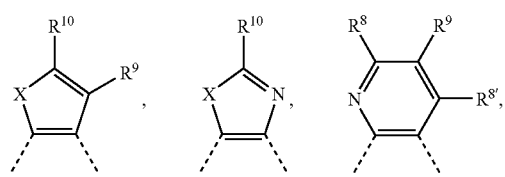

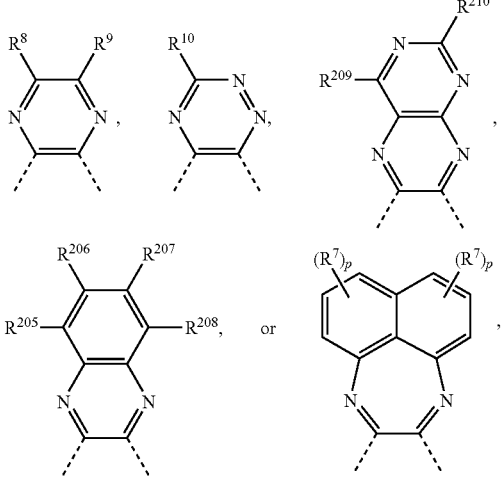

wherein $R^7$ has the meaning of $R^8$, $R^{8'}$ has the meaning of $R^8$, X is O, S, N—$R^{17}$, wherein $R^{205}$, $R^{206}$, $R^{207}$, $R^{208}$, $R^{209}$, $R^{210}$, $R^8$, $R^9$, $R^{10}$ and $R^{17}$ are as defined below, p is 0, 1, 2, or 3 and the dotted line - - - indicates the bonding to the benzene ring.

Preferably, A is one of the above 5-, 6-, or 7-membered heteroaromatic rings, containing one nitrogen atom and at least one further heteroatom selected from nitrogen, oxygen and sulphur. If the heteroatom is nitrogen, it can be a group =N—, or —NR—, especially —NR$^{10}$— wherein R is an organic substituent and $R^{10}$ is as defined below.

The polymers of the present invention should have a glass transition temperature above 100° C., especially a glass transition temperature above 150° C.

Preferably, the polymer of the present invention comprises a repeating unit(s) of the formula

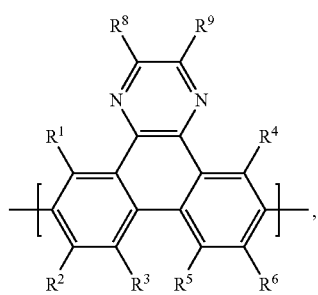

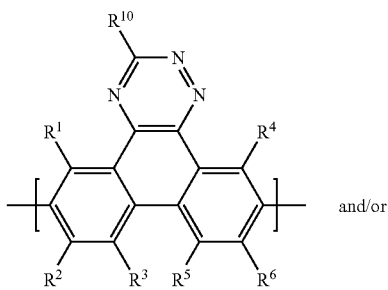

and/or

-continued

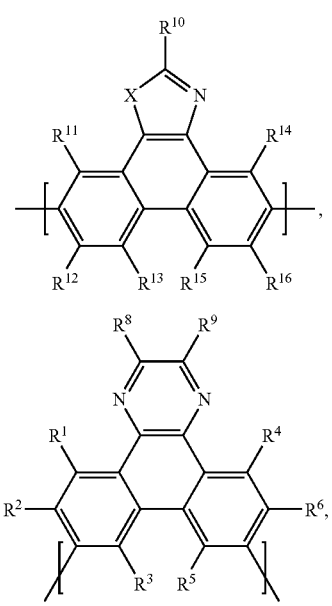
(XII)

(XVI)

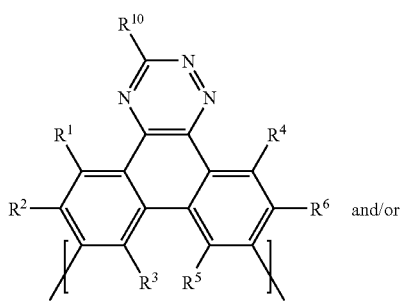
(XVII)

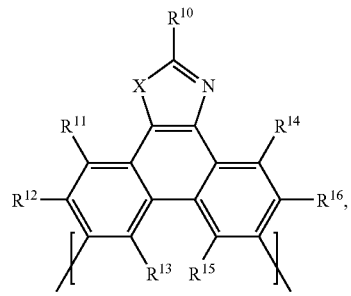
(XVIII)

wherein R¹ and R⁴ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^2$, $R^3$, $R^5$ and $R^6$ are independently of each other H, halogen, $C_1$-$C_{18}$alkyl, $C_1$-$C_{18}$alkyl which substituted by E and/or interrupted by D, $C_1$-$C_{18}$perfluoroalkyl, $C_6$-$C_{24}$aryl, $C_6$-$C_{24}$aryl which substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, $R^8$ and $R^9$ are independently of each other H, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, or $R^8$ and $R^9$ together form a group

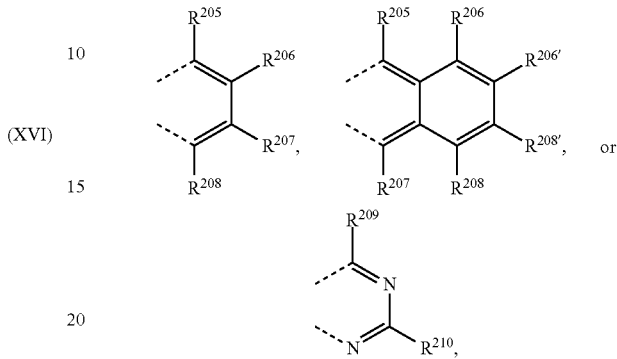

wherein
$R^{206'}$, $R^{208'}$, $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_7$-$C_{25}$aralkyl, CN, or —CO—$R^{28}$, $R^{10}$ is H, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —CO—$R^{28}$, $R^{11}$ and $R^{14}$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^{12}$, $R^{13}$, $R^{15}$ and $R^{16}$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN or —CO—$R^{28}$, X is O, S, or $NR^{17}$, wherein $R^{17}$ is H; $C_6$-$C_{18}$aryl, $C_2$-$C_{20}$heteroaryl; $C_6$-$C_{18}$aryl, or $C_2$-$C_{20}$heteroaryl, which are substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—;

or two substituents $R^2$ and $R^3$, $R^5$ and $R^6$, $R^{12}$ and $R^{13}$ and/or $R^{15}$ and $R^{16}$, $R^1$ and $R^2$, $R^4$ and $R^6$, $R^{11}$ and $R^{12}$ and/or $R^{14}$ and $R^{16}$, which are adjacent to each other, together form a group

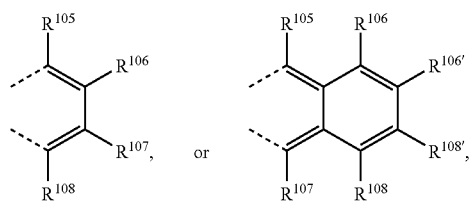

or two substituents $R^{15}$ and $R^{13}$, and/or $R^5$ and $R^3$, which are adjacent to each other, together form a group

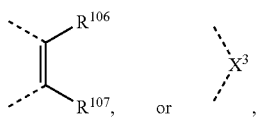

wherein $X^3$ is O, S, $C(R^{119})(R^{120})$, or $NR^{17}$, wherein $R^{17}$ is as defined above, $R^{105}$, $R^{106}$, $R^{107}$, $R^{108}$, $R^{106'}$ and $R^{108'}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $R^{119}$ and $R^{120}$ together form a group of formula $=CR^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{127}$, and $R^{127}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—; —COO—; —S—; —SO—; —$SO_2$—; —O—; —$NR^{25}$—; —$SiR^{30}R^{31}$—; —$POR^{32}$—; —$CR^{23}=CR^{24}$—; or —C≡C—; and E is —$OR^{29}$; —$SR^{29}$; —$NR^{25}R^{26}$; —$COR^{28}$; —$COOR^{27}$; —$CONR^{25}R^{26}$; —CN; or halogen; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, in particular

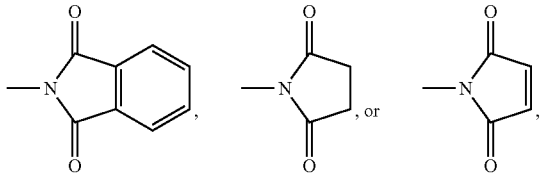

$R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{32}$ is $C_1$-$C_{18}$alkyl, $C_6$-$C_{18}$aryl, or $C_6$-$C_{18}$aryl, which is substituted by $C_1$-$C_{18}$alkyl.

Repeating units of the formula XVI, XVII and XVIII are suitable as host matrix material for phosphorescent compounds. Repeating units of the formula X, XI and XII are suitable as conjugated polymers for EL devices.

Repeating units of the formula X, XI and XII are preferred.

Repeating units of the formula X and XI (XVI and XVII) are even more preferred, wherein $R^1$ and $R^4$ are hydrogen, $R^2$, $R^3$, $R^5$ and $R^6$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $C_7$-$C_{25}$aralkyl, or a group —$X^2$—$R^{18}$, $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one more, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$—; or two substituents $R^2$ and $R^3$ and/or $R^5$ and $R^6$, which are adjacent to each other, together form a group

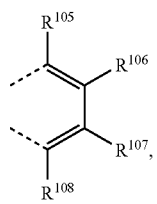

or two substituents $R^5$ and $R^3$, which are adjacent to each other, together form a group

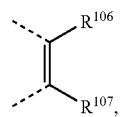

wherein $R^{105}$, $R^{106}$, $R^{107}$ and $R^{108}$ are independently of each other H, or $C_1$-$C_8$alkyl, or $R^8$ and $R^9$ together form a group

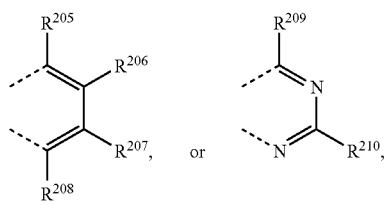

wherein $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one more, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$;

D is —CO—; —COO—; —S—; —SO—; —$SO_2$—; —O—; —$NR^{25}$—; —$CR^{23}$=$CR^{24}$—; or —C≡C—; wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or $R^{25}$ and $R^{26}$ together form a five or six membered ring, in particular

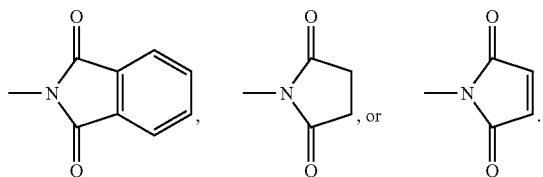

The repeating units of the formula X are preferred against the repeating units of the formula XI.

Among the repeating units of formula XII and XVIII repeating units of the formula

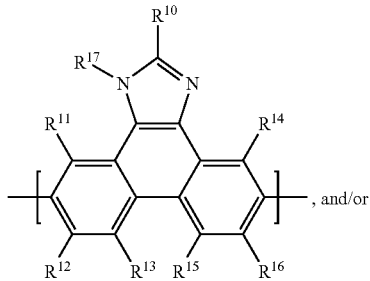

(XII')

, and/or

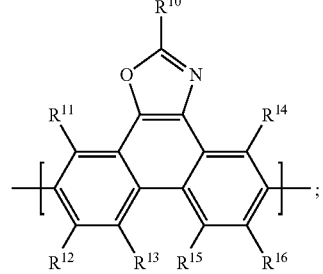

(XII")

;

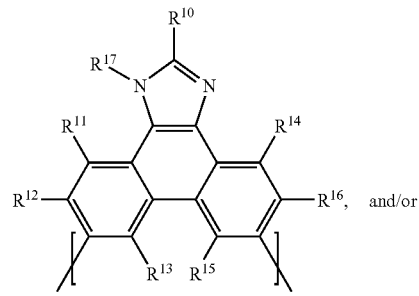

(XVIII')

, and/or

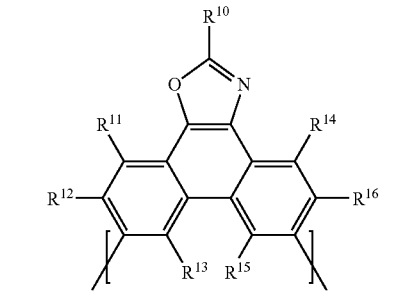

(XVIII")

are preferred, wherein $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one more, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$—;

$R^{11}$ and $R^{14}$ are hydrogen,
$R^{12}$, $R^{13}$, $R^{15}$ and $R^{16}$ are hydrogen,
$R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; or
two substituents $R^{11}$ and $R^{12}$, and/or $R^{14}$ and $R^{16}$, $R^{12}$ and $R^{13}$ and/or $R^{15}$ and $R^{16}$, which are adjacent to each other, together form a group

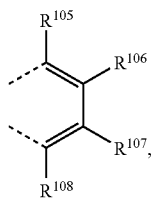

or two substituents $R^{15}$ and $R^{13}$, which are adjacent to each other, together form a group

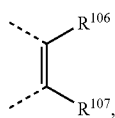

wherein $R^{105}$, $R^{106}$, $R^{107}$ and $R^{108}$ are independently of each other H, or $C_1$-$C_8$alkyl,
D is —S—; —O—; or —NR$^{25}$—;
E is —OR$^{29}$; —SR$^{29}$; —NR$^{25}$R$^{26}$; —CN; or F; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or
$R^{25}$ and $R^{26}$ together form a five or six membered ring, in particular

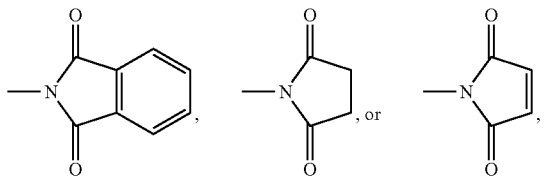

and
$R^{29}$ is $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—.

Repeating units of formula X, XI and XII (XVI, XVII and XVIII) are preferred, wherein $R^{10}$ and $R^8$ and/or $R^9$ are different from a hydrogen atom and are in particular a solubilizing substituent which is especially selected from $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D.

The aryl, and heteroaryl group are preferably a substituted or unsubstituted aryl, or heteroaryl moiety selected from the group consisting of phenyl, biphenyl, naphthyl, anthryl, phenanthryl, pyridyl, bipyridyl, indyl and quinolinyl. The term "substituted" means that the aryl moiety can be substituted by one or more groups, especially one to three groups, which may be the same or may be different. The substituents are preferably selected from $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D. Most preferred among the aryl, and heteroaryl groups are

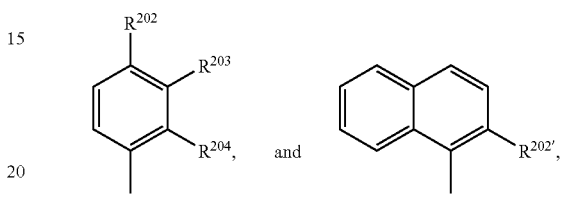

wherein $R^{202'}$ is $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, especially $C_1$-$C_{18}$alkoxy;
one of the groups $R^{202}$, $R^{203}$ and $R^{204}$ is $R^{202'}$, and the other groups are H, or $R^{202'}$.

In a preferred embodiment of the present invention $R^{10}$ is a group

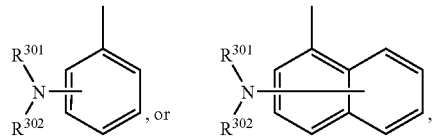

wherein $R^{301}$ and $R^{302}$ are independently of each other $C_6$-$C_{24}$aryl, such as phenyl, 1-naphthyl, 2-naphthyl, 4-biphenyl, phenanthryl, terphenyl, pyrenyl, 2- or 9-fluorenyl or anthracenyl, preferably $C_6$-$C_{12}$aryl such as phenyl, 1-naphthyl, 2-naphthyl, 4-biphenyl, which may be unsubstituted or substituted by, for example, $C_1$-$C_{18}$alkyl, or $C_1$-$C_{18}$alkoxy.

In another preferred embodiment of the present invention $R^{10}$ is a $C_6$-$C_{30}$aryl group, such as phenyl, biphenyl, pentalenyl, indenyl, azulenyl, naphthyl, biphenylenyl, as-indacenyl, s-indacenyl, acenaphthylenyl, fluorenyl, phenanthryl, anthracenyl, fluoranthenyl, acephenanthrylenyl, aceanthrylenyl, triphenylenyl, pyrenyl, chrysenyl, naphthacenyl, picenyl, perylenyl, pentacenyl, pentaphenyl, hexacenyl, or hexaphenyl, which can optionally be substituted by one, two, or three, preferably $C_1$-$C_{18}$alkyl groups, or $C_1$-$C_{18}$alkoxy groups. In another preferred embodiment of the present invention $R^{10}$ is a $C_2$-$C_{20}$heteroaryl group such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, perimidinyl, phenanthrolinyl, phenazinyl, isothiazolyl, phenothiazinyl, isoxazolyl, furazanyl, 2-phenyl-1,2,4-oxadiazyl, 2,4-diphenyl-1,2,4-triazyl, or phenoxazinyl, which can optionally be substituted by one, two, or three, preferably C$_1$-C$_8$alkyl groups, or C$_1$-C$_8$alkoxy groups.

If R$^{10}$ is derived from a heteroaryl group, it is preferably a group of formula

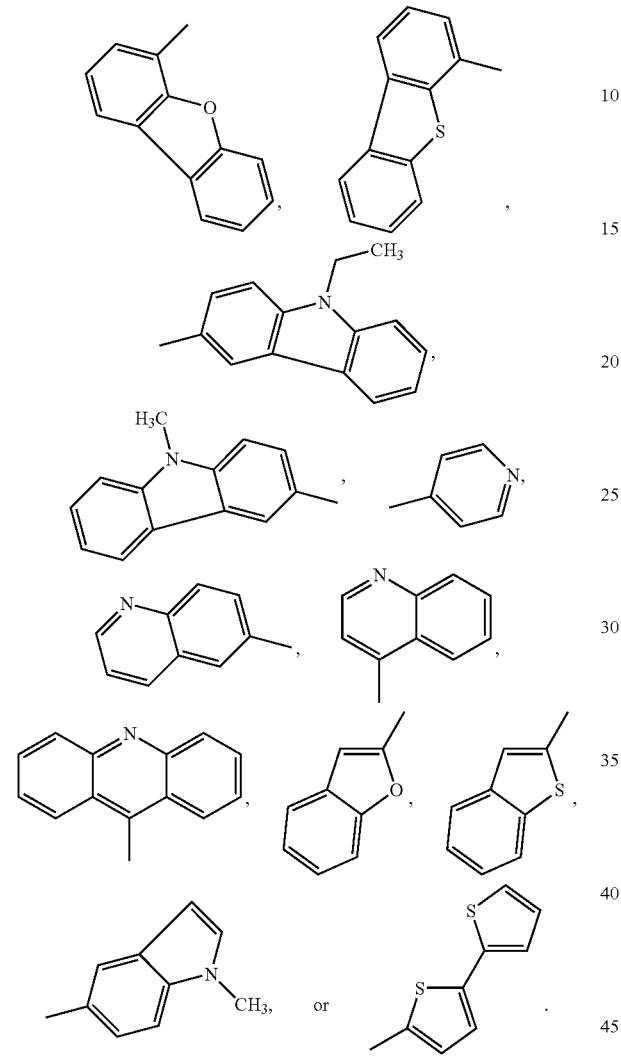

In case of repeating units of formula X and XI (XVI and XVII) it is preferred that R$^8$ and/or R$^9$ are different from a hydrogen atom and are selected from C$_1$-C$_{18}$alkyl, C$_1$-C$_{18}$alkyl which is interrupted by D, C$_1$-C$_{18}$perfluoroalkyl, C$_1$-C$_{18}$alkoxy, or C$_1$-C$_{18}$alkoxy which is substituted by E and/or interrupted by D. In case of repeating units of formula XII (XVIII) the solubilizing group is preferably a substituted aryl, or heteroaryl moiety.

Repeating units of formula XII are preferably used in combination with repeating units, which increase the hole-injection or hole-transport properties of the polymers. Repeating units of formula X and XI are preferably used in combination with repeating units, which increase the electron-injection or electron-transport properties of the polymers.

R$^{17}$ is preferably C$_1$-C$_{18}$alkyl, such as methyl, ethyl, n-propyl, iso-propyl, n-butyl, isobutyl, sec-butyl, hexyl, octyl, or 2-ethyl-hexyl.

Among the repeating units of formula X, XI, XII, XVI, XVII and XVIII compounds of formula

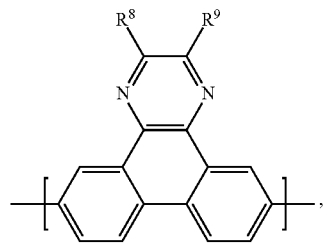

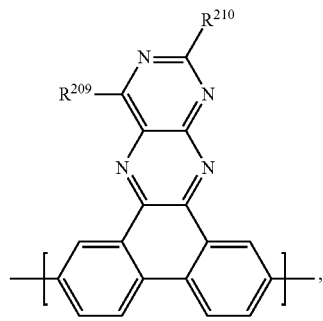

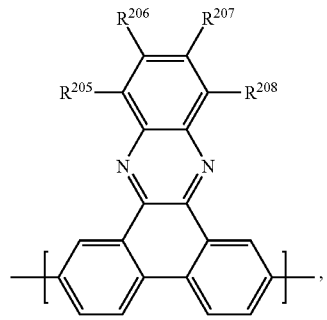

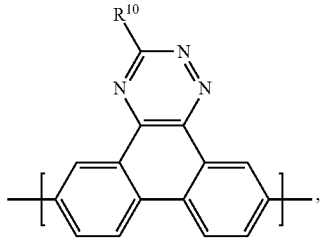

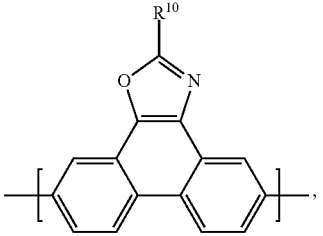

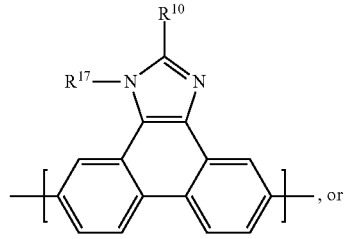

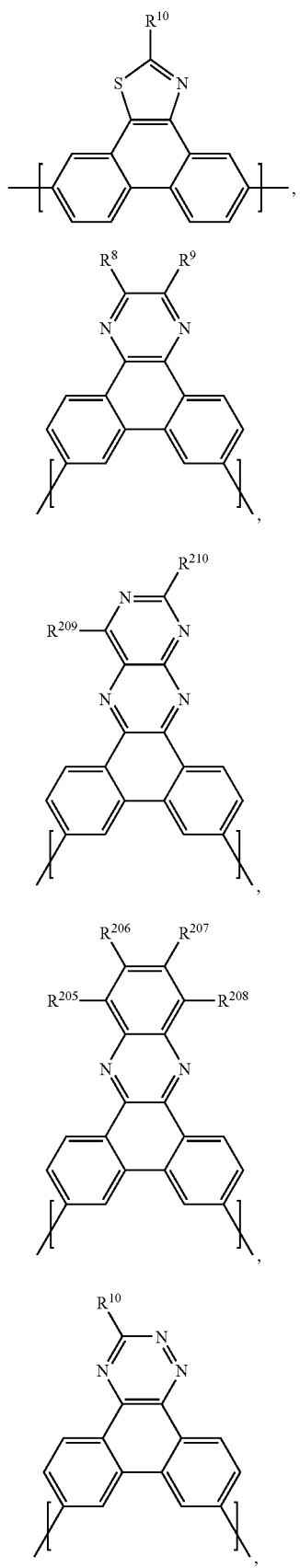

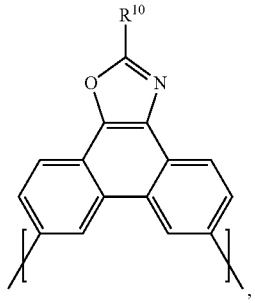
(XIIc)

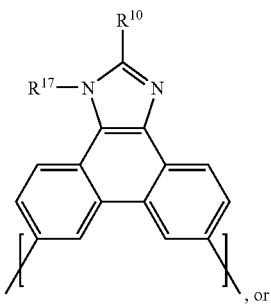
(XVIIIa)

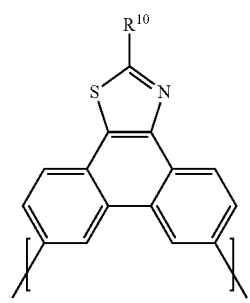
(XVIIIb)

, or (XVIIIc)

are most preferred, wherein $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, or $R^8$ and $R^9$ together form a group

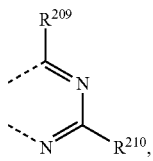

wherein $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one more, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $R^{205}$, $R^{206}$, $R^{207}$, $R^{208}$, $R^{209}$ and $R^{210}$ are independently of each other H, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D.

As used herein the term "polymer of the present invention" refers to polymers having repeating units of formula I, especially repeating units of formula X, XI and/or XII (XVI, XVII and XVIII), very especially repeating units of formula Xa, XIa, XIIa and/or XIIb.

The present invention is illustrated in more detail on the basis of repeating units of formula X, XI and/or XII, but is not limited thereto.

In a first aspect, the present invention relates to polymers comprising a repeating unit of the formula I, especially repeating units of formula X, XI and/or XII, very especially repeating units of formula Xa, XIa, XIIa and/or XIIb.

The polymers of formula I can contain in addition to the repeating unit (recurring unit) of formula I one or more repeating units $Ar^3$ and/or T. $Ar^3$ is selected from the following groups:

group II: units, which increase the hole-injection or hole-transport properties of the polymers;

group III: units, which increase the electron-injection or electron-transport properties of the polymers;

group IV: units, which are combinations of units of group II and III; group V:

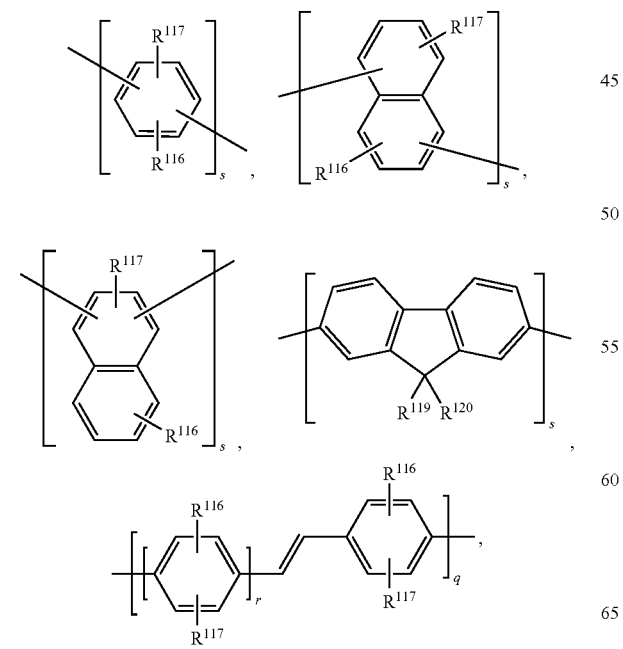

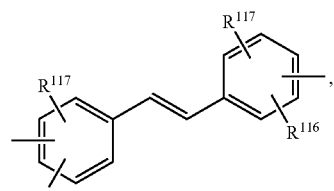

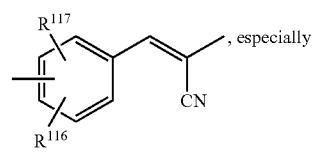, especially

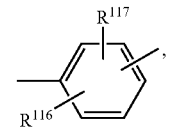 (Va)

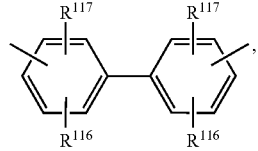 (Vb)

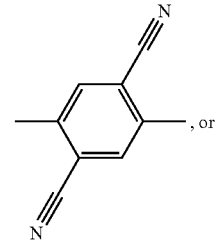 (Vc)

, or

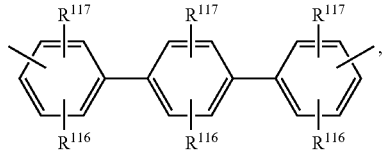 (Vd)

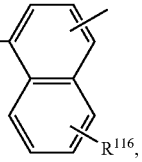 (Ve)

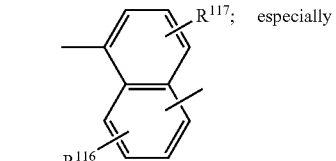 $R^{117}$; especially (Vf)

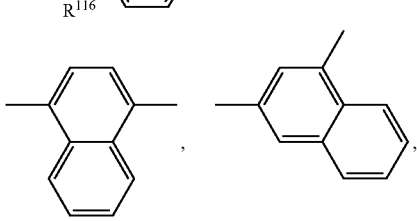

-continued

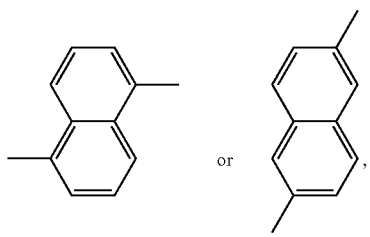
(Vg)

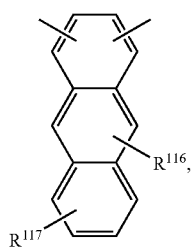
(Vh)

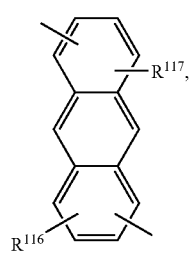
(Vi)

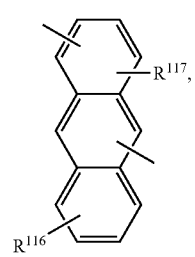
(Vj)

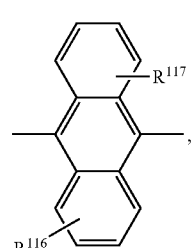
(Vk)

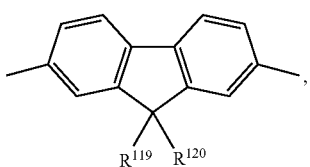
(Vl)

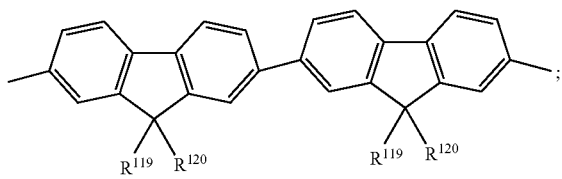

-continued

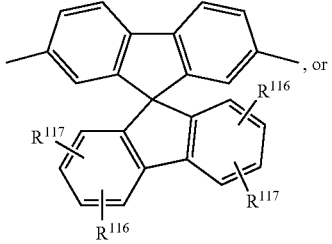
(Vm)

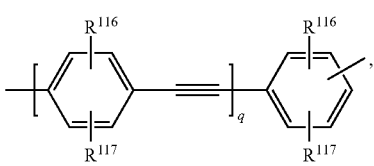
(Vn)

wherein
r is an integer from 1 to 10, especially 1, 2 or 3,
q is an integer from 1 to 10, especially 1, 2 or 3,
s is an integer from 1 to 10, especially 1, 2 or 3,
$R^{116}$ and $R^{117}$ are independently of each other H, halogen, —CN, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, —C(=O)—$R^{127}$—C(=O)O$R^{127}$, or —C(=O)N$R^{127}R^{128}$,
$R^{119}$ and $R^{120}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or
$R^{119}$ and $R^{120}$ together form a group of formula =$CR^{121}R^{122}$, wherein
$R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or
$R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{127}$, and
$R^{126}$ and $R^{127}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—,
D is —CO—, —COO—, —S—, —SO—, —$SO_2$—, —O—, —N$R^{65}$, —Si$R^{70}R^{71}$—, —PO$R^{72}$—C$R^{63}$=C$R^{64}$, or —C≡C—, and
E is —O$R^{69}$, —S$R^{69}$, —N$R^{65}R^{66}$, —CO$R^{68}$, —COO$R^{67}$, —CON$R^{65}R^{66}$, —CN, or halogen,
G is E, or $C_1$-$C_{18}$alkyl,
$R^{63}$, $R^{64}$, $R^{65}$ and $R^{66}$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or $R^{65}$ and $R^{66}$ together form a five or six membered ring, in particular

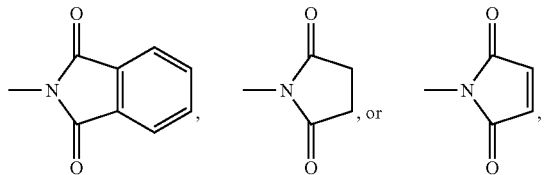

$R^{67}$ and $R^{68}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{69}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{70}$ and $R^{71}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{72}$ is $C_1$-$C_{18}$alkyl, $C_6$-$C_{18}$aryl, or $C_6$-$C_{18}$aryl, which is substituted by $C_1$-$C_{18}$alkyl.

Among the above units of group V the units of formula Ve, especially Va, Vk and Vm are more preferred.

The repeating units T are selected from the following group VI:

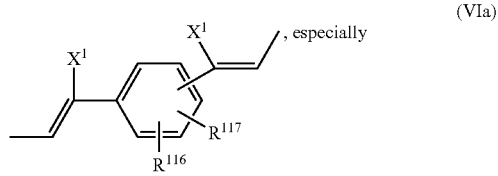
(VIa), especially

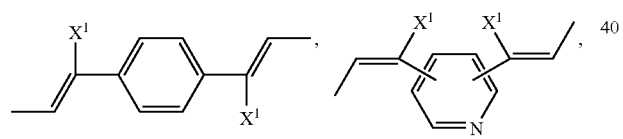
(VIb)

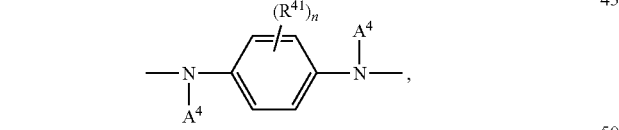
(VIc)

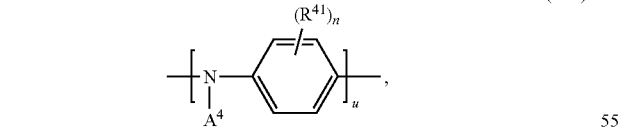
(VId)

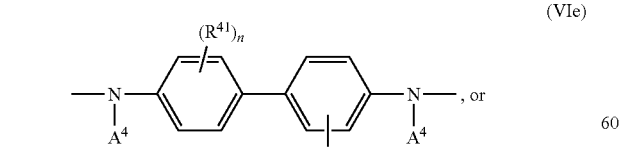
(VIe), or $$\text{—N—}_{A^4}$$
(VIf)

wherein $X^1$ is a hydrogen atom, or a cyano group, $R^{116}$ and $R^{117}$ are as defined above, $R^{41}$ can be the same or different at each occurrence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{45}$ is H, a $C_1$-$C_{25}$alkyl group, a $C_4$-$C_{18}$cycloalkyl group, in which one or more carbon atoms which are not in neighbourhood to each other could be replaced by —$NR^{45'}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, $R^{45'}$ is H, a $C_1$-$C_{25}$alkyl group, or a $C_4$-$C_{18}$cycloalkyl group, n can be the same or different at each occurrence and is 0, 1, 2, or 3, especially 0, 1, or 2, very especially 0 or 1, and u is 1, 2, 3, or 4;

$A^4$ is a $C_6$-$C_{24}$aryl group, a $C_2$-$C_{30}$heteroaryl group, especially phenyl, naphthyl, anthryl, biphenylyl, 2-fluorenyl, phenanthryl, or perylenyl, which can be substituted by one or more non-aromatic groups $R^{41}$.

Preferred units of group II, which increase the hole-injection or hole-transport properties of the polymers, are:

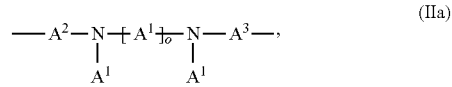
(IIa)

(IIb)

(IIc)

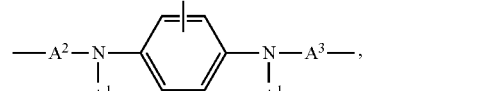
(IId)

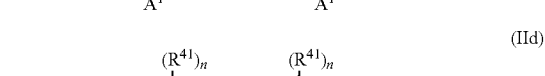
(IIe)

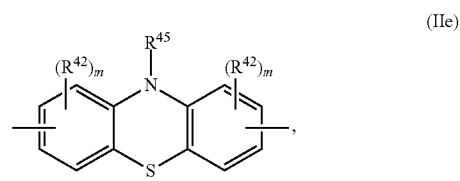

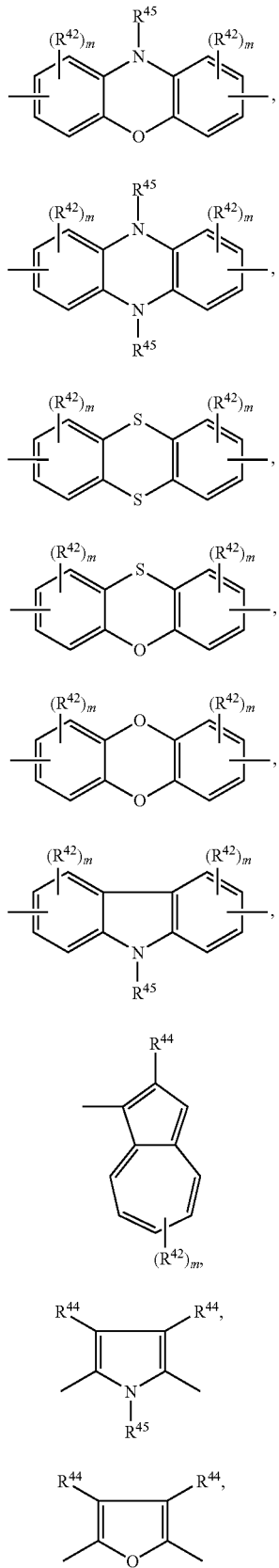

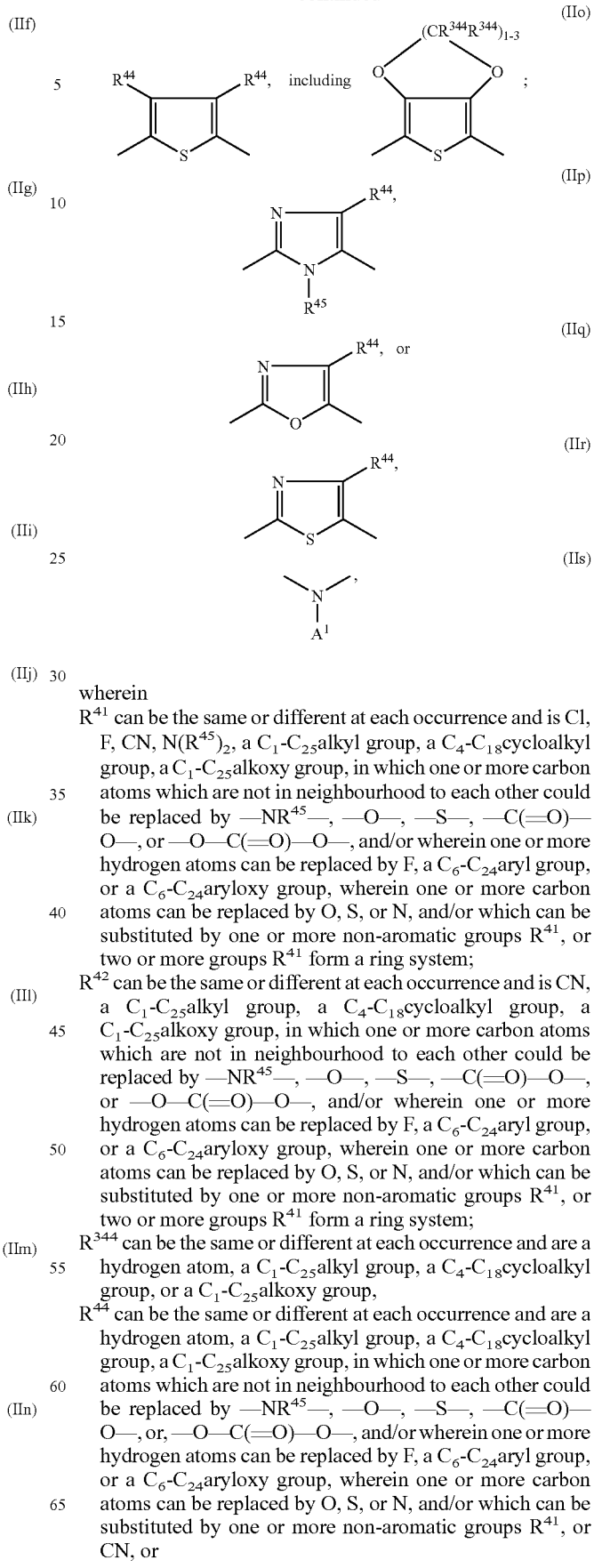

wherein $R^{41}$ can be the same or different at each occurrence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{42}$ can be the same or different at each occurrence and is CN, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{344}$ can be the same or different at each occurrence and are a hydrogen atom, a $C_1$-$C_{25}$alkyl group, a $C_4$-$C_{18}$cycloalkyl group, or a $C_1$-$C_{25}$alkoxy group, $R^{44}$ can be the same or different at each occurrence and are a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{44}$, which are in neighbourhood to each other, form a ring;

$R^{45}$ is H, a $C_1$-$C_{25}$alkyl group, a $C_4$-$C_{18}$cycloalkyl group, in which one or more carbon atoms which are not in neighbourhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$;

m can be the same or different at each occurrence and is 0, 1, 2, or 3, especially 0, 1, or 2, very especially 0 or 1;

n can be the same or different at each occurrence and is 0, 1, 2, or 3, especially 0, 1, or 2, very especially 0 or 1;

o is 1, 2, or 3, especially 1, or 2, and $A^1$ is a $C_6$-$C_{24}$aryl group, a $C_2$-$C_{30}$heteroaryl group, which can be substituted by one or more non-aromatic groups $R^{41}$, or $NO_2$, especially phenyl, naphthyl, anthryl, biphenylyl, 2-fluorenyl, phenanthryl, or perylenyl, $A^2$ and $A^3$ are independently of each other a $C_6$-$C_{30}$arylene group, or a $C_2$-$C_{24}$heteroarylene group, which can optionally be substituted, especially

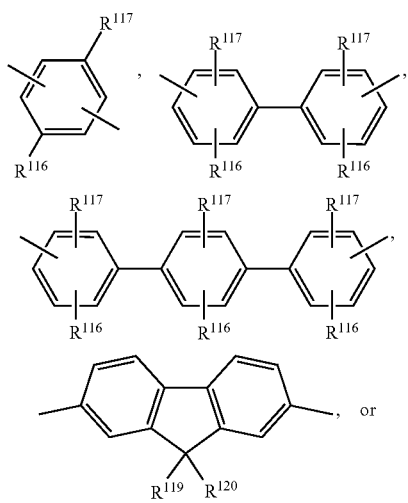

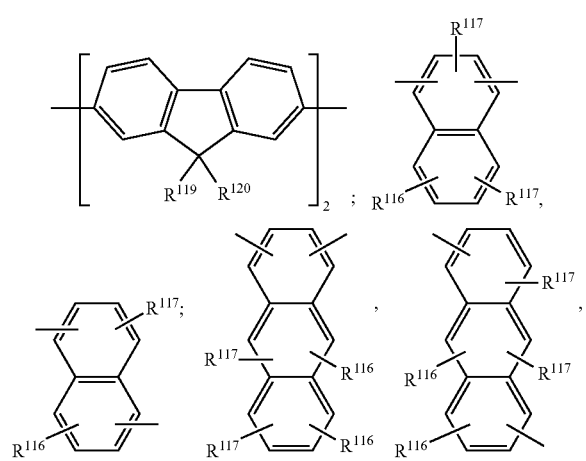

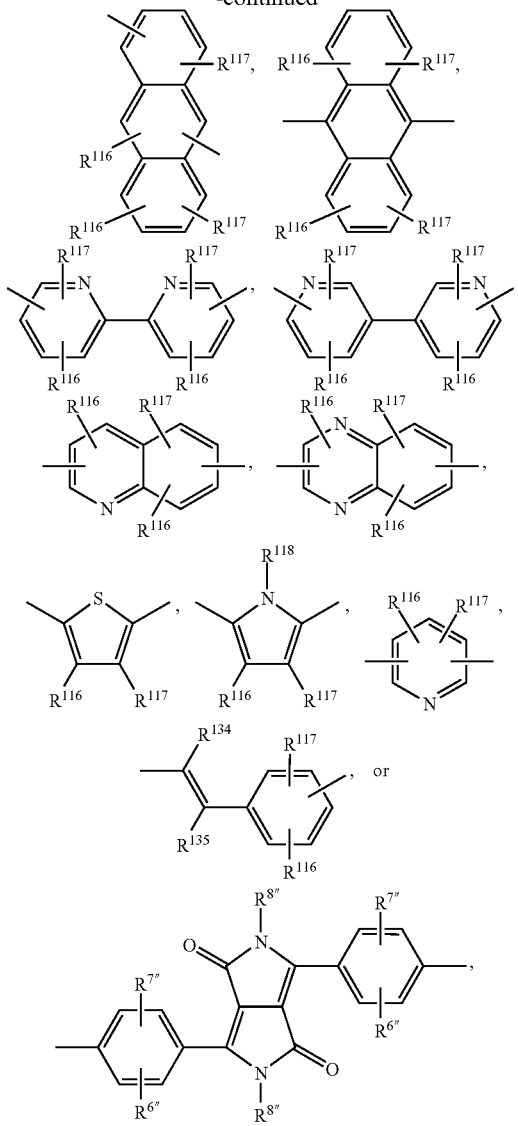

wherein $R^{116}$, $R^{117}$, $R^{119}$ and $R^{120}$ are as defined above, $R^{6''}$ and $R^{7''}$ are have independently of each other the meaning of $R^{16}$, $R^{118}$ and $R^{8''}$ are H, $C_1$-$C_{18}$alkyl, $C_1$-$C_{18}$alkyl which is substituted by E and/or interrupted by D, $C_6$-$C_{24}$ aryl, or $C_7$-$C_{25}$aralkyl, which are optionally substituted by G.

$R^{134}$ and $R^{135}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, or $C_2$-$C_{20}$heteroaryl, $C_2$-$C_{20}$heteroaryl which is substituted by E, wherein D, E and G are as defined above. Among the above units of group II the units of formula IIa, IIb and IIk are more preferred.

$A^1$ is preferably a phenyl group, which is substituted by $C_1$-$C_4$alkyl, in particular

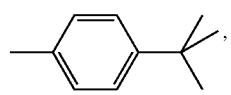

or an anthryl group, in particular an anthr-2-yl group.

Preferably, $R^{116}$ and $R^{117}$ are independently of each other H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, or n-heptyl; $C_1$-$C_{18}$alkyl which is substituted by E and/or interrupted by D, such as —$CH_2OCH_3$, —$CH_2OCH_2CH_3$, —$CH_2OCH_2CH_2OCH_3$, or —$CH_2OCH_2CH_2OCH_2CH_3$; $C_1$-$C_{18}$alkoxy, such as methoxy, ethoxy, n-propoxy, iso-propoxy, n-butoxy, isobutoxy, sec-butoxy, t-butoxy, 2-methylbutoxy, n-pentyloxy, isopentyloxy, n-hexyloxy, 2-ethylhexyloxy, or n-heptyloxy; $C_6$-$C_{14}$aryl, such as phenyl, naphthyl, or biphenylyl, $C_5$-$C_{12}$cycloalkyl, such as cyclohexyl, $C_6$-$C_{14}$aryl which is substituted by G, such as —$C_6H_4OCH_3$, —$C_6H_4OCH_2CH_3$, —$C_6H_3(OCH_3)_2$, or —$C_6H_3(OCH_2CH_3)_2$, —$C_6H_4CH_3$, —$C_6H_3(CH_3)_2$, —$C_6H_2(CH_3)_3$, —$C_6H_4OtBu$, or —$C_6H_4tBu$.

$R^{118}$ is preferably H, $C_1$-$C_{12}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, n-heptyl, or $C_6$-$C_{14}$aryl, such as phenyl, naphthyl, or biphenylyl.

Preferably, $R^{119}$ and $R^{120}$ are independently of each other H, $C_1$-$C_{12}$alkyl, such as methyl, ethyl, n-propyl, iso-propyl, n-butyl, sec-butyl, hexyl, octyl, or 2-ethyl-hexyl, $C_1$-$C_{12}$alkyl which is substituted by E and/or interrupted by D, such as —$CH_2(OCH_2CH_2)_wOCH_3$, w=1, 2, 3, or 4, $C_6$-$C_{14}$aryl, such as phenyl, naphthyl, or biphenylyl, $C_6$-$C_{14}$aryl which is substituted by one to three times by $C_1$-$C_{12}$alkyl, or $C_1$-$C_{12}$alkoxy, which can optionally be interrupted by —O—, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, or —$C_6H_4tBu$, or $R^{119}$ and $R^{120}$ together form a 4 to 8 membered ring, especially a 5 or 6 membered ring, such as cyclohexyl, or cyclopentyl, which can optionally be substituted by $C_1$-$C_8$alkyl.

Preferably, $R^{134}$ and $R^{135}$ are independently of each other H, $C_1$-$C_{12}$alkyl, such as methyl, ethyl, n-propyl, iso-propyl, n-butyl, isobutyl, or sec-butyl, or $C_6$-$C_{14}$aryl, such as phenyl, naphthyl, or biphenylyl.

D is preferably —CO—, —COO—, —S—, —SO—, —$SO_2$—, —O—, —$NR^{65}$—, wherein $R^{65}$ is $C_1$-$C_{12}$alkyl, such as methyl, ethyl, n-propyl, iso-propyl, n-butyl, isobutyl, or sec-butyl, or $C_6$-$C_{14}$aryl, such as phenyl, naphthyl, or biphenylyl.

E is preferably —$OR^{69}$; —$SR^{69}$; —$NR^{65}R^{65}$; —$COR^{68}$; —$COOR^{67}$; —$CONR^{65}R^{65}$; or —CN; wherein $R^{65}$, $R^{67}$, $R^{68}$ and $R^{69}$ are independently of each other $C_1$-$C_{12}$alkyl, such as methyl, ethyl, n-propyl, iso-propyl, n-butyl, isobutyl, sec-butyl, hexyl, octyl, or 2-ethyl-hexyl, or $C_6$-$C_{14}$aryl, such as phenyl, naphthyl, or biphenylyl.

G has the same preferences as E, or is $C_1$-$C_{18}$alkyl, especially $C_1$-$C_{12}$alkyl, such as methyl, ethyl, n-propyl, iso-propyl, n-butyl, isobutyl, sec-butyl, hexyl, octyl, or 2-ethyl-hexyl.

Preferred units of group III, which increase the electron-injection or electron-transport properties of the polymers, are:

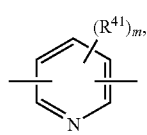
(IIIa)

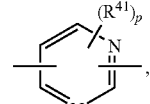
(IIIb)

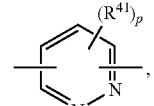
(IIIc)

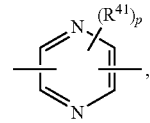
(IIId)

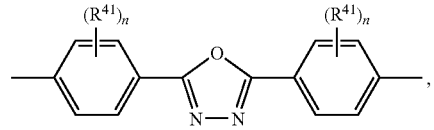
(IIIe)

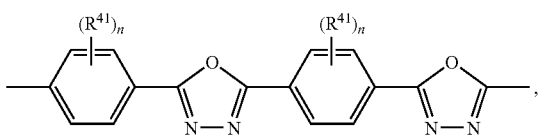
(IIIe')

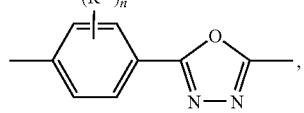
(IIIe'')

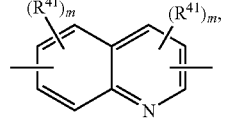
(IIIf)

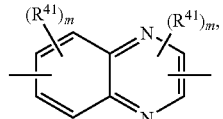
(IIIg)

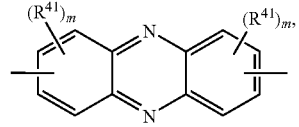
(IIIh)

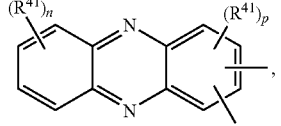
(IIIi)

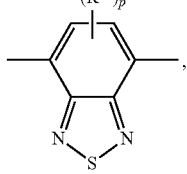
(IIIj)

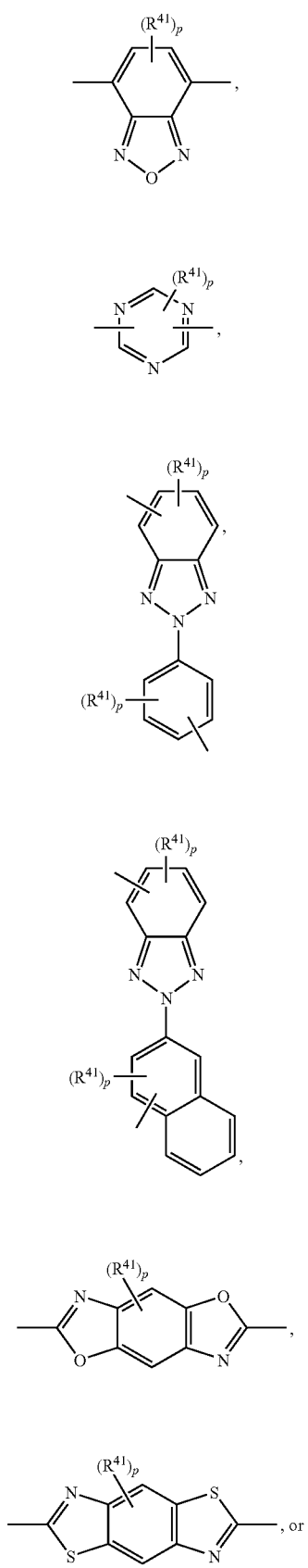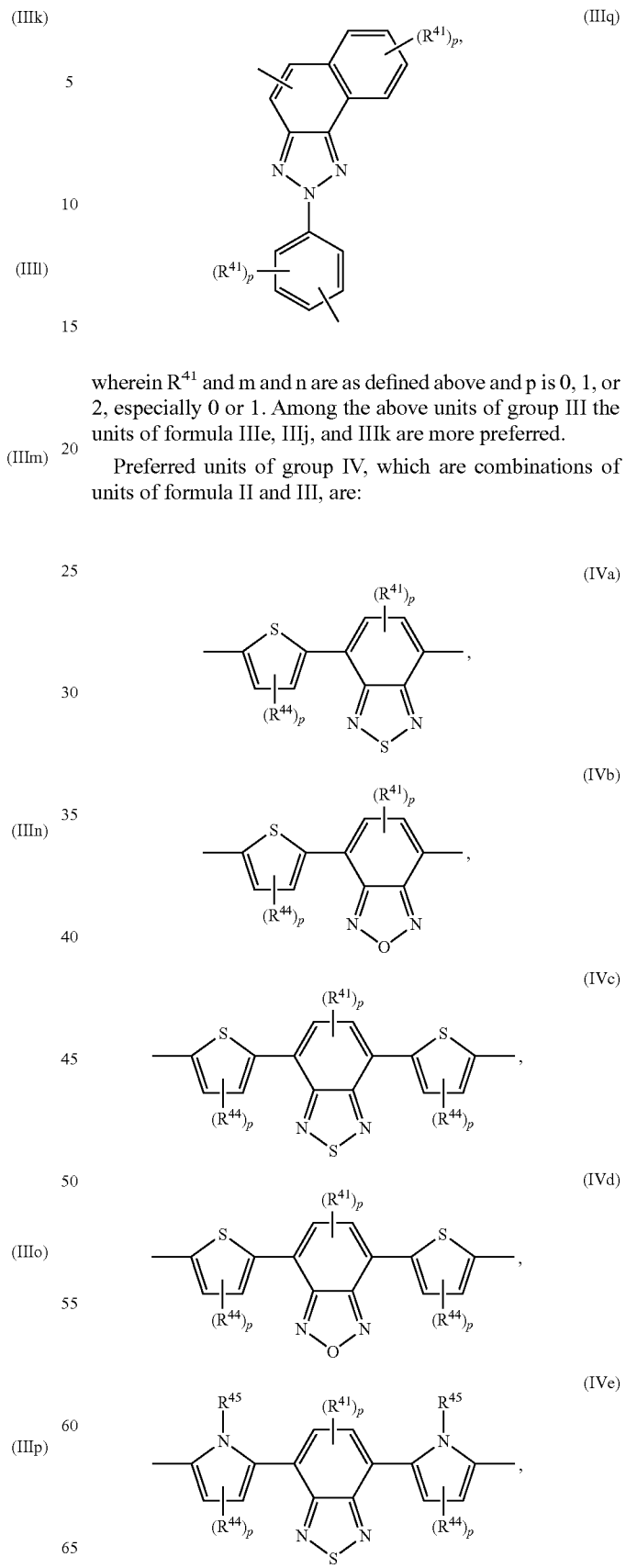
wherein $R^{41}$ and m and n are as defined above and p is 0, 1, or 2, especially 0 or 1. Among the above units of group III the units of formula IIIe, IIIj, and IIIk are more preferred.
Preferred units of group IV, which are combinations of units of formula II and III, are:

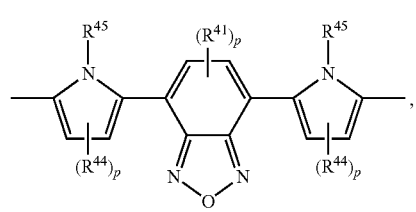
(IVf)

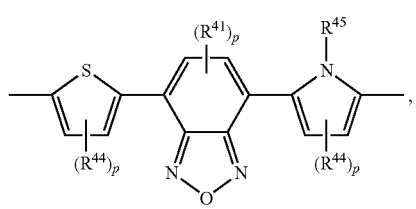
(IVg)

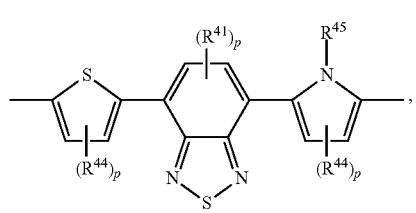
(IVh)

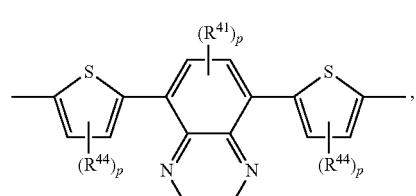
(IVi)

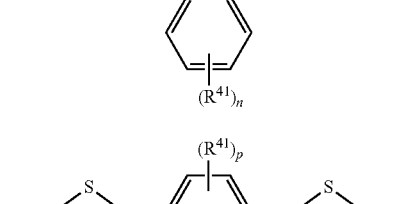
(IVj)

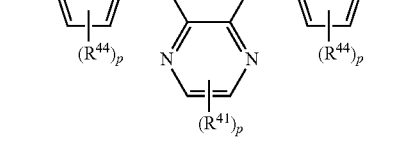
(IVk)

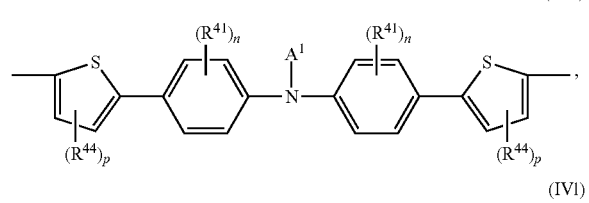
(IVl)

(IVm), (IVn), (IVo), (IVp), (IVq)

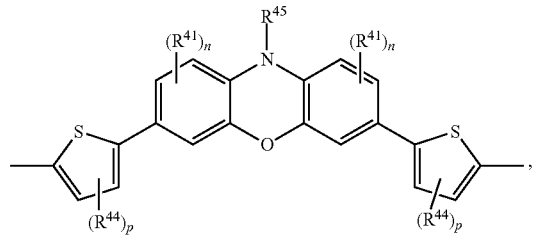

wherein $X^4$ is O, S, or $NR^{45}$, $R^{43}$ is a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{43}$ and/or $R^{44}$, which are in neighbourhood to each other, form a ring;

o is 1, 2, or 3, especially 1, or 2, u is 1, 2, 3, or 4, and $A^1$, $R^{41}$, $R^{42}$, $R^{44}$, $R^{45}$, m, n and p are as defined above.

The presence of repeating units of formula II to V can lead to the following advantages:

If structures of group II, e.g. repeating units of formula IIa to IIr are present, improved hole-injection and/or hole-transport properties of the polymers can be observed. If used in PLEDs, the PLEDs show higher current density and electroluminescence at a given voltage. This property is of high importance in mobile applications, such as, for example, displays for mobile phones and PDAs, when the power consumption can be reduced.

If structures of group III, e.g. repeating units of formula IIIa to IIIk are present, improved electron-injection or electron-transport properties of the polymers are observed. The presence of structures of group IV, e.g. repeating units of formula IVa to IVp, enables the variation of the of the electronic band gap and, hence, a variation of the color properties.

The preparation of monomers from which the units of group II, III, IV and V are derived, is, for example, described in WO03/020790.

In one embodiment, the polymers according to the invention consist only of one or more type of repeating units of formula I. In a preferred embodiment, the polymers according to the invention consist of precisely one type of repeating unit of formula I (homopolymers).

According to the present invention the term "polymer" comprises polymers as well as oligomers, wherein a polymer is a molecule of high relative molecular mass, the structure of which essentially comprises the repetition of units derived, actually or conceptually, from molecules of low relative molecular mass and an oligomer is a molecule of intermediate molecular mass, the structure of which essentially comprises a small plurality of units derived, actually or conceptually, from molecules of lower relative molecular mass. A molecule is regarded as having a high relative molecular mass if it has properties which do not vary significantly with the removal of one or a few of the units. A molecule is regarded as having an intermediate molecular mass if it has properties which do vary significantly with the removal of one or a few of the units.

According to the present invention a homopolymer is a polymer derived from one species of (real, implicit, or hypothetical) monomer. Many polymers are made by the mutual reaction of complementary monomers. These monomers can readily be visualized as reacting to give an "implicit monomer", the homopolymerisation of which would give the actual product, which can be regarded as a homopolymer. Some polymers are obtained by chemical modification of other polymers, such that the structure of the macromolecules that constitute the resulting polymer can be thought of having been formed by the homopolymerisation of a hypothetical monomer.

Accordingly a copolymer is a polymer derived from more than one species of monomer, e.g. bipolymer, terpolymer, quaterpolymer, etc.

The oligomers of this invention have a weight average molecular weight of <2,000 Daltons. The polymers of this invention preferably have a weight average molecular weight of 2,000 Daltons or greater, especially 2,000 to 2,000,000 Daltons, more preferably 10,000 to 1,000,000 and most preferably 20,000 to 750,000 Daltons. Molecular weights are determined according to gel permeation chromatography using polystyrene standards.

In one aspect of the present invention polymers are preferred, which besides the repeating units of formula I at the same time have at least one additional repeating unit $Ar^3$, or T, which is selected from groups II to VI. In said aspect, the polymers according to the invention comprise from 1 to 99 mol % of repeating units of formula I and preferably from 5 to 95 mol % of repeating units of groups II to VI, more preferably from 10 to 90 mol % of repeating units of groups II to VI, most preferably from 25 to 75 mol % of repeating units of groups II to VI. In said aspect of the present invention polymers are preferred, which besides the repeating units of formula I at the same time have at least two additional repeating units, which are selected from at least two different groups II to VI. Most preferred is the simultaneous presence of repeating units of group III and VI, IV and VI, or II and III and VI.

Accordingly, in one preferred embodiment the present invention relates to polymers, wherein the polymer comprises a repeating unit(s) of formula

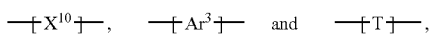

wherein
$X^{10}$ is a repeating unit of formula I, especially

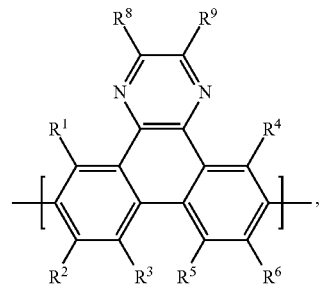

(X)

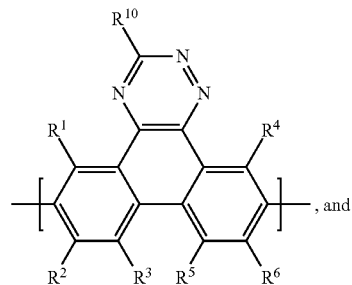

(XI)

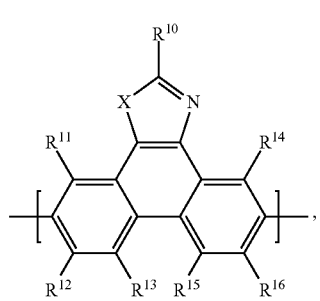

(XII)

wherein
X, $R^1$, $R^2$, $R^3$, $R^4$, $R^5$, $R^6$, $R^8$, $R^9$, $R^{10}$, $R^{11}$, $R^{12}$, $R^{13}$, $R^{14}$, $R^{15}$ and $R^{16}$ are as defined above, very especially

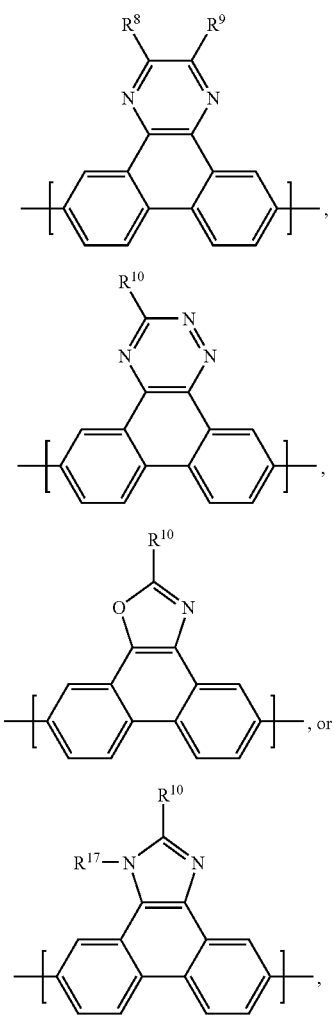

(Xa)

(XIa)

(XIIa)

, or (XIIb)

, wherein $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$,
$R^8$ and $R^9$ together form a group

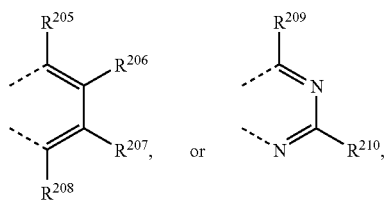

wherein $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl,
$R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$ wherein $X^2$ is a spacer, such as $C_6$-$C_{12}$aryl, or $C_6$-$C_{12}$heteroaryl, especially phenyl, or naphthyl, which can be substituted one more, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D.

In said embodiment T is preferably a repeating unit of formula VIa or VIb and $Ar^3$ is preferably selected from repeating units of formula:

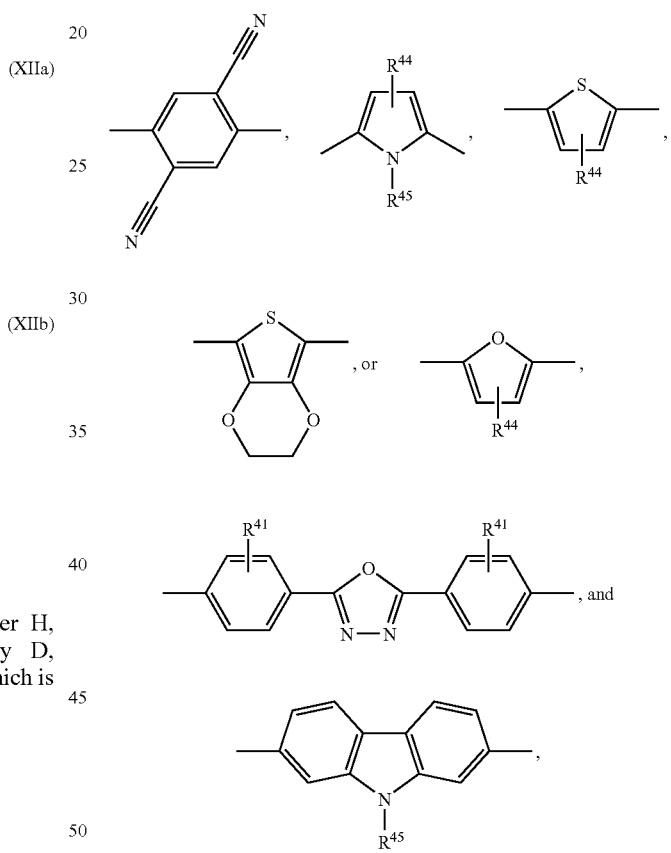

wherein
$R^{44}$ and $R^{41}$ are hydrogen, $C_1$-$C_{18}$alkyl, or $C_1$-$C_{18}$alkoxy, and
$R^{45}$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above.

In said aspect of the present invention terpolymers comprising a repeating unit of formula

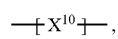, a repeating unit of formula

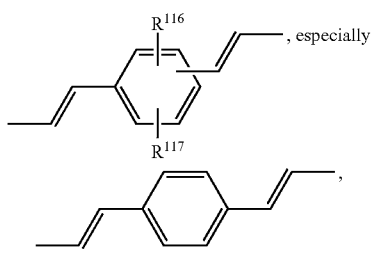, especially

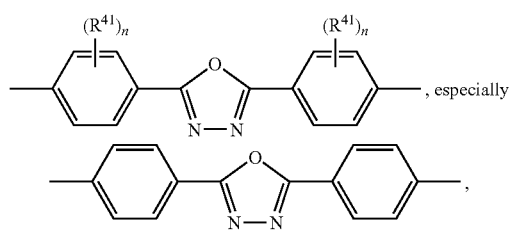, and a repeating unit of formula

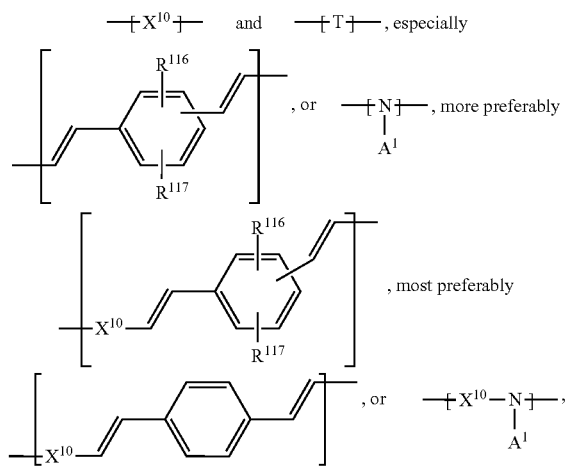

are most preferred, wherein
X$^{10}$ is a repeating unit of formula I, especially X, XI and XII, very especially Xa, XIa, XIIa and XIIb.
R$^{116}$ and R$^{117}$ are as defined above and are preferably H, halogen, CN, C$_1$-C$_{12}$alkyl, C$_1$-C$_{12}$alkoxy, or C$_6$-C$_{14}$aryl, more preferably H, C$_1$-C$_{12}$alkyl, or C$_1$-C$_{18}$alkoxy,
R$^{41}$ is Cl, F, CN, N(R$^{45}$)$_2$, C$_1$-C$_{18}$alkyl, C$_1$-C$_{18}$alkoxy, or C$_6$-C$_{14}$aryl,
n is 0, 1, or 2.

In another preferred embodiment the present invention relates to polymers, wherein the polymer comprises repeating units of formula $-\!\!+\!X^{10}\!+\!\!-$ and $-\!\!+T\!+\!\!-$, especially

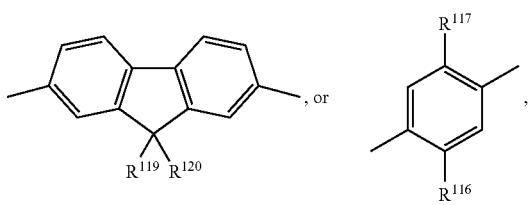

or an anthryl group, in particular an anthr-2-yl group.

In another preferred embodiment the polymer comprises a repeating unit of formula $$-\!\!+\!X^{10}\!+\!\!-, \quad (I)$$

and a repeating unit $$-\!\!+Ar^3\!+\!\!-,$$

wherein
X$^{10}$ is a repeating unit of formula I, especially X, XI and XII (XVI, XVII and XVIII), very especially Xa, XIa, XIIa and XIIb ((XVIa, XVIIa, XVIIIa and XVIIIb);
and —Ar$^3$— is a group of formula

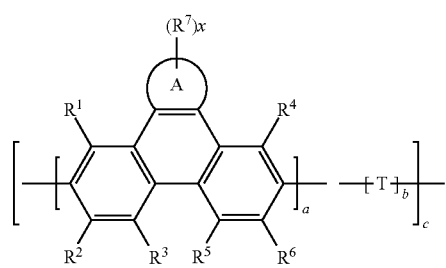

wherein
R$^{116}$ and R$^{117}$ are independently of each other H, C$_1$-C$_{18}$alkyl, which can optionally be interrupted by O, or C$_1$-C$_{18}$alkoxy, which can optionally be interrupted by O,
R$^{119}$ and R$^{120}$ are independently of each other H, C$_1$-C$_{18}$alkyl, which can optionally be interrupted by O, or
R$^{119}$ and R$^{120}$ together form a group of formula =CR$^{100}$R$^{101}$, wherein
R$^{100}$ and R$^{101}$ are independently of each other H, C$_1$-C$_{18}$alkyl, or
R$^{119}$ and R$^{120}$ together form a five or six membered ring, which optionally can be substituted by C$_1$-C$_{18}$alkyl.

The present invention is illustrated in more detail on the basis of an especially preferred embodiment below, but should not be limited thereto.

In said embodiment the polymer is a polymer of formula (VII)

-continued $$-\!\!\left[\!\left[Ar^3\right]_d\!\left[T\right]_e\right]_f\!-,$$

wherein
A, $R^1$, $R^2$, $R^3$, $R^4$, $R^5$, $R^6$, $R^7$ and x are as defined above, T and $Ar^3$ are as defined above,
a is 1,
b is 0, or 1,
c is 0.005 to 1,
d is 0, or 1,
e is 0, or 1, wherein e is not 1, if d is 0,
f is 0.995 to 0, wherein the sum of c and f is 1.

T is preferably a repeating unit of formula VIa, VIb or VIf and $Ar^3$ is preferably selected from repeating units of formula:

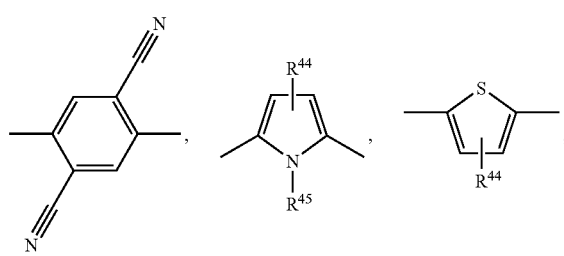

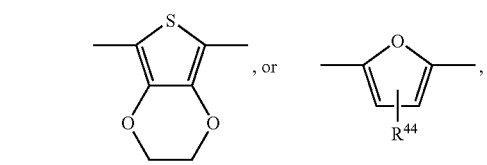, or 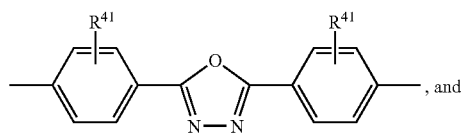,

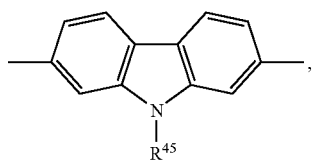, and

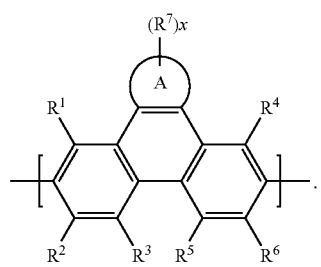, wherein
$R^{44}$ and $R^{41}$ are hydrogen, $C_1$-$C_{18}$alkyl, or $C_1$-$C_{18}$alkoxy, and
$R^{45}$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above.

Homopolymers of formula VII, wherein a=1, b=0, c=1, d=0, e=0, f=0, are, for example, obtained by nickel coupling reactions, especially the Yamamoto reaction:

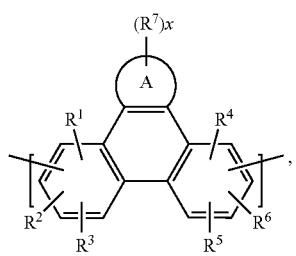

wherein A, $R^1$, $R^2$, $R^3$, $R^4$, $R^5$, $R^6$, $R^7$ and x are as defined above. In said aspect homopolymers consisting of repeating units of formula X, XI, or XII are preferred and homopolymers consisting of repeating units of formula Xa, XIa, XIIa and XIIb are most preferred.

Copolymers of formula VII, involving repeating units of formula I and —$Ar^3$— (a=1, c=0.995 to 0.005, b=0, d=1, e=0, f=0.005 to 0.995), can be obtained by nickel coupling reactions:

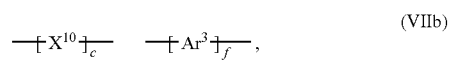

wherein $X^{10}$, c, f and $Ar^3$ are as defined above.

In an especially preferred embodiment the present invention is directed to copolymers which contain at least two different repeating units of formula

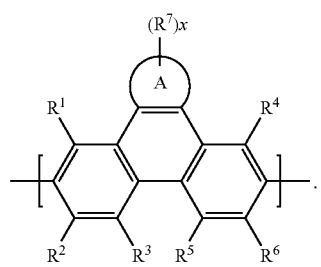

In said embodiment copolymers are more preferred, which comprise at least one repeating unit of formula I' wherein A is a 5 membered heteroaromatic ring and at least one repeating unit of formula I' wherein A is a 6 membered heteroaromatic ring. Appropriate examples of repeating units comprising a 6 membered heteroaromatic ring are compounds of formula

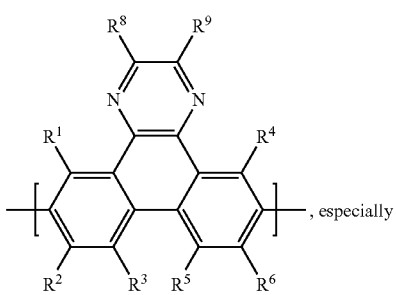, especially

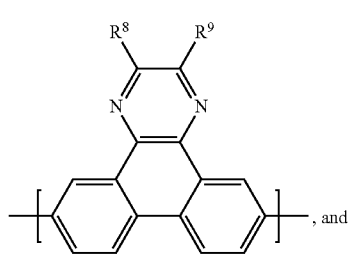
(Xa)
, and

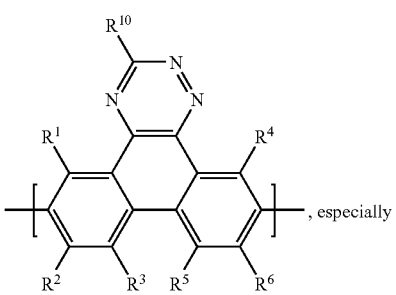
(XI)
, especially

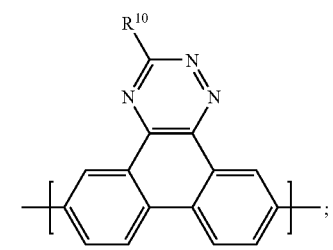
(XIa)
;

examples of repeating units comprising a 5 membered heteroaromatic ring are compounds of formula and

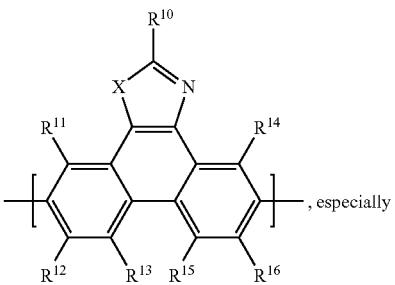
(XII)
, especially

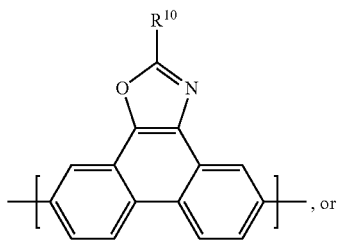
(XIIa)
, or

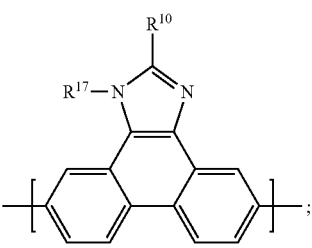
(XIIb)
;

wherein $R^1$, $R^2$, $R^3$, $R^4$, $R^5$, $R^6$, $R^8$, $R^9$, $R^{10}$, $R^{11}$, $R^{12}$, $R^{13}$, $R^{14}$, $R^{15}$, $R^{16}$ and $R^{17}$ are as defined above. In said aspect of the present invention copolymers comprising repeating units of formula Xa and XIIa and/or XIIa (Xa and XIIa; Xa and XIIa; Xa and Xa, XIIa and XIIb), or XIa and XIIa and/or XIIa (XIa and XIIa; XIa and XIIa; XIa and Xa, XIIa and XIIb) are most preferred.

The following polymers are especially preferred:

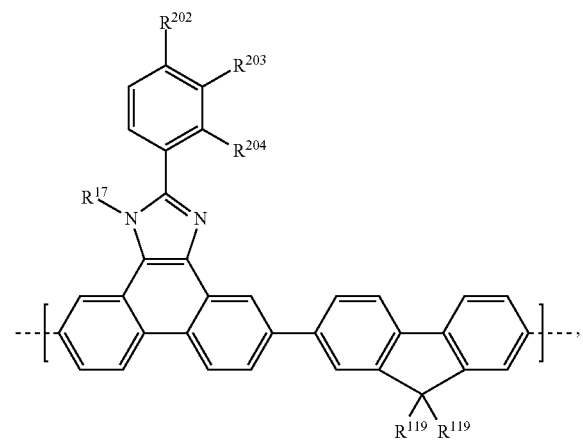

-continued
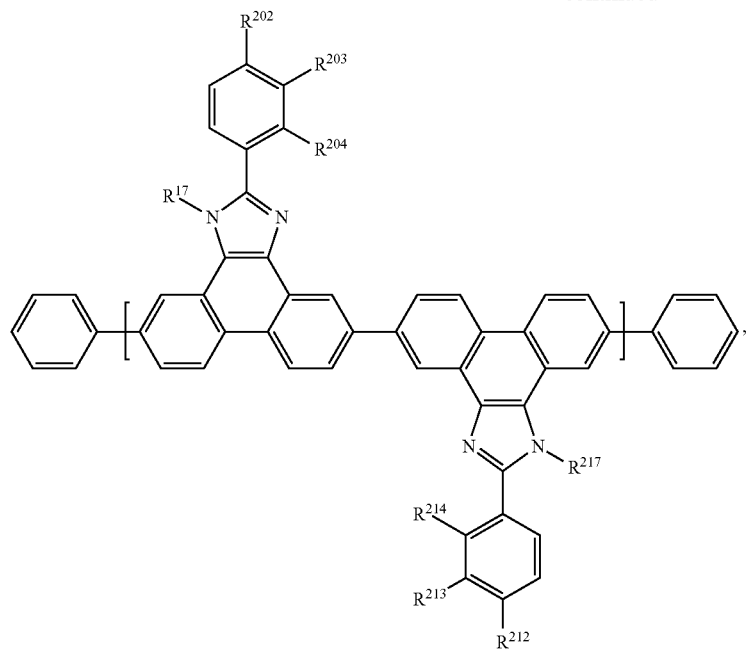
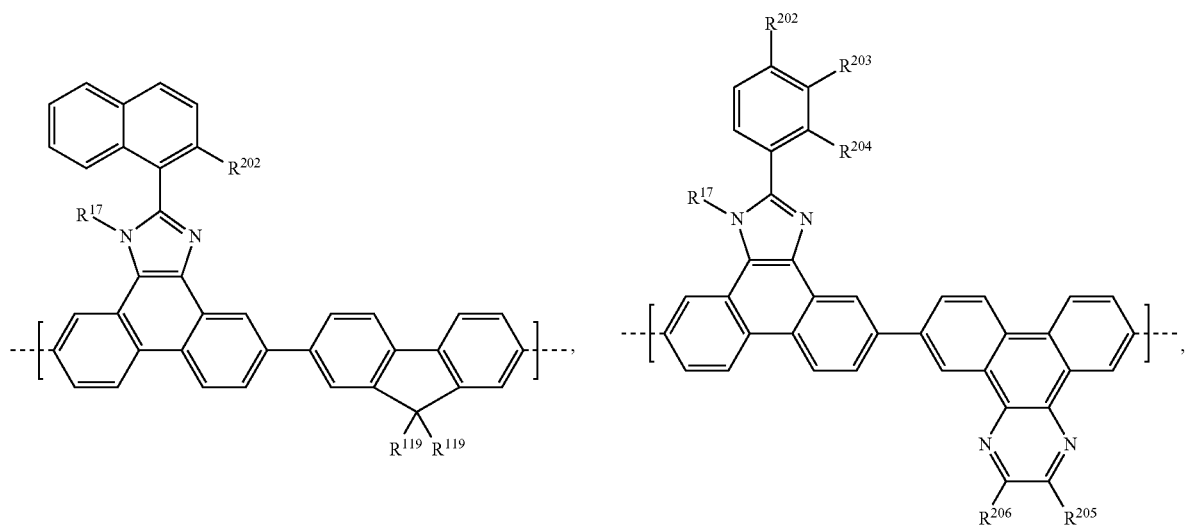
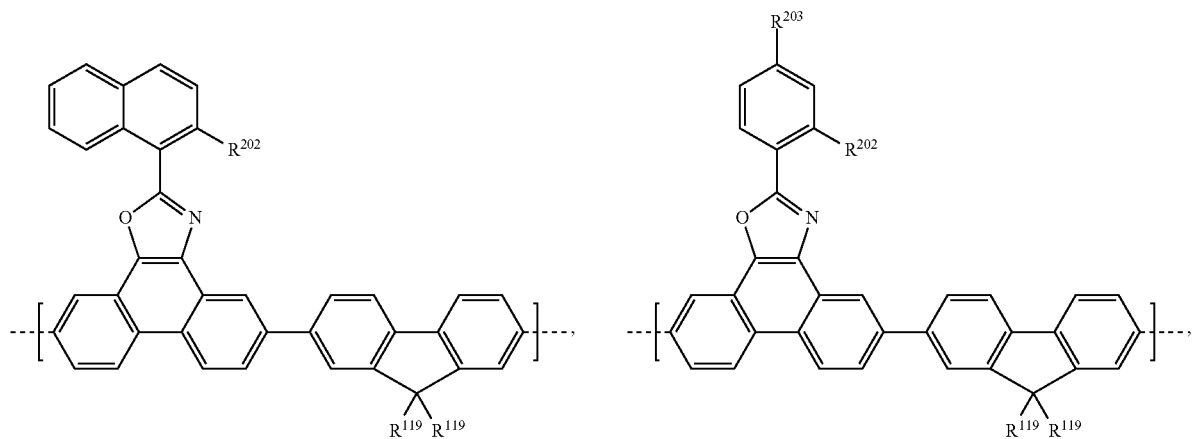

-continued
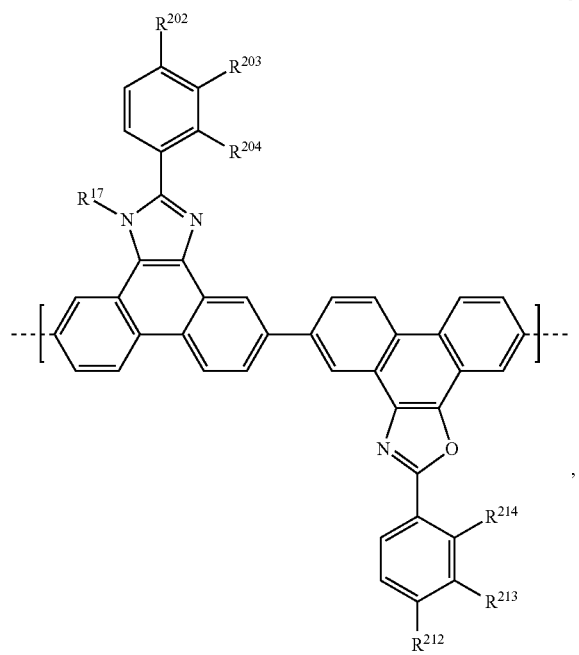
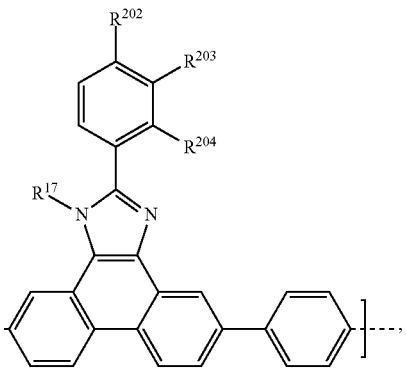
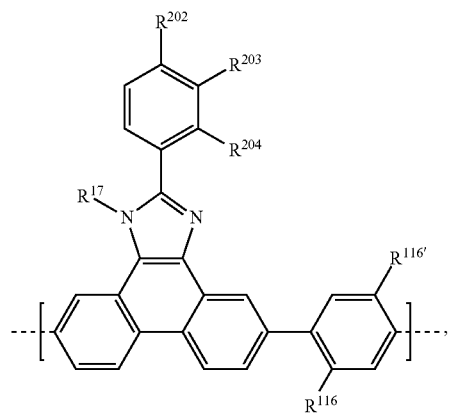
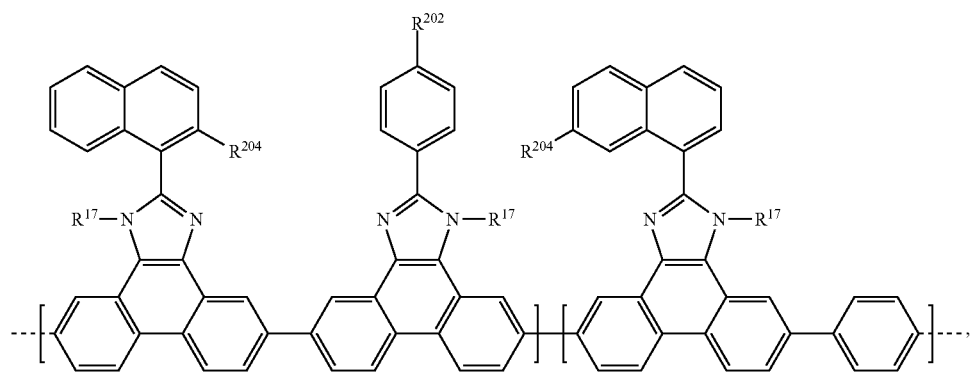

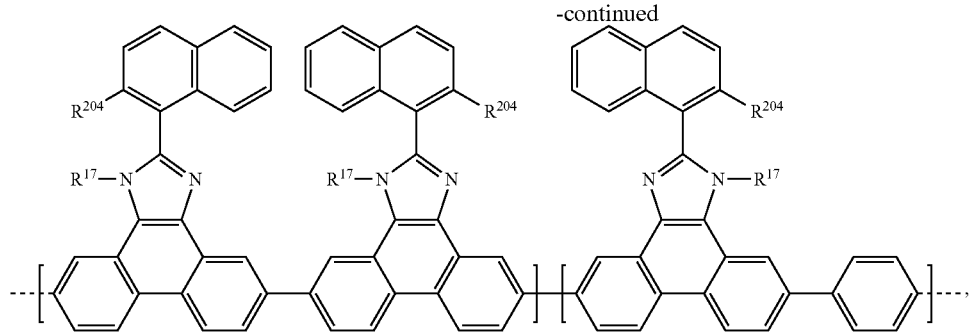

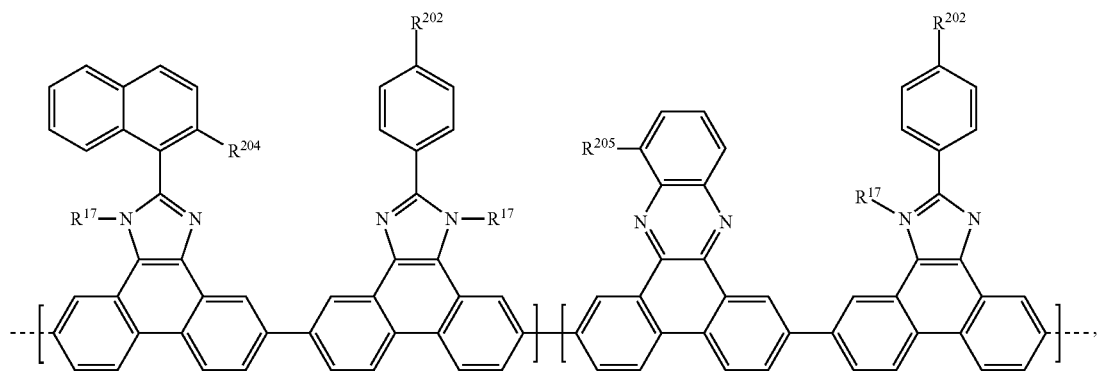

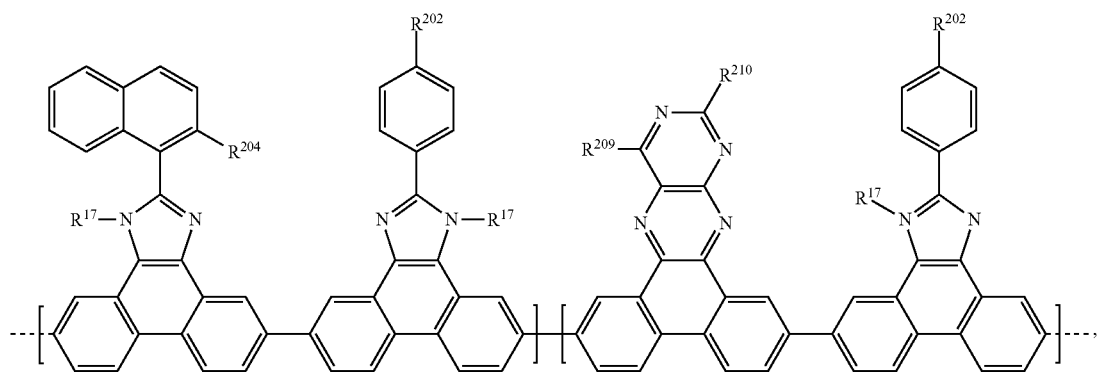

wherein
$R^{17}$ and $R^{217}$ are independently of each other $C_1$-$C_{18}$alkyl, especially $C_4$-$C_{12}$alkyl, such as, for example, n-butyl, n-hexyl, n-octyl, 2-ethylhexyl, and 2-hexadecyl,
$R^{202}$, $R^{203}$, $R^{204}$, $R^{212}$, $R^{213}$ and $R^{214}$ are independently of each other H, or $C_1$-$C_{18}$alkoxy, such as for example, n-butoxy, n-hexyloxy, n-octyloxy, 2-ethylhexyloxy, and 2-hexadecyloxy,
$R^{209}$ and $R^{210}$ are independently of each other H, or $C_1$-$C_{18}$alkoxy;
$R^{205}$ and $R^{206}$ are independently of each other H, or $C_1$-$C_{18}$alkoxy, especially $C_1$-$C_8$alkyl;
$R^{116}$ is H, or $C_1$-$C_{18}$alkoxy,
$R^{116'}$ is $R^{116}$ $R^{119}$ is $C_1$-$C_{18}$alkyl, especially $C_4$-$C_{12}$alkyl, such as, for example, n-butyl, n-hexyl, n-octyl, and 2-ethylhexyl, or

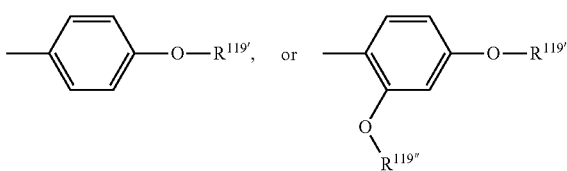

$C_1$-$C_{18}$alkyl, especially $C_1$-$C_8$alkyl, wherein $R^{119'}$ and $R^{119''}$ are independently of each other $C_1$-$C_{18}$alkyl (all shown polymer structures are idealized structures).

In a further preferred embodiment the present invention relates to polymers of formula

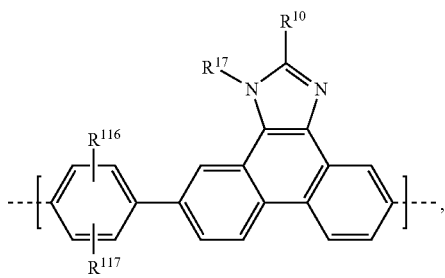

wherein $R^{10}$ is $C_6$-$C_{12}$aryl, which can optionally be substituted by one to three groups selected from $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D; especially

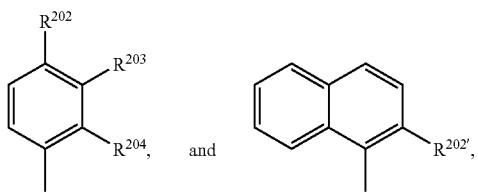

wherein $R^{202'}$ is $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, especially $C_1$-$C_{18}$alkoxy;
one of $R^{202}$, $R^{203}$ and $R^{204}$ is $R^{202'}$, and the other groups are H, or $R^{202'}$.
$R^{116}$ and $R^{117}$ are H, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, especially $C_1$-$C_{18}$alkoxy;
$R^{17}$ is $C_1$-$C_{18}$alkyl, or $C_6$-$C_{12}$aryl, which can optionally be substituted by one to three $C_1$-$C_{18}$alkoxy groups.

In a further preferred embodiment the present invention relates to polymers comprising repeating units of formula

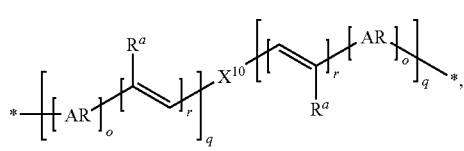

XX wherein
$X^{10}$ is a repeating unit of formula I, especially X, XI and XII (XVI, XVII and XVIII), very especially Xa, XIa, XIIa and XIIb ((XVIa, XVIIa, XVIIIa and XVIIIb);
q is an integer 0, 1, or 2, o is 0, 1, or 2, r is 0, or 1;
AR is $C_6$-$C_{24}$aryl, $C_6$-$C_{24}$aryl which is substituted by G, $C_2$-$C_{20}$heteroaryl, or $C_2$-$C_{20}$heteroaryl which is substituted by G.
$R^a$ is H, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, wherein E, D and G are as defined above.

AR is the same or different in each occurrence. AR can be derived from thiophen, 2,7-N-alkylcarbazol, 2,7-N-arylcarbazol, 3,6-N-alkylcarbazol, 3,6-N-arylcarbazol, benzene, pyridine, fluorene, spirobifluorene, anthracene, phenanthrene, pyrene, quinoline, or naphthalene, which be substituted by 0 to 2 substituents $R^a$.

Examples of additional repeating units are units of group II, which increase the hole injection or hole transport properties of the polymers. Examples of additional repeating units are in particular selected from the group consisting of ortho-, meta- or para-phenylene, 1,4-naphthylene, 9,10-anthracenylene, 2,7-phenanthrenylene, 1,6-, 2,7-, 4,9-pyrene, 2,7-tetrahydropyrene, oxadiazolylene, 2,5-thiophenylene, 2,5-pyrrolylene; 2,5-furanylene, 2,5-pyridylene, 2,5-pyrimidinylene, 5,8-chinolinylene, fluorene, spiro-9,9'-bifluorene, indenofluorene, heteroindenofluorene, 2,7-N-alkylcarbazol, 2,7-N-arylcarbazol, 3,6-N-alkylcarbazol, and 3,6-N-arylcarbazol. Preferred examples of additional repeating units are

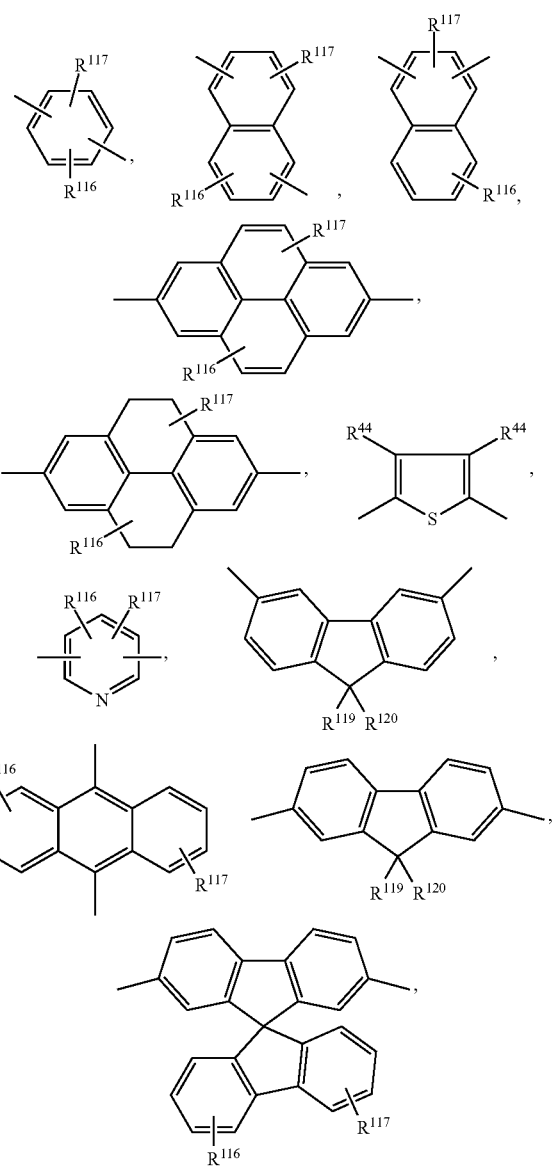

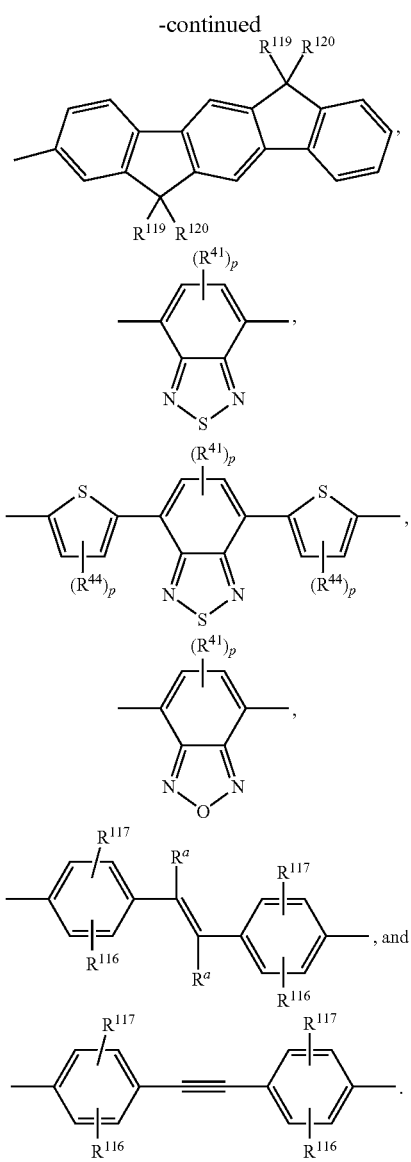

Examples of repeating units of formula XX are:

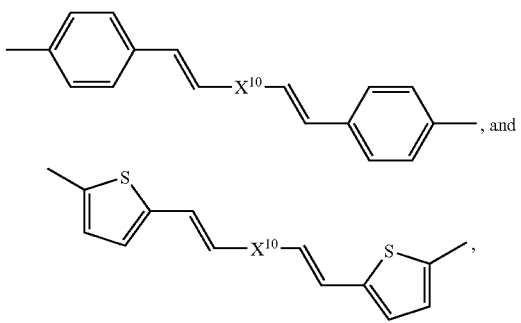

wherein
$X^{10}$ is a repeating unit of formula I, especially X, XI and XII (XVI, XVII and XVIII), very especially Xa, XIa, XIIa and XIIb ((XVIa, XVIIa, XVIIIa and XVIIIb)).

The polymers of the present invention can show high photoluminescence and/or electroluminescence.

Polymerization processes involving only dihalo-functional reactants may be carried out using nickel coupling reactions. One such coupling reaction was described by Colon et al. in J. Pol. Sci., Part A, Polymer Chemistry Edition 28 (1990) 367, and by Colon et al. in J. Org. Chem. 51 (1986) 2627. The reaction is typically conducted in a polar aprotic solvent (e.g., dimethylacetamide) with a catalytic amount of nickel salt, a substantial amount of triphenylphosphine and a large excess of zinc dust. A variant of this process is described by Ioyda et al. in Bull. Chem. Soc. Jpn, 63 (1990) 80 wherein an organosoluble iodide was used as an accelerator.

Another nickel-coupling reaction was disclosed by Yamamoto in Progress in Polymer Science 17 (1992) 1153 wherein a mixture of dihaloaromatic compounds was treated with an excess amount of nickel (1,5-cyclooctadiene) complex in an inert solvent. All nickel-coupling reactions when applied to reactant mixtures of two or more aromatic dihalides yield essentially random copolymers. Such polymerization reactions may be terminated by the addition of small amounts of water to the polymerization reaction mixture, which will replace the terminal halogen groups with hydrogen groups. Alternatively, a monofunctional aryl halide may be used as a chain-terminator in such reactions, which will result in the formation of a terminal aryl group.

Nickel-coupling polymerizations yield essentially homopolymers or random copolymers comprising units of formula I and units derived from other co-monomers.

Homopolymers of formula VII, wherein a=1, c=1, b=0, d=1, e=0, f=1, can be obtained, for example, by the Suzuki reaction:

$$-\!\!\!+\!\!X^{10}\!\!-\!\!Ar^3\!\!-\!\!\!+\!\!\!-, \quad \text{(VIIc)}$$

wherein $X^{10}$ and $Ar^3$ are as defined above.

The condensation reaction of an aromatic boronate and a halogenide, especially a bromide, commonly referred to as the "Suzuki reaction", is tolerant of the presence of a variety of organic functional groups as reported by N. Miyaua and A. Suzuki in Chemical Reviews, Vol. 95, pp. 457-2483 (1995). This reaction can be applied to preparing high molecular weight polymers and copolymers. Preferred catalysts are 2-dicyclohexylphosphino-2',6'-di-alkoxybiphenyl/palladium (II)acetates. An especially preferred catalyst is 2-dicyclohexyl phosphino-2',6'-di-methoxybiphenyl (sPhos)/palladium(II)acetate.

To prepare polymers corresponding to formula VIIc, a dihalogenide, such as a dibromide or dichloride, especially a dibromide corresponding to formula Br—$X^{10}$—Br is reacted with an equimolar amount of a diboronic acid or diboronate corresponding to formula $$X^{11}\!\!-\!\!\!+\!\!Ar^3\!\!\!+\!\!\!-X^{11},$$

wherein $X^{11}$ is independently in each occurrence —$B(OH)_2$, —$B(OY^1)_2$ or

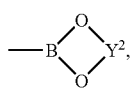

wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, or —$C(CH_3)_2CH_2C(CH_3)_2$—, under the catalytic action of Pd and a phosphine ligand, especially triphenylphosphine. The reaction is typically conducted at about 70° C. to 180° C. in an aromatic hydrocarbon solvent such as toluene. Other solvents such as dimethylformamide and tetrahydrofuran can also be used alone, or in mixtures with an aromatic hydrocarbon. An aqueous base, preferably sodium carbonate, potassium carbonate, $K_3PO_4$, or bicarbonate, is used as the HBr scavenger. Depending on the reactivities of the reactants, a polymerization reaction may take 2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252.

If desired, a monofunctional aryl halide or aryl boronate may be used as a chain-terminator in such reactions, which will result in the formation of a terminal aryl group.

It is possible to control the sequencing of the monomeric units in the resulting copolymer by controlling the order and composition of monomer feeds in the Suzuki reaction.

Homopolymers of formula VII, wherein a=1, c=1, b=1, d=0, e=0, f=0, can be obtained, for example by the Heck reaction:

(VIId)

wherein $X^{10}$ and T are as defined above.

Polyphenylenethenylene derivatives and polyphenylenethynylene derivatives can be obtained by polymerization of divinyl or diethinyl compounds with dihalogen compounds by the Heck reaction (R. F. Heck, Palladium Reagents in Organic Synthesis, Academic Press, New York 1985, pp. 179; L. S. Hegedus, Organometalics in Synthesis, Ed. M. Schlosser, Wiley, Chichester, UK 1994, pp. 383; Z. Bao, Y. Chen, R. Cai, L. Yu, Macromolecules 26 (1993) pp. 5281; W.-K. Chan, L. Yu, Macromolecules 28 (1995) pp. 6410; A. Hilberer, H.-J. Brouwer, B.-J. van der Scheer, J. Wildeman, G. Hadziioannou, Macromolecules 1995, 28, 4525) and the Sonogaschira reaction (Dmitri Gelman and Stephen L. Buchwald, Angew. Chem. Int. Ed. 42 (2003) 5993-5996; Rik, R. Tykwinski, Angew. Chem. 115 (2003) 1604-1606; Jason M. Nolan and Daniel L. Comins, J. Org. Chem. 68 (2003) 3736-3738; Jiang Cheng et al., J. Org. Chem. 69 (2004) 5428-5432; Zolta'n Nova'k et al., Tetrahedron 59 (2003) 7509-7513):

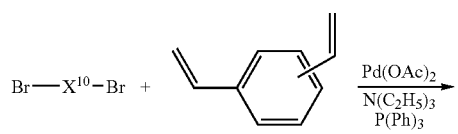

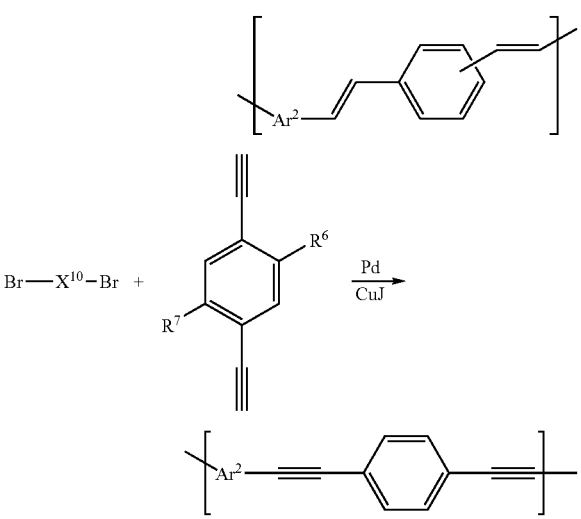

(Random) copolymers of formula VII, wherein a is 1, b is 1, c is 0.005 to 0.995, d is 1, e is 1, f is 0.995 to 0.005, wherein the sum of c and f is 1, can also be obtained by the Heck reaction:

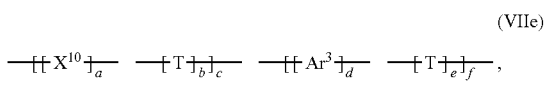

(VIIe)

wherein a, b, c, d, e, f, $X^{10}$, $Ar^3$ and T are as defined above.

The polymers containing groups of formulas (I) may be prepared by any suitable process, but are preferably prepared by the processes described above.

The polymers of the present invention can optionally comprise end moieties $E^1$, wherein $E^1$ is an aryl moiety which may optionally be substituted with a reactive group capable of undergoing chain extension or crosslinking, or a tri($C_1$-$C_{18}$) alkylsiloxy group. As used herein, a reactive group capable of undergoing chain extension or crosslinking refers to any group which is capable of reacting with another of the same group or another group so as to form a link to prepare polymers. Preferably, such reactive group is a hydroxy, glycidyl ether, acrylate ester, methacrylate ester, ethenyl, ethynyl, maleimide, naphthimide, trifluorovinyl ether moiety or a cyclobutene moiety fused to the aromatic ring of $E^1$.

The polymers of the present invention, where $E^1$ are reactive groups as defined above, are capable of crosslinking to form solvent resistant, heat-resistant films at 100° C. or more, more preferably at 150° C. or more. Preferably, such crosslinking occurs at 350° C. or less, more preferably 300° C. or less and most preferably 250° C. or less. The crosslinkable polymers of the invention are stable at 100° C. or more and more preferably 150° C. or more. "Stable" as used herein means that such polymers do not undergo crosslinking or polymerization reactions at or below the stated temperatures. If a crosslinkable material is desired, $E^1$ is preferably a vinylphenyl, an ethynylphenyl, or 4-(or 3-)benzocyclobutenyl radical. In another embodiment, $E^1$ is selected from a group of phenolic derivatives of the formula —$C_6H_4$—O—Y, wherein Y is —H, —CN,

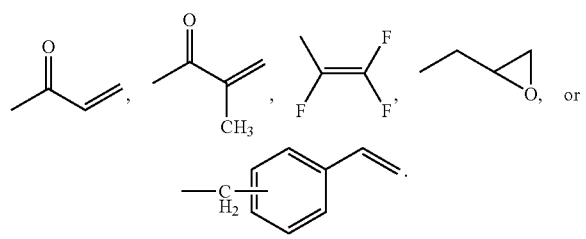

If desired, the cross-linkable groups can be present in other parts of the polymer chain. For example, one of the substituents of the co-monomer T may be a crosslinkable group $E^1$.

The end-capping agent $E^1$-$X^{12}$ ($E^1$ is as defined above and $X^{12}$ is either Cl or Br) is incorporated into the polymers of the present invention under the condition in which the resulting polymers are substantially capped by the reactive group $E^1$. The reactions useful for this purpose are the nickel-coupling, Heck reactions and Suzuki reactions described above. The average degree of polymerization is controlled by the mole ratio of monomers to end-capping agent.

The polymers according to the invention can be worked up by known methods which are familiar to the person skilled in the art, as described, for example, in D. Braun, H. Cherdron, H. Ritter, Praktikum der makromolekularen Stoffe, $1^{st}$ Edn., Wiley VCH, Weinheim 1999, p. 68-79 or R. J. Young, P. A. Lovell, Introduction to Polymers, Chapman & Hall, London 1991. For example, the reaction mixture can be filtered, diluted with aqueous acid, extracted and the crude product obtained after drying and stripping-off of the solvent can be further purified by reprecipitation from suitable solvents with addition of precipitants. Residual palladium can be removed by using activated carbon, chromatography etc. Advantageously, the residual palladium could be reduced to <3 ppm by washing the crude organic solvent layer containing the polymer with an aqueous solution of L-cysteine at room temperature to the boiling point of the organic solvent, especially by washing a toluene layer containing the polymer with an aqueous solution of L-cysteine at 85 to 90° C., optionally followed by washing with a solution of L-cysteine and sodium thiosulfate at 78 to 82° C. (Mahavir Prashad, Yugang Liu, Oljan Repicoe, Adv. Synth. Catal. 2003, 345, 533-536; Christine E. Garrett, Kapa Prasad, Adv. Synth. Catal. 2004, 346, 889-900). Additionally the Pd can be removed by washing the polymer with an aqueous NaCN solution as described in U.S. Pat. No. 6,956,095. Polymer-analogous reactions can subsequently be carried out for further functionalization of the polymer. Thus, for example, terminal halogen atoms can be removed reductively by reduction with, for example, LiAlH$_4$ (see, for example, J. March, Advanced Organic Chemistry, $3^{rd}$ Edn. McGraw-Hill, p. 510).

Another aspect of this invention is related to polymer blends containing 1 to 99 percent of at least one containing polymers comprising a unit of formula I. The remainder 1 to 99 percent of the blend is composed of one or more polymeric materials selected from among chain growth polymers such as polystyrene, polybutadiene, poly(methyl methacrylate), and poly(ethylene oxide); step-growth polymers such as phenoxy resins, polycarbonates, polyamides, polyesters, polyurethanes, and polyimides; and crosslinked polymers such as crosslinked epoxy resins, crosslinked phenolic resins, crosslinked acrylate resins, and crosslinked urethane resins. Examples of these polymers may be found in Preparative Methods of Polymer Chemistry, W. R. Sorenson and T. W. Campbell, Second Edition, Interscience Publishers (1968). Also may be used in the blends are conjugated polymers such as poly(phenylene vinylene), substituted poly(phenylene vinylene)s, substituted polyphenylenes and polythiophenes. Examples of these conjugated polymers are given by Greenham and Friend in Solid State Physics, Vol. 49, pp. 1-149 (1995).

A further embodiment of the present invention is represented by the monomers of the formula

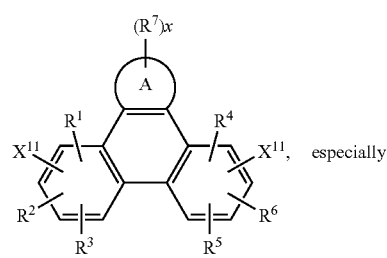

(XIII)

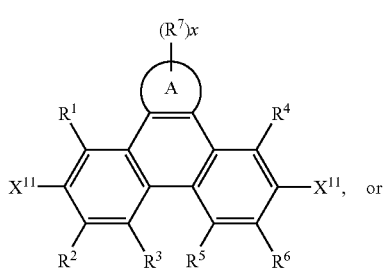

(XIIIa)

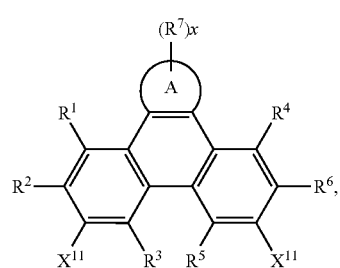

(XIIIb)

wherein A is a 5-, 6-, or 7-membered heteroaromatic ring, containing one heteroatom selected from nitrogen, oxygen and sulfur, especially one nitrogen atom and at least one further heteroatom selected from nitrogen, substituted nitrogen, oxygen and sulfur, $R^1$, $R^2$, $R^3$, $R^4$, $R^5$ and $R^6$ are independently of each other hydrogen, halogen, or an organic substituent, or two substituents $R^1$ and $R^2$, $R^4$ and $R^6$, $R^2$ and $R^3$, $R^5$ and $R^3$ and/or $R^5$ and $R^6$, which are adjacent to each other, together form an aromatic, or heteroaromatic ring, or ring system, which can optionally be substituted, $R^7$ is an organic substituent, wherein two or more substituents $R^7$ in the same molecule may have different meanings, or can form together an aromatic, or heteroaromatic ring, or ring system, and x is 0, or an integer of 1 to 5;

$X^{11}$ is independently in each occurrence a halogen atom, or —OS(O)$_2$CF$_3$, —OS(O)$_2$-aryl, especially

—OS(O)₂CH₃, —B(OH)₂, —B(OY¹)₂,

—BF₄Na, or —BF₄K, wherein Y¹ is independently in each occurrence a C₁-C₁₀alkyl group and Y² is independently in each occurrence a C₂-C₁₀alkylene group, such as —CY³Y⁴—CY⁵Y⁶—, or —CY⁷Y⁸—CY⁹, Y¹⁰—CY¹¹Y¹²—, wherein Y³, Y⁴, Y⁵, Y⁶, Y⁷, Y⁸, Y⁹, Y¹⁰, Y¹¹ and Y¹² are independently of each other hydrogen, or a C₁-C₁₀alkyl group, especially —C(CH₃)₂C(CH₃)₂—, or —C(CH₃)₂CH₂C(CH₃)₂—, wherein nitrogen atom as heteroatom comprises a group =N—, or —NR¹⁰, wherein R¹⁰ is as defined in claim 2, with the proviso that are excluded.

Preference is given to monomers of formula (XIV)

(XV) and/or (XVI) especially (XVIa) and/or

-continued

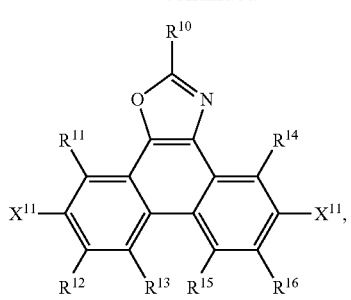
(XVIb)

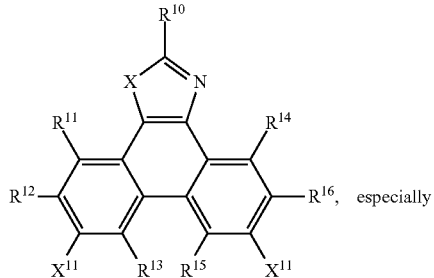
(XIX) especially

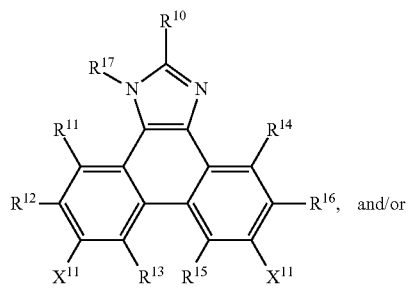
(XXa) and/or

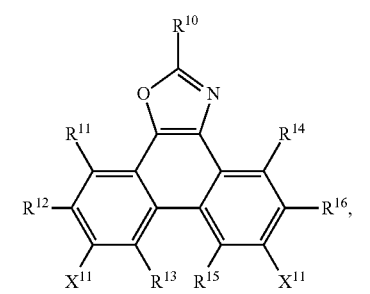
(XXb)

wherein $X^{11}$ is independently in each occurrence a halogen, especially Br, or I, especially Br, or —OS(O)$_2$CF$_3$, —B(OH)$_2$, —B(OY$^1$)$_2$ or

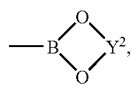

wherein Y$^1$ is independently in each occurrence a C$_1$-C$_{10}$alkyl group and Y$^2$ is independently in each occurrence a C$_2$-C$_{10}$alkylene group, such as —CY$^3$Y$^4$—CY$^5$Y$^6$, or —CY$^7$Y$^8$—CY$^9$Y$^{10}$CY$^{11}$Y$^{12}$—, wherein Y$^3$, Y$^4$, Y$^5$, Y$^6$, X$^7$, Y$^8$, X$^9$, Y$^{10}$, Y$^{11}$ and Y$^{12}$ are independently of each other hydrogen, or a C$_1$-C$_{10}$alkyl group, especially —C(CH$_3$)$_2$C(CH$_3$)$_2$—, or —C(CH$_3$)$_2$CH$_2$C(CH$_3$)$_2$—.

Monomers are preferred, wherein at least one of the substituents R$^8$ and/or R$^9$ and R$^{10}$ are different from a hydrogen atom and are in particular a solubilizing substituent which is especially selected from C$_6$-C$_{18}$aryl, which can be substituted by G, C$_2$-C$_{18}$heteroaryl, which can be substituted by G, C$_1$-C$_{18}$alkyl, C$_1$-C$_{18}$alkyl which is interrupted by D, C$_1$-C$_{18}$perfluoroalkyl, C$_1$-C$_{18}$alkoxy, or C$_1$-C$_{18}$alkoxy which is substituted by E and/or interrupted by D.

R$^{17}$ is preferably different from a hydrogen atom and is very especially C$_1$-C$_{18}$alkyl, or C$_1$-C$_{18}$alkyl which is interrupted by D.

In particular R$^8$ and/or R$^9$ and R$^{10}$ are a solubilizing substituent and are in particular selected from C$_6$-C$_{18}$aryl, which can be substituted by G, C$_2$-C$_{18}$heteroaryl, which can be substituted by G, C$_1$-C$_{18}$alkyl, C$_1$-C$_{18}$alkyl which is interrupted by D, C$_1$-C$_{18}$perfluoroalkyl, C$_1$-C$_{18}$alkoxy, or C$_1$-C$_{18}$alkoxy which is substituted by E and/or interrupted by D.

The following monomers are especially preferred:

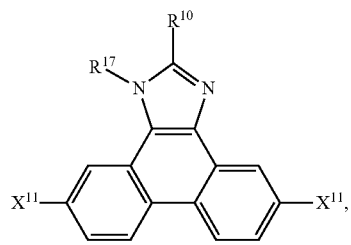

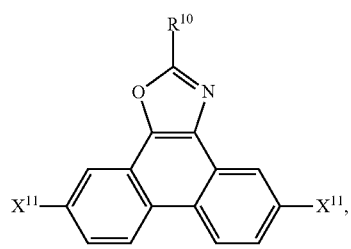

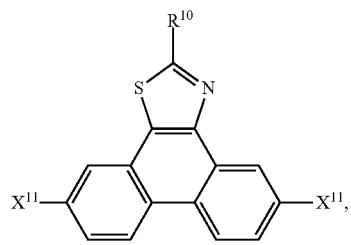

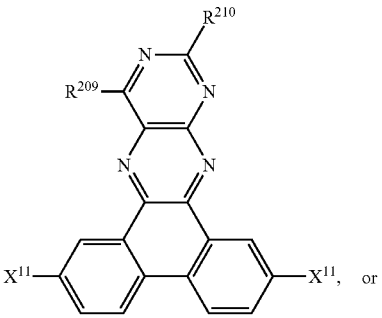 or

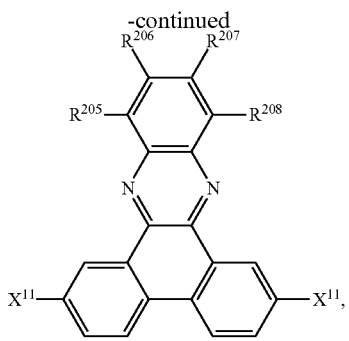

wherein

X$^{11}$ is independently in each occurrence Br, I, —B(OH)$_2$, —B(OY$^1$)$_2$ or

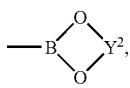

wherein Y$^1$ and Y$^2$ are as defined above;

R$^{10}$ is a group of formula

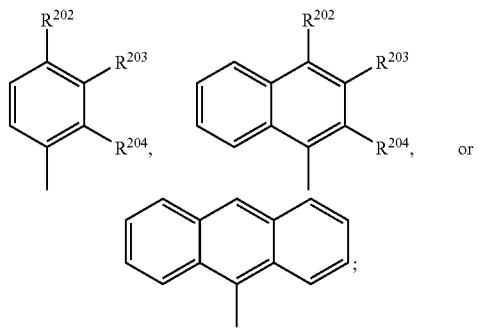

wherein

R$^{202}$, R$^{203}$, R$^{204}$, R$^{205}$, R$^{206}$, R$^{207}$, R$^{208}$, R$^{209}$ and R$^{210}$ are independently of each other H, or C$_1$-C$_{18}$alkoxy;

R$^{17}$ is phenyl, which is substituted by C$_1$-C$_{18}$alkyl, C$_1$-C$_{18}$perfluoroalkyl, or C$_1$-C$_{18}$alkoxy; or C$_1$-C$_{18}$alkyl;

R$^{10}$ is preferably a group of formula

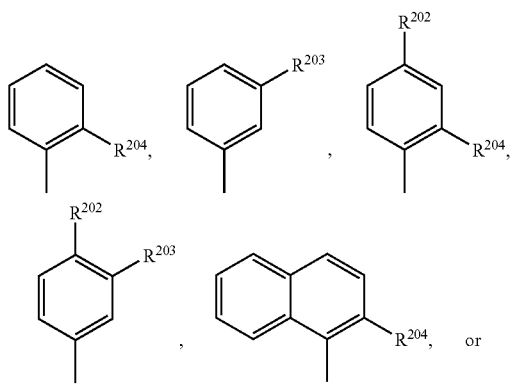

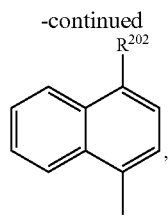

wherein R$^{202}$, R$^{203}$ and R$^{204}$ are independently of each other C$_4$-C$_{18}$alkoxy.

R$^{209}$ and R$^{210}$ are preferably C$_4$-C$_{18}$alkoxy. Preferably at least one of R$^{205}$, R$^{206}$, R$^{207}$ and R$^{208}$ is C$_4$-C$_{18}$alkoxy. Polymers derived from such monomers are especially preferred.

Halogen is fluorine, chlorine, bromine and iodine.

C$_1$-C$_{25}$alkyl is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. C$_1$-C$_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl. C$_1$-C$_4$alkyl is typically methyl, ethyl, n-propyl, isopropyl, n-butyl, sec.-butyl, isobutyl, tert.-butyl.

C$_1$-C$_{25}$alkoxy groups are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of C$_1$-C$_8$alkoxy are methoxy, ethoxy, n-propoxy, isopropoxy, n-butoxy, sec.-butoxy, isobutoxy, tert.-butoxy, n-pentyloxy, 2-pentyloxy, 3-pentyloxy, 2,2-dimethylpropoxy, n-hexyloxy, n-heptyloxy, n-octyloxy, 1,1,3,3-tetramethylbutoxy and 2-ethylhexyloxy, preferably C$_1$-C$_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

C$_2$-C$_{25}$alkenyl groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

C$_{2-24}$alkynyl is straight-chain or branched and preferably C$_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

C$_1$-C$_{18}$perfluoroalkyl, especially C$_1$-C$_4$perfluoroalkyl, is a branched or unbranched radical such as for example —CF$_3$, —CF$_2$CF$_3$, —CF$_2$CF$_2$CF$_3$, —CF(CF$_3$)$_2$, —(CF$_2$)$_3$CF$_3$, and —C(CF$_3$)$_3$.

The terms "haloalkyl, haloalkenyl and haloalkynyl" mean groups given by partially or wholly substituting the above-mentioned alkyl group, alkenyl group and alkynyl group with halogen, such as trifluoromethyl etc. The "aldehyde group, ketone group, ester group, carbamoyl group and amino group" include those substituted by an alkyl group, a cycloalkyl group, an aryl group, an aralkyl group or a heterocyclic group, wherein the alkyl group, the cycloalkyl group, the aryl group, the aralkyl group and the heterocyclic group may be unsubstituted or substituted. The term "silyl group" means a group of formula —$SiR^{62}R^{63}R^{64}$, wherein $R^{62}$, $R^{63}$ and $R^{64}$ are independently of each other a $C_1$-$C_8$alkyl group, in particular a $C_1$-$C_4$ alkyl group, a $C_6$-$C_{24}$aryl group or a $C_7$-$C_{12}$aralkylgroup, such as a trimethylsilyl group. The term "siloxanyl group" means a group of formula —O—$SiR^{62}R^{63}R^{64}$, wherein $R^{62}$, $R^{63}$ and $R^{64}$ are as defined above, such as a trimethylsiloxanyl group.

The term "cycloalkyl group" is typically $C_5$-$C_{12}$cycloalkyl, such as cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The term "cycloalkenyl group" means an unsaturated alicyclic hydrocarbon group containing one or more double bonds, such as cyclopentenyl, cyclopentadienyl, cyclohexenyl and the like, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

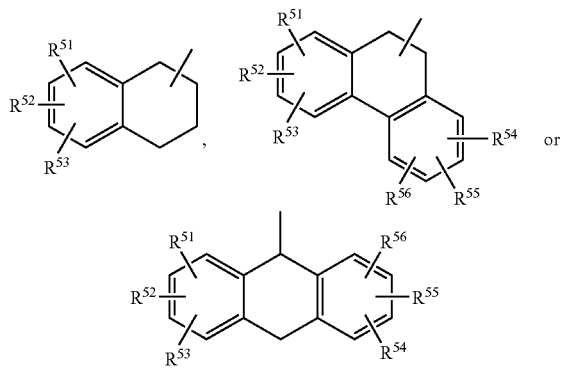

in particular

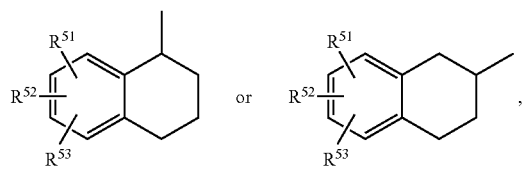

wherein $R^{51}$, $R^{52}$, $R^{53}$, $R^{54}$, $R^{55}$ and $R^{56}$ are independently of each other $C_1$-$C_8$-alkyl, $C_1$-$C_8$-alkoxy, halogen and cyano, in particular hydrogen.

Aryl is usually $C_6$-$C_{30}$aryl, preferably $C_6$-$C_{24}$aryl, which optionally can be substituted, such as, for example, phenyl, 4-methylphenyl, 4-methoxyphenyl, naphthyl, especially 1-naphthyl, or 2-naphthyl, biphenylyl, terphenylyl, pyrenyl, 2- or 9-fluorenyl, phenanthryl, anthryl, tetracyl, pentacyl, hexacyl, or quaderphenylyl, which may be unsubstituted or substituted.

The term "aralkyl group" is typically $C_7$-$C_{24}$aralkyl, such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ωphenyl-eicosyl or ωphenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ωdimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted.

The term "aryl ether group" is typically a $C_{6-24}$aryloxy group, that is to say O—$C_{6-24}$aryl, such as, for example, phenoxy or 4-methoxyphenyl. The term "aryl thioether group" is typically a $C_{6-24}$arylthio group, that is to say S—$C_{6-24}$aryl, such as, for example, phenylthio or 4-methoxyphenylthio. The term "carbamoyl group" is typically a $C_{1-18}$carbamoyl radical, preferably $C_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

The terms "aryl" and "alkyl" in alkylamino groups, dialkylamino groups, alkylarylamino groups, arylamino groups and diarylgroups are typically $C_1$-$C_{25}$alkyl and $C_6$-$C_{24}$aryl, respectively.

Alkylaryl refers to alkyl-substituted aryl radicals, especially $C_7$-$C_{12}$alkylaryl. Examples are tolyl, such as 3-methyl-, or 4-methylphenyl, or xylyl, such as 3,4-dimethylphenyl, or 3,5-dimethylphenyl.

Heteroaryl is typically $C_2$-$C_{26}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Examples of a five or six membered ring formed by, for example, $R^{16}$ and $R^{17}$, or $R^{65}$ and $R^{66}$, respectively are heterocycloalkanes or heterocycloalkenes having from 3 to 5 carbon atoms which can have one additional hetero atom selected from nitrogen, oxygen and sulfur, for example

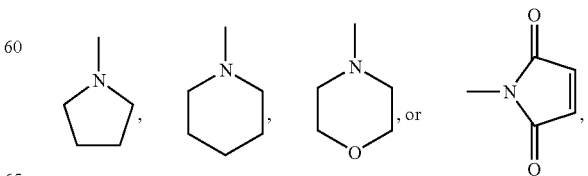

which can be part of a bicyclic system, for example

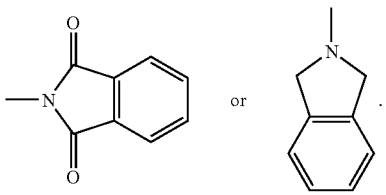

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group or a silyl group.

If a substituent, such as, for example $R^7$ occurs more than one time in a group, it can be different in each occurrence.

The wording "substituted by G" means that one, or more, especially one to three substituents G might be present.

As described above, the aforementioned groups may be substituted by E and/or, if desired, interrupted by D. Interruptions are of course possible only in the case of groups containing at least 2 carbon atoms connected to one another by single bonds; $C_6$-$C_{18}$aryl is not interrupted; interrupted arylalkyl or alkylaryl contains the unit D in the alkyl moiety. $C_1$-$C_{18}$alkyl substituted by one or more E and/or interrupted by one or more units D is, for example, $(CH_2CH_2O)_{1\text{-}9}$-$R^x$, where $R^x$ is H or $C_1$-$C_{10}$alkyl or $C_2$-$C_{10}$alkanoyl (e.g. CO—CH($C_2H_5$)$C_4H_9$), $CH_2$—CH(OR$^{y\prime\prime}$)—$CH_2$—O—R$^y$, where $R^y$ is $C_1$-$C_{18}$alkyl, $C_5$-$C_{12}$cycloalkyl, phenyl, $C_7$-$C_{15}$-phenylalkyl, and $R^{y\prime\prime}$ embraces the same definitions as $R^y$ or is H;

$C_1$-$C_8$alkylene-COO—$R^z$, e.g. $CH_2COOR_z$, $CH(CH_3)CO$-$OR^z$, $C(CH_3)_2COOR^z$, where $R^z$ is H, $C_1$-$C_{18}$alkyl, $(CH_2CH_2O)_{1\text{-}9}$—$R^x$, and $R^x$ embraces the definitions indicated above; $CH_2CH_2$—O—CO—CH=$CH_2$; $CH_2CH$(OH)$CH_2$—O—CO—C($CH_3$)=$CH_2$.

Preferred arylene radicals are 1,4-phenylene, 2,5-tolylene, 1,4-naphthylene, 1,9 antracylene, 2,7-phenantrylene and 2,7-dihydrophenantrylene.

Preferred heteroarylene radicals are 2,5-pyrazinylene, 3,6-pyridazinylene, 2,5-pyridinylene, 2,5-pyrimidinylene, 1,3,4-thiadiazol-2,5-ylene, 1,3-thiazol-2,4-ylene, 1,3-thiazol-2,5-ylene, 2,4-thiophenylene, 2,5-thiophenylene, 1,3-oxazol-2,4-ylene, 1,3-oxazol-2,5-ylene and 1,3,4-oxadiazol-2,5-ylene, 2,5-indenylene and 2,6-indenylene.

Another aspect of the invention is the films formed from the polymers of the invention. Such films can be used in polymeric light-emitting diodes (PLEDs). Preferably, such films are used as emitting layers. These films may also be used as protective coatings for electronic devices and as fluorescent coatings. The thickness of the coating or film is dependent upon the ultimate use. Generally, such thickness can be from 0.01 to 200 microns. In that embodiment wherein the coating is used as a fluorescent coating, the coating or film thickness is from 10 to 200 microns. In that embodiment where the coatings are used as electronic protective layers, the thickness of the coating can be from 5 to 20 microns. In that embodiment where the coatings are used in a polymeric light-emitting diode, the thickness of the layer formed is 0.01 to 0.5 microns. The polymers of the invention form good pinhole- and defect-free films. Such films can be prepared by means well known in the art including spin-coating, spray-coating, dip-coating and roller-coating. Such coatings are prepared by a process comprising applying a composition to a substrate and exposing the applied composition to conditions such that a film is formed. The conditions which form a film depend upon the application technique. Preferably, the solution contains from 0.1 to 10 weight percent of the polymers. This composition is applied to the appropriate substrate by the desired method and the solvent is allowed to evaporate. Residual solvent may be removed by vacuum and/or by heat-drying. The films are preferably substantially uniform in thickness and substantially free of pinholes. In another embodiment, the polymers may be partially cured. This is known as B-staging.

A further embodiment of the present invention is directed to an electronic device or a component therefore, comprising a substrate and a polymer according to the present invention.

In such a device the polymers according to the present invention are used as electroluminescent material. For the purposes of the present invention, the term "electroluminescent material" is taken to mean materials which can be used as or in an active layer in an electroluminescent device. The term "active layer" means that the layer is capable of emitting light (light-emitting layer) on application of an electric field and/or that it improves the injection and/or transport of the positive and/or negative charges (charge injection or charge transport layer). The invention therefore also relates to the use of the polymers according to the invention as electroluminescent material. The invention furthermore relates to an electroluminescent material which comprises the polymers according to the invention. Electroluminescent devices are used, for example, as self-illuminating display elements, such as control lamps, alphanumeric displays, signs and in opto-electronic couplers.

A device according to the present invention may be prepared in accordance with the disclosure of WO99/48160, the contents of which are incorporated by reference. Polymers according to the present invention may be present in the device as the sole light emitting polymer or as a component in a blend further comprising hole and/or electron transporting polymers. Alternatively, the device may comprise distinct layers of a polymer of the present invention, a hole transporting polymer and/or an electron transporting polymer.

In one embodiment the electronic device comprises an electroluminescent device, which comprises (a) a charge injecting layer for injecting positive charge carriers, (b) a charge injecting layer for injecting negative charge carriers, (c) a light-emissive layer located between the layers (a) and (b) comprising a polymer according to the present invention.

The layer (a) may be a positive charge carrier transport layer which is located between the light emissive layer (c) and an anode electrode layer, or may be an anode electrode layer. The layer (b) may be a negative charge carrier transport layer which is located between the light emissive layer (c) and an cathode electrode layer, or may be an cathode electrode layer. Optionally, an organic charge transport layer can be located between the light emissive layer (c) and one of the charge carrier injecting layers (a) and (b).

The EL device emits light in the visible electro-magnetic spectrum between 400 nm and 780 nm, preferably between 430 nm and 470 nm for a blue color, preferably between 520 nm and 560 nm for a green color, preferably between 600 nm and 650 nm for a red color. By incorporating specific repeating units in the backbone of the polymer the emission can be even shifted to the near infrared (NIR, >780 nm).

It will be appreciated that the light emissive layer may be formed from a blend or mixture of materials including one or more polymers according to the present invention, and optionally further different polymers. The further different polymers may be so-called hole transport polymers (i.e. to improve the efficiency of hole transport to the light-emissive material) or electron-transport polymers (i.e. to improve the efficiency of electron transport to the light-emissive material). Preferably, the blend or mixture would comprise at least 0.1% by weight of a polymer according to the present invention, preferably from 0.2 to 50%, more preferably from 0.5 to 30% by weight.

An organic EL device typically consists of an organic film sandwiched between an anode and a cathode such that when a positive bias is applied to the device, holes are injected into the organic film from the anode, and electrons are injected into the organic film from the cathode. The combination of a hole and an electron may give rise to an exciton, which may undergo radiative decay to the ground state by liberating a photon. In practice the anode is commonly an mixed oxide of tin and indium for its conductivity and transparency. The mixed oxide (ITO) is deposited on a transparent substrate such as glass or plastic so that the light emitted by the organic film may be observed. The organic film may be the composite of several individual layers each designed for a distinct function. Since holes are injected from the anode, the layer next to the anode needs to have the functionality of transporting holes. Similarly, the layer next to the cathode needs to have the functionality of transporting electrons. In many instances, the hole-(electron) transporting layer also acts as the emitting layer. In some instances one layer can perform the combined functions of hole and electron transport and light emission. The individual layers of the organic film may be all polymeric in nature or combinations of films of polymers and films of small molecules deposited by thermal evaporation. It is preferred that the total thickness of the organic film be less than 1000 nanometers (nm). It is more preferred that the total thickness be less than 500 nm. It is most preferred that the total thickness be less than 300 nm. It is preferred that the thickness of the active (light emitting) layer be less than 400 nanometers (nm). It is more preferred that the thickness is in the range of from 40 to 160 nm.

The ITO-glass, which serves as the substrate and the anode, may be used for coating after the usual cleaning with detergent, organic solvents and UV-ozone treatment. It may also be first coated with a thin layer of a conducting substance to facilitate hole injection. Such substances include copper phthalocyanine, polyaniline (PANI) and poly(3,4-ethylenedioxy-thiophene) (PEDOT); the last two in their (doped) conductive forms, doped, for example, with $FeCl_3$ or $Na_2S_2O_8$. They contain poly(styrenesulfonic acid) (PSS) as counter-ion to ensure water solubility. It is preferred that the thickness of this layer be 200 nm or less; it is more preferred that the thickness be 100 nm or less.

In the cases where a hole-transporting layer is used, the polymeric arylamines described in U.S. Pat. No. 5,728,801, may be used. Other known hole-conducting polymers, such as polyvinylcarbazole, may also be used. The resistance of this layer to erosion by the solution of the copolymer film which is to be applied next is obviously critical to the successful fabrication of multi-layer devices. The thickness of this layer may be 500 nm or less, preferably 300 nm or less, most preferably 150 nm or less.

In the case where an electron-transporting layer is used, it may be applied either by thermal evaporation of low molecular weight materials or by solution coating of a polymer with a solvent that would not cause significant damage to the underlying film.

Examples of low molecular weight materials include the metal complexes of 8-hydroxyquinoline (as described by Burrows et al. in Appl. Phys. Lett. 64 (1994) 2718-2720), metallic complexes of 10-hydroxybenzoquinoline (as described by Hamada et al. in Chem. Lett. (1993) 906-906), 1,3,4-oxadiazoles (as described by Hamada et al. in Optoelectronics-Devices and Technologies 7 (1992) 83-93), 1,3,4-triazoles (as described by Kido et al. in Chem. Lett. (1996) 47-48), and dicarboximides of perylene (as described by Yoshida et al. in Appl. Phys. Lett. 69 (1996) 734-736).

Polymeric electron-transporting materials are exemplified by 1,3,4-oxadiazole-containing polymers (as described by Li et al. in J. Chem. Soc. (1995) 2211-2212, by Yang and Pei in J. Appl. Phys. 77 (1995) 4807-4809), 1,3,4-triazole-containing polymers (as described by Strukelj et al. in Science 267 (1995) 1969-1972), quinoxaline-containing polymers (as described by Yamamoto et al. in Jpn. J. Appl. Phys. 33 (1994) L250-L253, O'Brien et al. in Synth. Met. 76 (1996) 105-108), and cyano-PPV (as described by Weaver et al. in Thin Solid Films 273 (1996) 39-47). The thickness of this layer may be 500 nm or less, preferably 300 nm or less, most preferably 150 nm or less.

The cathode material may be deposited either by thermal evaporation or by sputtering. The thickness of the cathode may be from 1 nm to 10,000 nm, preferably 5 nm to 500 nm.

OLEDs made according to the present invention may include phosphorescent dopants dispersed in the device's emissive layer, capable of achieving internal quantum efficiencies approaching 100%. As used herein, the term "phosphorescence refers to emission from a triplet excited state of an organic or metal-organic molecule. High efficiency organic light emitting devices using phosphorescent dopants have been demonstrated using several different conducting host materials (M. A. Baldo et al., Nature, Vol 395, 151 (1998), C. Adachi et al., Appl. Phys. Lett., Vol. 77, 904 (2000)).

In a preferred embodiment, the electroluminescent device comprises at least one hole-transporting polymer film and a light-emitting polymer film comprised of the polymer of the invention, arranged between an anode material and a cathode material such that under an applied voltage, holes are injected from the anode material into the hole-transporting polymer film and electrons are injected from the cathode material into the light-emitting polymer films when the device is forward biased, resulting in light emission from the light-emitting layer.

In another preferred embodiment, layers of hole-transporting polymers are arranged so that the layer closest to the anode has the lower oxidation potential, with the adjacent layers having progressively higher oxidation potentials. By these methods, electroluminescent devices having relatively high light output per unit voltage may be prepared.

The term "hole-transporting polymer film" as used herein refers to a layer of a film of a polymer which when disposed between two electrodes to which a field is applied and holes are injected from the anode, permits adequate transport of holes into the emitting polymer. Hole-transporting polymers typically are comprised of triarylamine moieties. The term "light-emitting polymer film" as used herein refers to a layer of a film of a polymer whose excited states can relax to the ground state by emitting photons, preferably corresponding to wavelengths in the visible range. The term "anode material" as used herein refers to a semi-transparent, or transparent, conducting film with a work function between 4.5 electron volts (eV) and 5.5 eV. Examples are gold, silver, copper, aluminum, indium, iron, zinc, tin, chromium, titanium, vanadium, cobalt, nickel, lead, manganese, tungsten and the like, metallic alloys such as magnesium/copper, magnesium/silver, magnesium/aluminum, aluminum/indium and the like, semiconductors such as Si, Ge, GaAs and the like, metallic oxides such as indium-tin-oxide ("ITO"), ZnO and the like, metallic compounds such as CuI and the like, and furthermore, electroconducting polymers such as polyacetylene, polyaniline, polythiophene, polypyrrole, polyparaphenylene and the like. Oxides and mixed oxides of indium and tin, and gold are preferred. Most preferred is ITO, especially ITO on glass, or on a plastics material, such as polyester, for example polyethylene terephthalate (PET), as substrate.

The term "cathode material" as used herein refers to a conducting film with a work function between 2.0 eV and 4.5 eV. Examples are alkali metals, earth alkaline metals, group 13 elements, silver, and copper as well as alloys or mixtures thereof such as sodium, lithium, potassium, calcium, lithium fluoride (LiF), sodium-potassium alloy, magnesium, magnesium-silver alloy, magnesium-copper alloy, magnesium-aluminum alloy, magnesium-indium alloy, aluminum, aluminum-aluminum oxide alloy, aluminum-lithium alloy, indium, calcium, and materials exemplified in EP-A 499,011, such as electroconducting polymers e.g. polypyrrole, polythiophene, polyaniline, polyacetylene etc. Preferably lithium, calcium, magnesium, indium, silver, aluminum, or blends and alloys of the above are used. In the case of using a metal or a metallic alloy as a material for an electrode, the electrode can be formed also by the vacuum deposition method. In the case of using a metal or a metallic alloy as a material forming an electrode, the electrode can be formed, furthermore, by the chemical plating method (see for example, Handbook of Electrochemistry, pp 383-387, Mazuren, 1985). In the case of using an electroconducting polymer, an electrode can be made by forming it into a film by means of anodic oxidation polymerization method onto a substrate, which is previously provided with an electroconducting coating.

As methods for forming said thin films, there are, for example, the vacuum deposition method, the spin-coating method, the casting method, the Langmuir-Blodgett ("LB") method, the ink jet printing method and the like. Among these methods, the vacuum deposition method, the spin-coating method, the ink jet printing method and the casting method are particularly preferred in view of ease of operation and cost.

In the case of forming the layers by using the spin-coating method, the casting method and ink jet printing method, the coating can be carried out using a solution prepared by dissolving the composition in a concentration of from 0.0001 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide and mixtures thereof.

The organic EL device of the present invention is seen as a future replacement technology for a flat panel display of an on-wall television set, a flat light-emitting device, such as a wall paper, a light source for a copying machine or a printer, a light source for a liquid crystal display or counter, a display signboard and a signal light and perhaps even to replace incandescent and fluorescent lamps. The polymers and compositions of the present invention can be used in the fields of an organic EL device, a photovoltaic device, an electrophotographic photoreceptor, a photoelectric converter, a solar cell, an image sensor, and the like.

Accordingly, the present invention relates also to PLEDs, organic integrated circuits (O-ICs), organic field effect transistors (OFETs), organic thin film transistors (OTFTs), organic solar cells (O-SCs), thermoelectric devices, or organic laser diodes comprising one or more of the polymers according to the present invention.

The following examples are included for illustrative purposes only and do not limit the scope of the claims. Unless otherwise stated, all parts and percentages are by weight.

Weight-average molecular weight ($M_w$) and polydispersity ($M_w/M_n$=PD) are determined by Gel Permeation Chromatography (GPC) [Apparatus: $GPC_{max}$+TDA 302 from Viscotek (Houston, Tex., USA) yielding the responses form refractive index (RI), low angle light scattering (LALS), right angle light scattering (RALS) and differential viscosity (DP) measurements. Chromatographic conditions: Column: $PL_{gel}$ mixed C (300×7.5 mm, 5 μm particles) covering the molecular weight range from about $1\times10^3$ to about $2.5\times10^6$ Da from Polymer Laboratories (Church Stretton, UK); Mobile phase: tetrahydrofuran containing 5 g/l of sodium trifluoroacetate; Mobile phase flow: either 0.5 or 0.7 ml/min; Solute concentration: about 1-2 mg/ml; Injection volume: 100 μl; Detection: RI, LALS, RALS, DP. Procedure of molecular weight calibration: Relative calibration is done by use of a set of 10 polystyrene calibration standards obtained from Polymer Laboratories (Church Stretton, UK) spanning the molecular weight range from 1'930'000 Da-5'050 Da, i.e., PS 1'930'000, PS 1'460'000, PS 1'075'000, PS 560'000, PS 330'000, PS 96'000, PS 52'000, PS 30'300, PS 10'100, PS 5'050 Da. Absolute calibration is done on the base of the responses of LALS, RALS and DP. As experienced in a large number of investigations this combination provides optimum calculation of molecular weight data. Usually PS 96'000 is used as the molecular weight calibration standard, but in general every other PS standard lying in the molecular weight range to be determined can be chosen for this purpose.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

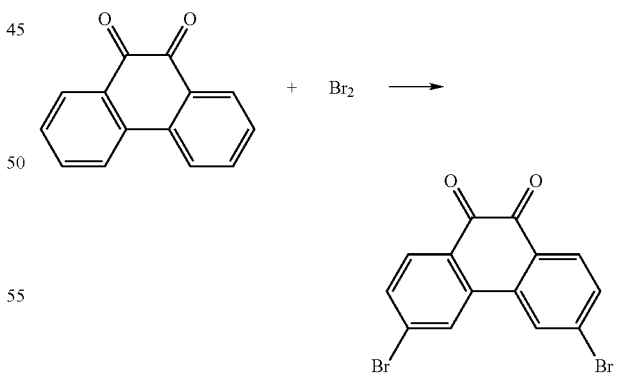

a) 9,10-Phenanthrenequinone is prepared according to *Yuki Gosei Kagaku Kyokaishi* 1957, 15, 84-87.

To 42.2 g (0.203 mol) of 9,10-phenanthrenequinone in 230 ml of nitrobenzene approximately 300 mg of aluminum chloride are added. The reaction mixture is stirred under nitrogen and is heated to 105° C. 84.2 g (0.527 mol) of bromine in 40 ml of nitrobenzene are added over a period of 40 minutes. After three hours the reaction mixture is cooled to 25° C. and the product is filtered off. The product can be further purified by recrystallization from xylene (yield: 46.9 g (63%)).

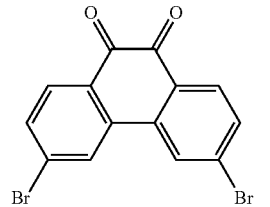

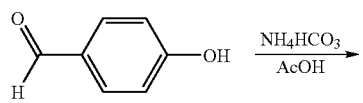

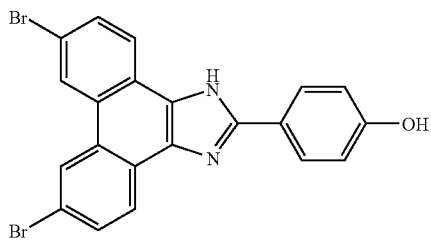

b) To 10 g (27.3 mmol) of 3,6-dibromophenanthrene-9,10-quinone in 250 ml of acetic acid (>99%) are added under nitrogen 5.00 g (41.0 mmol) of 4-hydroxybenzaldehyde and 10.8 g (0.136 mol) of ammonium bicarbonate. The reaction mixture is heated under reflux for 4 h. The reaction mixture is cooled to 25° C. and the product is filtered off. The product is dissolved in THF (tetrahydrofurane) and filtered over Hyflo® (CAS 91053-39-3; Fluka 56678). The solvent is removed under vacuum. The product is heated in 100 ml of acetic acid (>99%) under reflux. The product is filtered off after cooling to 25° C. This procedure is repeated once and the product is washed with ethanol (yield: 8.60 g (67%)).

Example 2

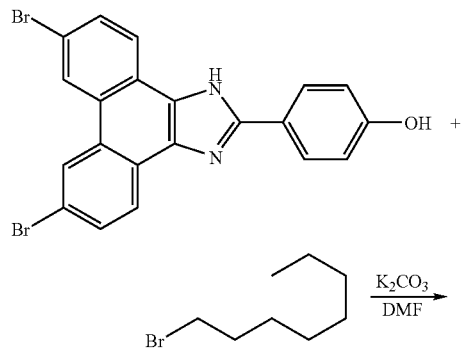

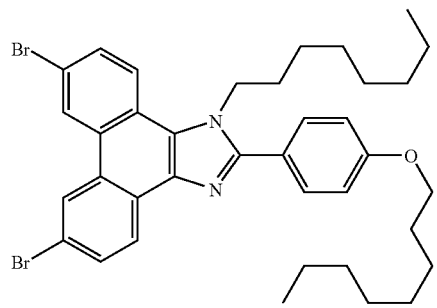

6.00 g (12.8 mmol) of the product from example 1b are dissolved under nitrogen in 70 ml of water free DMF (dimethyl formamide). 7.43 g (38.5 mmol) of 1-bromoctane and 7.97 g (57.7 mmol) of potassium carbonate are added. The reaction mixture is heated for 30 h at 120° C. The reaction mixture is cooled to 25° C. and the inorganic salts are filtered off. The solvent is removed under vacuum. The product is filtered over silica gel first by eluting with hexane and then with THF. The crude product is further purified via column chromatography (SiO$_2$, dichloromethane) followed by recrystallization from diethyl ether giving the title compound (yield: 3.34 g (38%)). Melting Point: 135.5-137° C.

Example 3

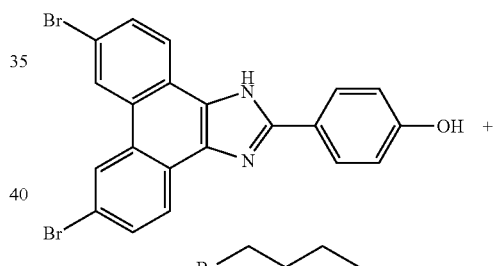

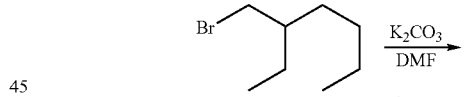

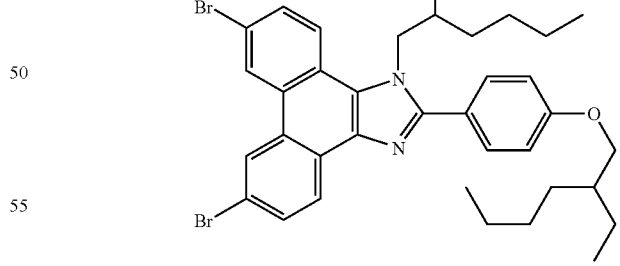

1.00 g (2.14 mmol) of the product from example 1b is dissolved under nitrogen in 20 ml of water free DMF. 1.24 g (6.41 mmol) of 1-bromo-2-ethylhexane and 1.03 g (7.48 mmol) of potassium carbonate are added. The reaction mixture is heated for 17 h at 120° C., then diluted with dichloromethane and washed with water. The solvent is removed under vacuum. The reaction mixture is filtered over silica gel first by eluting with hexane and then with dichloromethane.

The crude product is further purified via column chromatography (SiO$_2$, toluene) giving the title compound (yield: 420 mg (28%)).

Example 4

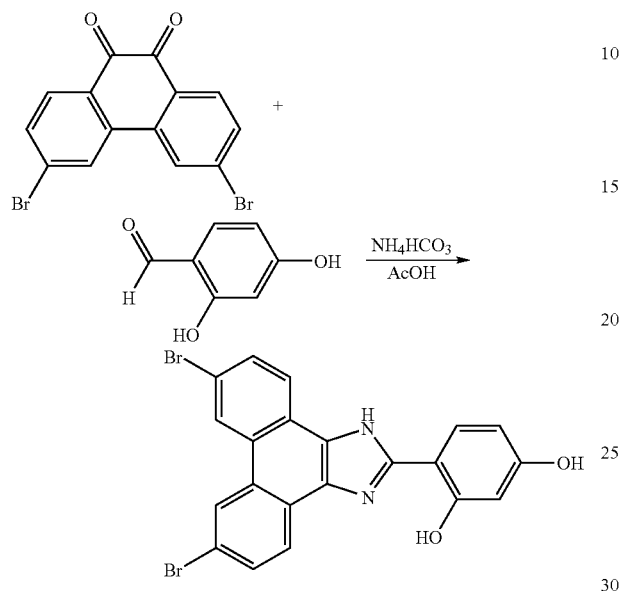

a) To 8.04 g (20.0 mmol) of 3,6-dibromophenanthrene-9,10-quinone in 100 ml acetic acid (>99%) are added under nitrogen 3.59 g (26.0 mmol) of 2,4-dihydroxybenzaldehyde and 7.91 g (0.100 mol) of ammonium bicarbonate. The reaction mixture is first heated under reflux for 4 h, then cooled to 25° C., followed by the addition of water. The product is filtered off and used without further purification for the next step.

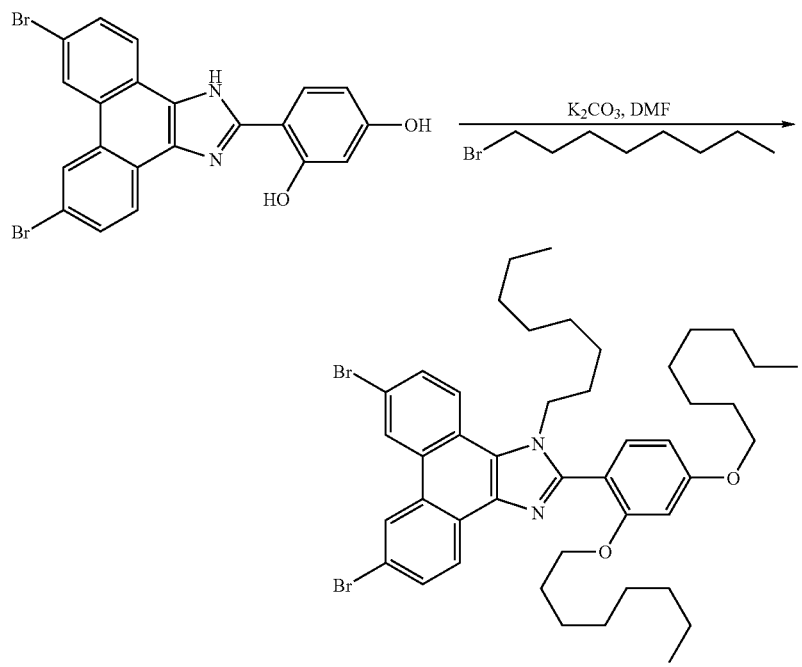

b) 4.84 g (10.0 mmol) of the product from example 4a are dissolved under nitrogen in 50 ml of water free DMF. 6.37 g (33.0 mmol) of 1-bromoctane and 6.22 g (45.0 mmol) of potassium carbonate are added. The reaction mixture is heated for 18 h at 140° C., diluted with diethyl ether and washed with water. The solvent is removed under vacuum. The crude product is further purified via column chromatography (SiO$_2$, toluene) followed by another column chromatography (SiO$_2$, toluene). The resulting solid is recrystallized from n-heptane giving the title compound (yield: 1.2 g (15%)). Melting point: 99.5-101° C.

The following product is formed in small quantities:

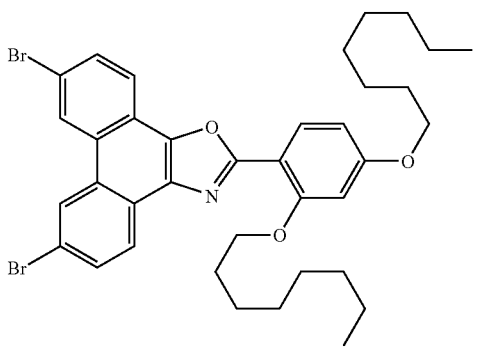 [SMILES: CCCCCCCCOc1ccc(-c2nc3c4ccc(Br)cc4c4cc(Br)ccc4c3o2)c(OCCCCCCCC)c1]

Melting point: 87-88.5° C.

Example 5

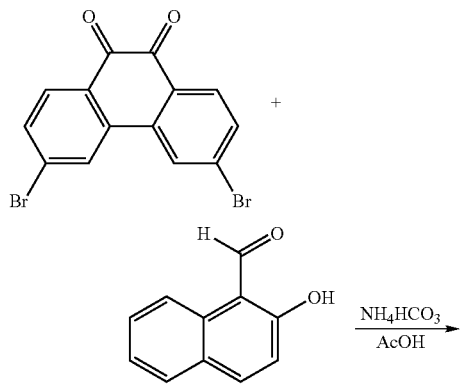

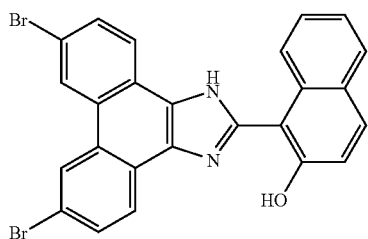

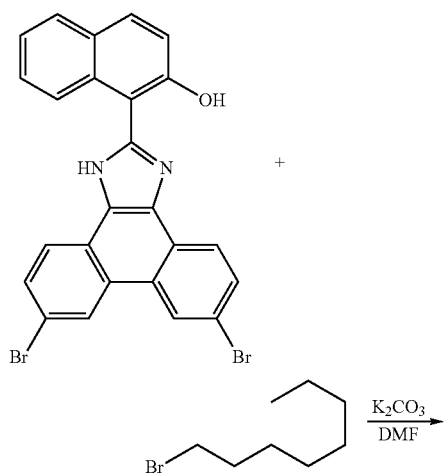

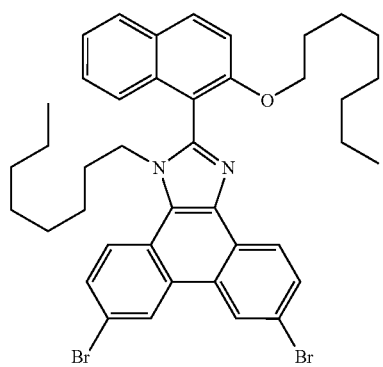

a) To 5.00 g (13.7 mmol) of 3,6-dibromophenanthrene-9,10-quinone in 120 ml of acetic acid (>99%) are added under nitrogen 3.53 g (20.5 mmol) of 2-hydroxy-naphthalene-1-carbaldehyde and 5.40 g (68.3 mmol) of ammonium bicarbonate. The reaction mixture is heated under reflux for 5 h. The reaction mixture is cooled to 25° C. The product is filtered off and washed with acetic acid and ethanol/water 1:5. The product is used without further purification for the next step.

b) 4.50 g (8.68 mmol) of the product from example 5a are dissolved under nitrogen in 100 ml of DMF. 5.03 g (26.1 mmol) of 1-bromooctane and 4.80 g (34.7 mmol) of potassium carbonate are added. The reaction mixture is heated for 26 h at 120° C., diluted with dichloromethane and washed with water. The organic phase is dried with magnesium sulfate and the solvent removed under vacuum. The crude product is purified via column chromatography (SiO$_2$, dichloromethane) and further recrystallized two times from n-hexane (yield: 1.29 g (20%)). Two atropisomers are formed according to NMR analysis. Melting point: 95.5-97.5° C.

The following product is also formed by alkylation of the oxazole obtained in step 5a) as a side-product:

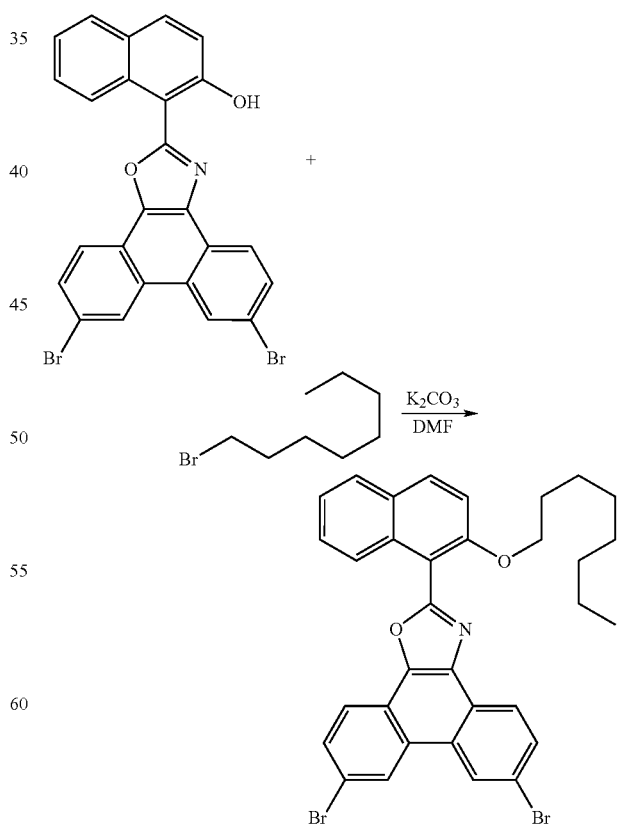

Melting point: 125-126.5° C.

Example 6

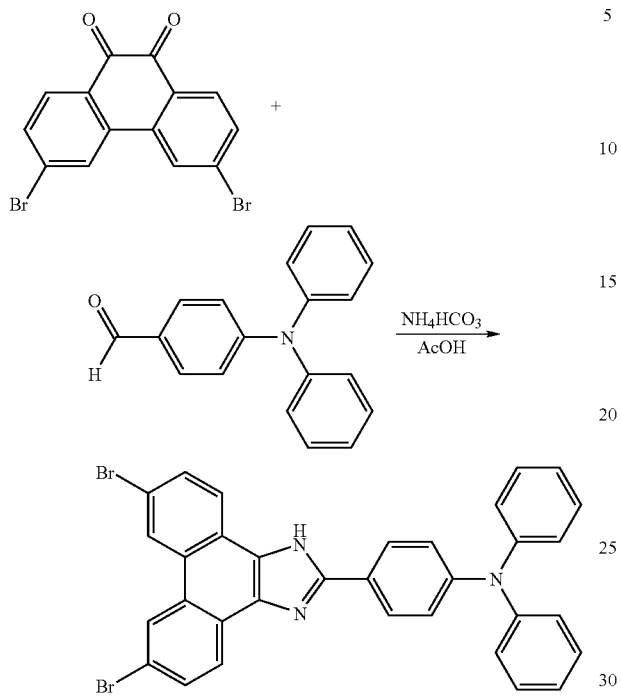

a) To 5.00 g (12.4 mmol) of 3,6-dibromophenanthrene-9,10-quinone in 180 ml of acetic acid (>99%) are added under nitrogen 4.42 g (16.2 mmol) of 4-diphenylamino-benzaldehyde and 4.92 g (62.2 mmol) of ammonium bicarbonate. The reaction mixture is heated under reflux for 3 h and cooled to 25° C. The product is filtered off and washed with acetic acid and ethanol/water 1:5. The product is used without further purification for the next step.

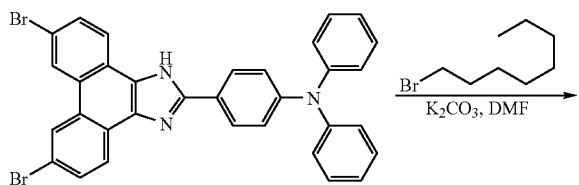

b) The product of example 6a is reacted with 1-bromooctane as described in example 5b, giving the title compound as a yellow powder (yield: 70%). Melting point: 175-176° C.

Example 7

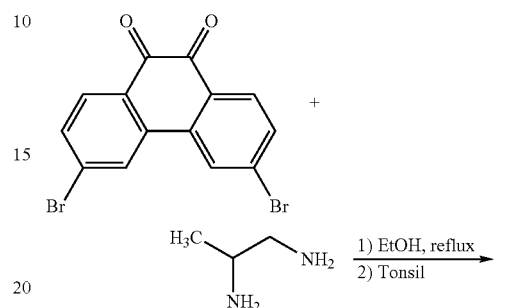

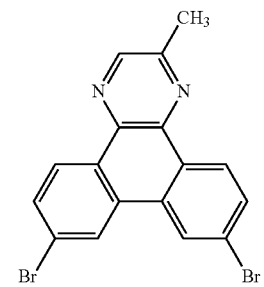

To a suspension of 4.11 g (11.2 mmol) of 3,6-dibromophenanthrene-9,10-quinone in 50 ml of ethanol (99%) are added 1.00 g (13.5 mmol) of 1,2-diaminopropane. The reaction mixture is heated under reflux for 6 h and then cooled to 25° C. The product is filtered off, dissolved in chloroform, followed by the addition of 5 g of Tonsil (montmorillonite, Süd-Chemie, pH 7). The reaction mixture is refluxed for two hours. The Tonsil is filtered off and the solvent is removed under vacuum. The product is heated under reflux in ethyl methyl ketone (MEK) and filtered off after cooling to 25° C. The product is dissolved in 500 ml of THF and 1 l of dichloromethane and filtered over silica gel (yield: 2.11 g (47%)). The title compound is obtained as a white powder. Melting Point: 280-305° C.

Example 8

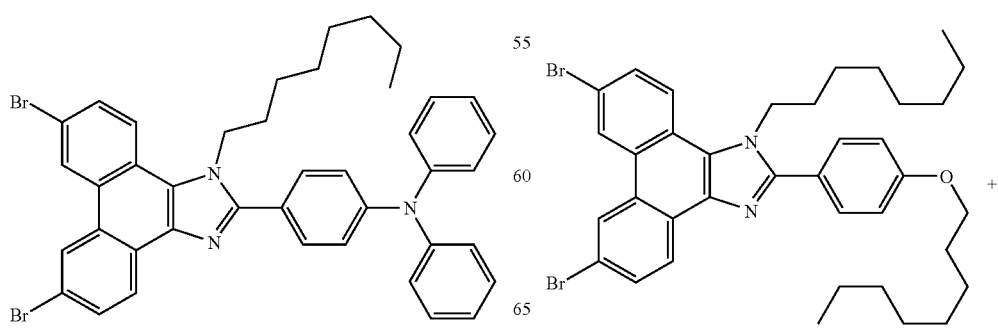

-continued

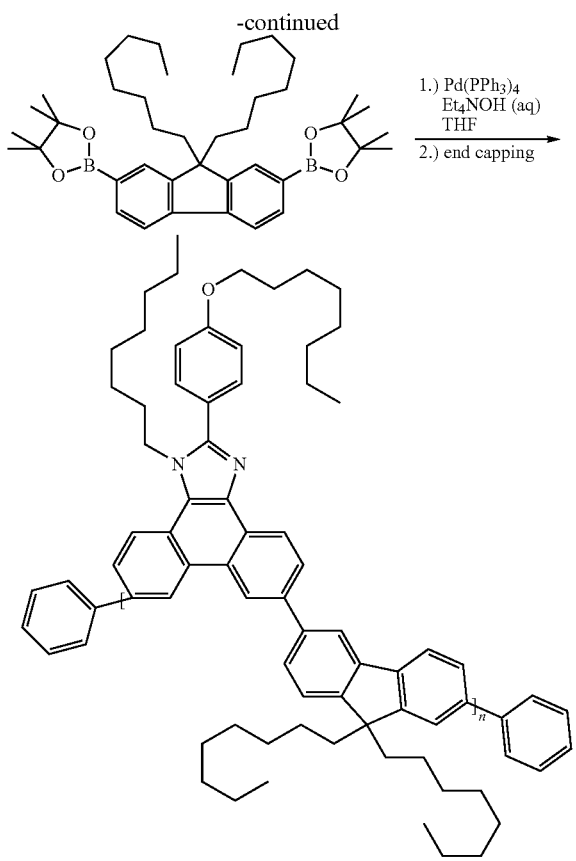

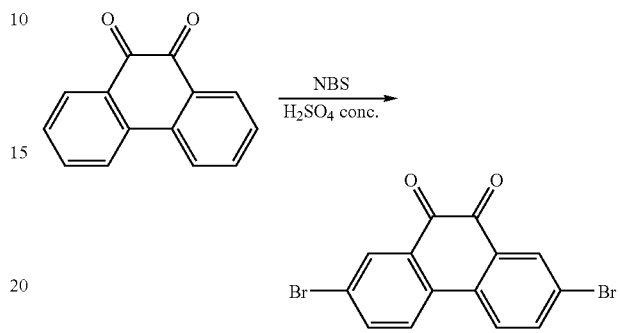

1.0455 g (1.51 mmol) of the dibromide product of example 2 and 1.0000 g (1.56 mmol) of 2,7-bis(4,4,5,5-tetramethyl-1,3,2-dioxaborolan-2-yl)-9,9-dioctylfluorene are dissolved in 20 ml of THF. This solution is degassed with argon. 180 mg of Pd(PPh$_3$)$_4$ are added and the reaction mixture is degassed with argon. 6 ml of a degassed solution of Et$_4$NOH (20% in water) are added. After degassing, the reaction mixture is refluxed for 44 h. 370 mg (2.33 mmol) of degassed bromobenzene are added and the reaction mixture is heated under reflux for two hours. 470 mg (3.89 mmol) of phenylboronic acid are added and the reaction mixture is stirred for two hours. The reaction mixture is diluted with 40 ml of toluene and then poured into 300 ml methanol. GPC (polystyrene standard): M$_w$=20 187 g/mol, polydispersity (PD)=2.24.

The crude polymer is dissolved in 100 ml of toluene and a solution of 25 g of L-cysteine in 250 ml of water are added. This mixture is heated under reflux for two hours. The mixture is cooled to 25° C. and the two phases are separated. The organic phase is refluxed again with a solution of 15 g of L-cysteine and 10 g of Na$_2$SO$_4$ in 250 ml of water. The organic phase is separated and the water phase is washed twice with water. The organic phase is dried with magnesium sulfate and filtered over silica gel with toluene. The solvent is removed until 50 ml are left. This solution is poured in 200 ml of methanol. The polymer is filtered off. GPC (polystyrene standard): M$_w$=21 372, PD=2.07.

1.0% by weight of the product of example 8 is dissolved in toluene. This solution is filtered through a Teflon filter having a pore width of 0.2 μm and is spin coated at 250 rpm on a quartz substrate. The film is characterized by UV-VIS and photoluminescent measurements (Perkin Elmer LS 50 B), showing a λ$_{max}$ at 358 nm in the absorption spectrum of the solid film and an emission maximum at 439 nm (excitation wavelength 368 nm) in the photoluminescent spectrum. The relative thin film quantum efficiency of the film is found to be ca. 40±5%.

Example 9

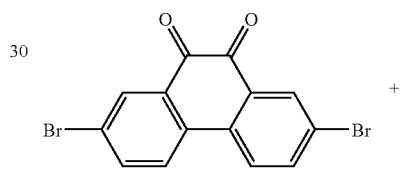

a) 2,7-Dibromophenanthrene-9,10-quinone is synthesized according to example A 1.2.2 of WO 2005/014689 from 9,10-phenanthrenequinone.

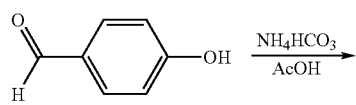

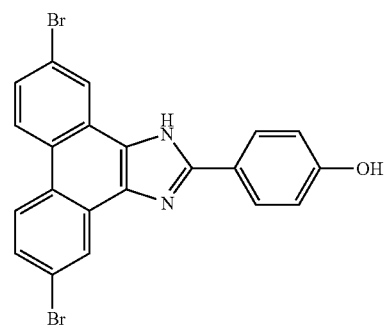

b) To a suspension of 2.00 g (5.46 mmol) of 2,7-dibromophenanthrenequinone in 100 ml of acetic acid are added 1.00 g (8.20 mmol) of 4-hydroxybenzaldehyde and 2.16 g (27.3 mmol) of ammonium bicarbonate. The reaction mixture is heated under reflux for 7 h. The crude product is filtered off, further washed with acetic acid and ethanol giving the title compound (yield: 2.55 g (99.7%)).

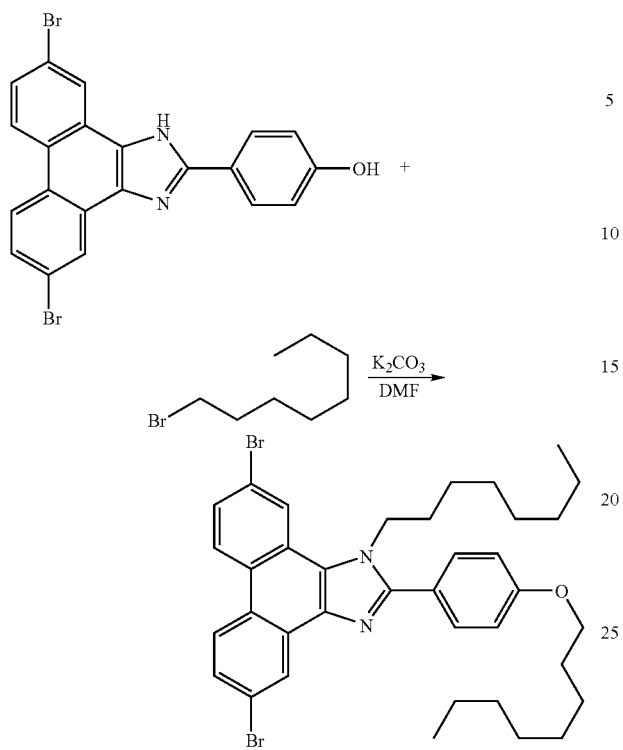

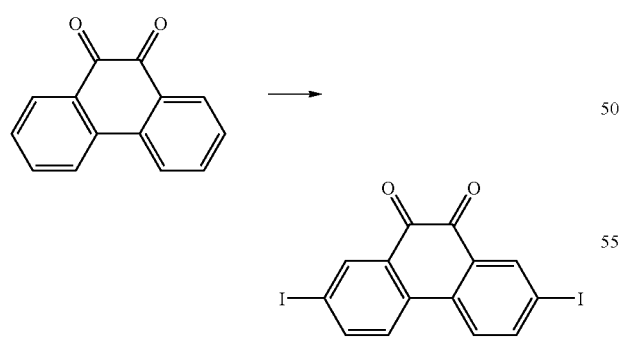

c) To 1.60 g (3.42 mmol) of the product of example 9b in 25 ml of dry DMF are added under nitrogen 2.13 g (15.4 mmol) of potassium carbonate and 2.64 g (13.7 mmol) of 1-bromo-octane. The reaction mixture is stirred for 29 h at 120° C. Diethyl ether and water are added. The organic phase is separated and washed with water. The organic phase is dried with magnesium sulfate. The solvent is removed under vacuum. The product is recrystallized from heptane giving the title compound with HPLC purity >99%. Melting Point: 97-98° C.

Example 10 a) 2,7-Diiodophenanthrene-9,10-quinone is synthesized according to *Bull. Chem. Soc. Jpn.* 1999, 72, 115 from 9,10-phenanthrenequinone. For higher yields an excess of $KMnO_4$, $H_2SO_4$, $Ac_2O$ and AcOH is required. 2,7-Di-iodophenanthrene-9,10-quinone is also prepared according to *Tetrahedron Letters* 2004, 45, 2801 (supporting information), or according to *Tetrahedron* 2004, 60, 9113.

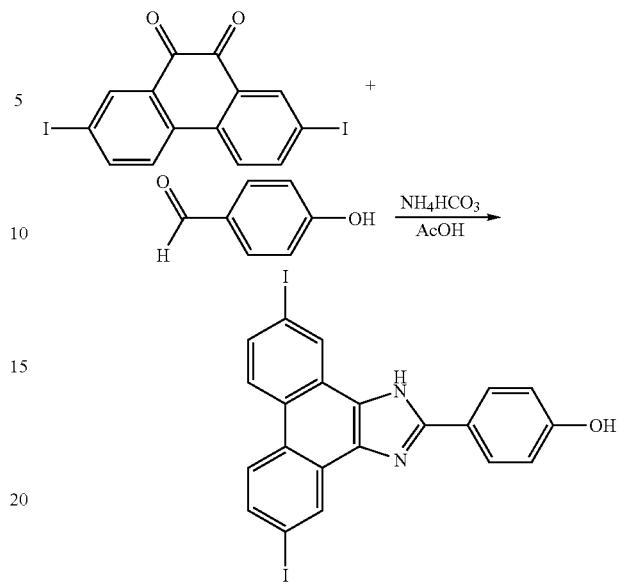

b) To a suspension of 2.00 g (4.35 mmol) of 2,7-di-iodophenanthrene-9,10-quinone in 100 ml acetic acid are added 800 mg (6.52 mmol) of 4-hydroxybenzaldehyde and 1.72 g (21.7 mmol) of ammonium bicarbonate. The reaction mixture is heated under reflux for 7 h. The crude product is filtered off and washed with acetic acid and ethanol giving the title compound (yield: 2.34 g (95.5%)).

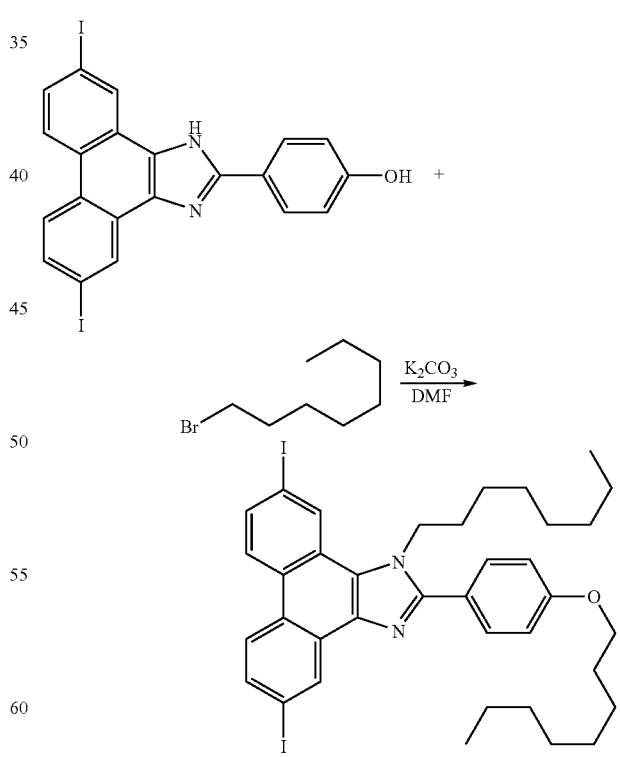

c) To 2.00 g (3.56 mmol) of the product of example 10b in 25 ml of dry DMF, 1.97 g (14.2 mmol) of potassium carbonate and 2.40 g (12.5 mmol) 1-bromooctane are added. The reaction mixture is stirred for 22 h at 120° C. under nitrogen. Dichloromethane is added and the mixture is filtered over silica gel. The silica gel is washed with additional dichloro-methane. The dichloromethane is removed under vacuum and the precipitated product is filtered off. The product is recrystallized two times from cyclohexane giving the title compound (yield: 1.18 g (42%)). Melting point: 121-122.5° C.

Example 11

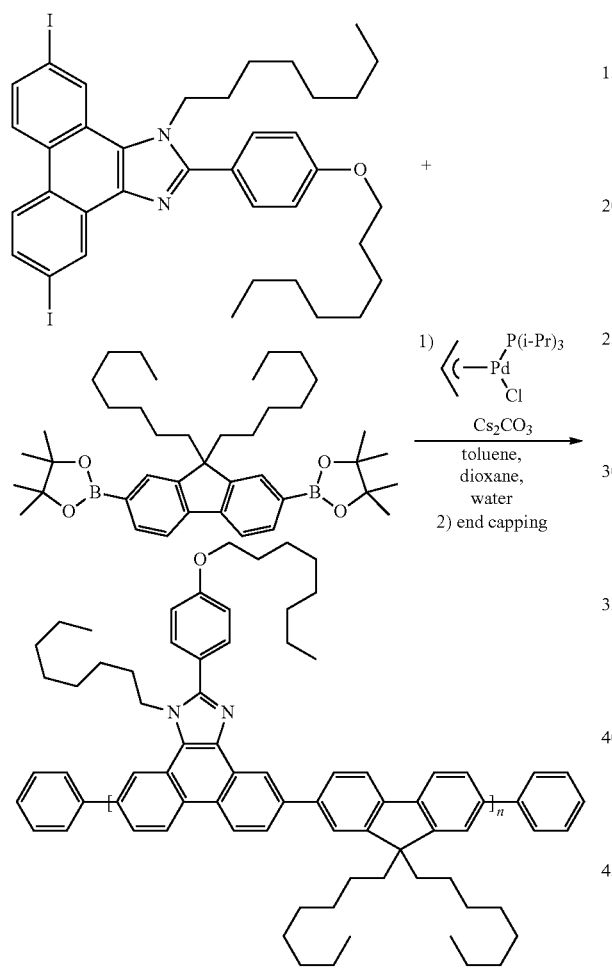

1.1500 g (1.46 mmol) of the diiodide product of example 10c and 0.9395 g (1.46 mmol) of 2,7-bis(4,4,5,5-tetramethyl-1,3,2-dioxaborolan-2-yl)-9,9-dioctylfluorene are dissolved in 15 ml of dioxane and 5 ml of toluene. This solution is degassed with argon. 50 mg of allyl(triiso-propylphosphine) palladium chloride is added and the reaction mixture is degassed again with argon. 2.38 g (7.31 mmol) of cesium carbonate in 5 ml of water are degassed and added to the reaction mixture. After degassing, the reaction mixture is heated under reflux for 18 h. 340 mg (2.19 mmol) of degassed bromobenzene is added and the reaction mixture is refluxed for two hours. A degassed solution of 750 mg (3.66 mmol) of 4,4,5,5-tetramethyl-2-phenyl-1,3,2-dioxaborolane in 5 ml of toluene is added and the reaction mixture is stirred for two hours. The reaction mixture is poured into 300 ml of methanol. GPC (polystyrene standard): $M_w$=24 486 g/mol, PD=3.10.

The polymer is dissolved in 100 ml of toluene and a solution of 25 g of L-cysteine in 250 ml of water is added. This mixture is heated under reflux for 3 h. The organic phase is separated and washed two times with water. A solution of 15 g of L-cysteine and 10 g of sodium thiosulfate in 250 ml of water are added to the organic phase. This mixture is heated under reflux for two hours. The organic phase is separated and washed two times with water. The organic phase is filtered over silica gel and magnesium sulfate with toluene as eluent. The solvent is removed under vacuum until 50 ml are left. This solution is poured into 200 ml of methanol. The polymer is filtered off. GPC (polystyrene standard): $M_w$=27 547 g/mol, polydispersity (PD)=2.84.

1.0% by weight of the product of example 11 is dissolved in toluene. This solution is filtered through a Teflon filter having a pore width of 0.2 μm and is spin coated at 150 rpm on a quartz substrate. The film was characterized by UV-VIS and photoluminescent measurements (Perkin Elmer LS 50 B), showing a $\lambda_{max}$ at 383 nm in the absorption spectrum of the solid film and an emission maximum at 430 nm and a distinct shoulder at 460 nm (excitation wavelength 368 nm) in the photoluminescent spectrum.

A solid state quantum yield of 32% was obtained in the film relative to a polyfluorene homopolymer standard.

Example 12

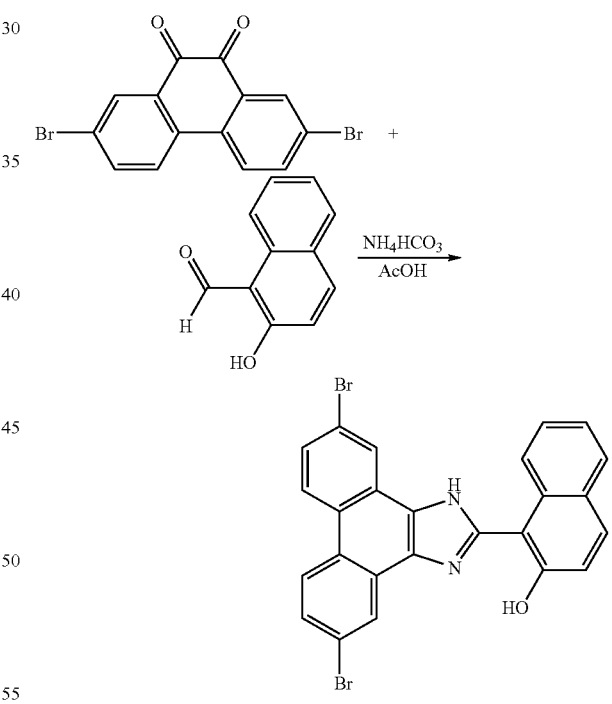

a) To a suspension of 4.02 g (10.0 mmol) of 2,7-dibromophenanthrene-9,10-quinone in 50 ml of acetic acid are added 2.24 g (13.0 mmol) of 2-hydroxy-naphthalene-1-carbaldehyde and 3.95 g (50.0 mmol) of ammonium bicarbonate. The reaction mixture is heated under reflux for 3 h. 220 mg of 2-hydroxy-naphthalene-1-carbaldehyde and 100 mg of ammonium bicarbonate are added. The reaction mixture is heated under reflux for an additional two hours. The product is filtered off, washed with acetic acid and water. The product is soxhlet extracted with ethyl-methyl-ketone (MEK). Most of the oxazole side-product is removed in this way giving the title compound (yield: 4.81 g (93%)). Melting point: 311-314° C. accompanied by decomposition.

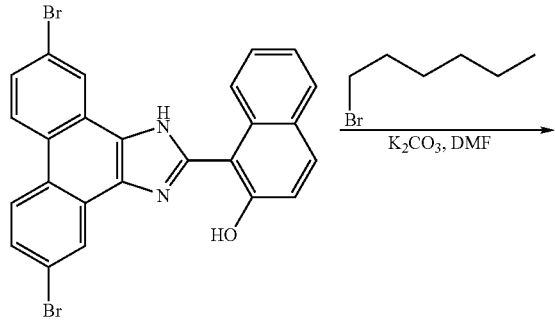

b) To 3.89 g (7.50 mmol) of the product of example 12a in 40 ml of dry DMF are added under nitrogen 3.11 g (22.5 mmol) of potassium carbonate and 3.62 g (18.8 mmol) of 1-bromohexane. The reaction mixture is stirred for 8 h at 130° C. Diethyl ether and water are added. The organic phase is separated and washed with water. The organic phase is dried with magnesium sulfate. The solvent is removed under vacuum. The crude product is purified via column chromatography (SiO$_2$, toluene) and further recrystallized from cyclohexane giving the title compound (yield: 700 mg (14%)). Two atropisomers are formed according to
NMR analysis. Melting point: 122-123° C.

Example 13

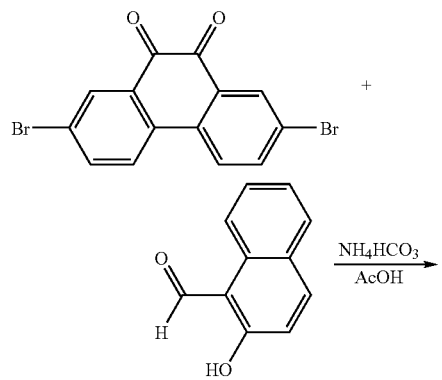

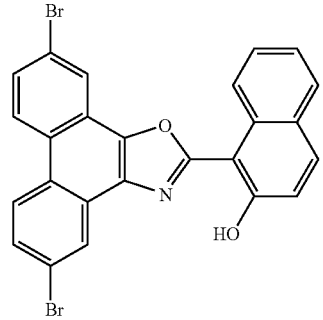

a) To a suspension of 4.02 g (10.0 mmol) of 2,7-dibromophenanthrene-9,10-quinone in 100 ml of acetic acid are added 2.24 g (13.0 mmol) of 2-hydroxy-naphthalene-1-carbaldehyde and 470 mg (6.00 mmol) of ammonium bicarbonate. The reaction mixture is refluxed. After 3 h 220 mg of 2-hydroxy-naphthalene-1-carbaldehyde and 160 mg of ammonium bicarbonate are added. After two hours 220 mg of 2-hydroxy-naphthalene-1-carbaldehyde and 160 mg of ammonium bicarbonate are added. The reaction mixture is refluxed for an additional two hours. The product is filtered off, washed with acetic acid and water. The product is decocted in 100 ml of ethyl-methyl-ketone (MEK). Most of the imidazole side-product is removed in this way giving the title compound (yield: 3.71 g (72%)).

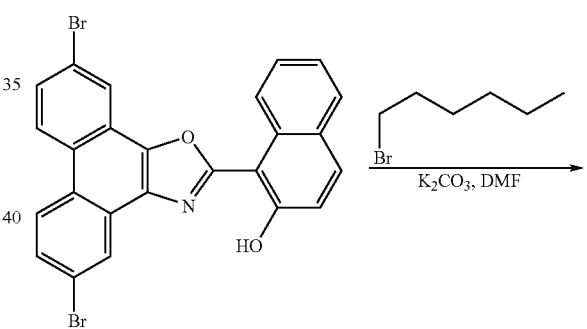

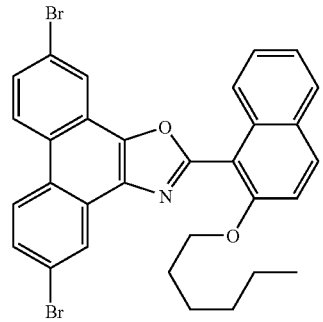

b) To 3.11 g (6.00 mmol) of the product of example 13a in 30 ml of dry DMF are added under nitrogen 1.66 g (12.0 mmol) of potassium carbonate and 1.74 g (9.00 mmol) of 1-bromohexane. The reaction mixture is stirred for 8 h at 130° C. Diethyl ether and water are added. The organic phase is separated and washed with water. The organic phase is dried with magnesium sulfate. The solvent is removed under vacuum. The crude product is purified via column chromatography (SiO$_2$, toluene/cyclohexane 2:1), followed by recrystallization from cyclohexane, giving the title compound (yield: 1.23 g (33%)).

Example 14

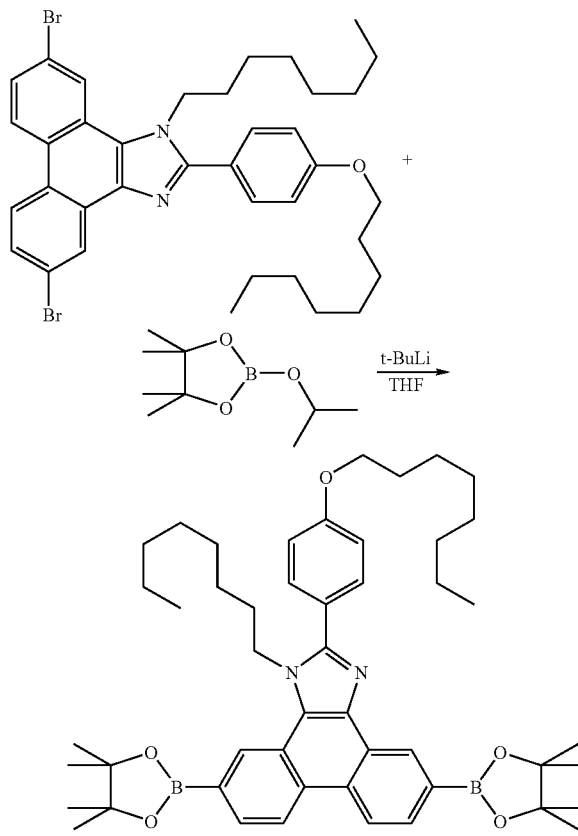

A solution of 2.08 g (3.00 mmol) of the product of example 9c in 90 ml of dry tetrahydrofurane (THF) is cooled to −78° C. under argon. 10 ml (15 mmol) of a 1.5 M solution of tert-butyl-lithium in pentane is added. The reaction mixture is stirred for 1 h at −78° C. To this reaction mixture 1.67 g (9.00 mmol) 2-isopropoxy-4,4,5,5-teramethyl-1,3,2-dioxaborolane are added as fast as possible. The reaction mixture is stirred for 30 min at −78° C., warmed up to 25° C., and stirring continued for one hour. The reaction mixture is diluted with diethyl ether and washed with water. The organic phase is dried with magnesium sulfate and the solvent is removed under vacuum. The product is recrystallized two times from cyclohexane giving the title compound (yield: 1.40 g (59%)). Melting point: 179-181° C.

Example 15

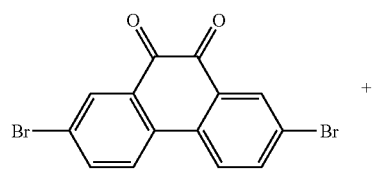

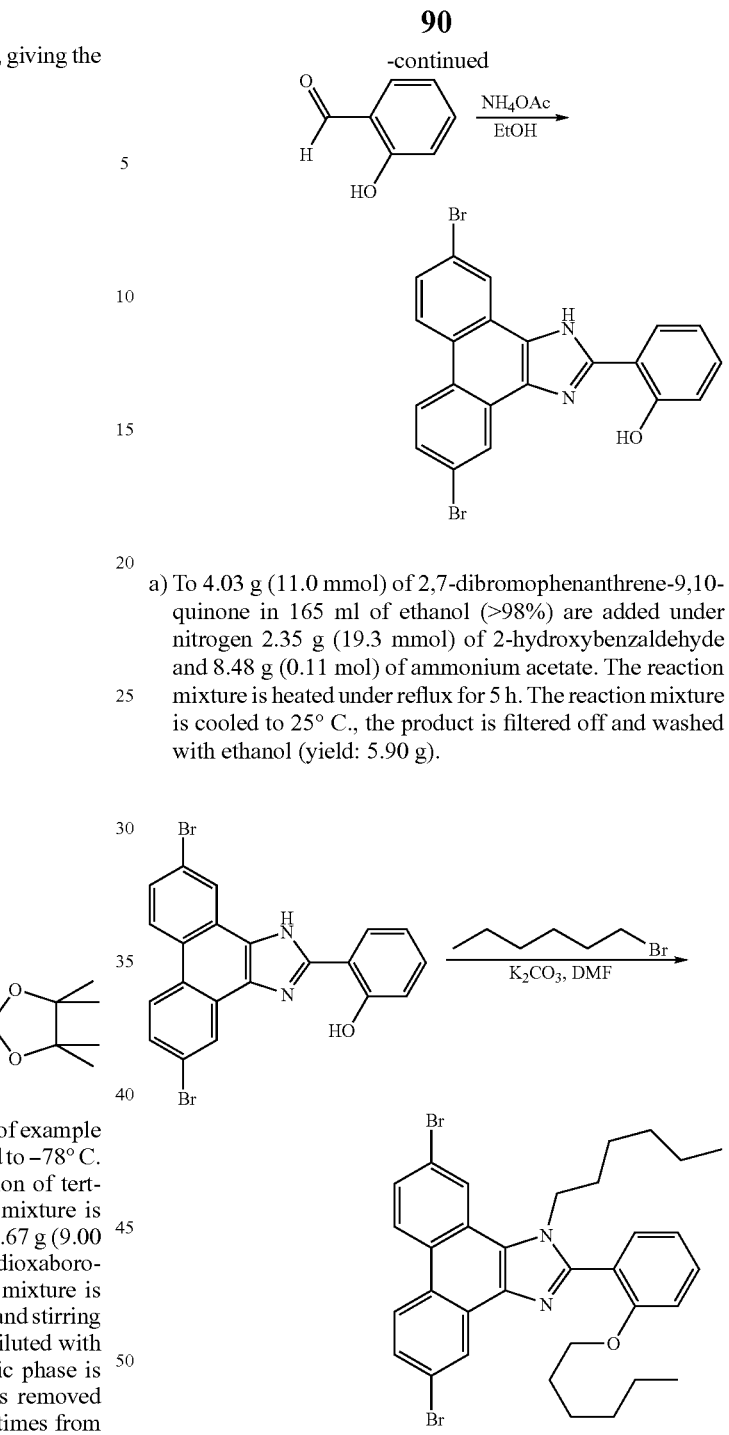

a) To 4.03 g (11.0 mmol) of 2,7-dibromophenanthrene-9,10-quinone in 165 ml of ethanol (>98%) are added under nitrogen 2.35 g (19.3 mmol) of 2-hydroxybenzaldehyde and 8.48 g (0.11 mol) of ammonium acetate. The reaction mixture is heated under reflux for 5 h. The reaction mixture is cooled to 25° C., the product is filtered off and washed with ethanol (yield: 5.90 g).

b) To 4.68 g (10.0 mmol) of the product of example 15a in 25 ml of dry DMF are added under nitrogen 4.13 g (25.0 mmol) of 1-bromohexane and 4.15 g (30.0 mmol) of potassium carbonate. The reaction mixture is stirred at 130° C. After 3 h 2.07 g (15.0 mmol) of potassium carbonate and 1.82 g (15.0 mmol) of 1-bromohexane are added. After 5 h the reaction mixture is poured into water and the water phase is extracted with diethyl ether. The organic phase is dried with magnesium sulfate and the solvent is removed under vacuum. The crude product is purified via column chromatography (SiO₂, toluene) leading to the product in form of an oil, which crystallizes slowly (yield: 5.1 g (80%)).

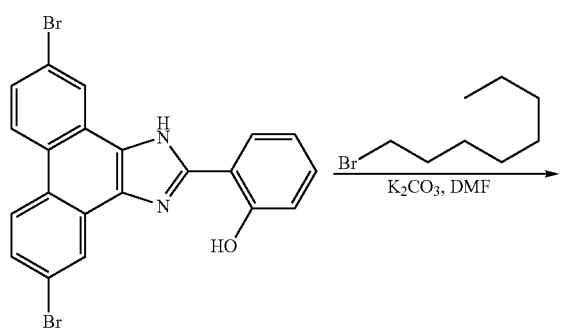

a) To 5.18 g (10.0 mmol) of the product of example 12a in 50 ml of dry DMF are added under nitrogen 5.79 g (30.0 mmol) of 1-bromo-2-ethylhexane, 4.84 g (35.0 mmol) of potassium carbonate. The reaction mixture is stirred at 130° C. Additional 2.07 g (1.50 mmol) of potassium carbonate and 1.93 (10.0 mmol) of 1-bromo-2-ethylhexane are added each four times. After 7 h the reaction mixture is poured into water and the water phase is extracted with diethyl ether. The crude product is further purified via column chromatography (SiO$_2$, toluene) giving the title compound as a light yellow, viscous oil which solidified upon standing (yield: 5.98 g (79%)). Melting point: 60.5-66.5° C.

Example 17

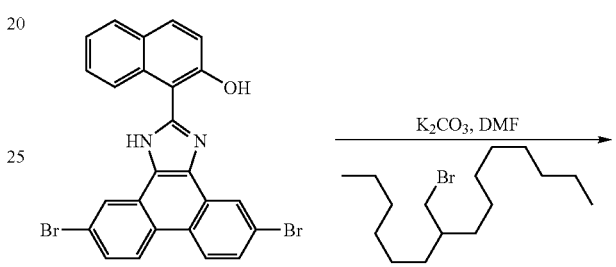

c) The title compound has been prepared according the above example. Melting point: 86-88° C.

Example 16

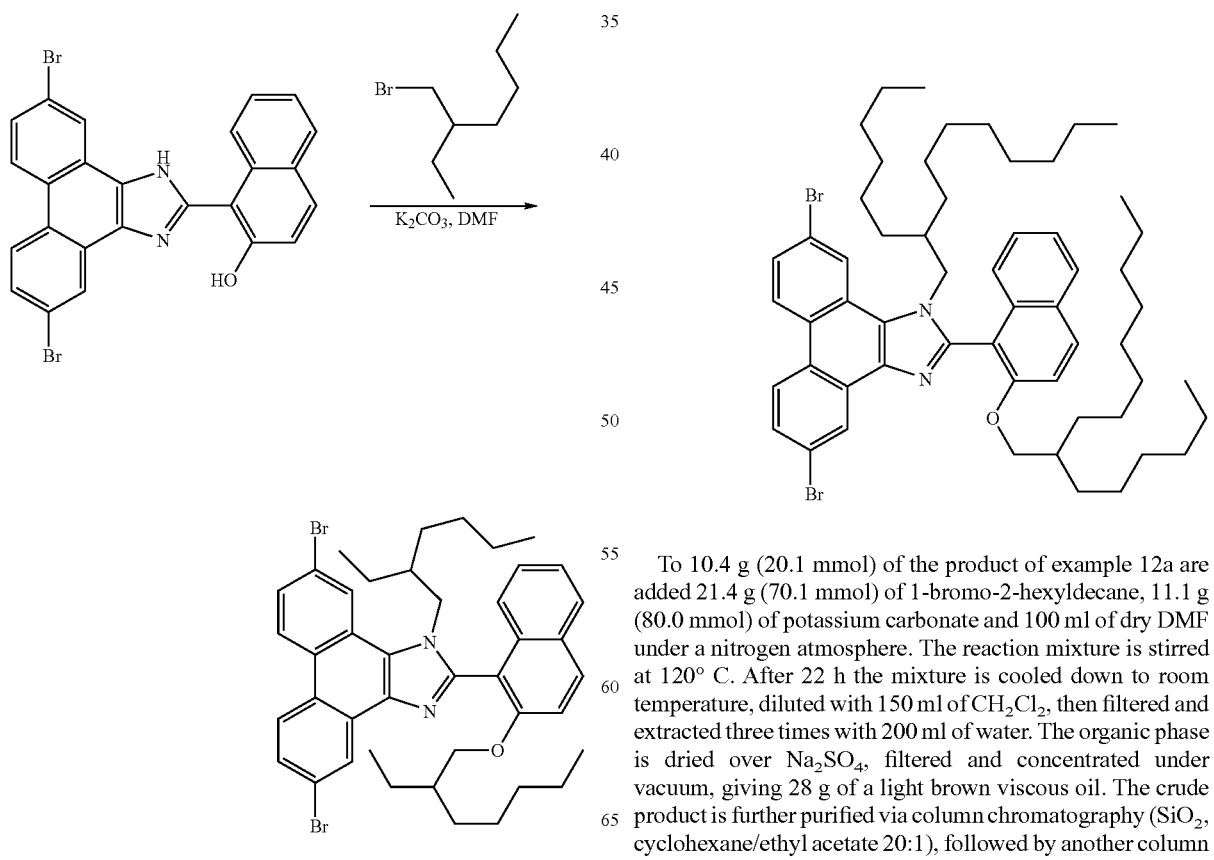

To 10.4 g (20.1 mmol) of the product of example 12a are added 21.4 g (70.1 mmol) of 1-bromo-2-hexyldecane, 11.1 g (80.0 mmol) of potassium carbonate and 100 ml of dry DMF under a nitrogen atmosphere. The reaction mixture is stirred at 120° C. After 22 h the mixture is cooled down to room temperature, diluted with 150 ml of CH$_2$Cl$_2$, then filtered and extracted three times with 200 ml of water. The organic phase is dried over Na$_2$SO$_4$, filtered and concentrated under vacuum, giving 28 g of a light brown viscous oil. The crude product is further purified via column chromatography (SiO$_2$, cyclohexane/ethyl acetate 20:1), followed by another column chromatography (cyclohexane/ethyl acetate 40:1). 17.2 g of the title compound are obtained as a light yellow, viscous oil with HPLC purity >99% (yield: 89%).

Example 18

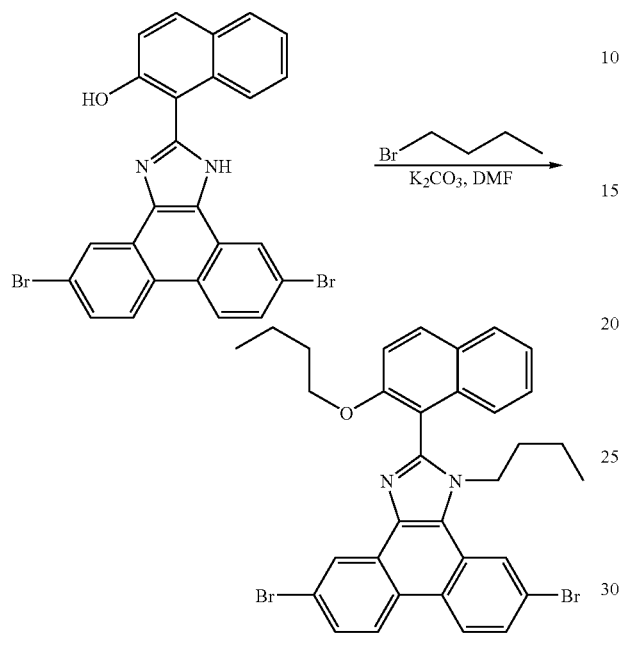

The product is prepared according to example 15b, decocted in ether and recrystallized from DMF (yield: 34%). Melting point: 86-87° C.

Example 19

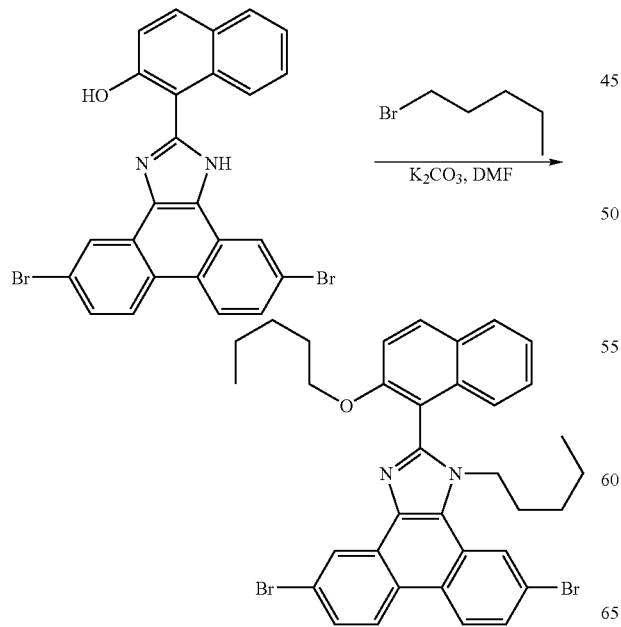

The product is prepared according to example 15b, decocted in ether and washed with ethanol (yield: 87%). Melting point: 132.5-134.5° C.

Example 20

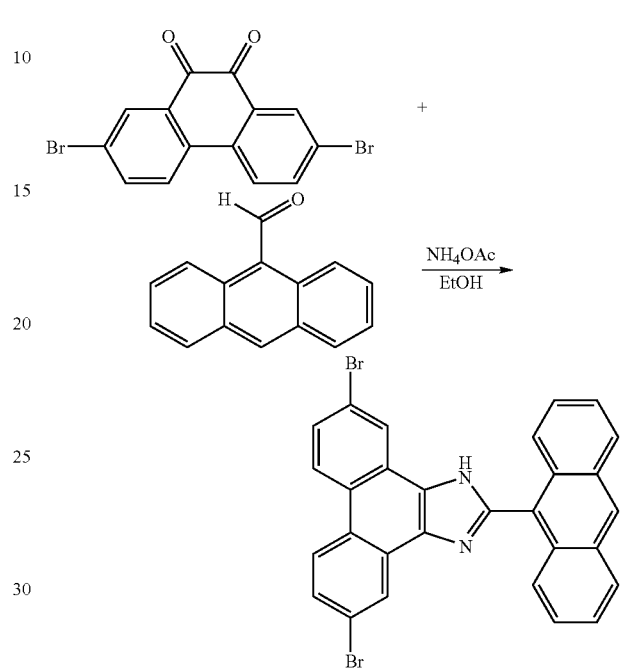

The product is prepared according to example 15a, with 9-anthracenecarbaldehyde (yield: 95%).

Example 21

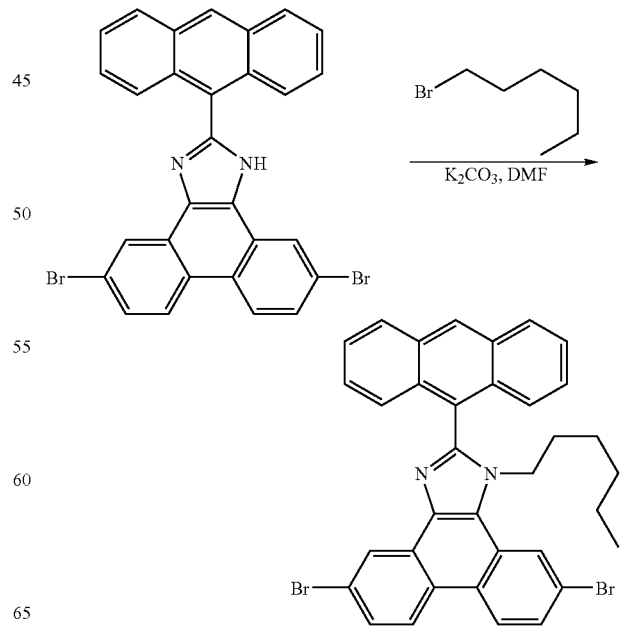

The product is prepared according to example 15b and decocted in DMF (yield: 66%). Melting point: 209.5-211° C.

Example 22

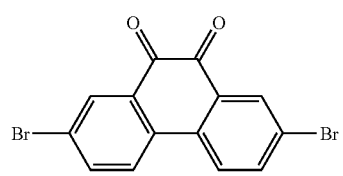

+

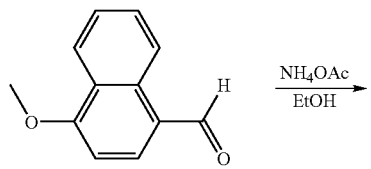

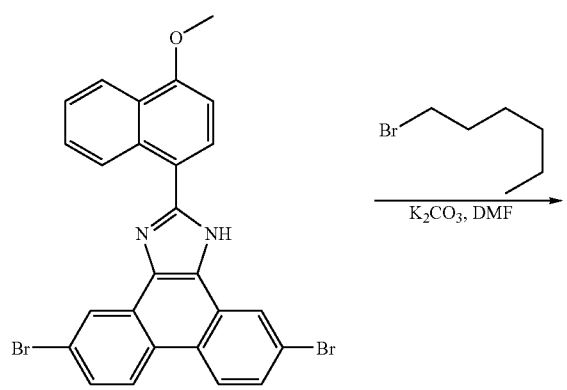

The product is prepared according to example 15a, with 4-methoxy-1-naphthaldehyde (yield: 84%).

Example 23

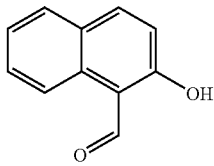

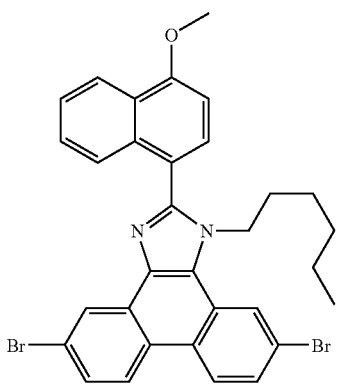

The product is prepared according to example 15b and recrystallized from n-hexane (yield: 69%). Melting point: 162-164° C.

Example 24

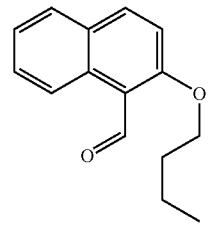

a) To 5.00 g (29.0 mmol) of 2-hydroxy-naphthalene-1-carbaldehyde in 30 ml of dry DMF are added under nitrogen 5.97 g (43.6 mmol) of 1-bromobutane and 12.8 g (87.1 mmol) of potassium carbonate. The reaction mixture is stirred at 130° C. After 7 h the solids are filtered off. The filtrate is diluted with dichloromethane and the organic phase is washed with water and dried with magnesium sulfate. The solvent is removed under vacuum and the product is recrystallized from methanol giving the title compound (yield: 66%).

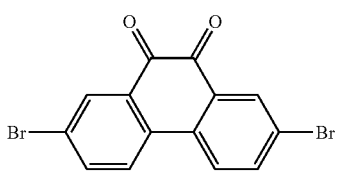

+

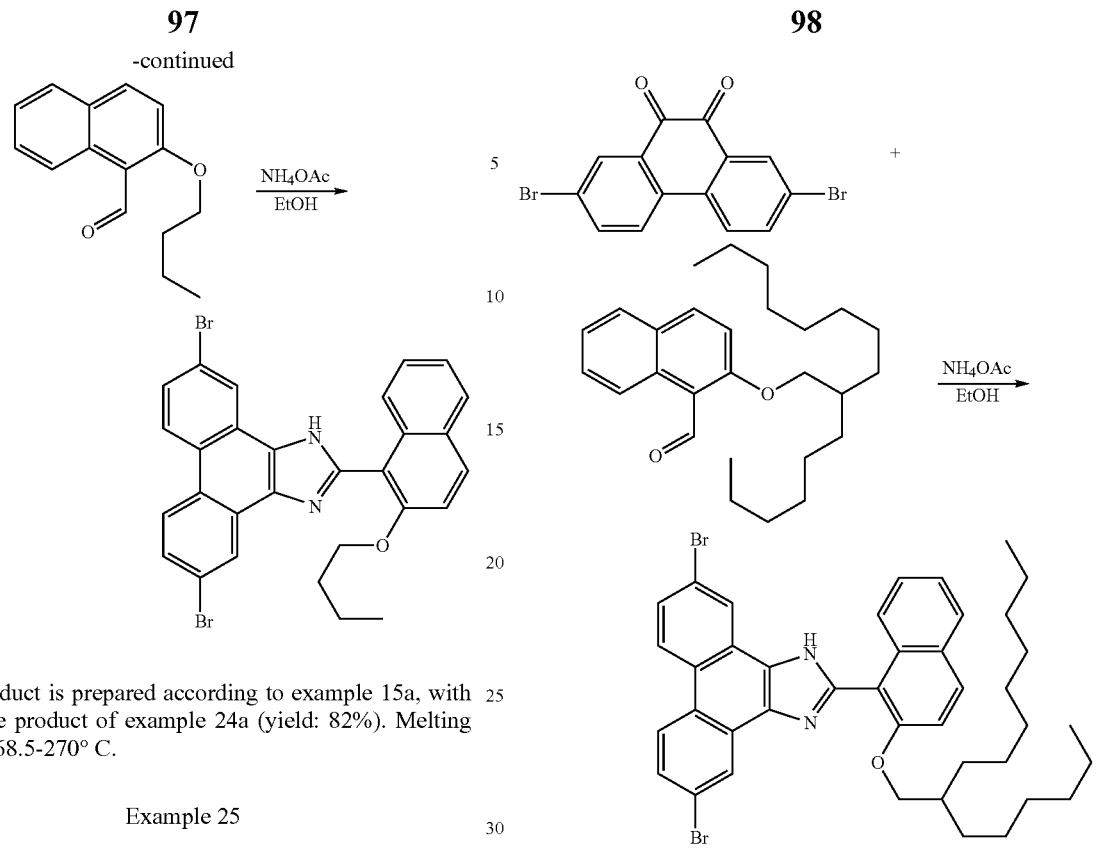

b) The product is prepared according to example 15a, with aldehyde product of example 24a (yield: 82%). Melting point: 268.5-270° C.

Example 25 a) To 10.00 g (58.0 mmol) of 2-hydroxy-naphthalene-1-carbaldehyde in 40 ml of dry DMF are added under nitrogen 21.3 g (69.7 mmol) of 1-bromo-2-hexyldecane and 20.1 g (145 mmol) of potassium carbonate. The reaction mixture is stirred at 130° C. After one hour the solids are filtered off. The filtrate is diluted with dichloromethane and the organic phase is washed with water and dried with magnesium sulfate. The solvent is removed under vacuum. The product is filtered over silica gel with toluene/cyclohexane 1:1 (yield: 96%).

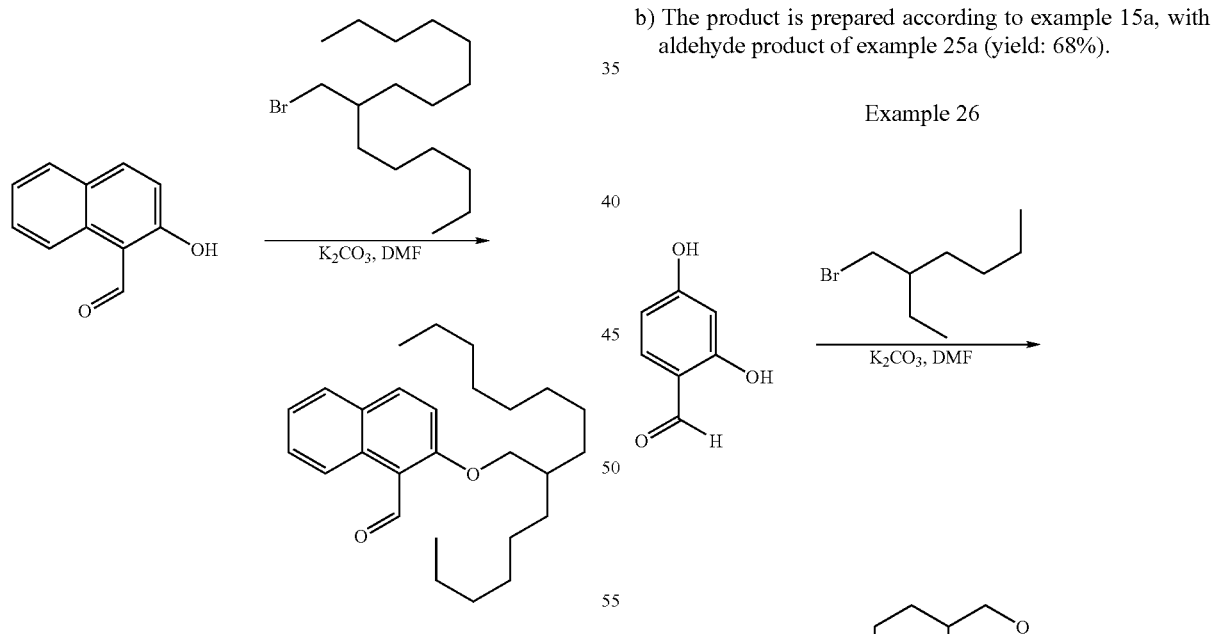

b) The product is prepared according to example 15a, with aldehyde product of example 25a (yield: 68%).

Example 26 a) The product is prepared according to example 25a, with 2,4-dihydroxybenzaldehyde (yield: 80%).

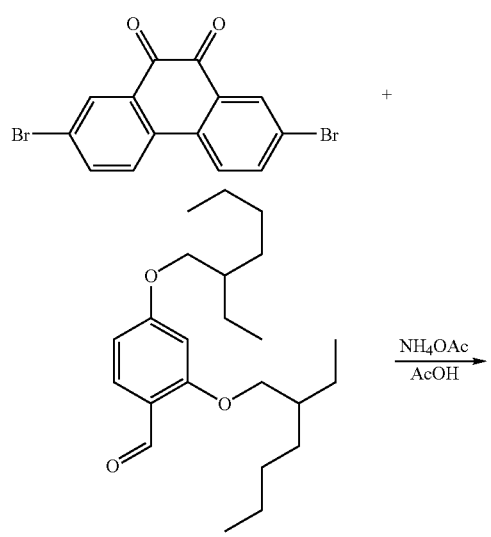

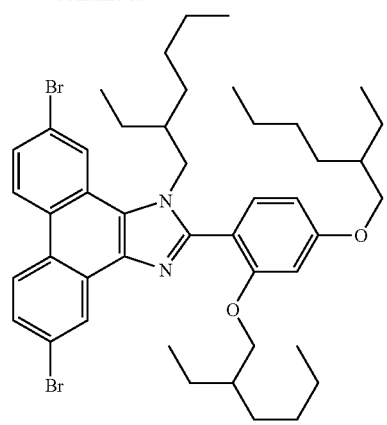

To 2.10 g (2.96 mmol) of the product of example 26b in 20 ml of DMF are added under nitrogen 2.86 g (14.8 mmol) of 1-bromo-2-ethylhexane, 2.46 g (17.8 mmol) of potassium carbonate. The reaction mixture is stirred at 130° C. After 5 days the solids are filtered off. The filtrate is diluted with dichloromethane, the organic phase is washed with water and dried with magnesium sulfate. The solvent is removed under vacuum. A filtration over silica gel with toluene leads to the product in form of an oil (yield: 2.36 g (97%)).

Example 28

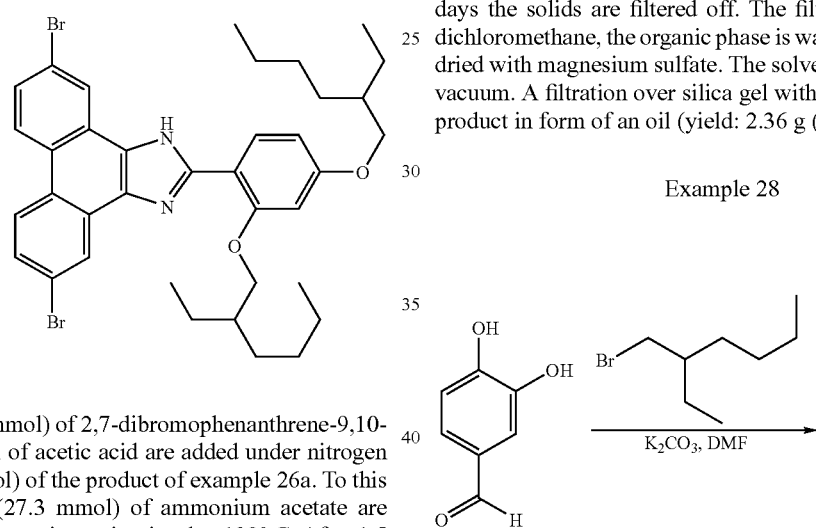

b) To 2.00 g (5.46 mmol) of 2,7-dibromophenanthrene-9,10-quinone in 60 ml of acetic acid are added under nitrogen 2.97 g (8.20 mmol) of the product of example 26a. To this mixture 2.11 g (27.3 mmol) of ammonium acetate are added. The reaction mixture is stirred at 130° C. After 1.5 h the reaction mixture is cooled to 20° C. and the product starts to crystallize slowly. The product is filtered off, washed with acetic acid and recrystallized three times from n-hexane (yield: 1.96 g (51%)).

Example 27

The product is prepared according to example 25a, with 3,4-dihydroxybenzaldehyde (yield: 100%).

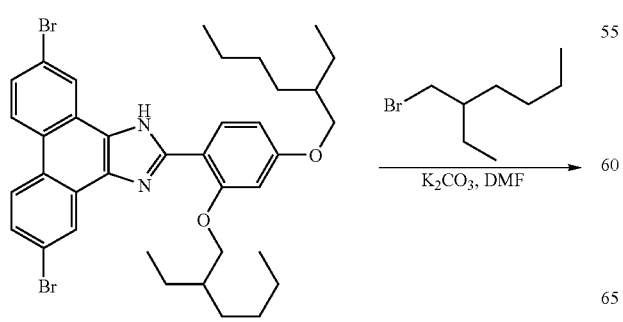

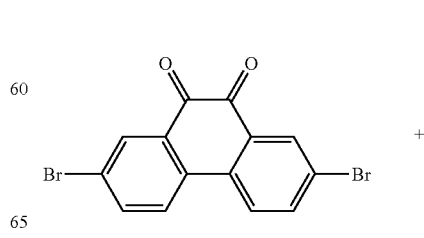

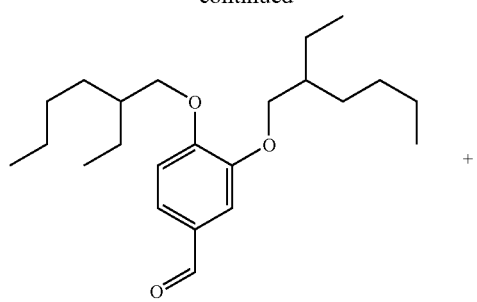

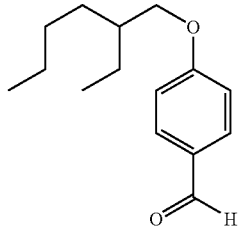

a) The product is prepared according to example 25a, starting from 4-hydroxybenzaldehyde (yield: 96%).

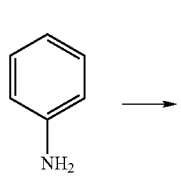

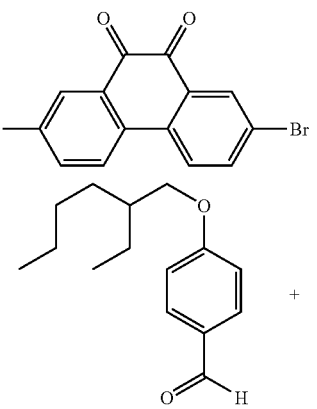

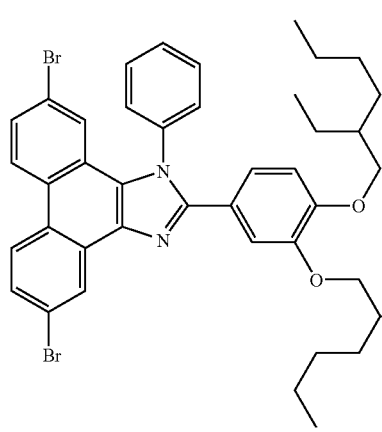

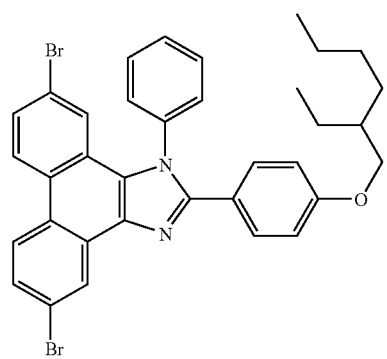

b) To 5.00 g (13.7 mmol) of 2,7-dibromophenanthrene-9,10-quinone in 80 ml acetic acid (>98%) are added under nitrogen 5.45 g (15.0 mmol) of the product of example 28a, 2.54 g (27.3 mmol) of aniline and 5.26 g (68.3 mmol) of ammonium acetate. The reaction mixture is heated under reflux for 3 h and cooled to 25° C. The product is filtered off, washed with water, aqueous sodium hydrogencarbonate solution and water, and recrystallized several times from iso-propanol (yield: 54%). Melting point: 117-118° C.

b) The product is prepared according to example 28b, with aldehyde product of example 29a, giving a white solid (yield: 69%). Melting point: 161.5-162.5° C.

Example 29

Example 30

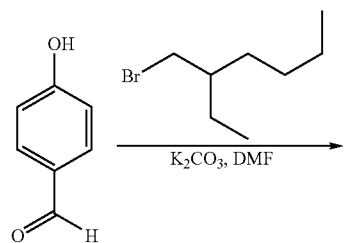

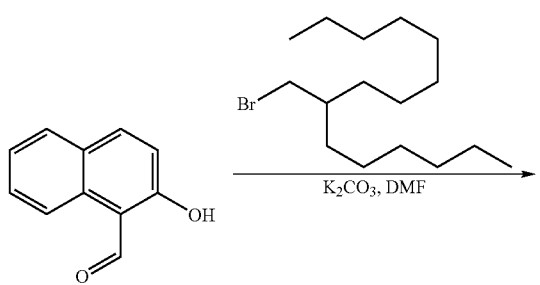

-continued

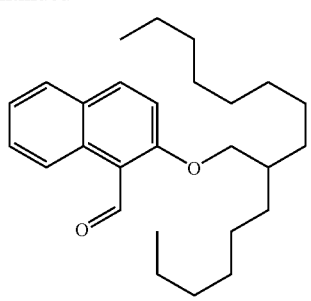

a) The product is prepared according to example 25a (yield: 96%).

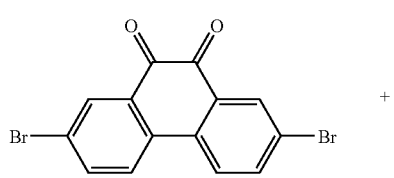

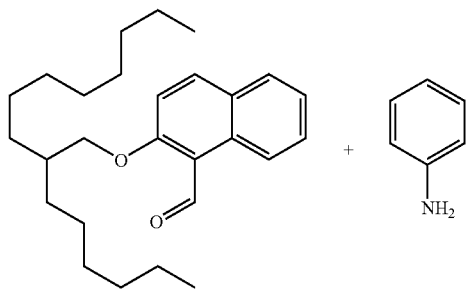

b) The product is prepared according to example 28b, with aldehyde product of example 25a, giving the title compound as a resin (yield: 27%).

Example 31

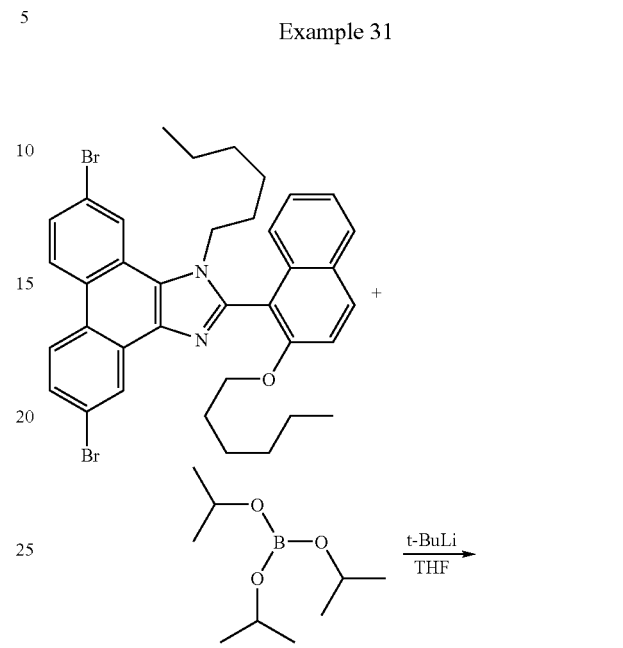

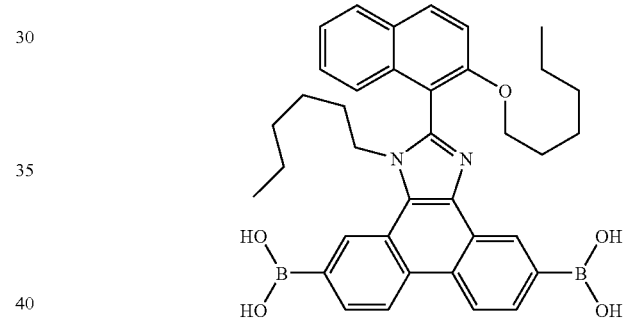

a) To 2.06 g (3.00 mmol) of the product of example 12b in 150 ml of tetrahydrofurane (THF) are added 10 ml (15 mmol) of tert-butyl lithium at −78° C. under argon. After two hours 1.69 g (9.00 mmol) of triisopropyl borate are added. The reaction mixture is stirred for two hours at −78° C., warmed up to 25° C. and stirring continued for two hours. The solvent is removed under vacuum. The product is dissolved in 40 ml of THF and 20 ml of 20% aqueous HCl is added at 0° C. The solvent is removed under vacuum. The product is used without purification in the next step.

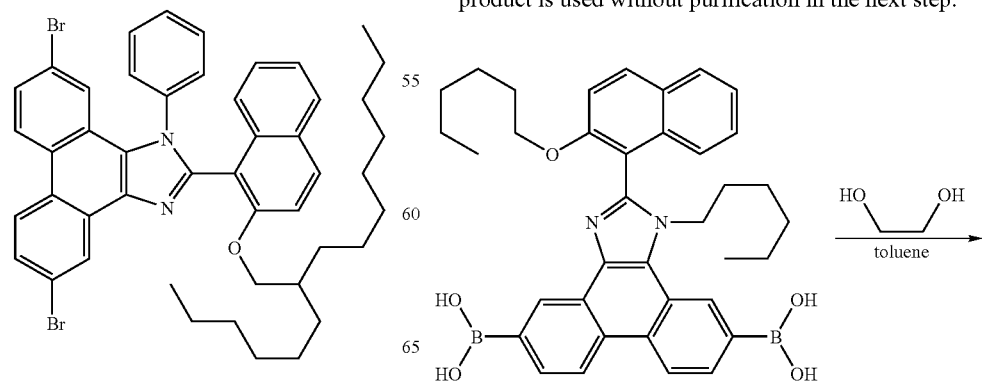

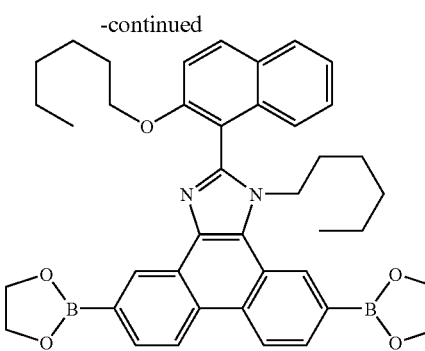

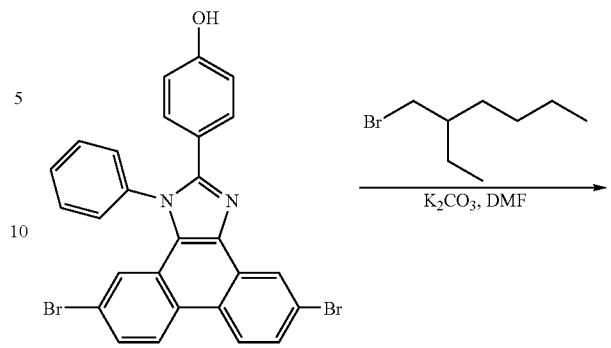

b) To 4.30 g (6.98 mmol) of the product of example 31a in 140 ml of toluene are added 520 mg (8.37 mmol) of ethylengycole. The reaction mixture is heated under reflux for several hours with azeotropic removal of water. The toluene is removed under vacuum and the product is washed with 4 ml of diethylether, 4 ml of n-hexane and 2 ml of toluene giving the title compound (yield: 1.73 g (37%)). Melting Point: >200° C. (the product decomposes at 200° C.).

b) To 3.20 g (6.00 mmol) of the product of example 32a in 12 mol of DMF are added under nitrogen 2.32 g (12.0 mmol) of 1-bromo-2-ethylhexane and 2.49 g (18.0 mmol) of potassium carbonate. The reaction mixture is stirred at 130° C. for 4 h. The reaction mixture is poured into water and the water phase is extracted with dichloromethane. The product is recrystallized several times from dibutylether (yield: 2.90 g (74%)). Melting point: 161.5-162.5° C.

Example 32

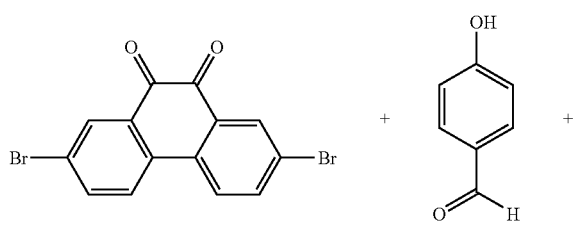

Example 33

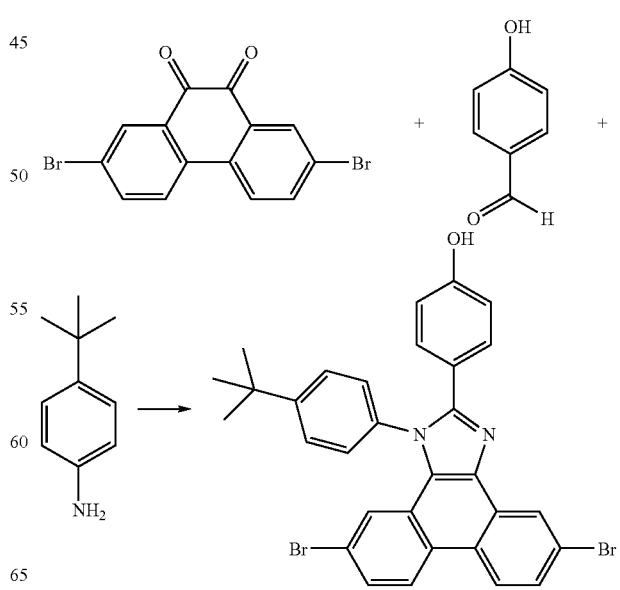

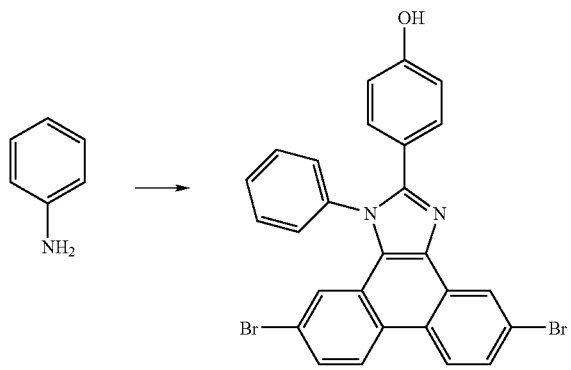

a) To 3.66 g (10.0 mmol) of 2,7-dibromophenanthrene-9,10-quinone in 100 ml of acetic acid (>98%) are added under nitrogen 1.34 g (11.0 mmol) of 4-hydroxybenzaldehyde, 1.03 g (11 mmol) of aniline and 3.08 g (40.0 mmol) of ammonium acetate. The reaction mixture is heated under reflux for 4 h. The reaction mixture is cooled to 25° C. and the product is filtered off. The product is washed with water, aqueous sodium hydrogencarbonate solution and water, and recrystallized from methyl ethyl ketone (yield: 3.70 g (67%)).

The product is prepared according to example 32a (yield: 83%).

Example 34

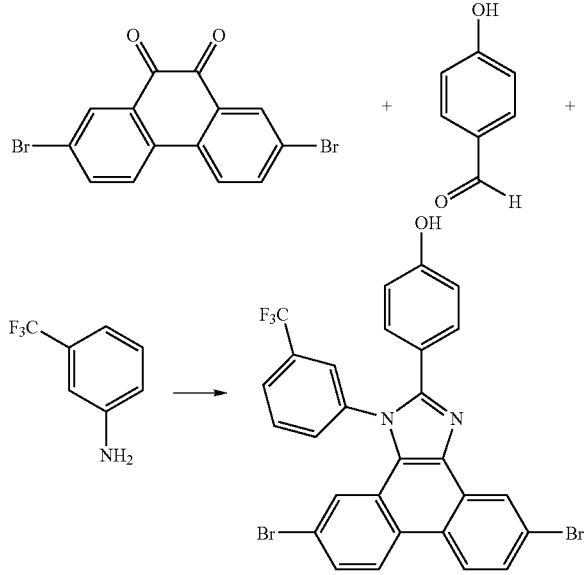

The product is prepared according to example 32a (yield: 77%).

Example 35

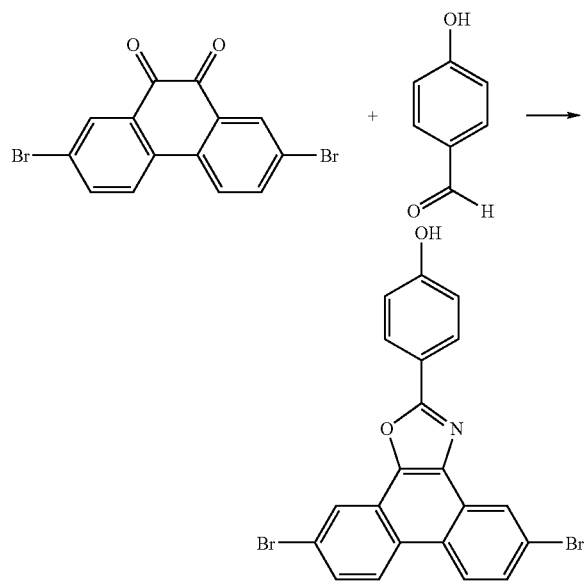

a) To 3.66 g (10 mmol) of 2,7-dibromophenanthrene-9,10-quinone in 100 ml of acetic acid are added under nitrogen 1.34 g (11.0 mmol) of 4-hydroxybenzaldehyde 1.42 g (11.0 mmol) of 2-ethylhexylamine and 3.08 g (0.110 mol) of ammonium acetate. The reaction mixture is heated under reflux until the reaction is complete and cooled to 25° C. The product is filtered off, washed with acetic acid, aqueous sodium hydrogencarbonate solution and water, and decocted in 50 ml of methyl ethyl ketone (yield: 2.50 q (43%)).

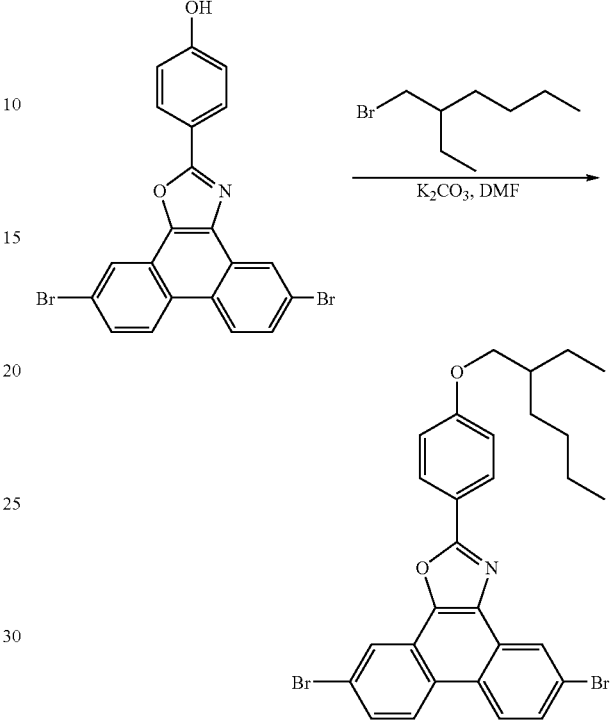

b) The product is prepared according to example 32b and recrystallized from di-n-butylether (yield: 1.5 g (51%)).

Example 36

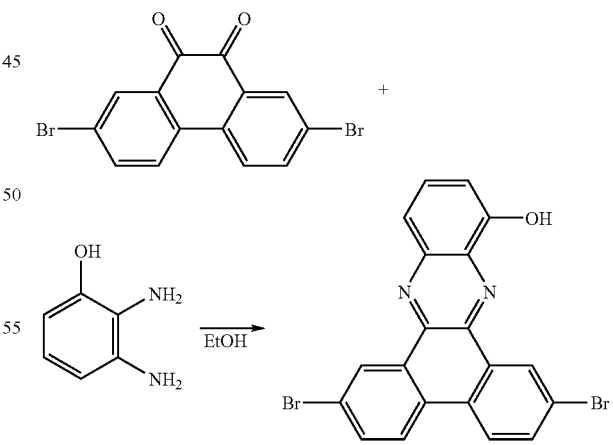

a) To 5 g (13.7 mmol) of 2,7-dibromophenanthrene-9,10-quinone in 200 ml of ethanol are added 2.04 g (16.4 mmol) 2,3-diaminophenol. The reaction mixture is refluxed for two hours. The reaction mixture is cooled to 25° C. The product is filtered off, washed with ethanol and used without purification for the next step.

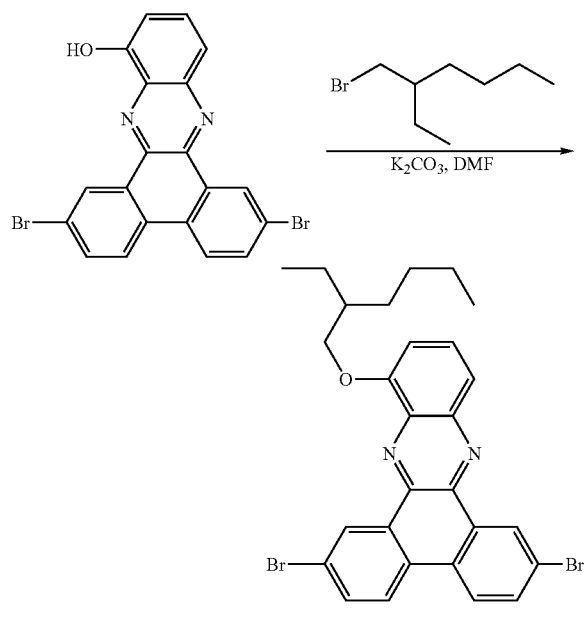

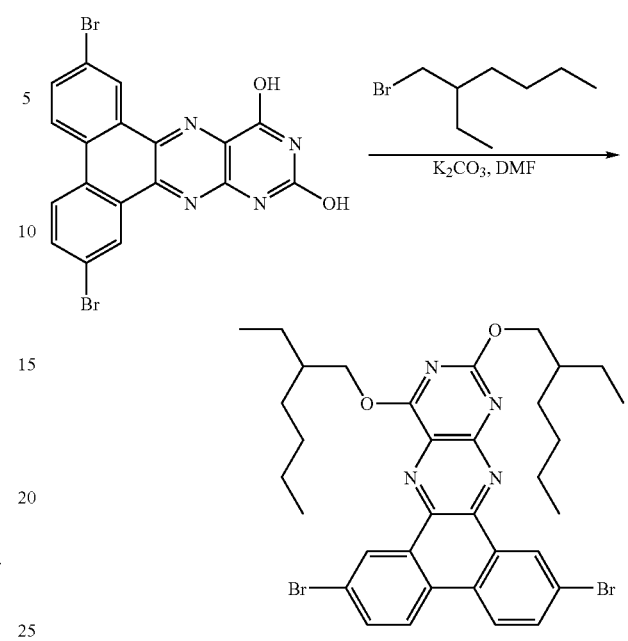

b) The product is prepared according to example 32b and recrystallized from DMF (yield: 27%). Melting point: 171.5-172.5° C.

b) The product is prepared according to example 32b. The product is recrystallized from DMF and further purified via column chromatography (SiO₂, toluene/cyclohexane 2:1) giving the title compound (yield: 1.13 g (13%)). Melting point: 157.5-159.5° C.

Example 37

Example 38

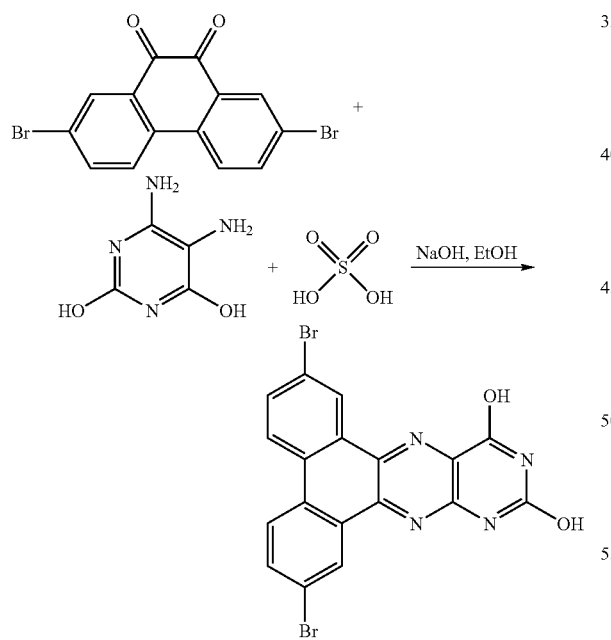

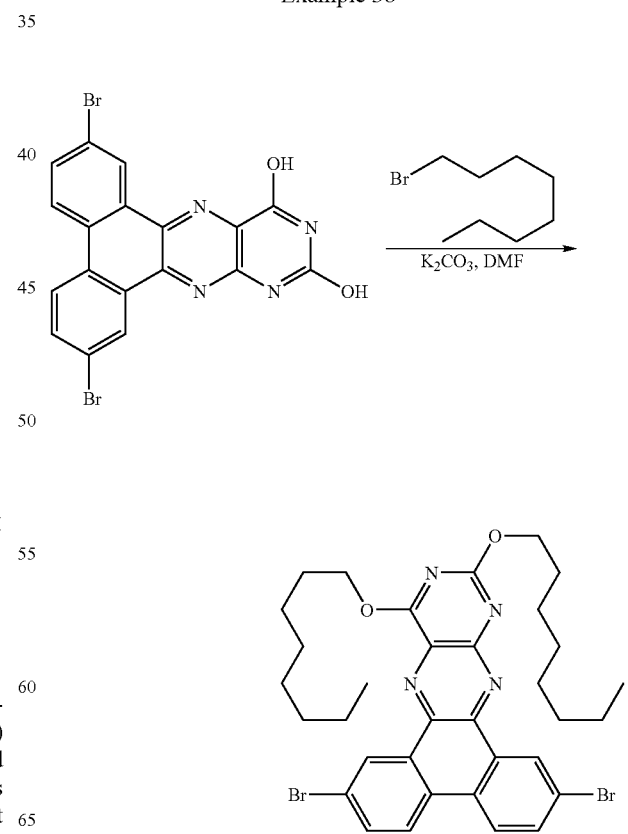

a) To 5.00 g (13.7 mmol) of 2,7-dibromophenanthrene-9,10-quinone in 250 ml of ethanol are added 3.94 g (16.4 mmol) of 5,6-diamino-2,4-dihydroxypyrimidine sulphate and 1.09 g (27.3 mmol) of NaOH. The reaction mixture is heated under reflux for 5 h and cooled to 25° C. The product is filtered off, washed with ethanol and water and is used without purification for the next step.

The product is prepared according to example 37b and recrystallized from diethyl ether and DMF (yield: 40%). Melting point: 173.5-174.5° C.

Example 39

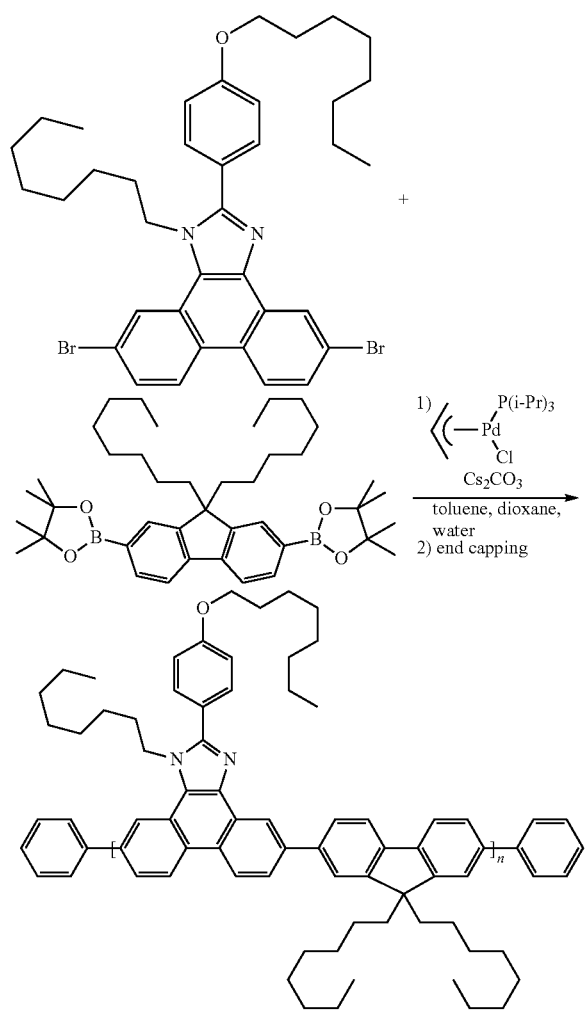

1.0778 g (1.56 mmol) of the dibromide product of example 9c and 1.0000 g (1.56 mmol) of 2,7-bis(4,4,5,5-tetramethyl-1,3,2-dioxaborolan-2-yl)-9,9-dioctylfluorene are dissolved in 15 ml of dioxane and 5 ml of toluene. This solution is degassed with argon. 50 mg of allyl(triiso-propylphosphine) palladium chloride are added and the reaction mixture is degassed with argon. 2.5352 g (7.78 mmol) of cesium carbonate in 5 ml of water are degassed and added to the reaction mixture. After degassing, the reaction mixture is heated under reflux for a total of 18 h. After 2 h reaction 3 ml of degassed dioxane and 3 ml of degassed toluene are added. After an additional 30 minutes reaction 6 ml of degassed toluene are added. After an additional 4 h reaction 8 ml of toluene are added. 370 mg (2.33 mmol) of degassed bromobenzene are added and the reaction mixture is heated under reflux for two hours. A degassed solution of 789 mg (3.89 mmol) of 4,4,5,5-tetramethyl-2-phenyl-1,3,2-dioxaborolane in 5 ml of toluene is added and the reaction mixture is stirred for two hours. The reaction mixture is poured into 300 ml of methanol. GPC (polystyrene standard) $M_w$=201 828 g/mol, PD=4.96.

This polymer is purified as described in example 11. After purification the polymer shows the following GPC data (polystyrene standard): $M_w$=135 084 g/mol, PD=3.24.

0.8 wt % by weight of the product of example 39 is dissolved in toluene. This solution is filtered through a Teflon filter having a pore width of 0.2 μm and is spin coated at 150 rpm on a quartz substrate. The film is characterized by UV-VIS and photoluminescent measurements (Perkin Elmer LS 50 B), showing a $\lambda_{max}$ at 392 nm in the absorption spectrum of the solid film and an emission maximum at 434 nm (excitation wavelength 368 nm) in the photoluminescent spectrum. A solid state quantum yield of 75% was obtained in the film relative to a polyfluorene homopolymer standard.

Example 40

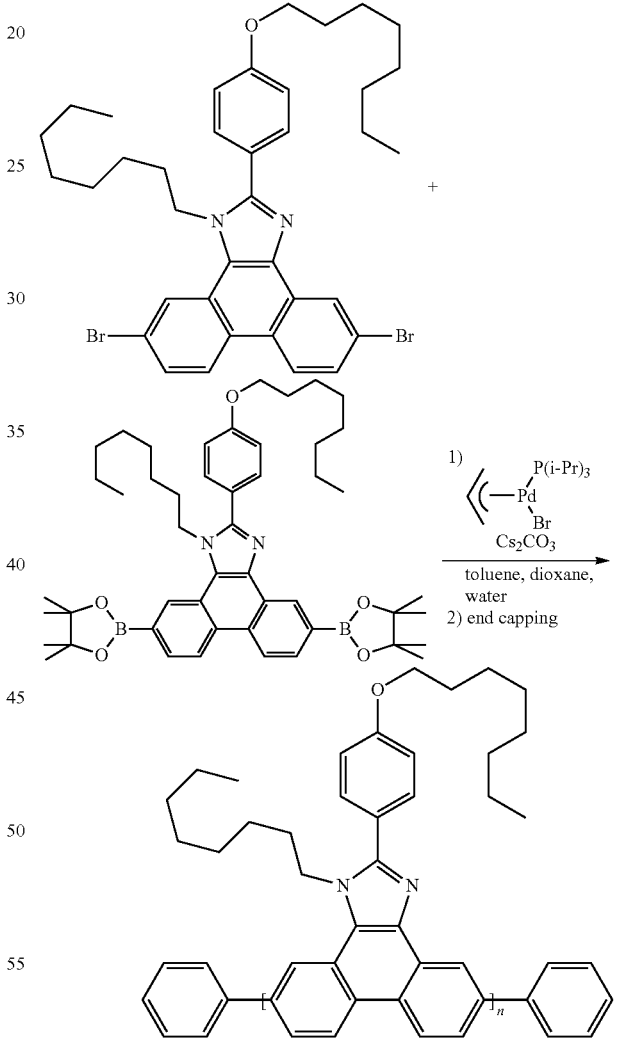

1.0564 g (1.53 mmol) of the dibromide product of example 9c and 1.2000 g (1.53 mmol) of the diboronate product of example 14 are dissolved in 15 ml of dioxane and 5 ml of toluene. This solution is degassed with argon. 61 mg of allyl (triisopropylphosphine)palladium bromide (CAS 244159-80-6) are added and the reaction mixture is degassed with argon. 2.4849 g (7.63 mmol) of cesium carbonate in 5 ml of water are degassed and added to the reaction mixture. After degassing, the reaction mixture is heated under reflux for a total of 18 h. After 40 minutes reaction 2 ml of degassed toluene are added. During the reaction 2 ml of degassed toluene are added for an additional six times. 360 mg (2.29 mmol) of degassed bromobenzene are added and the reaction mixture is heated under reflux for two hours. A degassed solution of 780 mg (3.81 mmol) of 4,4,5,5-tetramethyl-2-phenyl-1,3,2-dioxaborolane in 5 ml of toluene is added and the reaction mixture is stirred for two hours. The reaction mixture is poured into 300 ml of methanol. GPC (polystyrene standard): $M_w$=6120 g/mol, PD=1.77.

Example 41

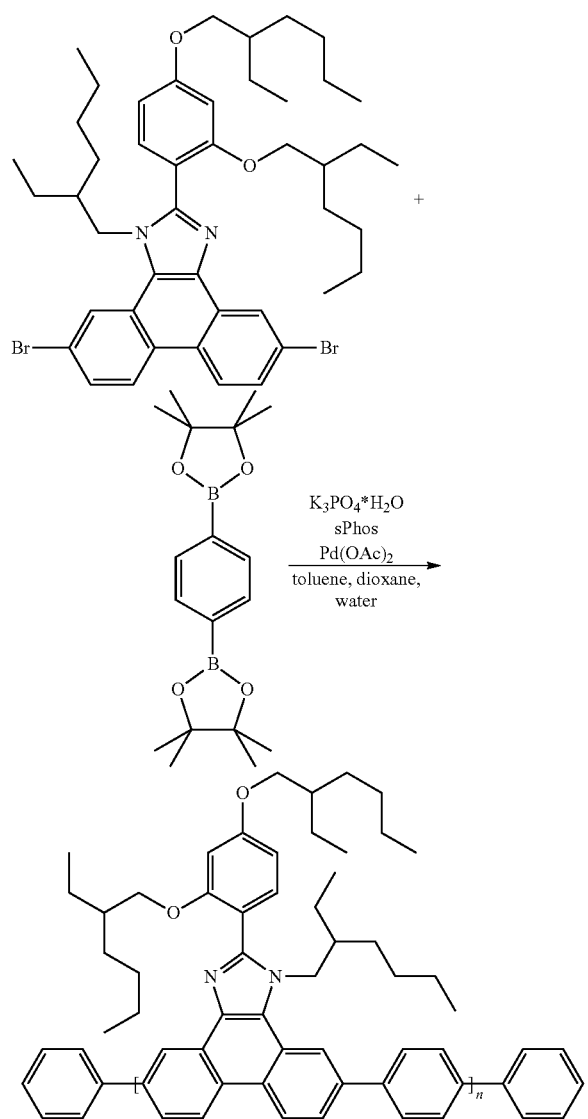

A mixture of 0.9290 g (2.8148 mmol) of 1,4-bis(4,4,5,5-tetramethyl-1,3,2-dioxaborolan-2-yl)benzene and 2.3104 g (2.8148 mmol) of the dibromide product of example 27 are dissolved in 15 ml of toluene and 15 ml of dioxane. This solution is evacuated and refilled with argon three times. 69.3 mg (0.169 mmol) of 2-dicyclohexylphosphino-2',6'-di-methoxybiphenyl (sphos) are added. The reaction mixture is degassed with argon. 63 mg (0.028 mmol) of palladium(II) acetate are added and the reaction mixture is degassed with argon. 3.41 g (14.1 mmol) of potassium phosphate tribasic monohydrate in 4.5 ml of water are degassed and added to the reaction mixture. After degassing, the reaction mixture is heated under reflux for 20 h. 663 mg (4.22 mmol) of degassed brombenzene is added and the reaction mixture is heated under reflux for two hours. A degassed solution of 1.44 g (7.037 mmol) of 4,4,5,5-tetramethyl-2-phenyl-[1,3,2]dioxaborolane in 3 ml of toluene is added. The reaction mixture is heated under reflux for two hours, cooled to 25° C. and treated with 100 ml of 1% aqueous NaCN solution. This mixture is stirred for 8 h at room temperature and is extracted with toluene. The solvent is removed under vacuum until 30 ml are left. The resulting solution is poured into 100 ml of methanol. The polymer is filtered off, dissolved in 30 ml of toluene, and treated with 100 ml of 1% aqueous NaCN solution. This mixture is again stirred for 8 h followed by extraction with toluene. The solvent is removed under vacuum until 30 ml are left. The resulting solution is poured into 100 ml of methanol. The polymer is filtered off and dissolved in 40 ml of THF. This solution is poured into 100 ml of methanol and the polymer is filtered off. Precipitation from THF is repeated once (yield: 1.38 g (67%)). GPC (polystyrene standard): $M_w$=32 859 g/mol, PD=1.93). Photoluminescent measurements of the polymer product have been performed as described in example 39: emission maximum at 450 nm.

Example 42

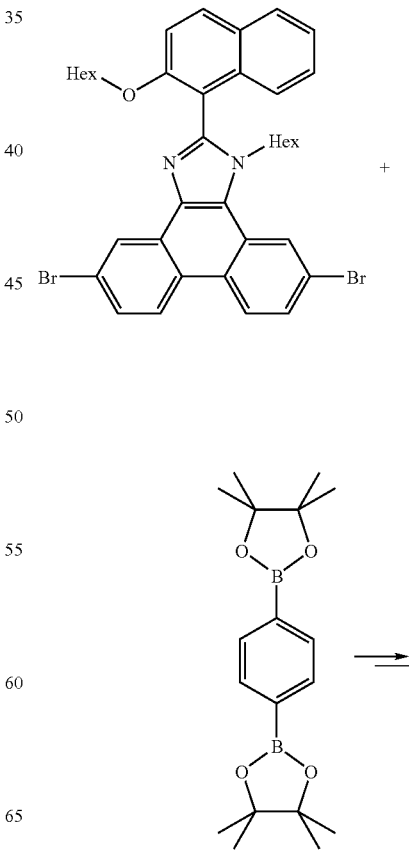

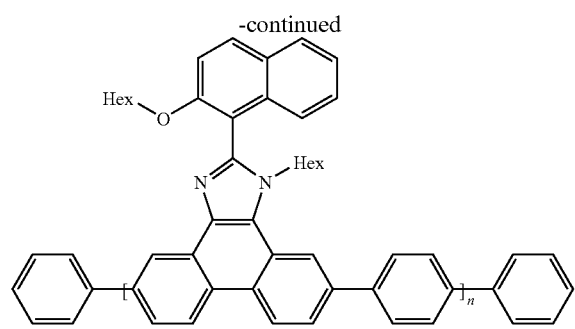

According to example 41 the above polymer is prepared, with dibromide product of example 12b, and 1,4-bis(4,4,5,5-tetramethyl-1,3,2-dioxaborolan-2-yl)benzene. GPC (polystyrene standard): $M_w$=66 775 g/mol, PD=2.85; Hex=n-hexyl.

Example 43

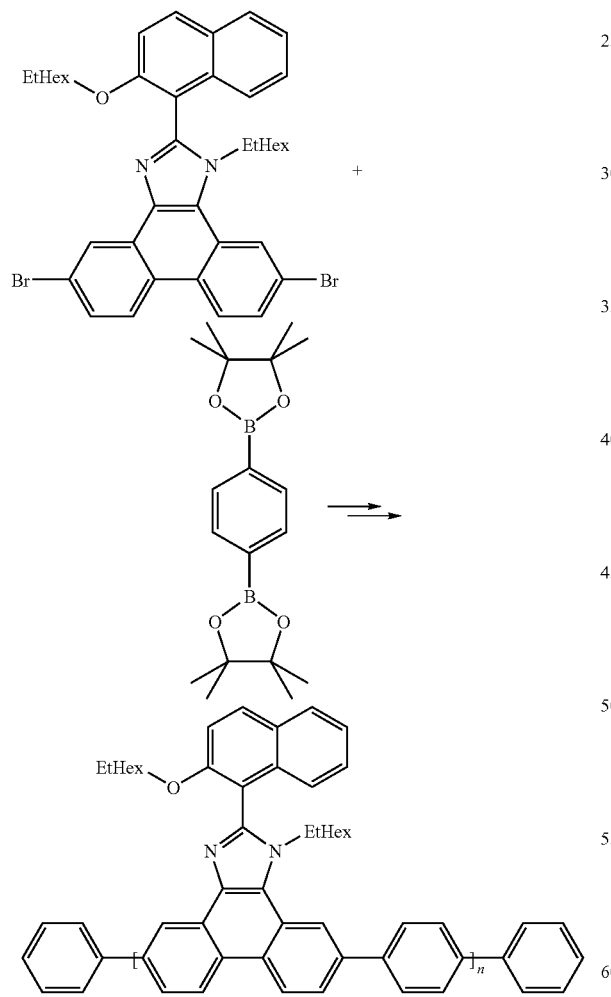

According to example 41 the above polymer is prepared, with dibromide product of example 16, and 1,4-bis(4,4,5,5-tetramethyl-1,3,2-dioxaborolan-2-yl)benzene. GPC (polystyrene standard): $M_w$=110 216 g/mol, PD=3.36; EtHex=2-ethylhexyl. Photoluminescent measurements of the polymer product have been performed as described in example 39: emission maximum at 440 nm.

Example 44

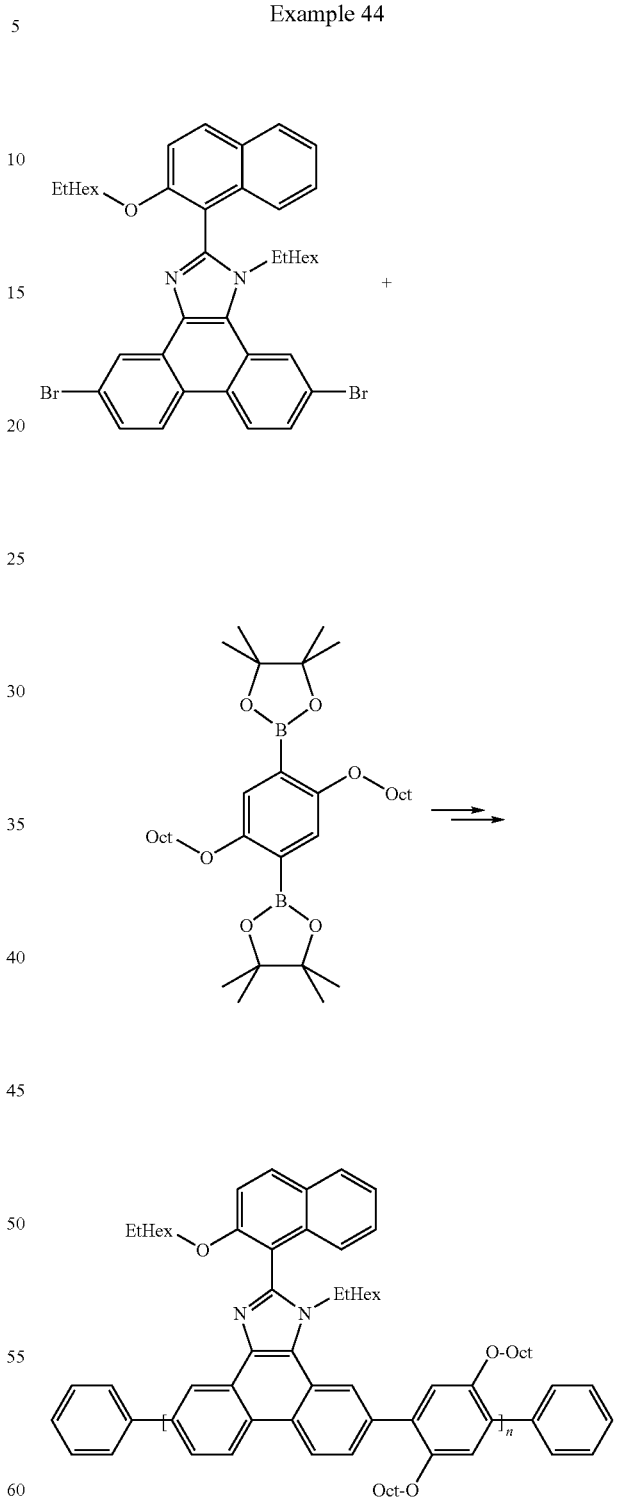

According to example 41 the above polymer is prepared, with dibromide product of example 16, and 1,4-bis[4,4,5,5-tetramethyl-(1,3,2)dioxaborolan-2-yl]-2,5-dioctyloxyphenylene (CAS 457931-26-9). GPC (polystyrene standard): $M_w$=9 500 g/mol, PD=1.20; EtHex=2-ethylhexyl. Photoluminescent measurements of the polymer product have been performed as described in example 39: emission maximum at 428 nm.

mer product have been performed as described in example 39: emission maximum at 433 nm.

Example 45

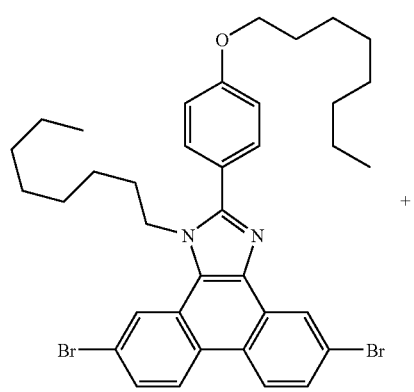

+

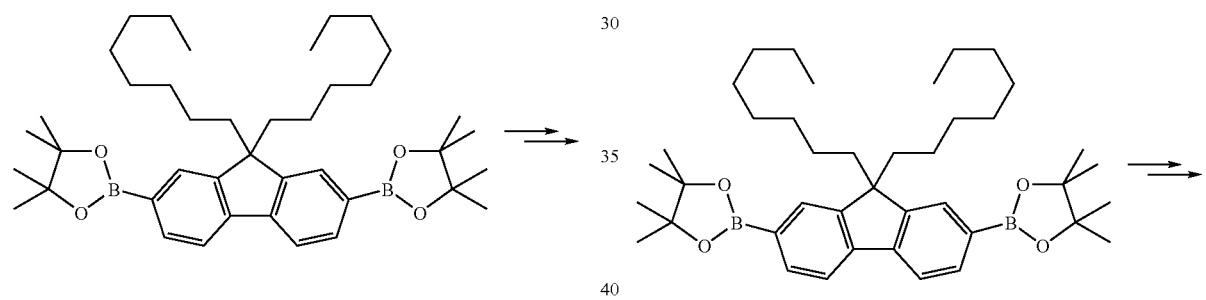

Example 46

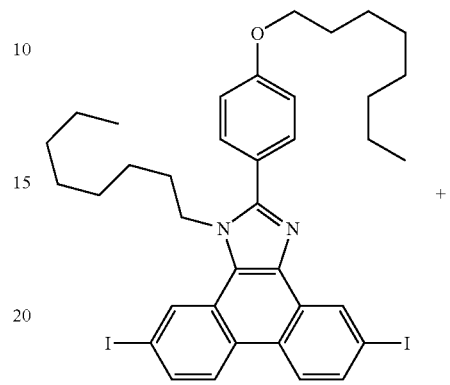

+

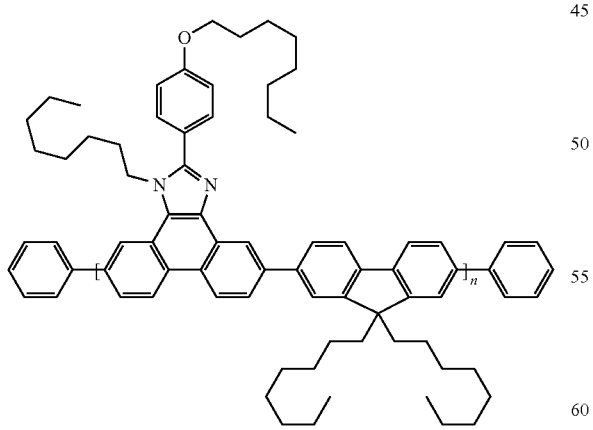

According to example 41 the above polymer is prepared, with dibromide product of example 9c, and 2,7-bis(4,4,5,5-tetramethyl-1,3,2-dioxaborolan-2-yl)-9,9-dioctylfluorene. GPC (poly-styrene standard): $M_w$=162 145 g/mol, PD=3.87; Oct=n-octyl. Photoluminescent measurements of the poly- According to example 85 the above polymer is prepared, with diiodide product of example 10c, and 2,7-bis(4,4,5,5- tetramethyl-1,3,2-dioxaborolan-2-yl)-9,9-dioctylfluorene. GPC (poly-styrene standard): $M_w$=39 438 g/mol, PD=2.23; Oct=n-octyl.

mer product have been performed as described in example 39: emission maximum at 433 nm.

Example 47

Example 48

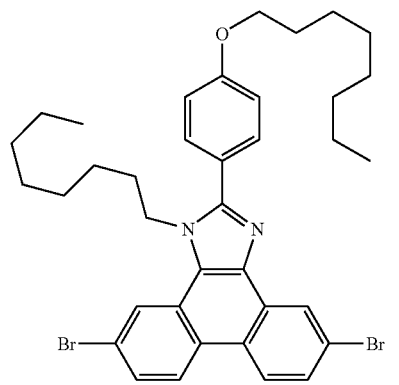

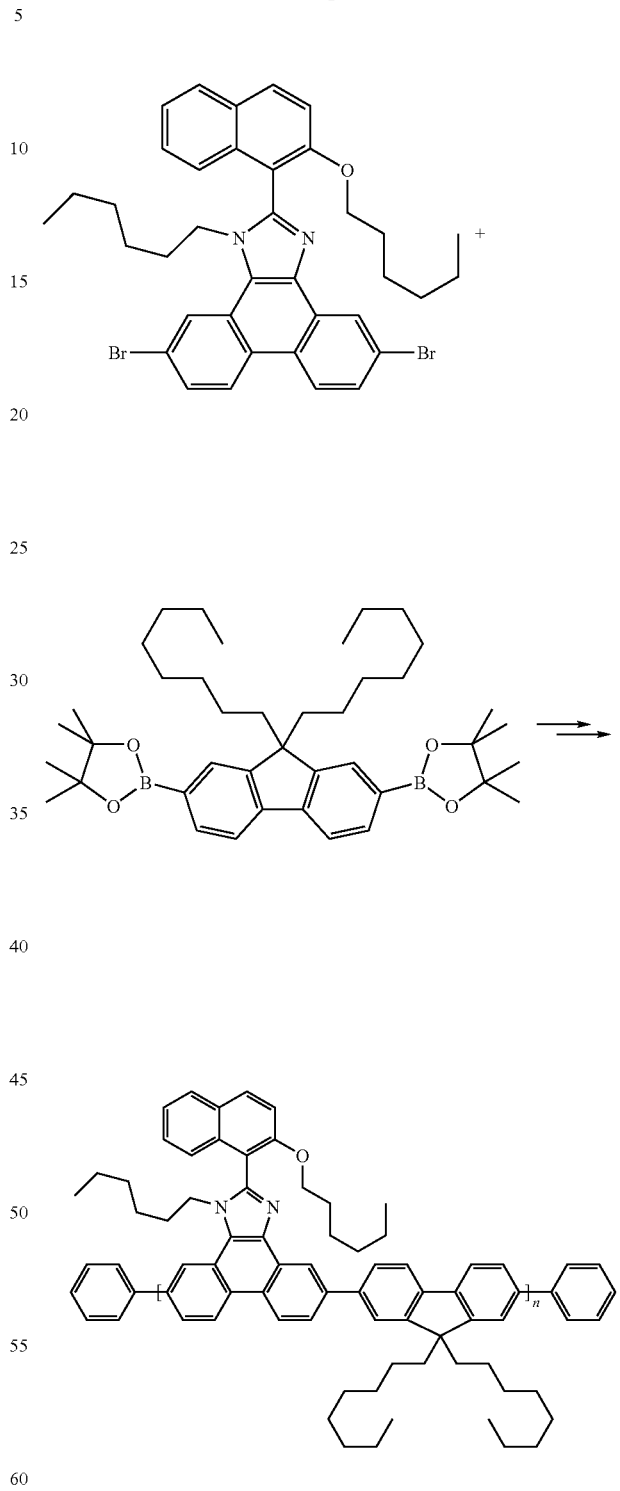

According to example 41 the above polymer is prepared, with dibromide product of example 9c, and 2,7-bis(4,4,5,5-tetramethyl-1,3,2-dioxaborolan-2-yl)-9,9-dioctylfluorene. GPC (poly-styrene standard): $M_w$=162 145 g/mol, PD=3.87; Oct=n-octyl. Photoluminescent measurements of the poly- According to example 85 the above polymer is prepared, with dibromide product of example 12b, and 2,7-bis(4,4,5,5-tetramethyl-1,3,2-dioxaborolan-2-yl)-9,9-dioctylfluorene. GPC (polystyrene standard): $M_w$=153 310 g/mol, PD=2.59; Oct=n-octyl. Photoluminescent measurements of the polymer product have been performed as described in example 39: emission maximum at 431 nm.

Example 49
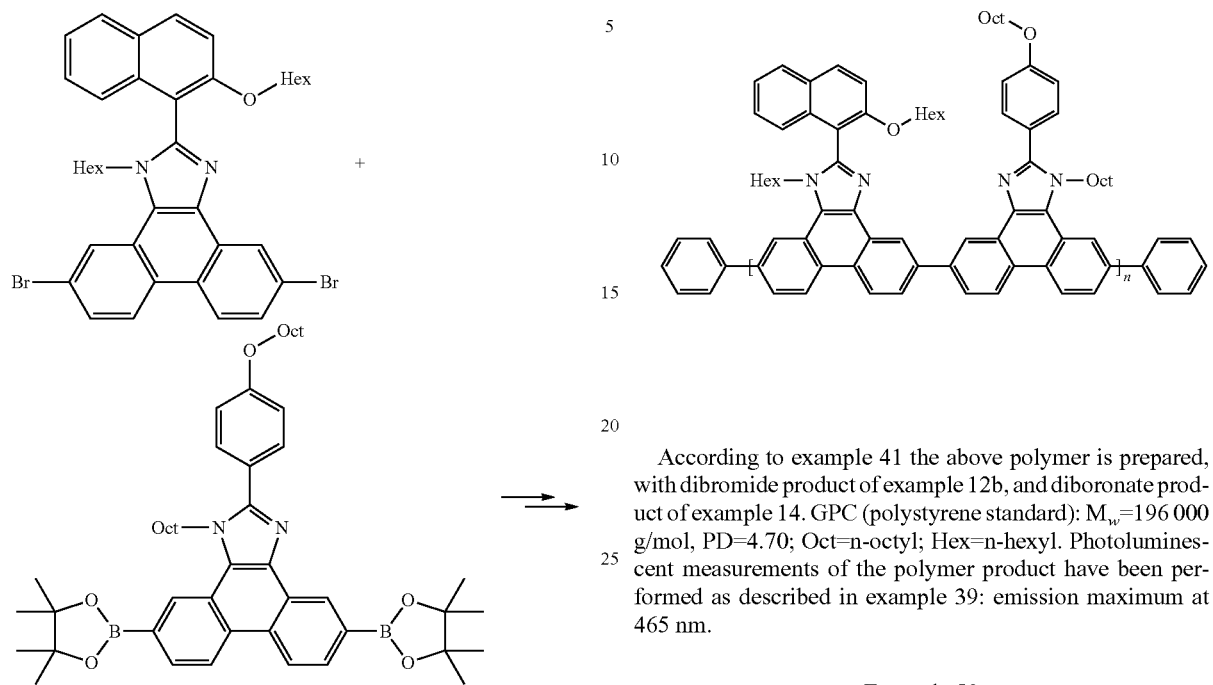
According to example 41 the above polymer is prepared, with dibromide product of example 12b, and diboronate product of example 14. GPC (polystyrene standard): $M_w$=196 000 g/mol, PD=4.70; Oct=n-octyl; Hex=n-hexyl. Photoluminescent measurements of the polymer product have been performed as described in example 39: emission maximum at 465 nm.
Example 50
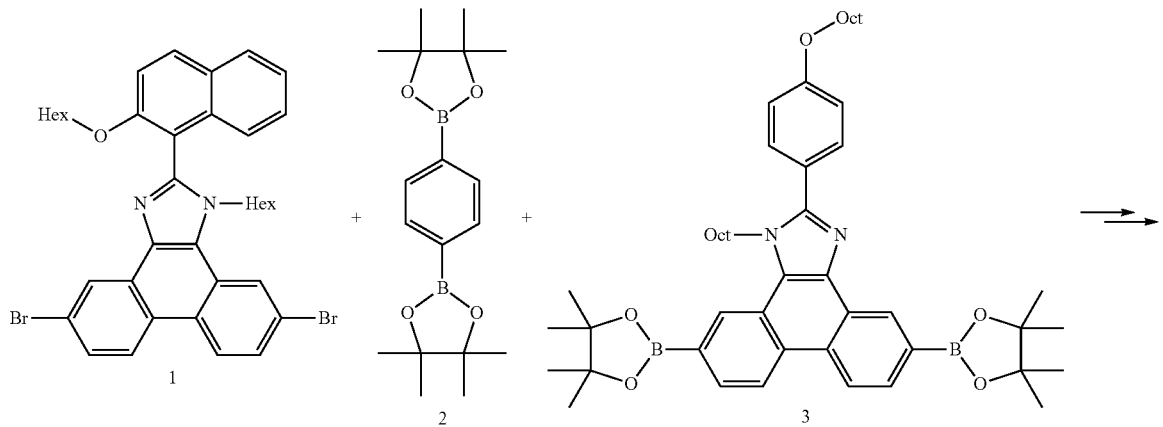
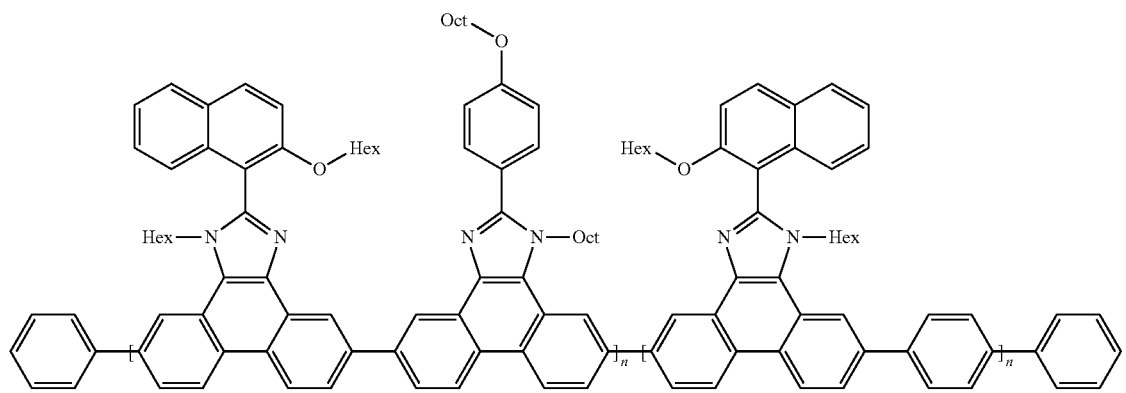

According to example 41 the above polymer is prepared, with dibromide product of example 12b (1), 1,4-bis(4,4,5,5-tetramethyl-1,3,2-dioxaborolan-2-yl)benzene (2), and diboronate product of example 14 (3). The monomers 1/2/3 are used in a ratio of 2:1:1. GPC (polystyrene standard): $M_w$=741 100 g/mol, PD=7.0; Oct=n-octyl; Hex=n-hexyl. Photo-luminescent measurements of the polymer product have been performed as described in example 39: emission maximum at 458 nm.

Example 51

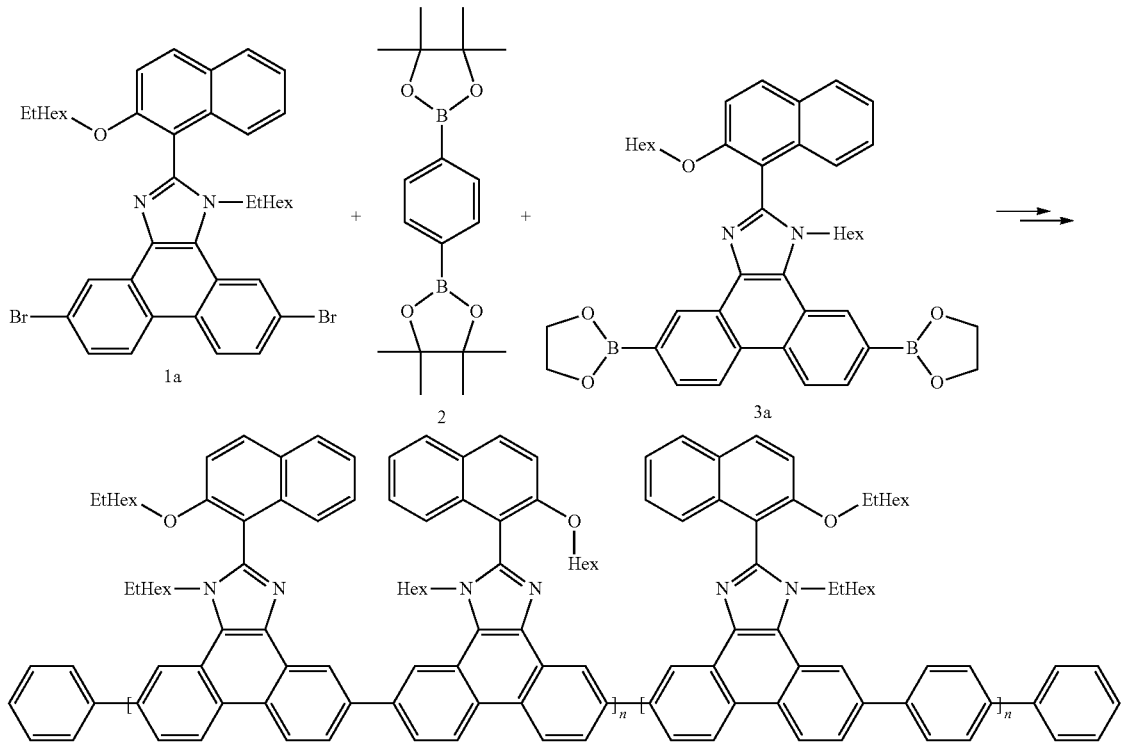

According to example 41 the above polymer is prepared, with dibromide product of example 16 (1a), 1,4-bis(4,4,5,5-tetramethyl-1,3,2-dioxaborolan-2-yl)benzene (2), and diboronate product of example 31b (3a). The monomers 1a/2/3a are used in a ratio of 2:1:1. GPC (polystyrene standard): $M_w$=53 180 g/mol, PD=2.38; EtHex=2-ethylhexyl.

Example 52

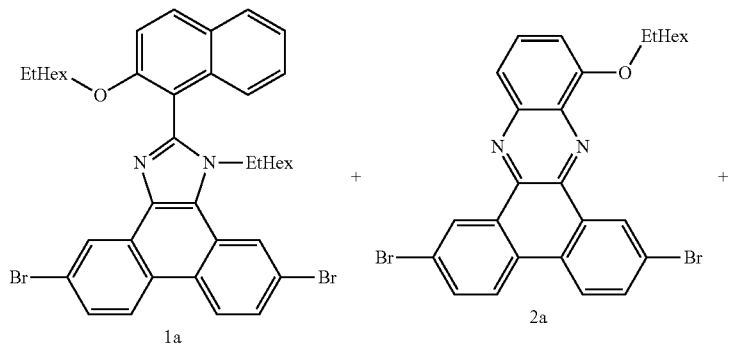

-continued

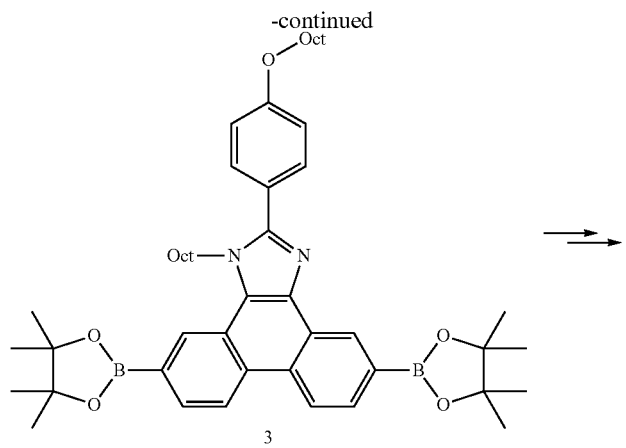

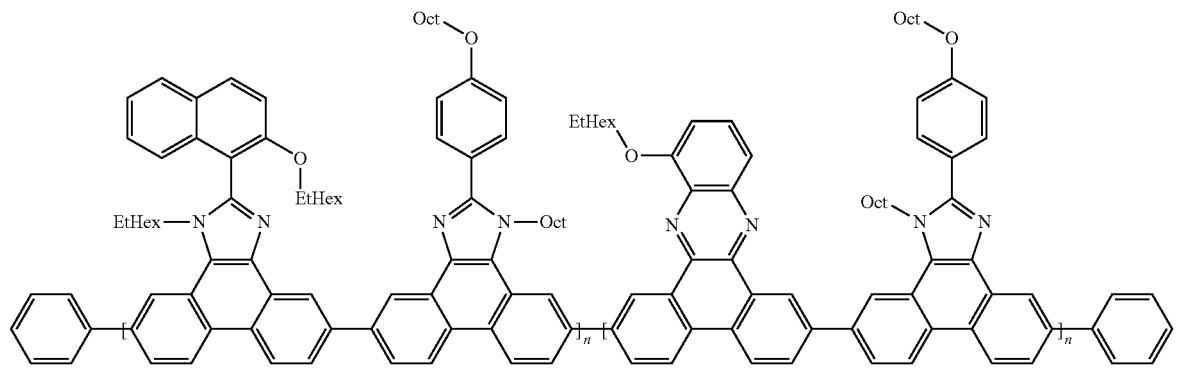

According to example 41 the above polymer is prepared, with dibromide product of example 16 (1a), dibromide product of example 36b (2a), and diboronate product of example 14 (3). The monomers 1a/2a/3 are used in a ratio of 1:1:2. GPC (polystyrene standard): $M_w$=48 558 g/mol, PD=2.00; EtHex=2-ethylhexyl; Oct=n-octyl. Photoluminescent measurements of the polymer product have been performed as described in example 39: emission maximum at 525 nm.

Example 53

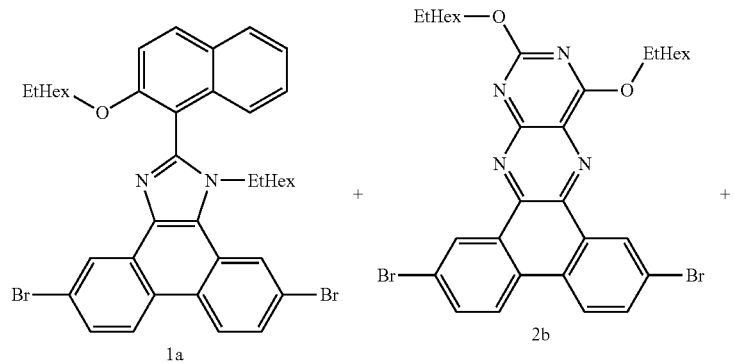

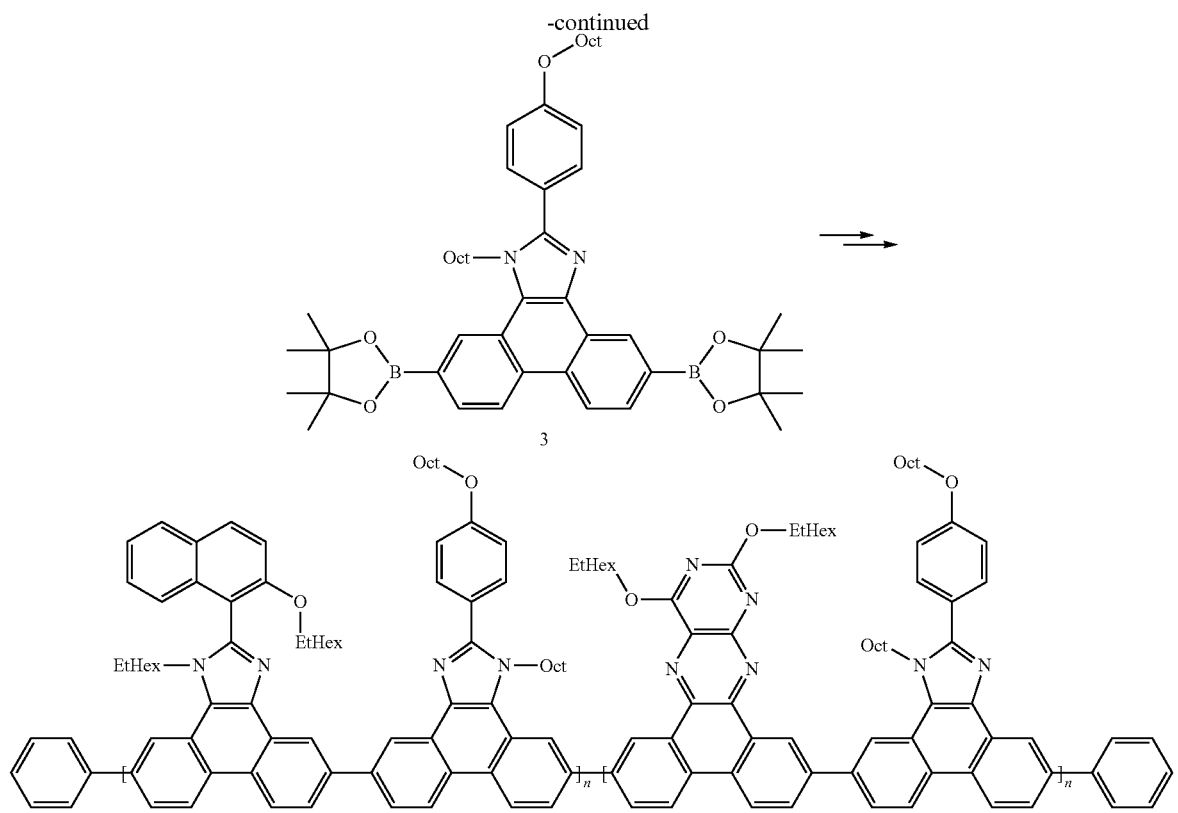

According to example 41 the above polymer is prepared, with dibromide product of example 16 (1a), dibromide product of example 37b (2b), and diboronate product of example 14 (3).

The monomers 1a/2b/3 are used in a ration of 1:1:2. GPC (polystyrene standard): $M_w$=332 100 g/mol, PD=6.10; GPC (absolute calibration): $M_w$=255 100 g/mol, PD=2.70; EtHex=2-ethylhexyl; Oct=n-octyl. Photoluminescent measurements of the polymer product have been performed as described in example 39: emission maximum at 547 nm.

Example 54

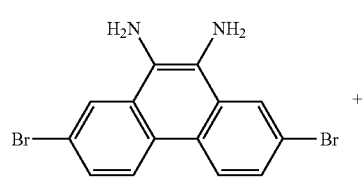

+

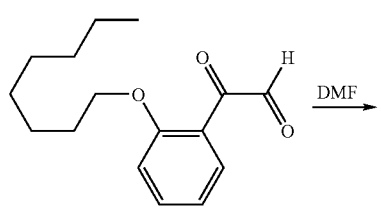

→ DMF

-continued

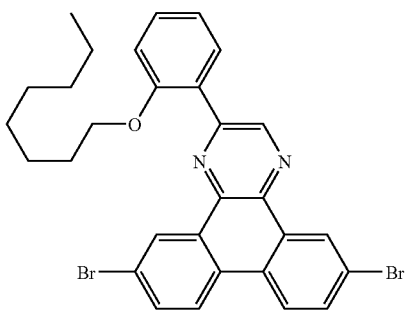

To 3.00 g (8.2 mmol) of 2,7-dibromo-phenanthrene-9,10-diamine in 50 ml of dimethylformamide are added 2.90 g (11.1 mmol) of 2-octyloxyphenylglyoxal. The reaction mixture is heated at 120° C. for 14 h, then cooled to 25° C. EtOAc (250 ml) and water (200 ml) are added, the phases separated and the organic phase washed with water (3×250 ml) and brine, dried over $Na_2SO_4$, filtered over a plug of silica and evaporated under reduced pressure. A column chromatography on silica gel (hexane/EtOAc 20:1) followed by crystallization (EtOAc) leads to the product in form of a yellow solid (yield: 19%). Melting point: 113.5-116° C.

Example 55

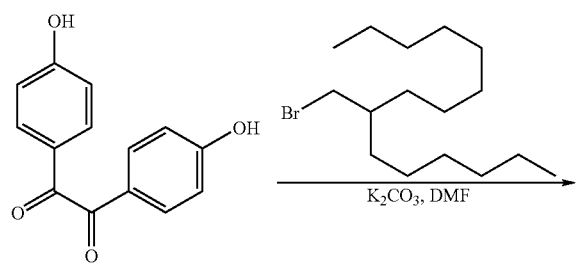

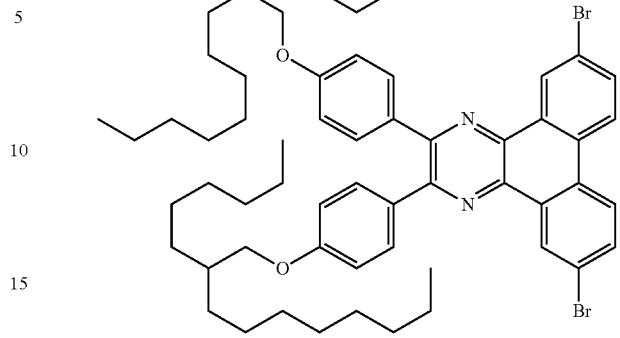

a) To 3.0 g (12.4 mmol) of 4,4'-dihydroxybenzil and 8.56 g (61.9 mmol) of potassium carbonate in dimethylformamide (30 ml) are added 11.34 g (37.2 mmol) of 1-bromo-2-hexyldecane. The reaction mixture is heated at 120° C. for 22 h, then poured into $H_2O$ and extracted with $CH_2Cl_2$. Column chromatography on silica gel (hexane/EtOAc 20:1) leads to the product in form of a yellow liquid (yield: 100%).

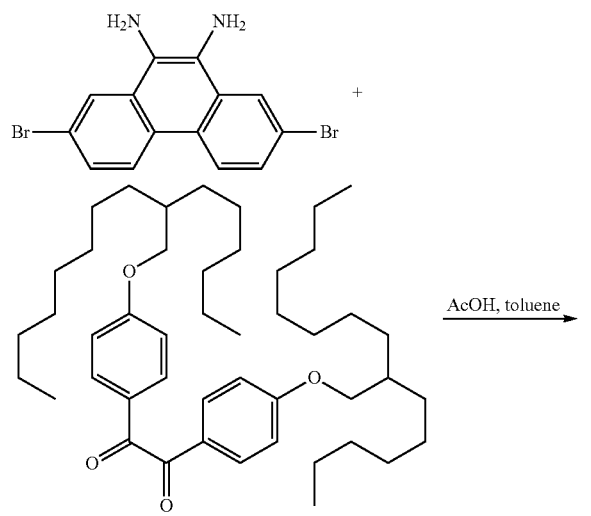

b) To 1.85 g (5.05 mmol) of 2,7-dibromo-phenanthrene-9,10-diamine in 50 ml of AcOH and 25 ml of toluene is added 4.19 g (6.06 mmol) of 4,4'-bis-(2-hexyldecyloxy)benzil. The reaction mixture is heated under reflux for 18 h, and then the solvents are evaporated under reduced pressure. Column chromatography on silica gel (hexane/EtOAc 30:1) followed by trituration (EtOH) leads to the product in form of a yellow solid (yield: 75%). Melting point: 66-67° C.

Example 56

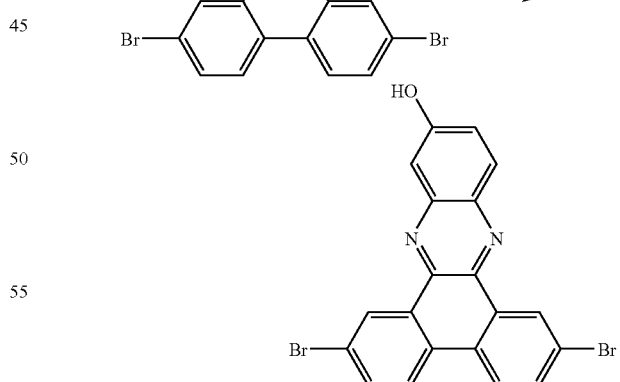

a) To a suspension of 10.98 g (30.0 mmol) of 2,7-dibromophenanthrene-9,10-quinone in EtOH (250 ml), 4.47 g (36.0 mmol) of 3,4-diaminophenol are added. The reaction mixture is stirred under reflux for 3 h, then water (100 ml) is added and the reaction mixture is cooled to room temperature, filtered and washed with EtOH to afford the product as an olive-green solid (yield: 87%).

131

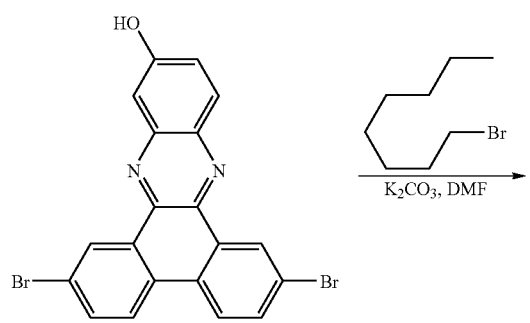

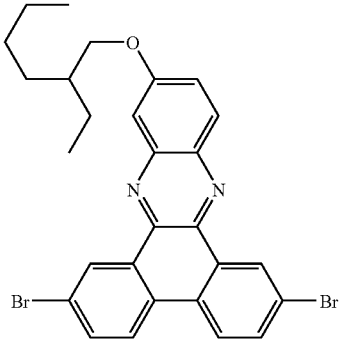

To 6.81 g (15 mmol) of the product of example 56a, 4.35 g (22.5 mmol) of 1-bromo-2-ethylhexane, 6.22 g (45 mmol) of potassium carbonate and 100 ml of dimethylformamide are added. The reaction mixture is stirred under nitrogen at 120° C. After 3.5 h water (150 ml) is added, the mixture cooled to room temperature and filtered. The crude product is purified by recrystallization from dimethylformamide and hexane/toluene to give a yellow-brown solid (yield: 55%). Melting point: 146.5-148° C.

Example 58

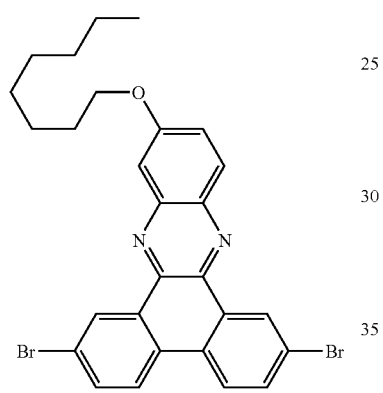

b) To 0.23 g (0.50 mmol) of the product of example 56a, 0.14 g (0.75 mmol) of 1-bromooctane, 0.21 g (1.50 mmol) of potassium carbonate and 5 ml dimethylformamide are added. The reaction mixture is stirred under nitrogen at 120° C. After two hours, EtOH (20 ml) and water (20 ml) are added, the mixture cooled to room temperature and filtered to yield the product as a brown solid (yield: 88%). Melting point 150-152° C.

Example 57

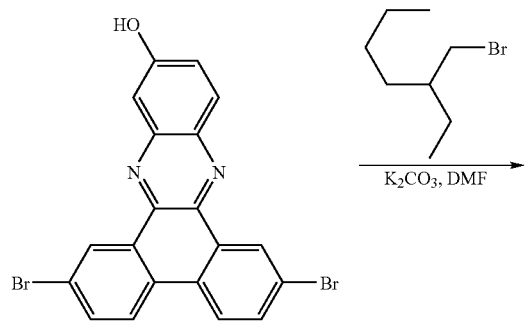

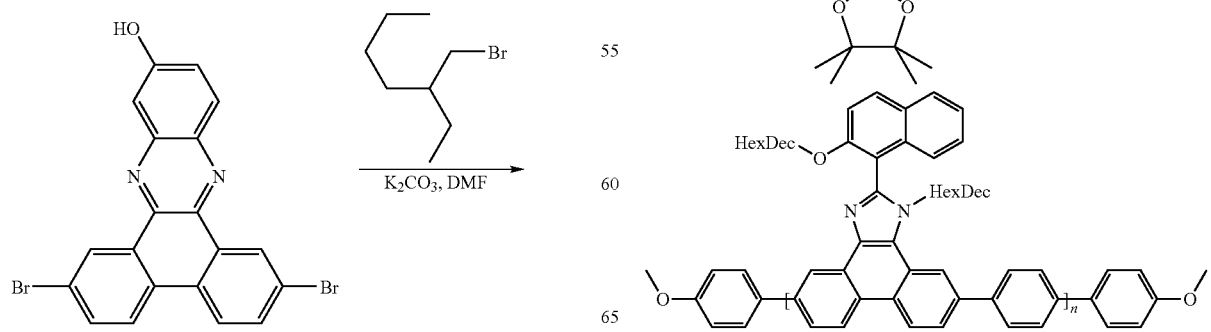

The above polymer is prepared according to example 41, with dibromide product of example 17, and 1,4-bis(4,4,5,5-tetramethyl-1,3,2-dioxaborolan-2-yl)benzene. 1,4-bis-(4,4,5,5-tetramethyl-1,3,2-dioxaborolan-2-yl)benzene. 2-(4-methoxyphenyl)-4,4,5,5-tetra-methyl-1,3,2-dioxaborolane. and 4-methoxyphenyl-bromide have been used as end-capping reagents. GPC (polystyrene standard): $M_w$=250 200 g/mol, PD=4.3; GPC (absolute calibration): $M_w$=165 300 g/mol, PD=2.9; HexDec=2-hexyldecyl. Photoluminescent measurements of the polymer product have been performed as described in example 39: emission maximum at 439 nm.

Example 59

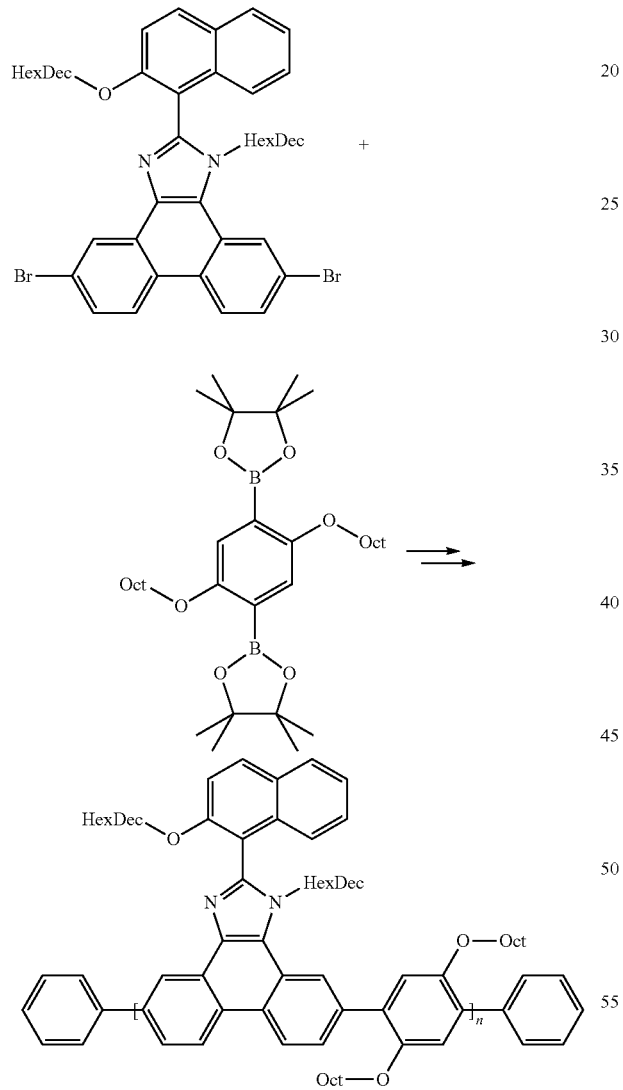

The above polymer is prepared according to example 41, with dibromide product of example 17, and 1,4-bis[4,4,5,5-tetramethyl-(1,3,2)dioxaborolan-2-yl]-2,5-dioctyloxyphenylene (CAS 457931-26-9). GPC (polystyrene standard): $M_w$=100 000 g/mol, PD=2.1; GPC (absolute calibration): $M_w$=42 700 g/mol, PD=1.7; HexDec=2-hexyldecyl. $M_w$=165 300 g/mol, PD=2.9; HexDec=2-hexyldecyl. Photoluminescent measurements of the polymer product have been performed as described in example 39: emission maximum at 423 nm.

Example 60

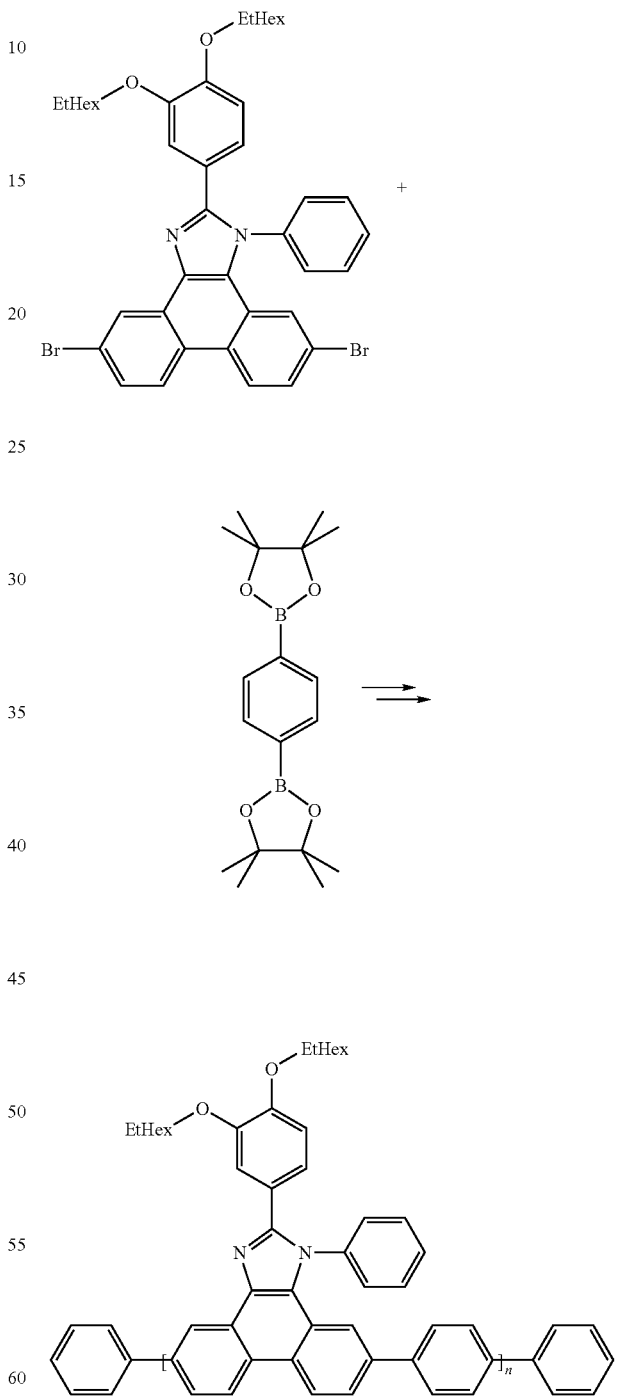

The above polymer is prepared according to example 41, with dibromide product of example 28, and 1,4-bis(4,4,5,5-tetramethyl-1,3,2-dioxaborolan-2-yl)benzene. GPC (absolute calibration): $M_w$=1 061 000 g/mol, PD=1.9; EtHex=2-ethylhexyl. Photoluminescent measurements of the polymer product have been performed as described in example 39: emission maximum at 471 nm.

Example 61

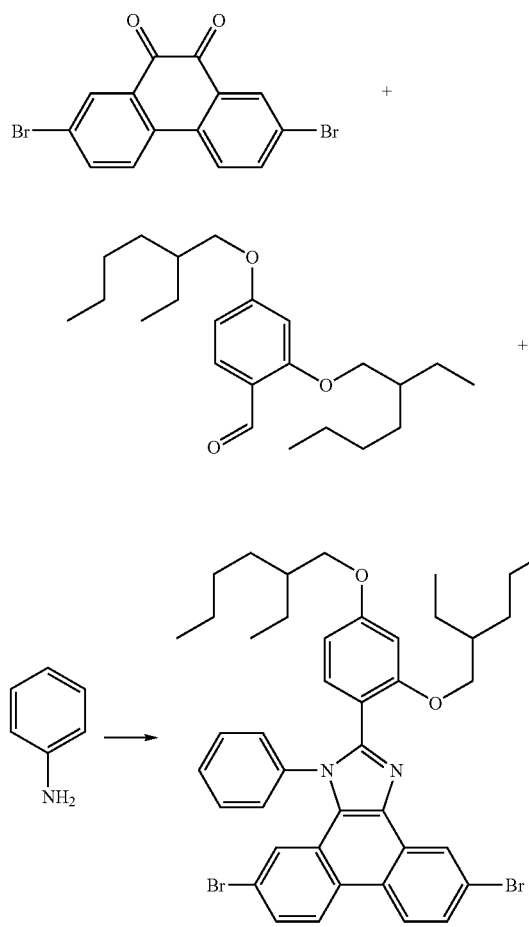

The product is prepared according to example 28b (yield: 34%).

Example 62

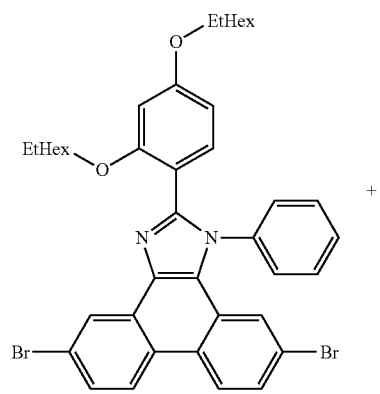

+

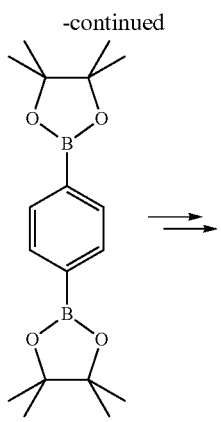

→

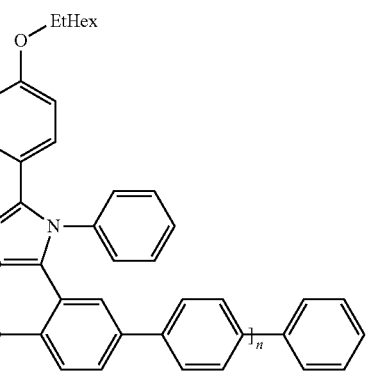

The above polymer is prepared according to example 41, with dibromide product of example 61, and 1,4-bis(4,4,5,5-tetramethyl-1,3,2-dioxaborolan-2-yl)benzene. GPC (absolute calibration): $M_w$=560 000 g/mol, PD=2.4; EtHex=2-ethylhexyl. Photoluminescent measurements of the polymer product have been performed as described in example 39: emission maximum at 459 nm.

Example 63

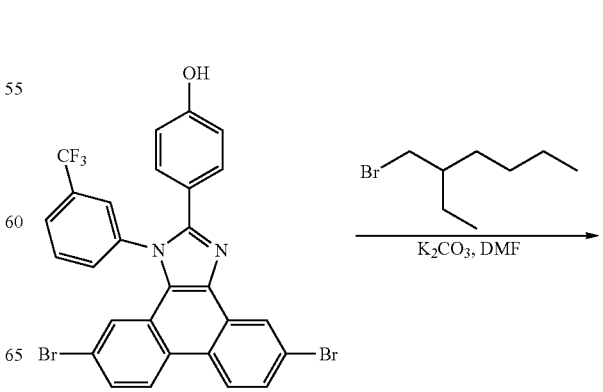

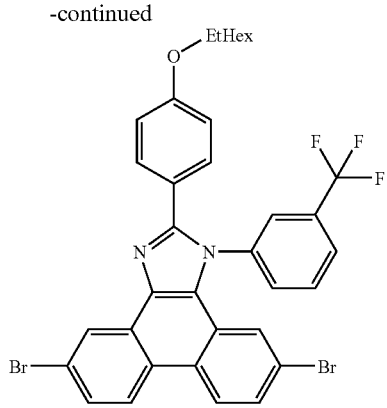

The product is prepared according to example 32b (yield: 45%). Melting point: 144-145° C.; EtHex=2-ethylhexyl.

Example 64

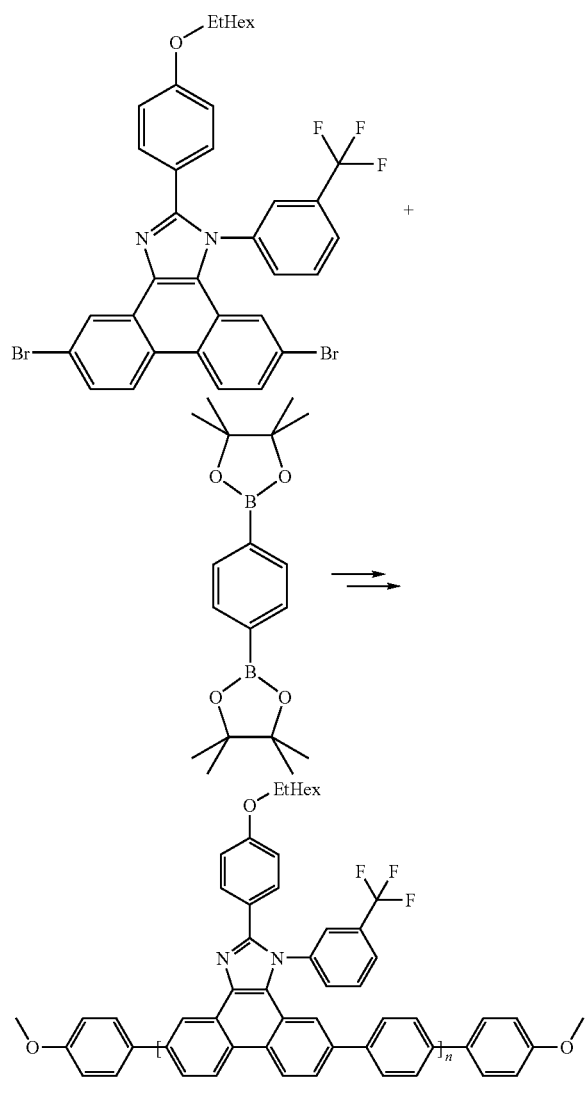

The above polymer is prepared according to example 41, with dibromide product of example 63, and 1,4-bis(4,4,5,5-tetramethyl-1,3,2-dioxaborolan-2-yl)benzene. 2-(4-methoxy-phenyl)-4,4,5,5-tetramethyl-1,3,2-dioxaborolane. and 4-methoxyphenyl-bromide have been used as end-capping reagents. GPC (absolute calibration): $M_w$=1 794 000 g/mol, PD=2.5; EtHex=2-ethylhexyl. Photoluminescent measurements of the polymer product have been performed as described in example 39: emission maximum at 472 nm.

Example 65

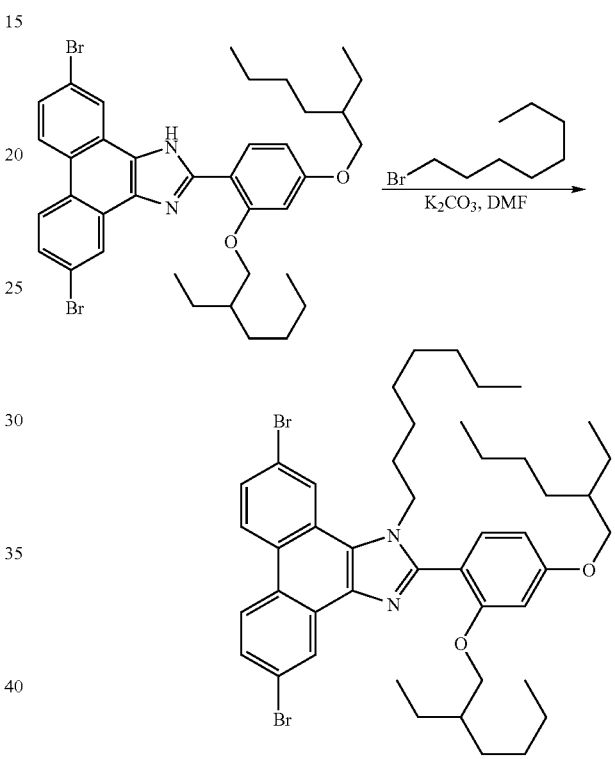

The product is prepared according to example 27, giving the product as an oil (yield: 26%).

Example 66

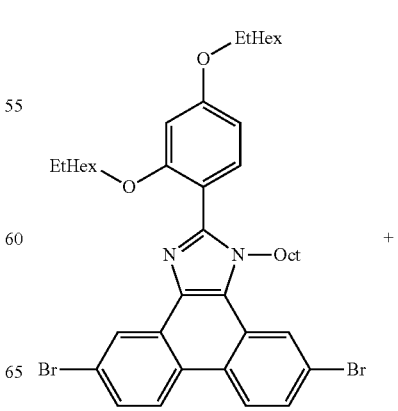

-continued

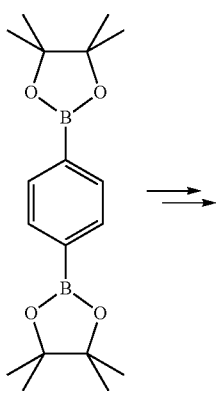

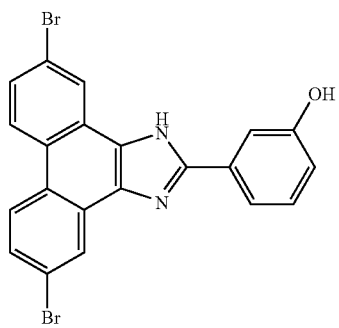

a) The product is prepared according to example 9b (yield: 100%).

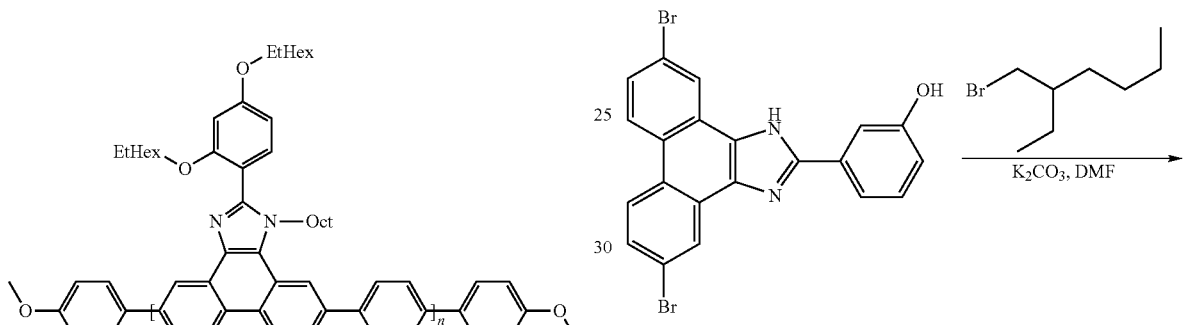

The above polymer is prepared according to example 41, with dibromide product of example 65, and 1,4-bis(4,4,5,5-tetramethyl-1,3,2-dioxaborolan-2-yl)benzene. 2-(4-methoxy-phenyl)-4,4,5,5-tetramethyl-1,3,2-dioxaborolane and 4-methoxyphenyl-bromide have been used as end-capping reagents. GPC (absolute calibration): $M_w$=604 000 g/mol, PD=2.10; EtHex=2-ethylhexyl. Photoluminescent measurements of the polymer product have been performed as described in example 39: emission maximum at 435 nm.

Example 67

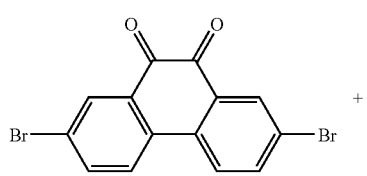

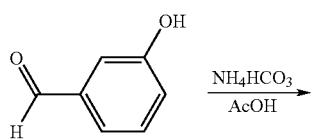

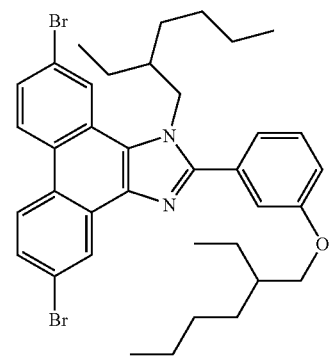

b) The product is prepared according to example 9c, giving the product as an oil (yield: 84%).

Example 68

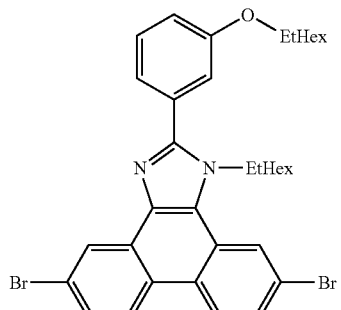

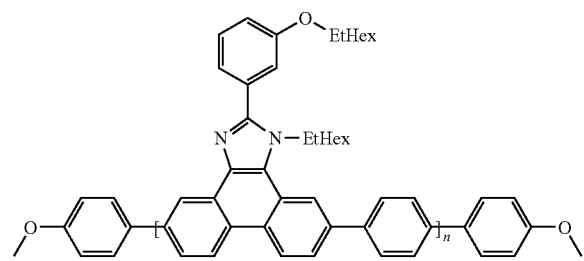

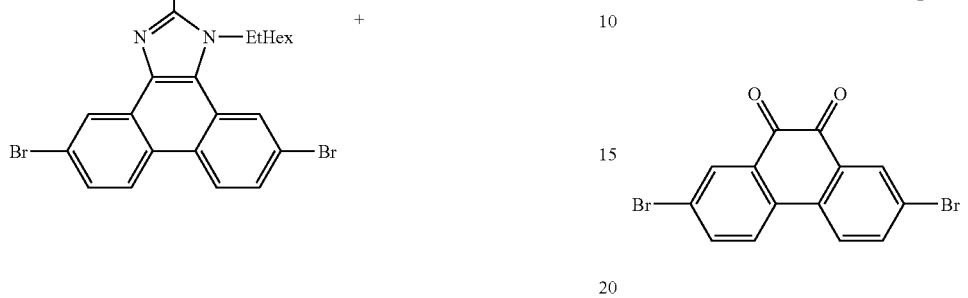

The above polymer is prepared according to example 41, with dibromide product of example 67, and 1,4-bis(4,4,5,5-tetramethyl-1,3,2-dioxaborolan-2-yl)benzene. 2-(4-methoxy-phenyl)-4,4,5,5-tetramethyl-1,3,2-dioxaborolane. and 4-methoxyphenyl-bromide have been used as end-capping reagents. GPC (absolute calibration): $M_w$=1 108 000 g/mol, PD=2.1; EtHex=2-ethylhexyl. Photoluminescent measurements of the polymer product have been performed as described in example 39: emission maximum at 460 nm.

Example 69

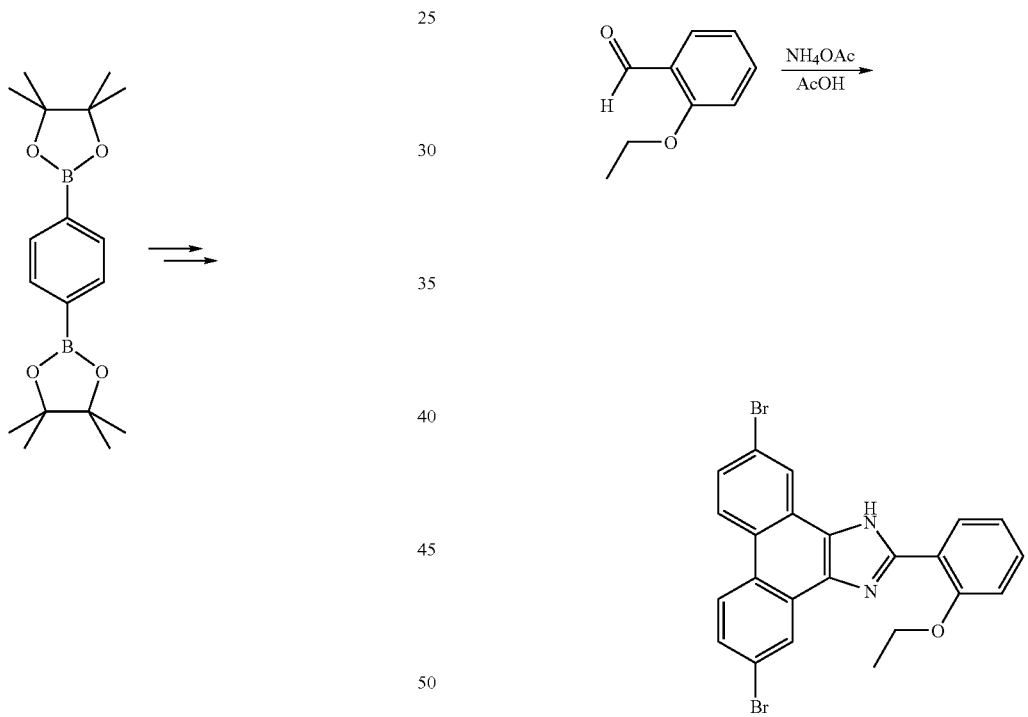

To a suspension of 21.9 g (55.0 mmol) of 2,7-dibromophenanthrene-9,10-quinone in 150 ml of acetic acid are added 12.8 g (82.5 mmol) of 2-ethoxybenzaldehyde and 43.7 g (0.55 mol) of ammonium acetate under a nitrogen atmosphere. The red suspension is heated under reflux for 22 h. The resulting beige suspension is filtered and the solid washed with acetic acid, providing the crude product as a beige solid. The wet product is decoted under reflux with 150 ml of acetic acid for 30 min. The suspension is cooled down to room temperature, filtered and decocted again in 100 ml of acetic acid. The suspension is filtered and the resulting solid washed with acetic acid and ethanol, and then dried under vacuum at 60° C. 27.0 g of the title compound are obtained as a beige solid (yield: 96%).

The compounds shown in the table below are prepared in analogy to the examples described above:
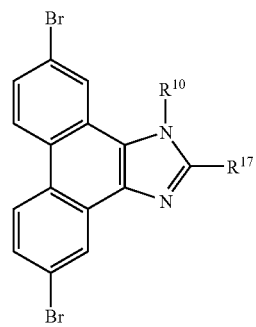
| Example | R[10] | R[17] | Yield [%] | Melting Point [° C.] |
|---|---|---|---|---|
| 70 | 4-(2-ethylhexyloxy)phenyl | 2-ethylhexyl | 80 | 105-108 |
| 71 | 4-(2-hexyldecyloxy)phenyl | 2-hexyldecyl | 55 | light yellow, viscous oil |
| 72 | naphthyl-O-(2-hexyldecyl) | 2-hexyldecyl | 89 | light yellow, viscous oil |
| 73 | 2-ethoxyphenyl | 1-octyl | 67 | 100-103 |
| 74 | fluorenyl | H | quantitative | yellow solid >300 |

| | | | | |
|---|---|---|---|---|
| 75 |  | H | 84 | white solid 270-273 |
| 76 | 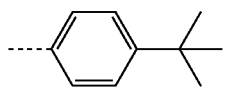 | H | quantitative | white solid >300 |
| 77 | 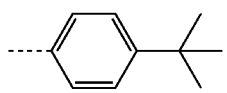 | 1-octyl | 47 | light yellow solid 114.5-116 |
| 78 | 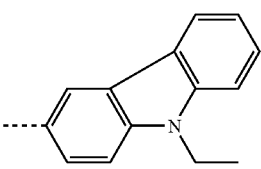 | H | 99 | light grey solid >300 |
| 79 | 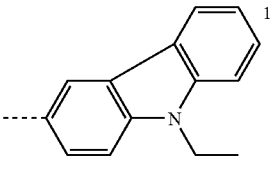 | 1-octyl | 20 | white solid 165-168 |
| 80 | 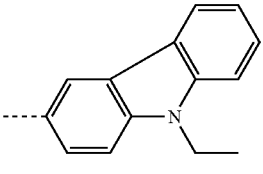 | 2-ethylhexyl | 82 | yellow viscous oil |
| 81 | 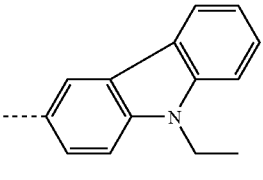 | 2-hexyldecyl | 56 | yellow slightly viscous solid |
| 82 | 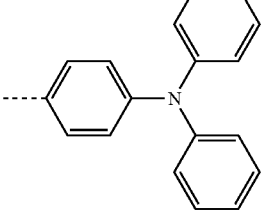 | H | quantitative | light beige solid >300 |
| 83 | 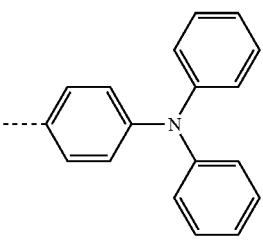 | 2-ethylhexyl | 78 | light beige solid 70-73 |

| 84 | 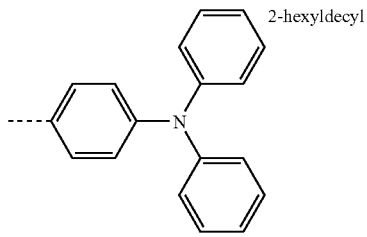 | 2-hexyldecyl | 57 | light yellow viscous oil, which solidifies upon standing |

Example 85

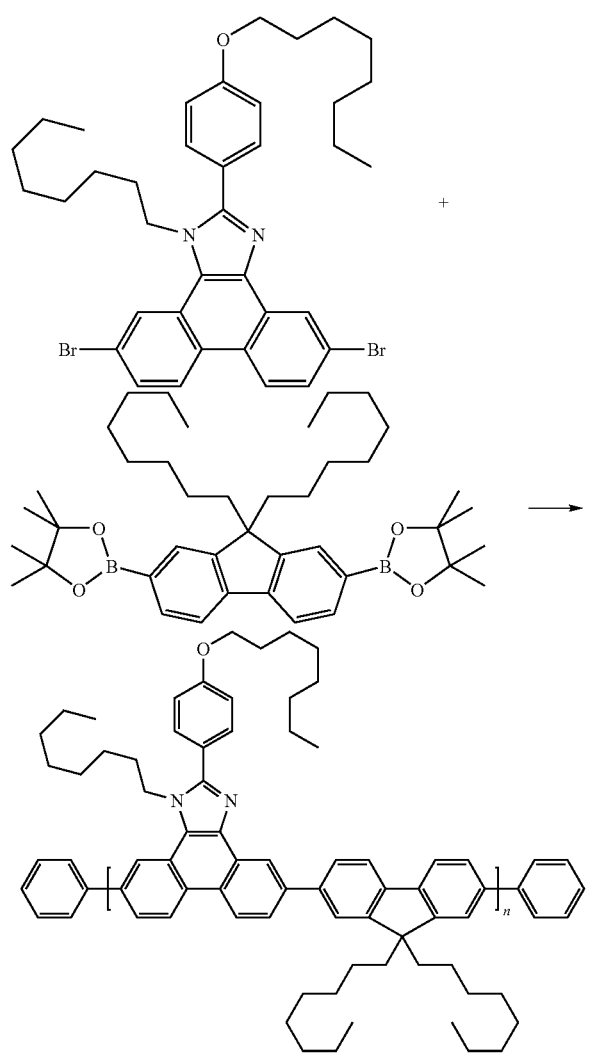

a) 1.0590 g (1.53 mmol) of the dibromide product of example 9c and 1.0000 g (1.56 mmol,) of 2,7-bis(4,4,5,5-tetramethyl-1,3,2-dioxaborolan-2-yl)-9,9-dioctylfluorene are placed under argon atmosphere in a dry Schlenk tube in 15 ml of dioxane and 5 ml of toluene. The solution is degassed with argon. 28.5 mg (0.094 mmol) of tri(o-tolyl)phosphine are added and the reaction mixture is degassed. 3.5 mg (0.016 mmol) of palladium(II)acetate are added and the reaction mixture is degassed. A solution of 1.89 g (7.80 mmol, 5.0 equiv.) of potassium phosphate tribasic monohydrate and 3 ml of water is degassed and added to the reaction mixture. The resulting suspension is heated at 90° C. oil bath temperature. An increase of viscosity of the reaction mixture with the appearance of a bluish fluorescence is observed after two hours. Additional amounts of degassed toluene are added to decrease the viscosity. After 20 h the oil bath temperature is increased up to 100° C. 367 mg (2.34 mmol,) of degassed bromobenzene are added and the reaction mixture is heated for two hours. A degassed solution of 796 mg (3.89 mmol) of 4,4,5,5-tetramethyl-2-phenyl-1,3,2-dioxaborolane in 3 ml toluene is added. The reaction mixture is heated for two hours, cooled to room temperature, and diluted with 65 ml of toluene. 32 ml of 1% aqueous NaCN solution are added and the mixture is stirred during three hours at room temperature. The organic phase is washed three times with 100 ml water, and the collected water phases two times with 100 ml toluene. The combined organic phases are concentrated under vacuum until 65 ml are left. The resulting solution is poured into 160 ml of methanol. The polymer is filtered off and dissolved in 190 ml of THF. The solution is poured into 380 ml of methanol and the polymer filtered off, giving 1.33 g of a yellow solid. GPC (polystyrene standard): $M_w$=223 765 g/mol, PD=2.37.

Example 86

The copolymerization reaction is performed according to example 85, except that the oil bath temperature is 110° C. instead of 90° C. 1.42 g of a yellow solid are obtained. GPC (polystyrene standard): $M_w$=136 477 g/mol, PD=2.71.

Example 87

The copolymerization reaction is performed according to example 85, except that 0.01 equivalents of allyl(triisopropylphosphine)palladium bromide (CAS 244159-80-6) are used instead of tri(o-tolyl)phosphine/palladium(II)acetate, 5.0 equivalents of potassium carbonate are used instead of potassium phosphate tribasic monohydrate, and the oil bath temperature is 120° C. instead of 90° C. 1.54 g of a yellow solid are obtained. GPC (polystyrene standard): $M_w$=159 393 g/mol, PD=2.43.

The polymers shown in the table below are prepared in analogy to the examples described above:

| Example | R¹⁰ | R¹⁷ | M_w [g/mol, GPC] | PD |
|---|---|---|---|---|
| 88 | 4-(2-ethylhexyloxy)phenyl | 2-ethylhexyl | 171224 | 3.81 |
| 89 | 4-tert-butylphenyl | 1-octyl | 184764 | 3.75 |
| 90 | 1-(hexyloxy)naphth-2-yl | 1-hexyl | 138987 | 3.03 |
| 91 | 1-(2-ethylhexyloxy)naphth-2-yl | 2-ethylhexyl | 74866 | 2.94 |
| 92 | 2-(octyloxy)phenyl | 1-octyl | 151200 | 2.46 |

Photoluminescent measurements of the polymer products have been performed as described in example 39: emission maximum at 428 nm for 90, 424 nm for 91, and 430 nm for 92.

Example 93

151

-continued

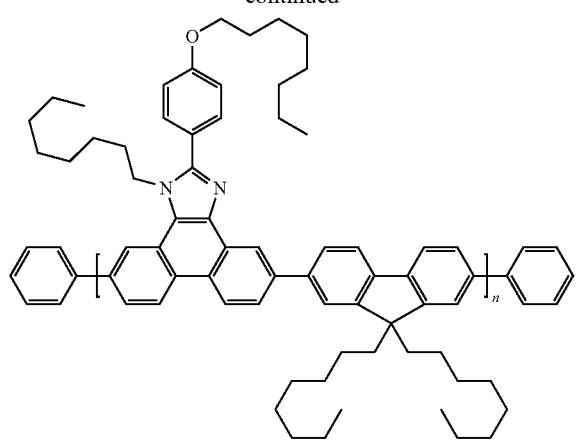

The copolymerization reaction has been performed according to the procedure of example 85, with 1.0 equivalents of the diiodide product of example 11 and 1.0 equivalents of 2,7-bis-(4,4,5,5-tetramethyl-1,3,2-dioxaborolan-2-yl)-9,9-dioctylfluorene. A yellow solid is obtained. GPC (polystyrene standard): $M_w$=83 917 g/mol, PD=2.78. Photoluminescent measurements of the polymer product have been performed as described in example 39: emission maximum at 433 nm.

Example 94

152

-continued

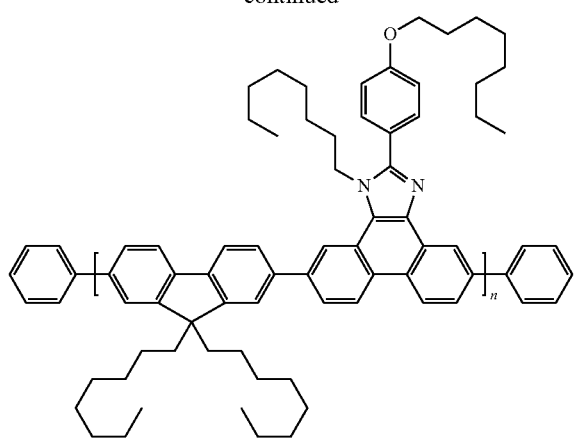

The copolymerization reaction has been performed according to the procedure of example 85, with 1.0 equivalents of 9,9-dioctyl-2,7-dibromofluorene and 1.0 equivalents of the diboronate product of example 14. A yellow solid is obtained. GPC (polystyrene standard): $M_w$=62 674 g/mol, PD=2.99. Photoluminescent measurements of the polymer product have been performed as described in example 39: emission maximum at 434 nm.

Example 95

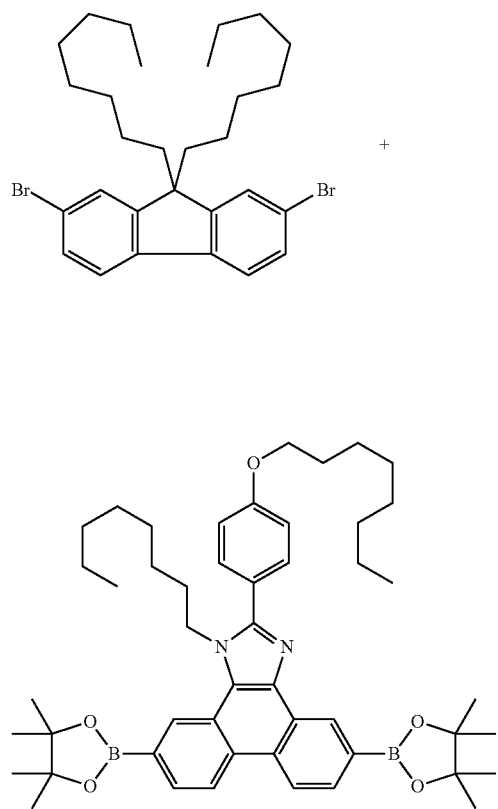

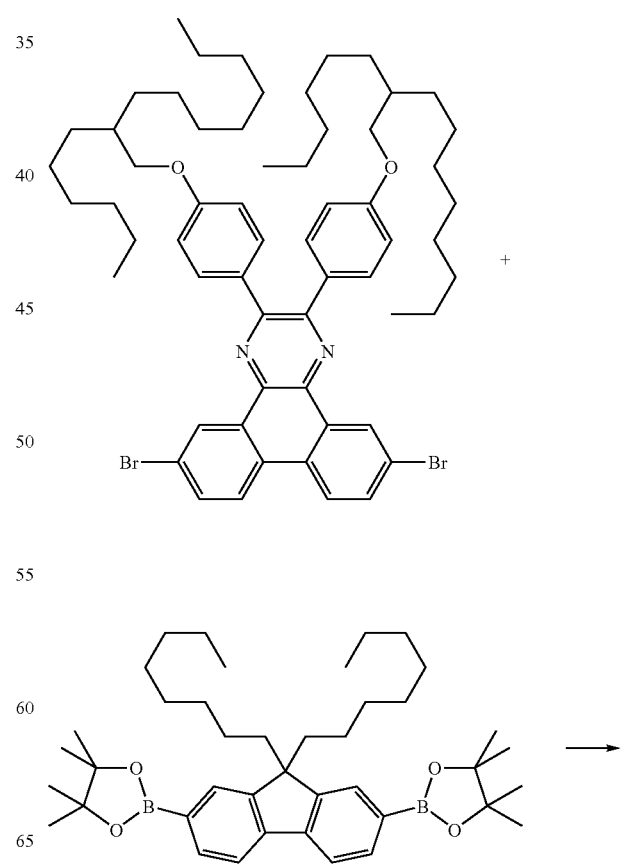

-continued

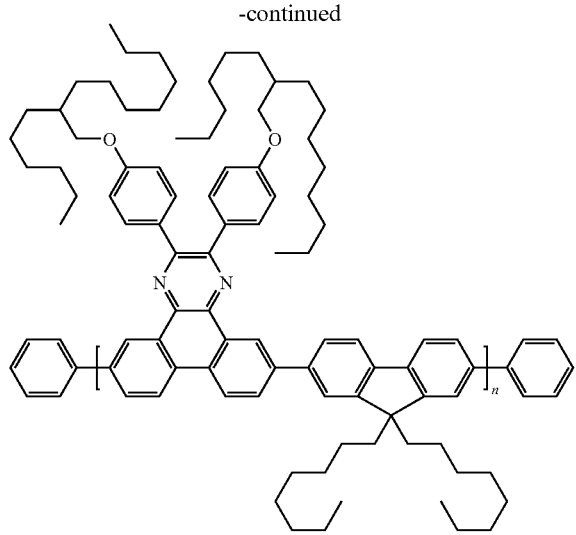

The copolymerization reaction is performed according to the procedure of example 85, with 1.0 equivalents of the dibromide product of example 55b and 1.0 equivalents of 2,7-bis-(4,4,5,5-tetramethyl-1,3,2-dioxaborolan-2-yl)-9,9-dioctylfluorene. A yellow solid is obtained. GPC (polystyrene standard): $M_w$=20 174 g/mol, PD=2.80.

Example 96

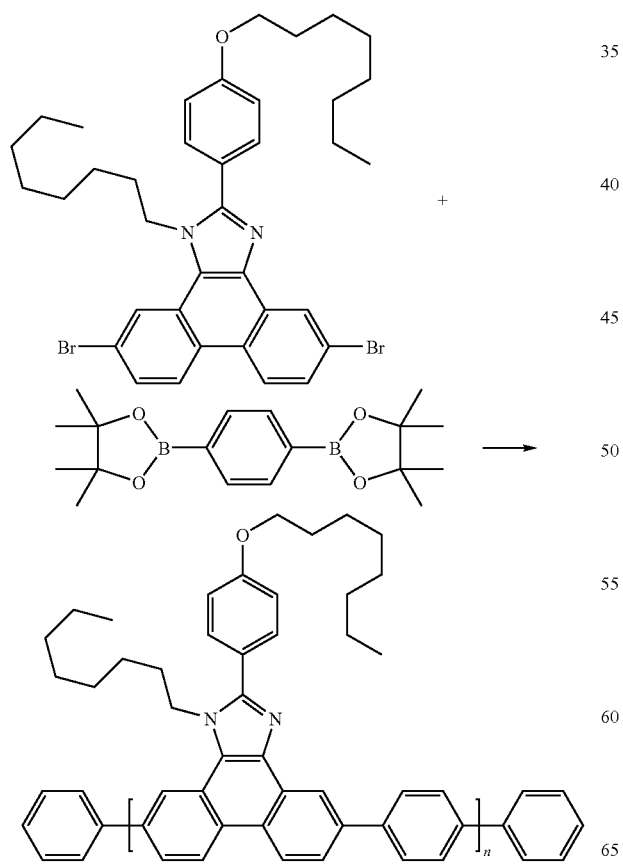

The copolymerization reaction is performed according to the procedure of example 85, with 1.0 equivalents of the dibromide product of example 9c and 1.0 equivalents of 1,4-bis(4,4,5,5-tetramethyl-1,3,2-dioxaborolan-2-yl)benzene. A yellow solid is obtained. GPC (polystyrene standard): $M_w$=51 760 g/mol, PD=2.15.

Example 97

The copolymerization reaction is performed according to the procedure of example 96, except that 5.0 equivalents of potassium carbonate are used instead of potassium phosphate tribasic monohydrate, and the oil bath temperature is 120° C. instead of 90° C. A yellow solid is obtained with $M_w$=50 982, PD=2.14.

Example 98

The copolymerization reaction is performed according to the procedure of example 96, except that 0.01 equivalents of allyl(triisopropylphosphine)palladium bromide (CAS 244159-80-6) are used instead of tri(o-tolyl)phosphine/palladium(II)acetate, 5.0 equivalents of cesium carbonate are used instead of potassium phosphate tribasic monohydrate, and the oil bath temperature is 120° C. instead of 90° C. A yellow solid is obtained. GPC (polystyrene standard): $M_w$=14 535, PD=1.28.

Example 98

The copolymerization reaction is performed according to the procedure of example 96, except that 0.01 equivalents of 2-(dimethylamino)-2-biphenyl-palladium(II)-chlorid dinorbornylphosphin-complex (CAS 359803-53-5) are used instead of tri(o-tolyl)phosphine/palladium(II)acetate, 5.0 equivalents of cesium carbonate are used instead of potassium phosphate tribasic monohydrate, 15 ml toluene and 0.27 g of Aliquat® 336 are used instead of dioxane and 3 ml of water, and the oil bath temperature is 120° C. instead of 90° C. A yellow solid is obtained. GPC (polystyrene standard): $M_w$=48 804, PD=1.86.

Example 100

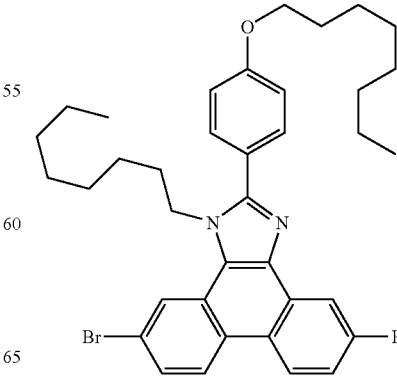

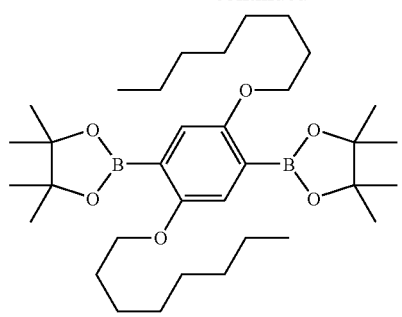

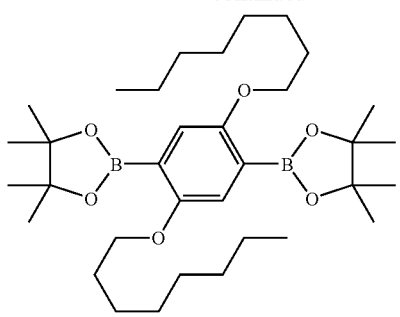

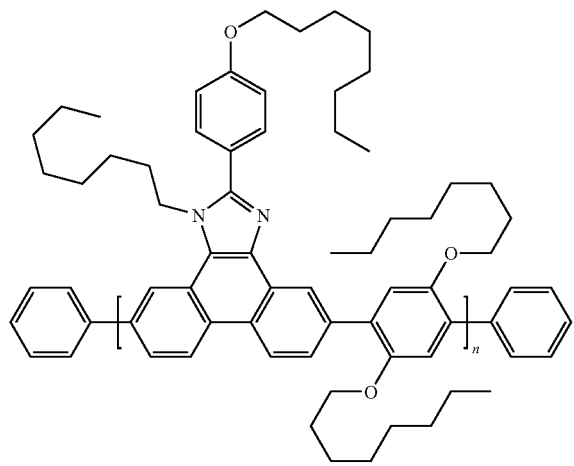

The copolymerization reaction is performed according to the procedure of example 85, with 1.0 equivalents of the dibromide product of example 9c and 1.0 equivalents of 1,4-bis[4,4,5,5-tetramethyl-(1,3,2)dioxaborolan-2-yl]-2,5-dioctyloxyphenylene (CAS 457931-26-9). A yellow solid is obtained. GPC (polystyrene standard): $M_w$=84 017, PD=4.58. Photo-luminescent measurements of the polymer product have been performed as described in example 39: emission maximum at 435 nm.

Example 101

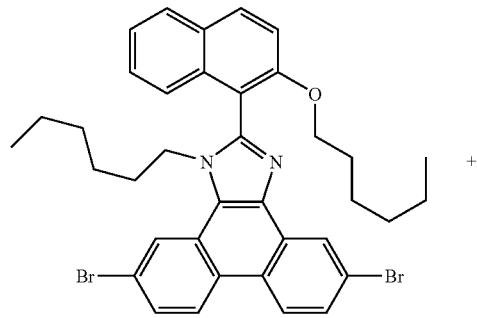

The copolymerization reaction has been performed according to the procedure of example 85, with 1.0 equivalents of the dibromide product of example 12b and 1.0 equivalents of 1,4-bis[4,4,5,5-tetramethyl-(1,3,2)dioxaborolan-2-yl]-2,5-dioctyloxyphenylene (CAS 457931-26-9). A yellow solid is obtained. GPC (polystyrene standard): $M_w$=46 509, PD=2.82. Photo-luminescent measurements of the polymer product have been performed as described in example 39: emission maximum at 430 nm.

Example 102

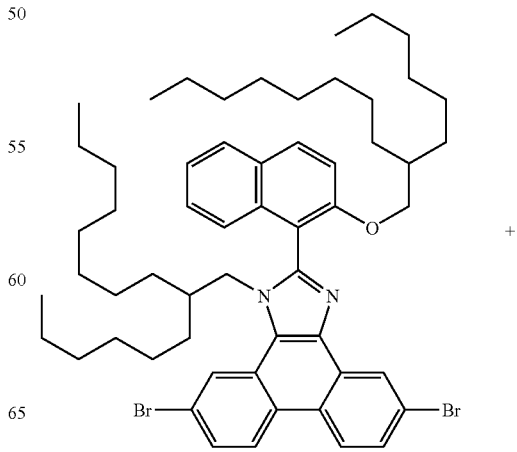

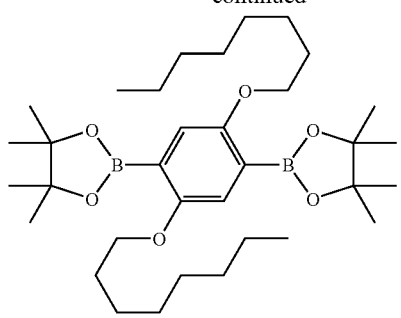

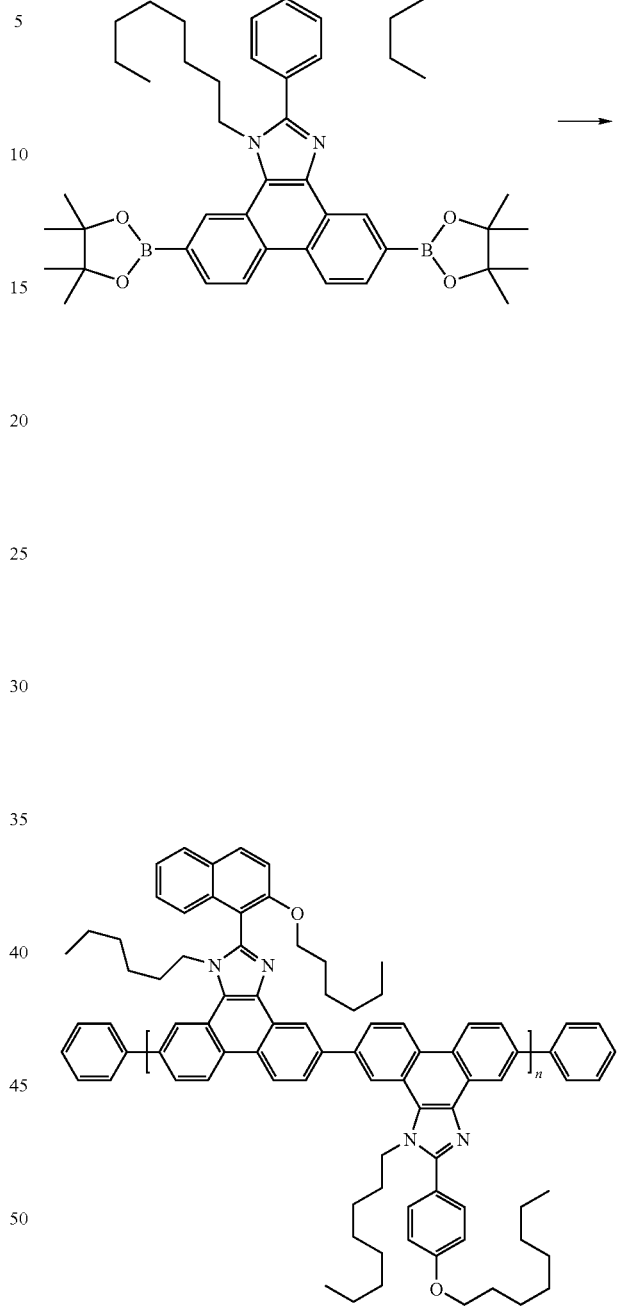

The copolymerization reaction is performed according to the procedure of example 85, with 1.0 equivalents of the dibromide product of example 71 and 1.0 equivalents of 1,4-bis-[4,4,5,5-tetramethyl-(1,3,2)dioxaborolan-2-yl]-2,5-dioctyloxyphenylene (CAS 457931-26-9). A yellow solid is obtained. GPC (polystyrene standard): $M_w$=90 075, PD=5.85. Photo-luminescent measurements of the polymer product have been performed as described in example 39: emission maximum at 427 nm.

Example 103

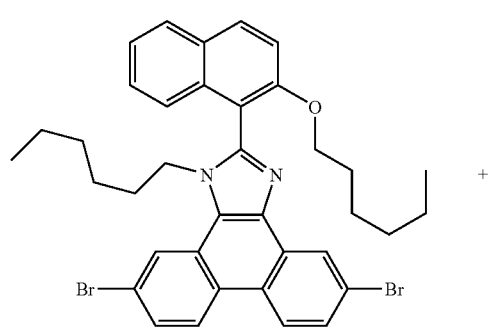

+

The copolymerization reaction has been performed according to the procedure of example 85, with 1.0 equivalents of the dibromide product of example 12b and 1.0 equivalents of the diboronate product of example 14. A yellow solid is obtained. GPC (polystyrene standard): $M_w$=21 356, PD=3.66. Photoluminescent measurements of the polymer product have been performed as described in example 39: emission maximum at 469 nm.

Example 104

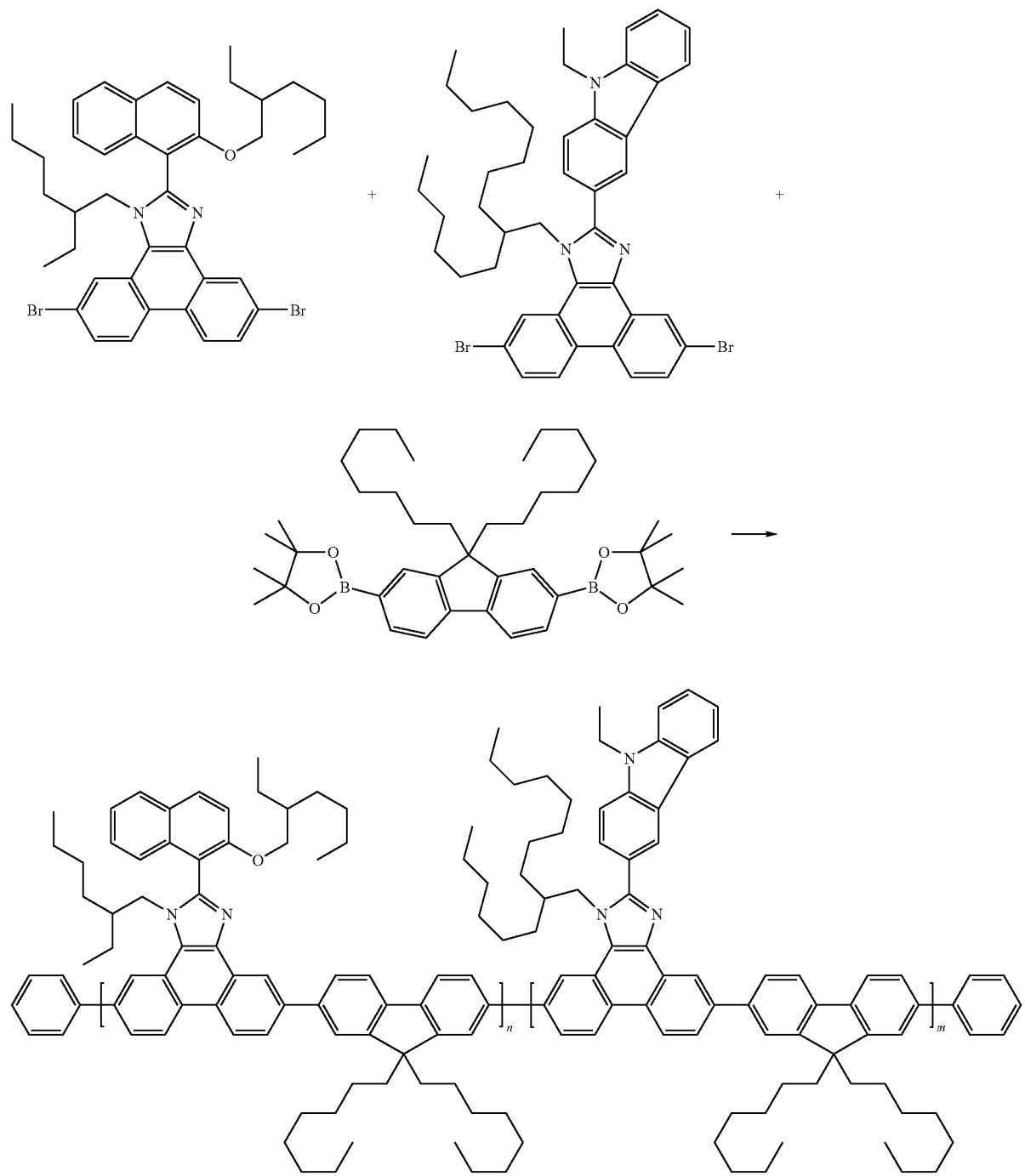

The copolymerization reaction is performed according to the procedure of example 85, with 0.65 equivalents of the dibromide product of example 16, 0.35 equivalents of the dibromide product of example 81, and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=84 101, PD=3.38. Photoluminescent measurements of the polymer product have been performed as described in example 39: emission maximum at 446 nm.

Example 105

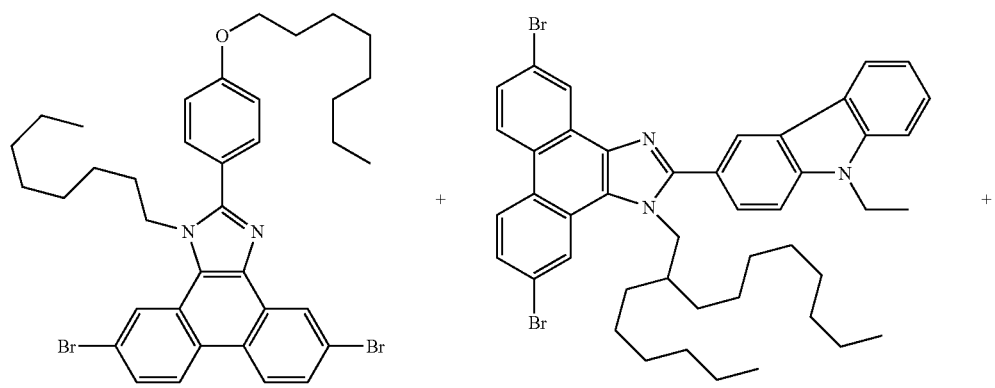

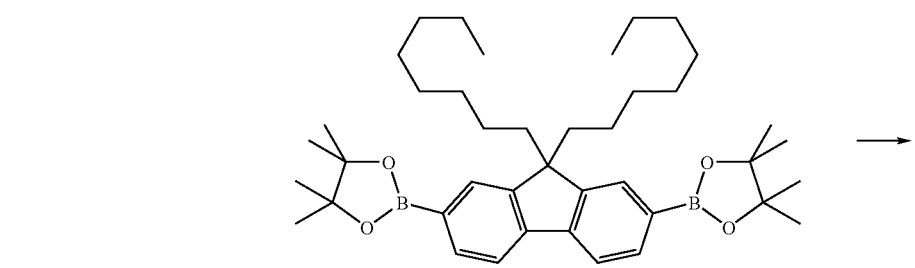

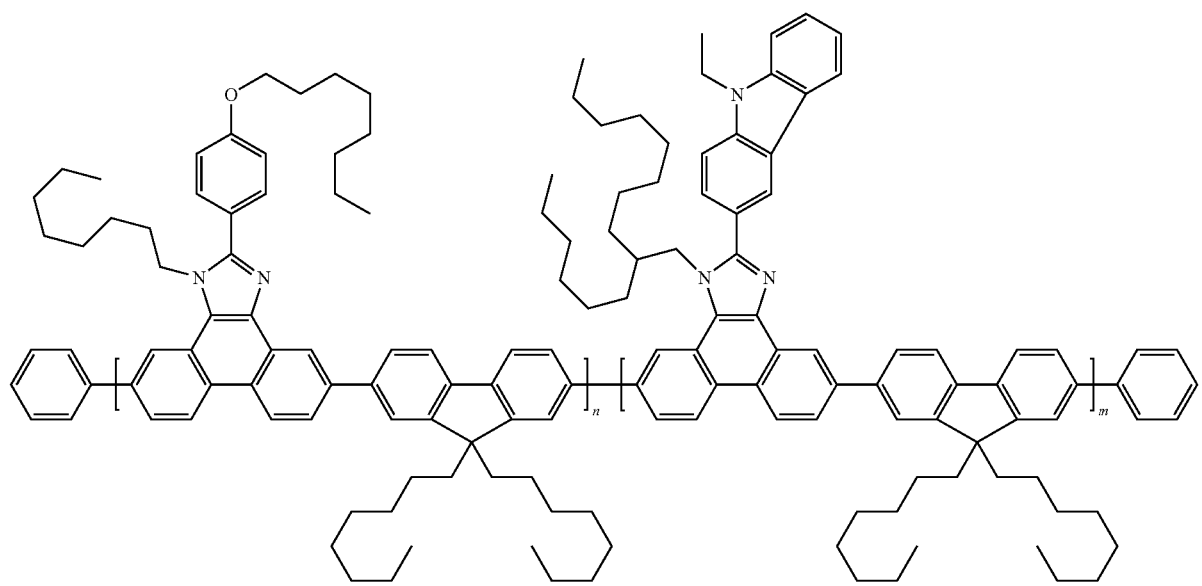

The copolymerization reaction is performed according to the procedure of example 85, with 0.6 equivalents of the dibromide product of example 9c, 0.4 equivalents of the dibromide product of example 81, and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=49 177, PD=3.10. Photoluminescent measurements of the polymer product have been performed as described in example 39: emission maximum at 430 nm.

Example 106

The copolymerization reaction is been performed according to the procedure of example 85, with 0.8 equivalents of the dibromide product of example 9c, 0.2 equivalents of the dibromide product of example 81, and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=77 760, PD=3.41.

Example 107

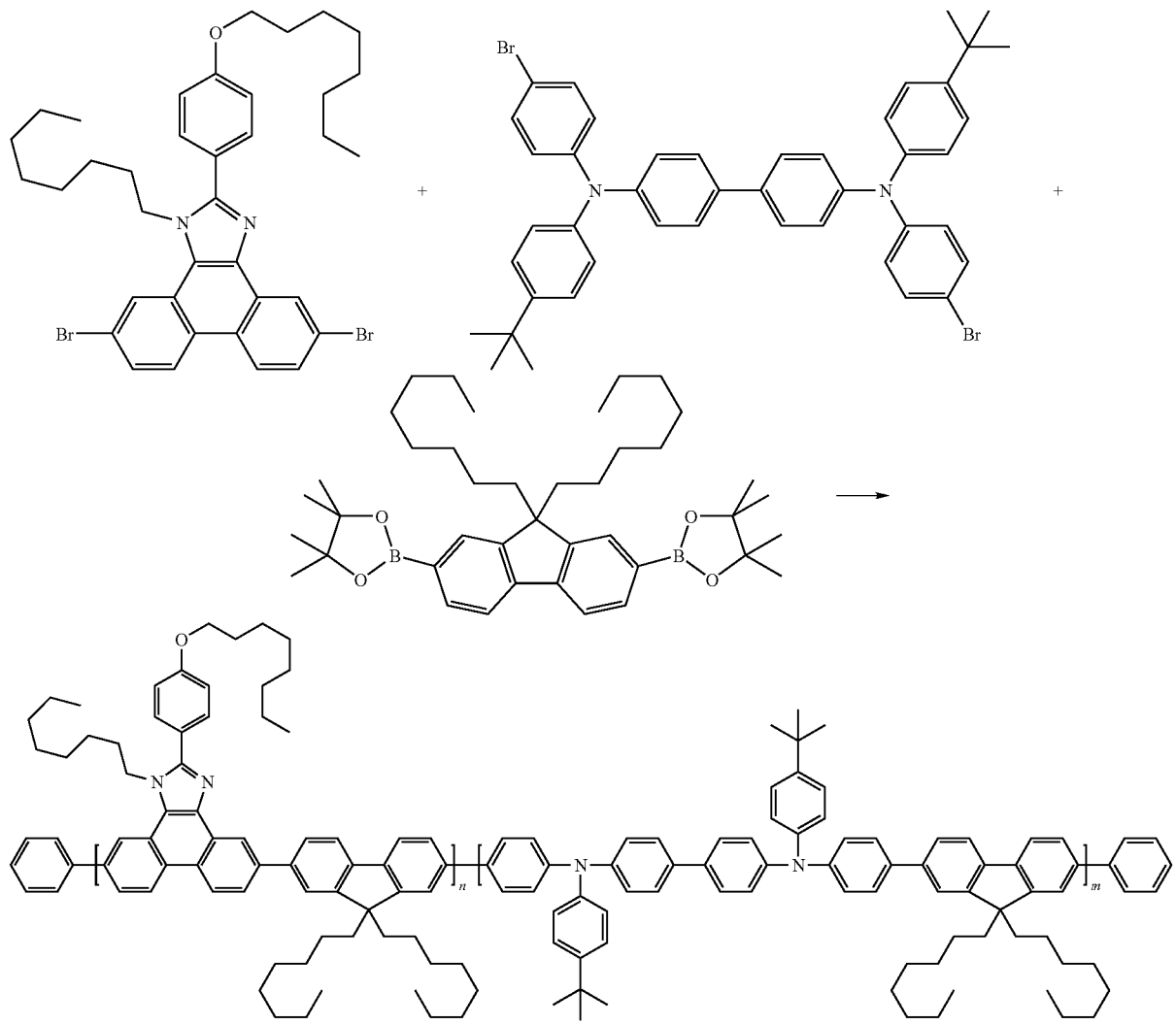

The copolymerization reaction is performed according to the procedure of example 85, with 0.8 equivalents of the dibromide product of example 9c, 0.2 equivalents of N,N'-bis(4-bromophenyl)-N,N'-bis(4-tert-butylphenyl)benzidine (CAS 463944-36-7, prepared according to WO02/077060), and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=154 946, PD=3.25.

Example 108

The copolymerization reaction is performed according to the procedure of example 85, with 0.6 equivalents of the dibromide product of example 9c, 0.4 equivalents of N,N'-bis(4-bromophenyl)-N,N'-bis(4-tert-butylphenyl)benzidine, and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=137 557, PD=3.64.

Example 109

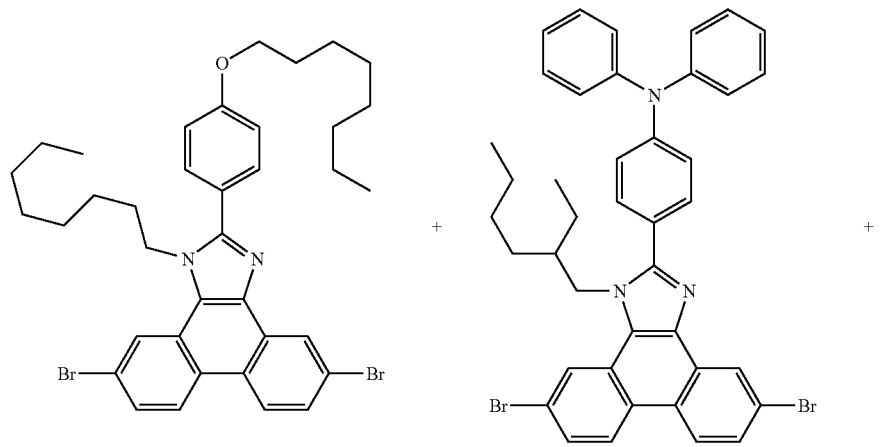

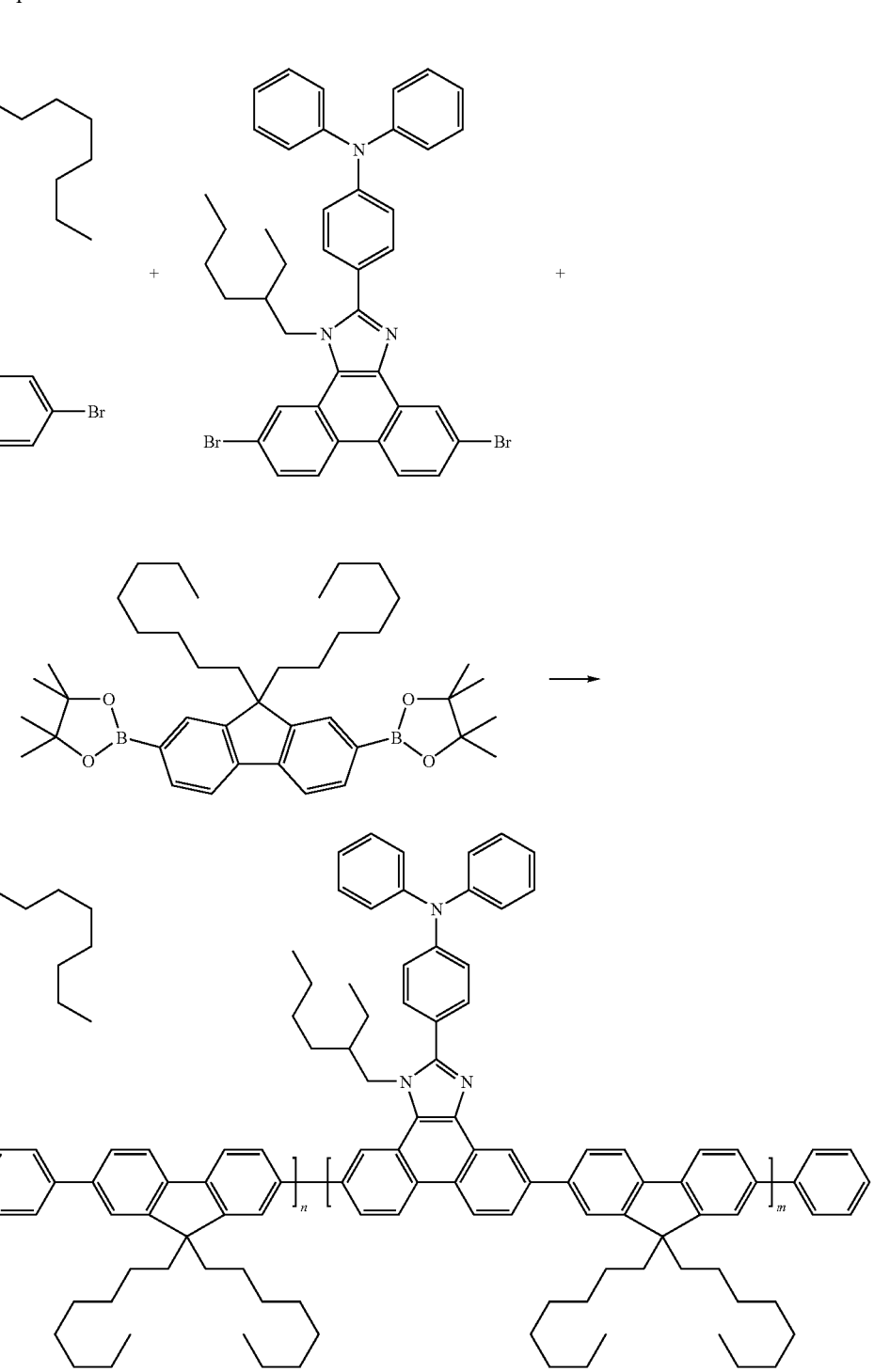

The copolymerization reaction is performed according to the procedure of example 85, with 0.8 equivalents of the dibromide product of example 9c, 0.2 equivalents of the dibromide product of example 83, and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=143 595, PD=3.42.

Example 110

The copolymerization reaction has been performed according to the procedure of example 85, with 0.6 equivalents of the dibromide product of example 9c, 0.4 equivalents of the dibromide product of example 83, and 1.0 equivalents of 2,7-bis(4,4,5,5-tetramethyl-1,3,2-dioxaborolan-2-yl)-9,9-dioctylfluorene. A yellow solid is obtained. GPC (polystyrene standard): $M_w$=87 924, PD=3.23.

Example 111
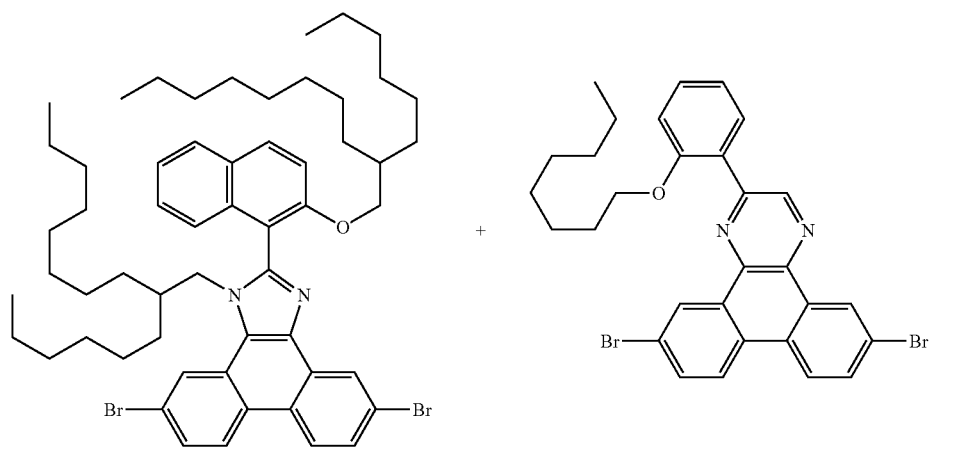
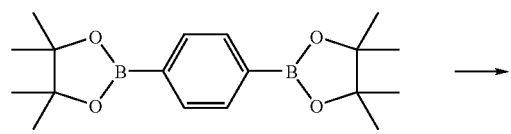
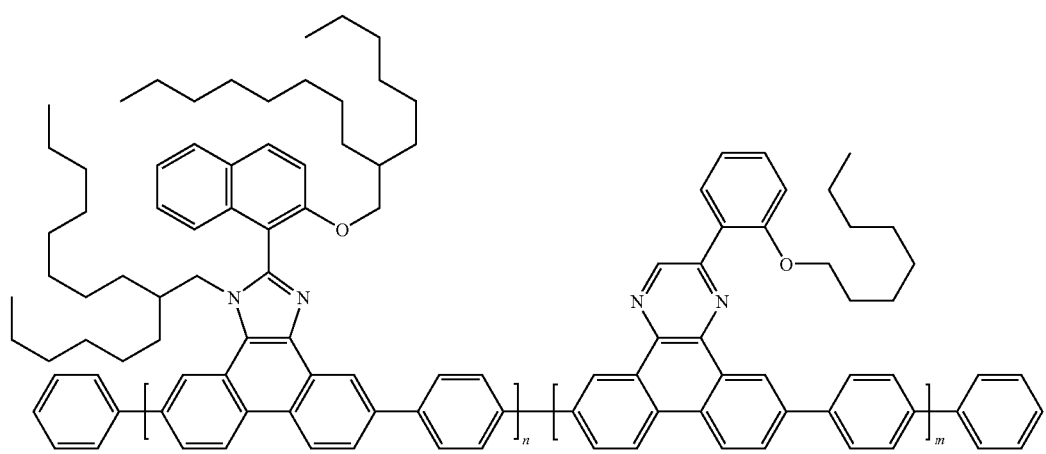
The copolymerization reaction is performed according to the procedure of example 85, with 0.65 equivalents of the dibromide product of example 17, 0.35 equivalents of the dibromide product of example 54, and 1.0 equivalents of 1,4-bis(4,4,5,5-tetramethyl-1,3,2-dioxaborolan-2-yl)benzene. A yellow solid is obtained. GPC (polystyrene standard): $M_w$=45 868, PD=4.72.

Example 112

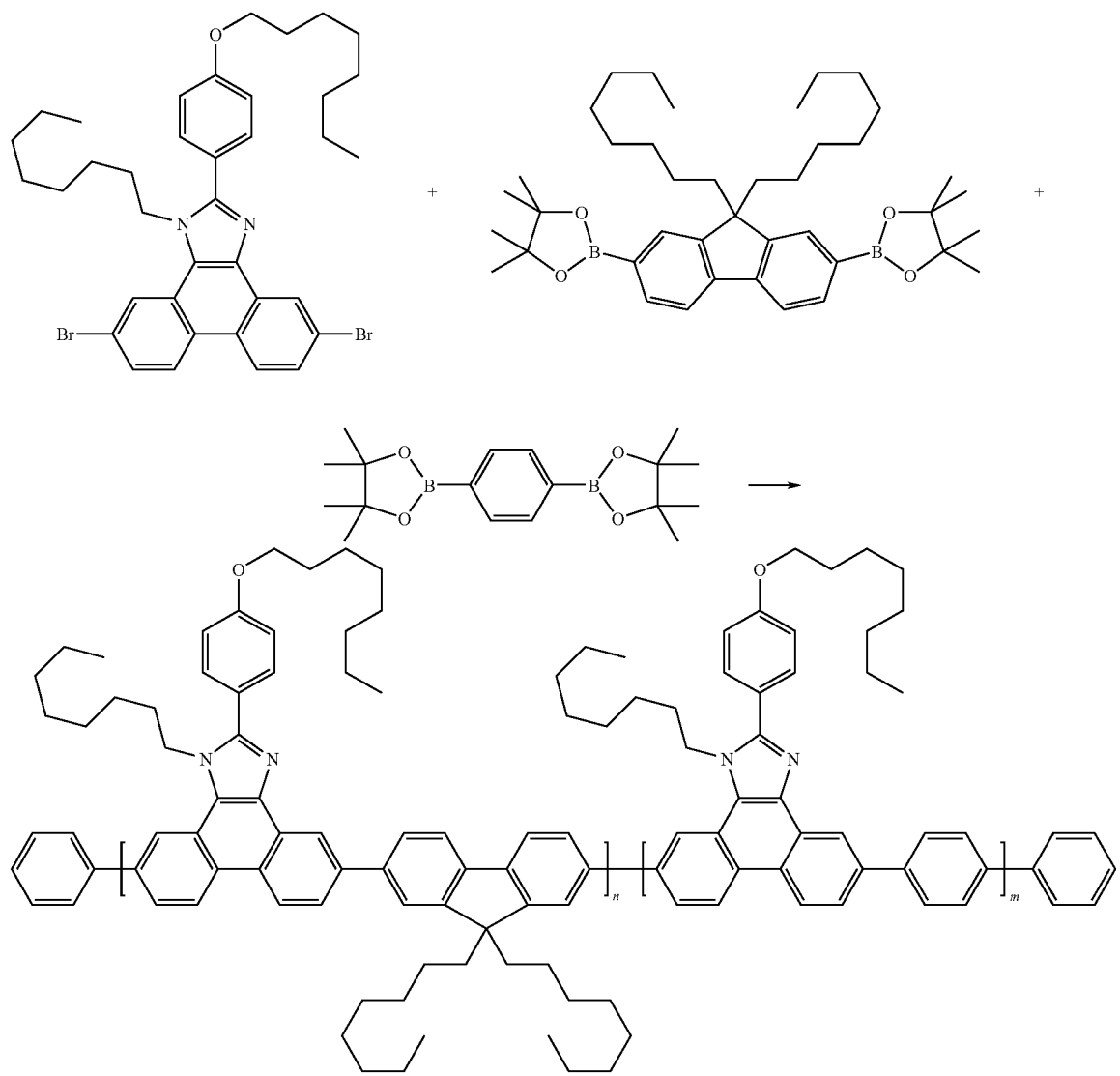

a) The copolymerization reaction is performed according to the procedure of example 85, with 1.0 equivalents of the dibromide product of example 9c, 0.75 equivalents of 2,7-bis(4,4,5,5-tetramethyl-1,3,2-dioxaborolan-2-yl)-9,9-dioctylfluorene, and 0.25 equivalents of 1,4-bis(4,4,5,5-tetramethyl-1,3,2-dioxaborolan-2-yl)benzene. A yellow solid is obtained. GPC (polystyrene standard): $M_w$=49 635, PD=5.08.

Example 113

The copolymerization reaction is performed according to the procedure of example 85, with 1.0 equivalents of the dibromide product of example 9c, 0.5 equivalents of 2,7-bis(4,4,5,5-tetramethyl-1,3,2-dioxaborolan-2-yl)-9,9-dioctylfluorene, and 0.5 equivalents of 1,4-bis-(4,4,5,5-tetramethyl-1,3,2-dioxaborolan-2-yl)benzene. A yellow solid is obtained. GPC (poly-styrene standard): $M_w$=132 849, PD=13.5.

Example 114

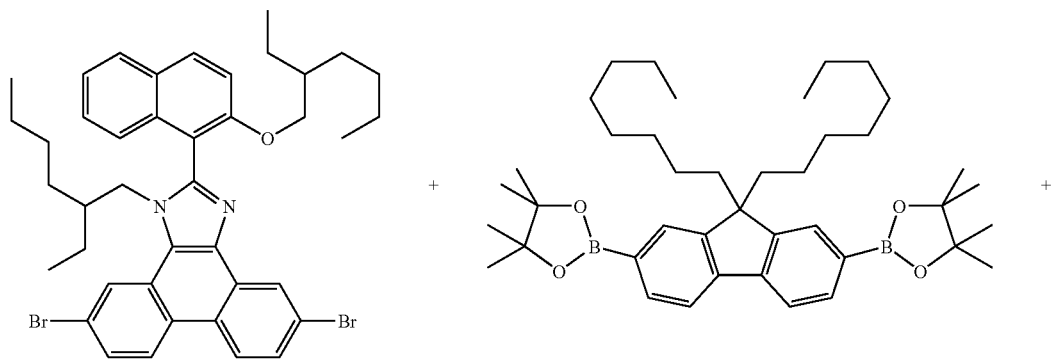

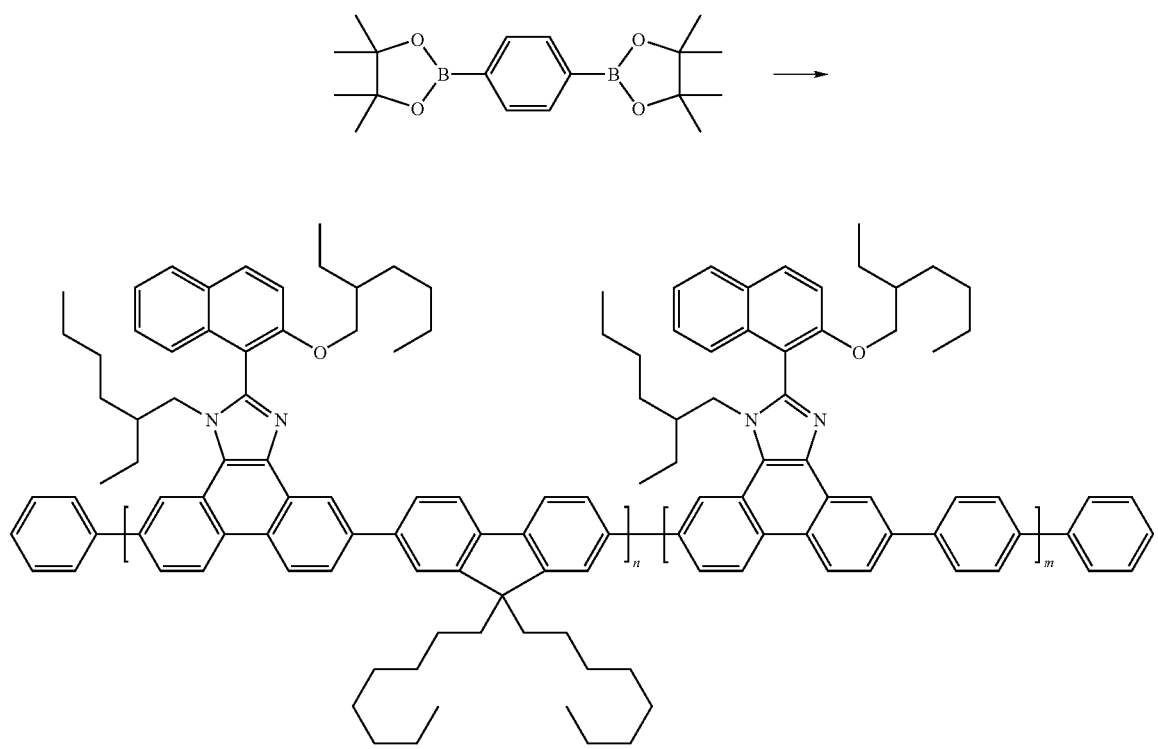

The copolymerization reaction is performed according to the procedure of example 85, with 1.0 equivalents of the dibromide product of example 16, 0.25 equivalents of 2,7-bis (4,4,5,5-tetramethyl-1,3,2-dioxaborolan-2-yl)-9,9-dioctylfluorene, and 0.75 equivalents of 1,4-bis-(4,4,5,5-tetramethyl-1,3,2-dioxaborolan-2-yl)benzene. A yellow solid is obtained. GPC (poly-styrene standard): $M_w$=135 369, PD=8.3. Photoluminescent measurements of the polymer product have been performed as described in example 39: emission maximum at 448 nm.

Example 115

The copolymerization reaction is performed according to the procedure of example 85, with 1.0 equivalents of the dibromide product of example 16, 0.2 equivalents of 2,7-bis (4,4,5,5-tetramethyl-1,3,2-dioxaborolan-2-yl)-9,9-dioctylfluorene, and 0.8 equivalents of 1,4-bis-(4,4,5,5-tetramethyl-1,3,2-dioxaborolan-2-yl)benzene. A yellow solid is obtained. GPC (poly-styrene standard): $M_w$=145 597, PD=8.0.

Example 116

The copolymerization reaction is performed according to the procedure of example 85, with 1.0 equivalents of the dibromide product of example 16, 0.4 equivalents of 2,7-bis (4,4,5,5-tetramethyl-1,3,2-dioxaborolan-2-yl)-9,9-dioctylfluorene, and 0.6 equivalents of 1,4-bis-(4,4,5,5-tetramethyl-1,3,2-dioxaborolan-2-yl)benzene. A yellow solid is obtained. GPC (poly-styrene standard): $M_w$=51 272, PD=5.3.

The following polymers are prepared in analogy to example 8, 11, 39, 40, 41, or 85. Instead of using compounds, wherein $X^{11}$ is Br, for the preparation of the following polymers compounds, wherein $X^{11}$ is I, can also be used.

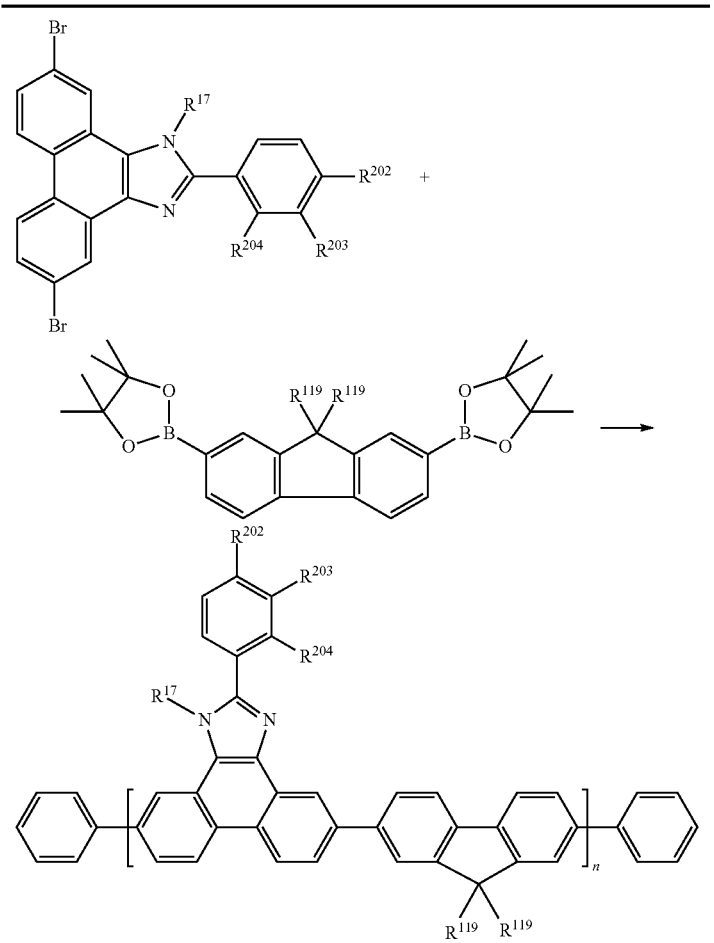

| Polymer No. | R[17] | R[202] | R[203] | R[204] | R[119] |
|---|---|---|---|---|---|
| 1-1 | n-octyl | —O-n-octyl | H | H | n-octyl |
| 1-2 | n-octyl | —O-n-octyl | H | H | n-hexyl |
| 1-3 | n-octyl | —O-n-octyl | H | H | 2-ethylhexyl |
| 1-4 | n-octyl | —O-n-octyl | H | —O-n-octyl | n-octyl |
| 1-5 | n-octyl | —O-n-octyl | H | —O-n-octyl | n-hexyl |
| 1-6 | n-octyl | —O-n-octyl | H | —O-n-octyl | 2-ethylhexyl |
| 1-7 | n-octyl | H | H | —O-n-octyl | n-octyl |
| 1-8 | n-octyl | H | H | —O-n-octyl | n-hexyl |
| 1-9 | n-octyl | H | H | —O-n-octyl | 2-ethylhexyl |
| 1-10 | n-octyl | H | —O-n-octyl | —O-n-octyl | n-octyl |
| 1-11 | n-octyl | H | —O-n-octyl | —O-n-octyl | n-hexyl |
| 1-12 | n-octyl | H | —O-n-octyl | —O-n-octyl | 2-ethylhexyl |
| 1-13 | n-hexyl | —O-n-hexyl | H | H | n-octyl |
| 1-14 | n-hexyl | —O-n-hexyl | H | H | n-hexyl |
| 1-15 | n-hexyl | —O-n-hexyl | H | H | 2-ethylhexyl |
| 1-16 | n-hexyl | —O-n-hexyl | H | —O-n-hexyl | n-octyl |
| 1-17 | n-hexyl | —O-n-hexyl | H | —O-n-hexyl | n-hexyl |
| 1-18 | n-hexyl | —O-n-hexyl | H | —O-n-hexyl | 2-ethylhexyl |
| 1-19 | n-hexyl | H | H | —O-n-hexyl | n-octyl |
| 1-20 | n-hexyl | H | H | —O-n-hexyl | n-hexyl |
| 1-21 | n-hexyl | H | H | —O-n-hexyl | 2-ethylhexyl |
| 1-22 | n-hexyl | H | —O-n-hexyl | —O-n-hexyl | n-octyl |
| 1-23 | n-hexyl | H | —O-n-hexyl | —O-n-hexyl | n-hexyl |
| 1-24 | n-hexyl | H | —O-n-hexyl | —O-n-hexyl | 2-ethylhexyl |
| 1-25 | n-butyl | —O-n-butyl | H | H | n-octyl |
| 1-26 | n-butyl | —O-n-butyl | H | H | n-hexyl |
| 1-27 | n-butyl | —O-n-butyl | H | H | 2-ethylhexyl |
| 1-28 | n-butyl | —O-n-butyl | H | —O-n-butyl | n-octyl |
| 1-29 | n-butyl | —O-n-butyl | H | —O-n-butyl | n-hexyl |
| 1-30 | n-butyl | —O-n-butyl | H | —O-n-butyl | 2-ethylhexyl |
| 1-31 | n-butyl | H | H | —O-n-butyl | n-octyl |
| 1-32 | n-butyl | H | H | —O-n-butyl | n-hexyl |

-continued

| | | | | | |
|---|---|---|---|---|---|
| 1-33 | n-butyl | H | H | —O-n-butyl | 2-ethylhexyl |
| 1-34 | n-butyl | H | —O-n-butyl | —O-n-butyl | n-octyl |
| 1-35 | n-butyl | H | —O-n-butyl | —O-n-butyl | n-hexyl |
| 1-36 | n-butyl | H | —O-n-butyl | —O-n-butyl | 2-ethylhexyl |
| 1-37 | 2-ethylhexyl | —O-2-ethylhexyl | H | H | n-octyl |
| 1-38 | 2-ethylhexyl | —O-2-ethylhexyl | H | H | n-hexyl |
| 1-39 | 2-ethylhexyl | —O-2-ethylhexyl | H | H | 2-ethylhexyl |
| 1-40 | 2-ethylhexyl | —O-2-ethylhexyl | H | 2-ethylhexyl | n-octyl |
| 1-41 | 2-ethylhexyl | —O-2-ethylhexyl | H | 2-ethylhexyl | n-hexyl |
| 1-42 | 2-ethylhexyl | —O-2-ethylhexyl | H | 2-ethylhexyl | 2-ethylhexyl |
| 1-43 | 2-ethylhexyl | H | H | 2-ethylhexyl | n-octyl |
| 1-44 | 2-ethylhexyl | H | H | 2-ethylhexyl | n-hexyl |
| 1-45 | 2-ethylhexyl | H | H | 2-ethylhexyl | 2-ethylhexyl |
| 1-46 | 2-ethylhexyl | H | —O-2-ethylhexyl | 2-ethylhexyl | n-octyl |
| 1-47 | 2-ethylhexyl | H | —O-2-ethylhexyl | 2-ethylhexyl | n-hexyl |
| 1-48 | 2-ethylhexyl | H | —O-2-ethylhexyl | 2-ethylhexyl | 2-ethylhexyl |
| 2-1 | n-octyl | O-n-octyl | H | H | 4-$C_6H_5$OMe |
| 2-2 | n-octyl | O-n-octyl | H | H | 4-$C_6H_5$OEt |
| 2-3 | n-octyl | O-n-octyl | H | H | 4-$C_6H_5$OBu |
| 2-4 | n-octyl | O-n-octyl | H | O-n-octyl | 4-$C_6H_5$OMe |
| 2-5 | n-octyl | O-n-octyl | H | O-n-octyl | 4-$C_6H_5$OEt |
| 2-6 | n-octyl | O-n-octyl | H | O-n-octyl | 4-$C_6H_5$OBu |
| 2-7 | n-octyl | H | H | O-n-octyl | 4-$C_6H_5$OMe |
| 2-8 | n-octyl | H | H | O-n-octyl | 4-$C_6H_5$OEt |
| 2-9 | n-octyl | H | H | O-n-octyl | 4-$C_6H_5$OBu |
| 2-10 | n-octyl | H | O-n-octyl | O-n-octyl | 4-$C_6H_5$OMe |
| 2-11 | n-octyl | H | O-n-octyl | O-n-octyl | 4-$C_6H_5$OEt |
| 2-12 | n-octyl | H | O-n-octyl | O-n-octyl | 4-$C_6H_5$OBu |

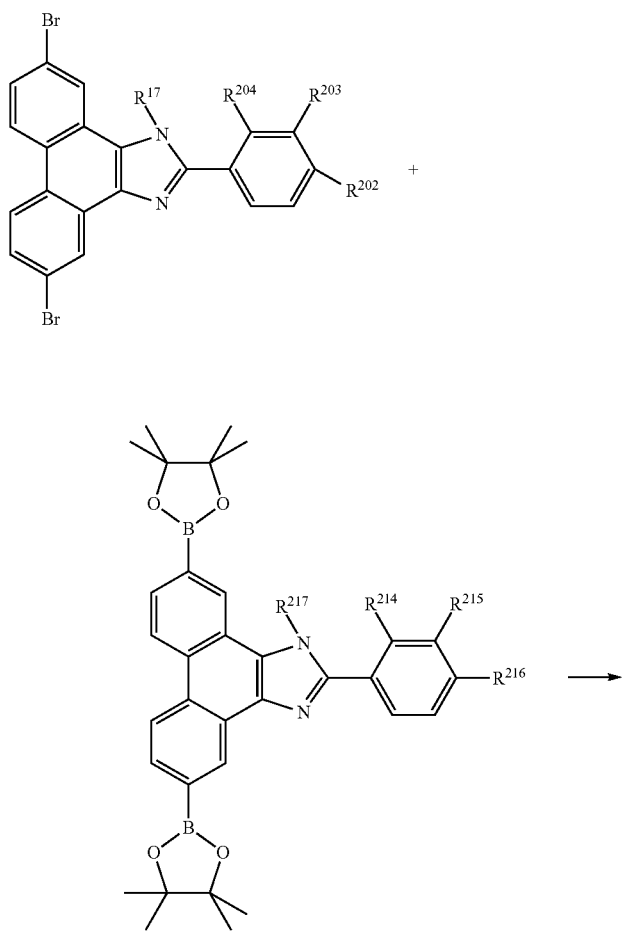

-continued

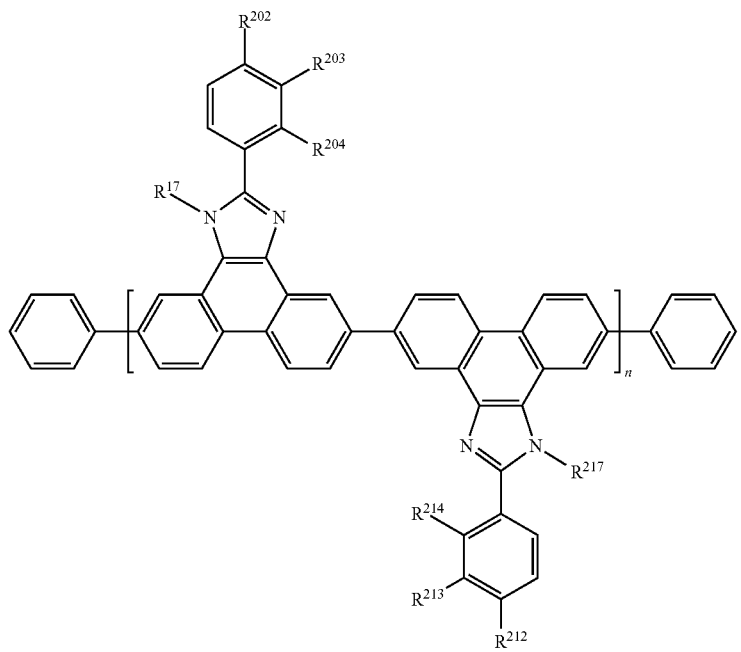

The orientation of the 5-ring heteroaromatic ring in the polymer chain is randomly.

| Polymer No. | $R^{17}$ | $R^{202}$ | $R^{203}$ | $R^{204}$ | $R^{217}$ | $R^{212}$ | $R^{213}$ | $R^{214}$ |
|---|---|---|---|---|---|---|---|---|
| 3-1 | n-octyl | O—$R^{17}$ | H | H | n-hexyl | O—$R^{217}$ | H | H |
| 3-2 | n-octyl | O—$R^{17}$ | H | H | n-butyl | O—$R^{217}$ | H | H |
| 3-3 | n-octyl | O—$R^{17}$ | H | H | n-octyl | O—$R^{217}$ | H | H |
| 3-4 | n-octyl | O—$R^{17}$ | H | H | n-hexyl | O—$R^{217}$ | H | O—$R^{217}$ |
| 3-5 | n-octyl | O—$R^{17}$ | H | H | n-butyl | O—$R^{217}$ | H | O—$R^{217}$ |
| 3-6 | n-octyl | O—$R^{17}$ | H | H | n-octyl | O—$R^{217}$ | H | O—$R^{217}$ |
| 3-7 | n-octyl | O—$R^{17}$ | H | H | n-hexyl | H | H | O—$R^{217}$ |
| 3-8 | n-octyl | O—$R^{17}$ | H | H | n-butyl | H | H | O—$R^{217}$ |
| 3-9 | n-octyl | O—$R^{17}$ | H | H | n-octyl | H | H | O—$R^{217}$ |
| 3-10 | n-octyl | O—$R^{17}$ | H | O—$R^{17}$ | n-hexyl | O—$R^{217}$ | H | H |
| 3-11 | n-octyl | O—$R^{17}$ | H | O—$R^{17}$ | n-butyl | O—$R^{217}$ | H | H |
| 3-12 | n-octyl | O—$R^{17}$ | H | O—$R^{17}$ | n-octyl | O—$R^{217}$ | H | H |
| 3-13 | n-octyl | O—$R^{17}$ | H | O—$R^{17}$ | n-hexyl | O—$R^{217}$ | H | O—$R^{217}$ |
| 3-14 | n-octyl | O—$R^{17}$ | H | O—$R^{17}$ | n-butyl | O—$R^{217}$ | H | O—$R^{217}$ |
| 3-15 | n-octyl | O—$R^{17}$ | H | O—$R^{17}$ | n-octyl | O—$R^{217}$ | H | O—$R^{217}$ |
| 3-16 | n-octyl | O—$R^{17}$ | H | O—$R^{17}$ | n-hexyl | H | H | O—$R^{217}$ |
| 3-17 | n-octyl | O—$R^{17}$ | H | O—$R^{17}$ | n-butyl | H | H | O—$R^{217}$ |
| 3-18 | n-octyl | O—$R^{17}$ | H | O—$R^{17}$ | n-octyl | H | H | O—$R^{217}$ |
| 3-19 | n-octyl | H | H | O—$R^{17}$ | n-hexyl | O—$R^{217}$ | H | H |
| 3-20 | n-octyl | H | H | O—$R^{17}$ | n-butyl | O—$R^{217}$ | H | H |
| 3-21 | n-octyl | H | H | O—$R^{17}$ | n-octyl | O—$R^{217}$ | H | H |
| 3-22 | n-octyl | H | H | O—$R^{17}$ | n-hexyl | O—$R^{217}$ | H | O—$R^{217}$ |
| 3-23 | n-octyl | H | H | O—$R^{17}$ | n-butyl | O—$R^{217}$ | H | O—$R^{217}$ |
| 3-24 | n-octyl | H | H | O—$R^{17}$ | n-octyl | O—$R^{217}$ | H | O—$R^{217}$ |
| 3-25 | n-octyl | H | H | O—$R^{17}$ | n-hexyl | H | H | O—$R^{217}$ |
| 3-26 | n-octyl | H | H | O—$R^{17}$ | n-butyl | H | H | O—$R^{217}$ |
| 3-27 | n-octyl | H | H | O—$R^{17}$ | n-octyl | H | H | O—$R^{217}$ |
| 3-28 | n-octyl | H | O—$R^{17}$ | O—$R^{17}$ | n-hexyl | O—$R^{217}$ | H | H |
| 3-29 | n-octyl | H | O—$R^{17}$ | O—$R^{17}$ | n-butyl | O—$R^{217}$ | H | H |
| 3-30 | n-octyl | H | O—$R^{17}$ | O—$R^{17}$ | n-octyl | O—$R^{217}$ | H | H |
| 3-31 | n-octyl | H | O—$R^{17}$ | O—$R^{17}$ | n-hexyl | O—$R^{217}$ | H | O—$R^{217}$ |
| 3-32 | n-octyl | H | O—$R^{17}$ | O—$R^{17}$ | n-butyl | O—$R^{217}$ | H | O—$R^{217}$ |
| 3-33 | n-octyl | H | O—$R^{17}$ | O—$R^{17}$ | n-octyl | O—$R^{217}$ | H | O—$R^{217}$ |
| 3-34 | n-octyl | H | O—$R^{17}$ | O—$R^{17}$ | n-hexyl | H | H | O—$R^{217}$ |
| 3-35 | n-octyl | H | O—$R^{17}$ | O—$R^{17}$ | n-butyl | H | H | O—$R^{217}$ |
| 3-36 | n-octyl | H | O—$R^{17}$ | O—$R^{17}$ | n-octyl | H | H | O—$R^{217}$ |

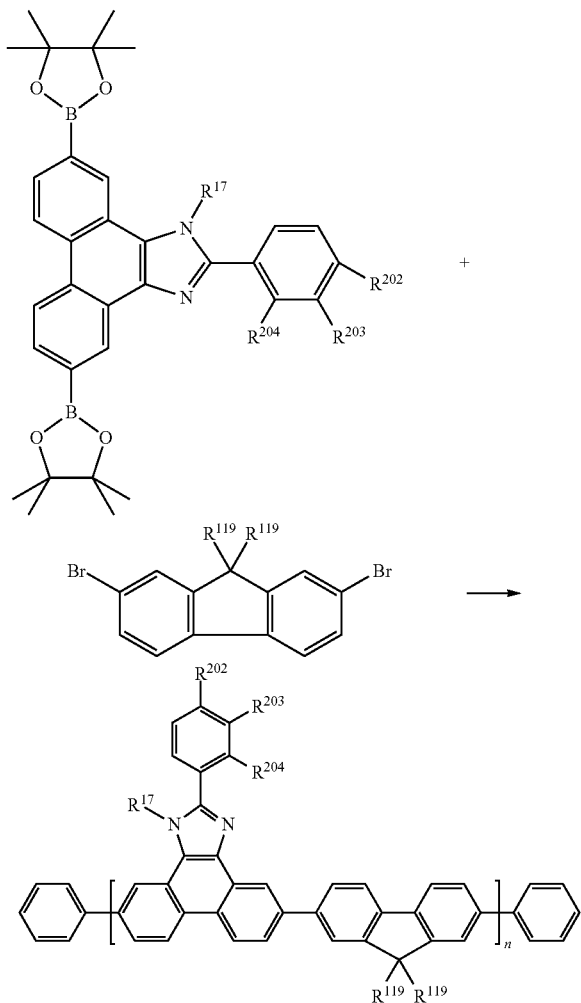

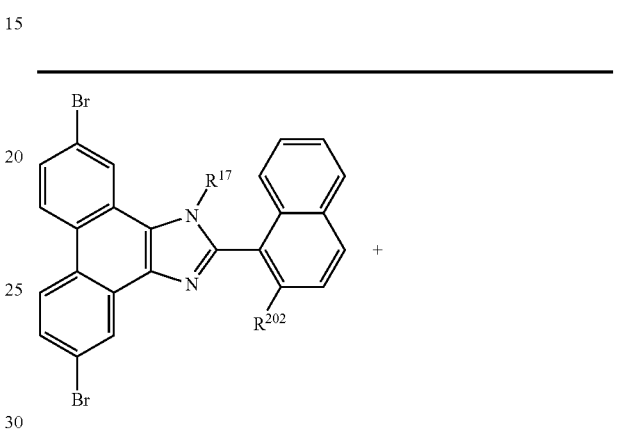

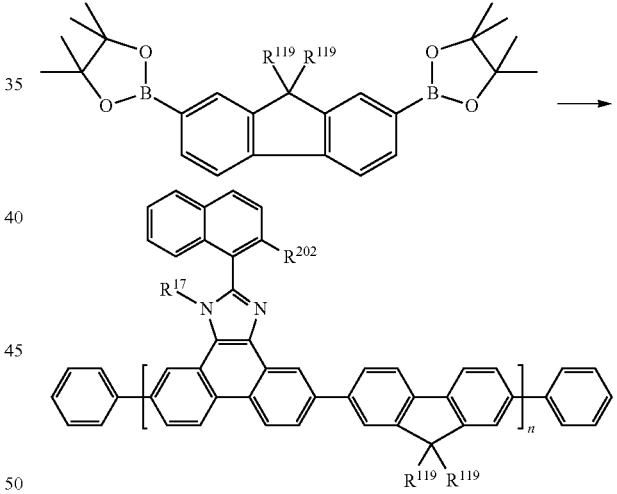

-continued

| | | | | | |
|---|---|---|---|---|---|
| 4-29 | n-butyl | —O-n-butyl | H | —O-n-butyl | n-hexyl |
| 4-30 | n-butyl | —O-n-butyl | H | —O-n-butyl | 2-ethylhexyl |
| 4-31 | n-butyl | H | H | —O-n-butyl | n-octyl |
| 4-32 | n-butyl | H | H | —O-n-butyl | n-hexyl |
| 4-33 | n-butyl | H | H | —O-n-butyl | 2-ethylhexyl |
| 4-34 | n-butyl | H | —O-n-butyl | —O-n-butyl | n-octyl |
| 4-35 | n-butyl | H | —O-n-butyl | —O-n-butyl | n-hexyl |
| 4-36 | n-butyl | H | —O-n-butyl | —O-n-butyl | 2-ethylhexyl |

| Polymer No. | $R^{17}$ | $R^{202}$ | $R^{203}$ | $R^{204}$ | $R^{119}$ |
|---|---|---|---|---|---|
| 4-1 | n-octyl | —O-n-octyl | H | H | n-octyl |
| 4-2 | n-octyl | —O-n-octyl | H | H | n-hexyl |
| 4-3 | n-octyl | —O-n-octyl | H | H | 2-ethylhexyl |
| 4-4 | n-octyl | —O-n-octyl | H | —O-n-octyl | n-octyl |
| 4-5 | n-octyl | —O-n-octyl | H | —O-n-octyl | n-hexyl |
| 4-6 | n-octyl | —O-n-octyl | H | —O-n-octyl | 2-ethylhexyl |
| 4-7 | n-octyl | H | H | —O-n-octyl | n-octyl |
| 4-8 | n-octyl | H | H | —O-n-octyl | n-hexyl |
| 4-9 | n-octyl | H | H | —O-n-octyl | 2-ethylhexyl |
| 4-10 | n-octyl | H | —O-n-octyl | —O-n-octyl | n-octyl |
| 4-11 | n-octyl | H | —O-n-octyl | —O-n-octyl | n-hexyl |
| 4-12 | n-octyl | H | —O-n-octyl | —O-n-octyl | 2-ethylhexyl |
| 4-13 | n-hexyl | —O-n-hexyl | H | H | n-octyl |
| 4-14 | n-hexyl | —O-n-hexyl | H | H | n-hexyl |
| 4-15 | n-hexyl | —O-n-hexyl | H | H | 2-ethylhexyl |
| 4-16 | n-hexyl | —O-n-hexyl | H | —O-n-hexyl | n-octyl |
| 4-17 | n-hexyl | —O-n-hexyl | H | —O-n-hexyl | n-hexyl |
| 4-18 | n-hexyl | —O-n-hexyl | H | —O-n-hexyl | 2-ethylhexyl |
| 4-19 | n-hexyl | H | H | —O-n-hexyl | n-octyl |
| 4-20 | n-hexyl | H | H | —O-n-hexyl | n-hexyl |
| 4-21 | n-hexyl | H | H | —O-n-hexyl | 2-ethylhexyl |
| 4-22 | n-hexyl | H | —O-n-hexyl | —O-n-hexyl | n-octyl |
| 4-23 | n-hexyl | H | —O-n-hexyl | —O-n-hexyl | n-hexyl |
| 4-24 | n-hexyl | H | —O-n-hexyl | —O-n-hexyl | 2-ethylhexyl |
| 4-25 | n-butyl | —O-n-butyl | H | H | n-octyl |
| 4-26 | n-butyl | —O-n-butyl | H | H | n-hexyl |
| 4-27 | n-butyl | —O-n-butyl | H | H | 2-ethylhexyl |
| 4-28 | n-butyl | —O-n-butyl | H | —O-n-butyl | n-octyl |

| Polymer No. | $R^{17}$ | $R^{202}$ | $R^{119}$ |
|---|---|---|---|
| 5-1 | n-octyl | —O-n-octyl | n-octyl |
| 5-2 | n-octyl | —O-n-octyl | n-hexyl |
| 5-3 | n-octyl | —O-n-octyl | 2-ethylhexyl |
| 5-4 | n-hexyl | —O-n-hexyl | n-octyl |
| 5-5 | n-hexyl | —O-n-hexyl | n-hexyl |
| 5-6 | n-hexyl | —O-n-hexyl | 2-ethylhexyl |
| 5-7 | n-butyl | —O-n-butyl | n-octyl |
| 5-8 | n-butyl | —O-n-butyl | n-hexyl |
| 5-9 | n-butyl | —O-n-butyl | 2-ethylhexyl |

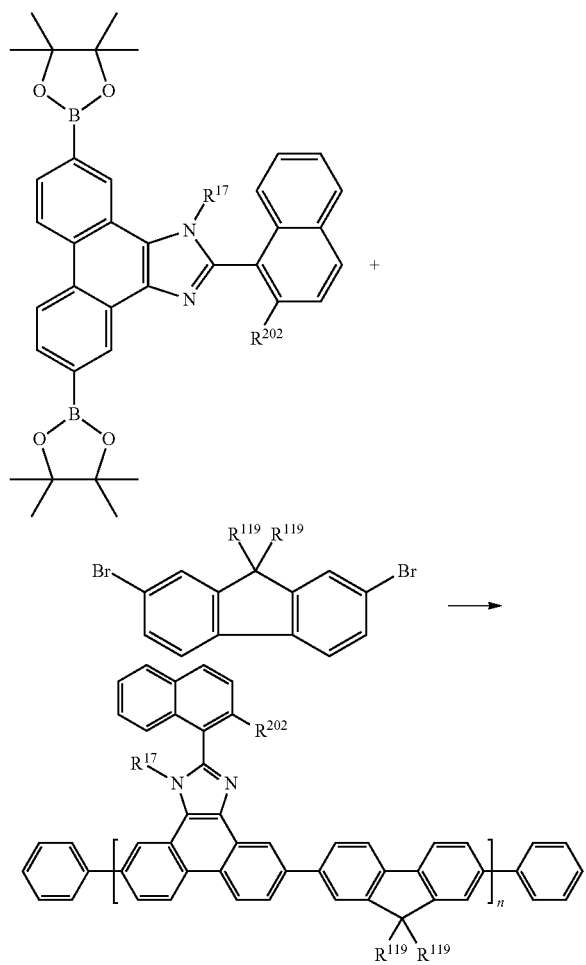

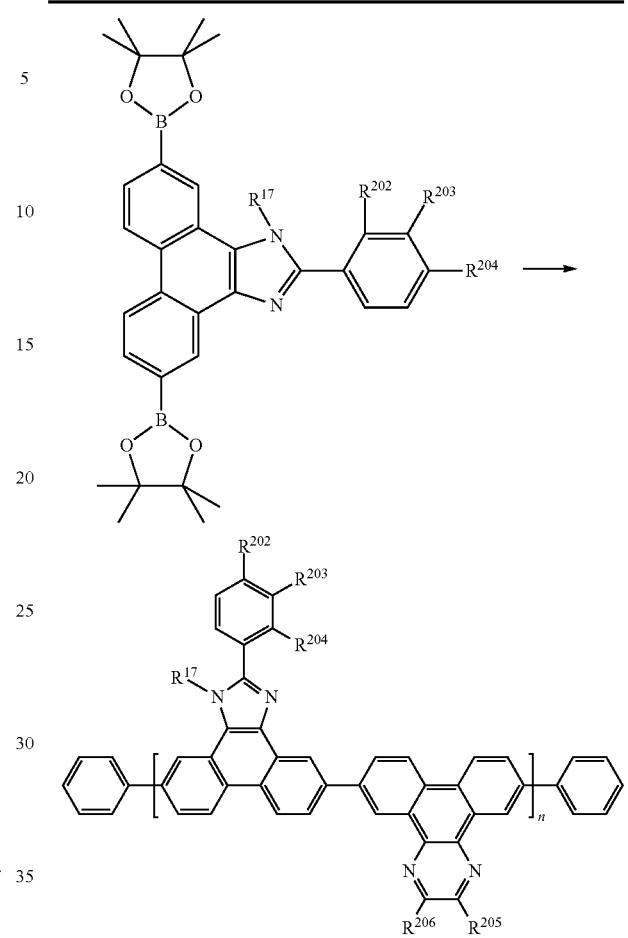

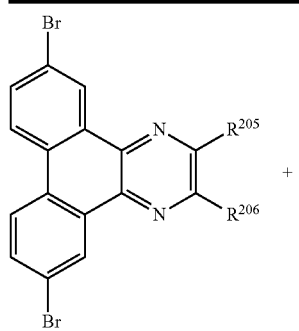

| Polymer No. | R¹⁷ | R²⁰² | R¹¹⁹ |
|---|---|---|---|
| 6-1 | n-octyl | —O-n-octyl | n-octyl |
| 6-2 | n-octyl | —O-n-octyl | n-hexyl |
| 6-3 | n-octyl | —O-n-octyl | 2-ethylhexyl |
| 6-4 | n-hexyl | —O-n-hexyl | n-octyl |
| 6-5 | n-hexyl | —O-n-hexyl | n-hexyl |
| 6-6 | n-hexyl | —O-n-hexyl | 2-ethylhexyl |
| 6-7 | n-butyl | —O-n-butyl | n-octyl |
| 6-8 | n-butyl | —O-n-butyl | n-hexyl |
| 6-9 | n-butyl | —O-n-butyl | 2-ethylhexyl |

| Polymer No. | R¹⁷ | R²⁰² | R²⁰³ | R²⁰⁴ | R²⁰⁵ | R²⁰⁶ |
|---|---|---|---|---|---|---|
| 7-1 | n-octyl | O—R¹⁷ | H | H | H | H |
| 7-2 | n-octyl | O—R¹⁷ | H | H | t-butyl | t-butyl |
| 7-3 | n-octyl | O—R¹⁷ | H | O—R¹⁷ | H | H |
| 7-4 | n-octyl | O—R¹⁷ | H | O—R¹⁷ | t-butyl | t-butyl |
| 7-5 | n-octyl | H | H | O—R¹⁷ | H | H |
| 7-6 | n-octyl | H | H | O—R¹⁷ | t-butyl | t-butyl |
| 7-7 | n-octyl | H | O—R¹⁷ | O—R¹⁷ | H | H |
| 7-8 | n-octyl | H | O—R¹⁷ | O—R¹⁷ | t-butyl | t-butyl |
| 7-9 | n-hexyl | O—R¹⁷ | H | H | H | H |
| 7-10 | n-hexyl | O—R¹⁷ | H | H | t-butyl | t-butyl |
| 7-11 | n-hexyl | O—R¹⁷ | H | O—R¹⁷ | H | H |
| 7-12 | n-hexyl | O—R¹⁷ | H | O—R¹⁷ | t-butyl | t-butyl |
| 7-13 | n-hexyl | H | H | O—R¹⁷ | H | H |
| 7-14 | n-hexyl | H | H | O—R¹⁷ | t-butyl | t-butyl |
| 7-15 | n-hexyl | H | O—R¹⁷ | O—R¹⁷ | H | H |
| 7-16 | n-hexyl | H | O—R¹⁷ | O—R¹⁷ | t-butyl | t-butyl |
| 7-17 | n-butyl | O—R¹⁷ | H | H | H | H |
| 7-18 | n-butyl | O—R¹⁷ | H | H | t-butyl | t-butyl |
| 7-19 | n-butyl | O—R¹⁷ | H | O—R¹⁷ | H | H |
| 7-20 | n-butyl | O—R¹⁷ | H | O—R¹⁷ | t-butyl | t-butyl |
| 7-21 | n-butyl | H | H | O—R¹⁷ | H | H |
| 7-22 | n-butyl | H | H | O—R¹⁷ | t-butyl | t-butyl |
| 7-23 | n-butyl | H | O—R¹⁷ | O—R¹⁷ | H | H |
| 7-24 | n-butyl | H | O—R¹⁷ | O—R¹⁷ | t-butyl | t-butyl |

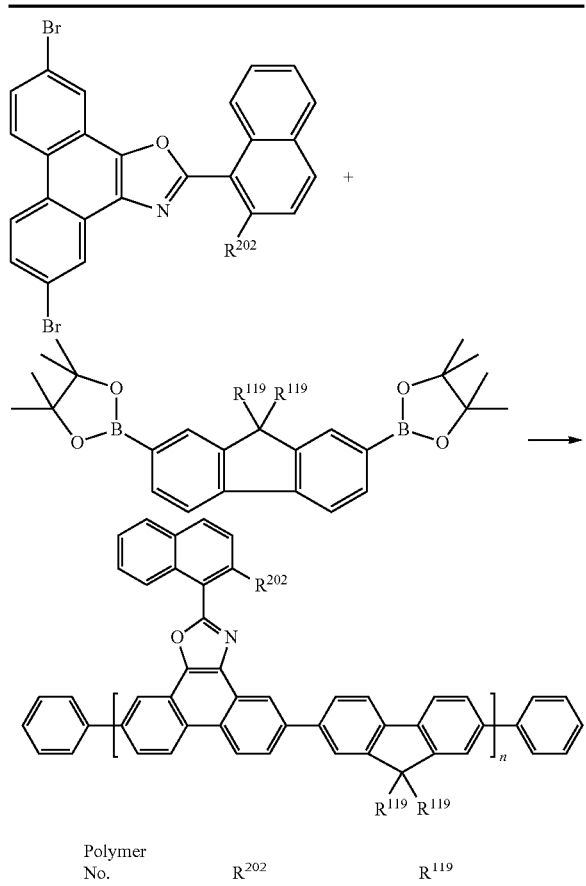
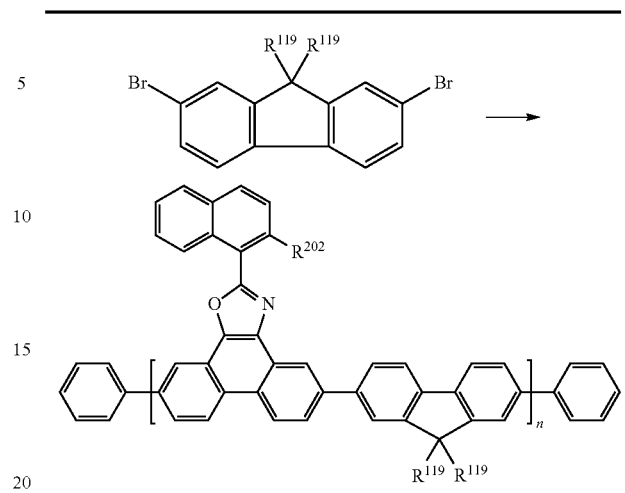
| Polymer No. | $R^{202}$ | $R^{119}$ |
|---|---|---|
| 8-1 | —O-n-octyl | n-octyl |
| 8-2 | —O-n-octyl | n-hexyl |
| 8-3 | —O-n-octyl | 2-ethylhexyl |
| 8-4 | —O-n-hexyl | n-octyl |
| 8-5 | —O-n-hexyl | n-hexyl |
| 8-6 | —O-n-hexyl | 2-ethylhexyl |
| 8-7 | —O-n-butyl | n-octyl |
| 8-8 | —O-n-butyl | n-hexyl |
| 8-9 | —O-n-butyl | 2-ethylhexyl |
| Polymer No. | $R^{202}$ | $R^{119}$ |
|---|---|---|
| 9-1 | —O-n-octyl | n-octyl |
| 9-2 | —O-n-octyl | n-hexyl |
| 9-3 | —O-n-octyl | 2-ethylhexyl |
| 9-4 | —O-n-hexyl | n-octyl |
| 9-5 | —O-n-hexyl | n-hexyl |
| 9-6 | —O-n-hexyl | 2-ethylhexyl |
| 9-7 | —O-n-butyl | n-octyl |
| 9-8 | —O-n-butyl | n-hexyl |
| 9-9 | —O-n-butyl | 2-ethylhexyl |
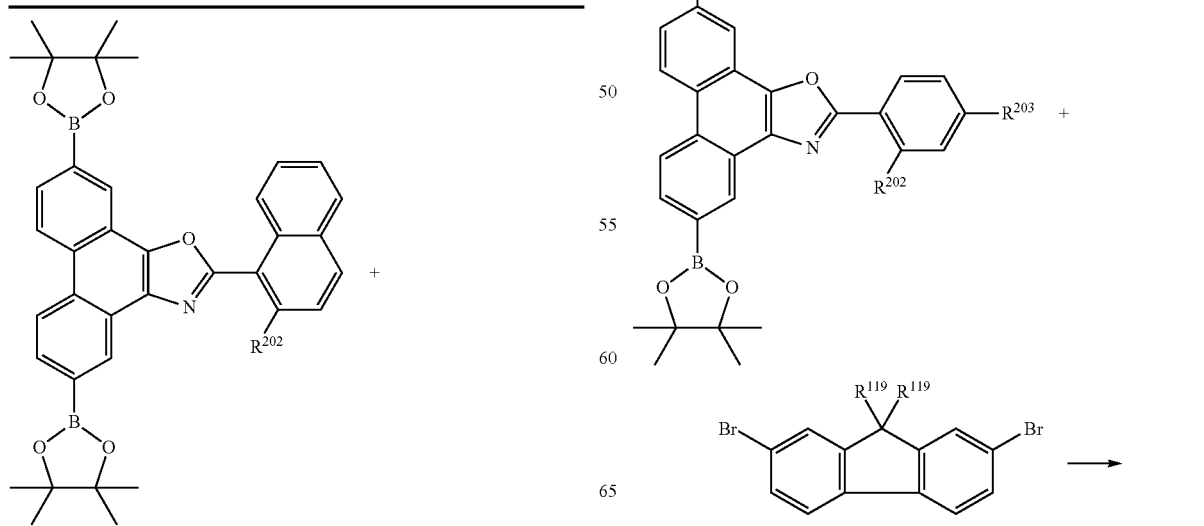

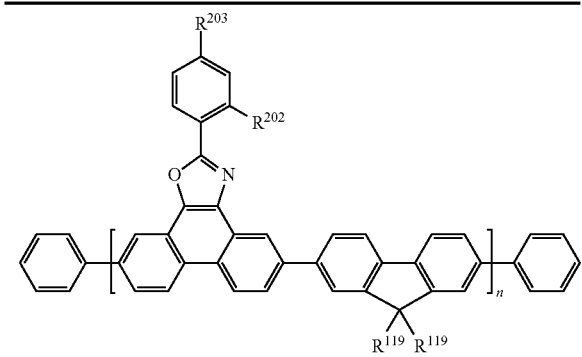

| Polymer No. | R²⁰² | R²⁰³ | R¹¹⁹ |
|---|---|---|---|
| 10-1 | —O-n-octyl | —O-n-octyl | n-octyl |
| 10-2 | —O-n-octyl | —O-n-octyl | n-hexyl |
| 10-3 | —O-n-octyl | —O-n-octyl | 2-ethylhexyl |
| 10-4 | —O-n-hexyl | —O-n-hexyl | n-octyl |
| 10-5 | —O-n-hexyl | —O-n-hexyl | n-hexyl |
| 10-6 | —O-n-hexyl | —O-n-hexyl | 2-ethylhexyl |
| 10-7 | —O-n-butyl | —O-n-butyl | n-octyl |
| 10-8 | —O-n-butyl | —O-n-butyl | n-hexyl |
| 10-9 | —O-n-butyl | —O-n-butyl | 2-ethylhexyl |
| 10-10 | —O-n-octyl | H | n-octyl |
| 10-11 | —O-n-octyl | H | n-hexyl |
| 10-12 | —O-n-octyl | H | 2-ethylhexyl |
| 10-13 | —O-n-hexyl | H | n-octyl |
| 10-14 | —O-n-hexyl | H | n-hexyl |
| 10-15 | —O-n-hexyl | H | 2-ethylhexyl |
| 10-16 | —O-n-butyl | H | n-octyl |
| 10-17 | —O-n-butyl | H | n-hexyl |
| 10-18 | —O-n-butyl | H | 2-ethylhexyl |

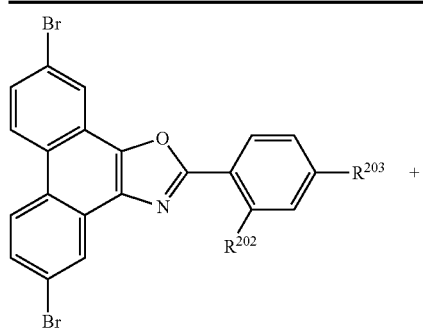

+

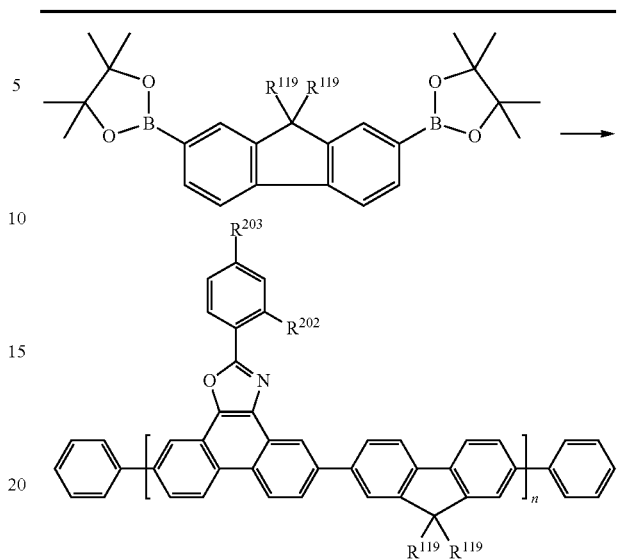

| Polymer No. | R²⁰² | R²⁰³ | R¹¹⁹ |
|---|---|---|---|
| 11-1 | —O-n-octyl | —O-n-octyl | n-octyl |
| 11-2 | —O-n-octyl | —O-n-octyl | n-hexyl |
| 11-3 | —O-n-octyl | —O-n-octyl | 2-ethylhexyl |
| 11-4 | —O-n-hexyl | —O-n-hexyl | n-octyl |
| 11-5 | —O-n-hexyl | —O-n-hexyl | n-hexyl |
| 11-6 | —O-n-hexyl | —O-n-hexyl | 2-ethylhexyl |
| 11-7 | —O-n-butyl | —O-n-butyl | n-octyl |
| 11-8 | —O-n-butyl | —O-n-butyl | n-hexyl |
| 11-9 | —O-n-butyl | —O-n-butyl | 2-ethylhexyl |
| 11-10 | —O-n-octyl | H | n-octyl |
| 11-11 | —O-n-octyl | H | n-hexyl |
| 11-12 | —O-n-octyl | H | 2-ethylhexyl |
| 11-13 | —O-n-hexyl | H | n-octyl |
| 11-14 | —O-n-hexyl | H | n-hexyl |
| 11-15 | —O-n-hexyl | H | 2-ethylhexyl |
| 11-16 | —O-n-butyl | H | n-octyl |
| 11-17 | —O-n-butyl | H | n-hexyl |
| 11-18 | —O-n-butyl | H | 2-ethylhexyl |

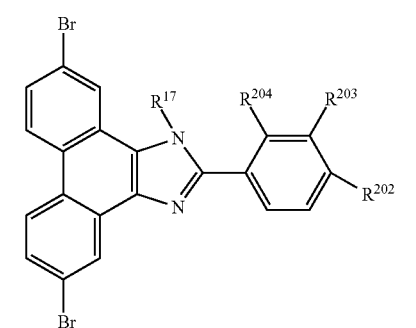

+

-continued

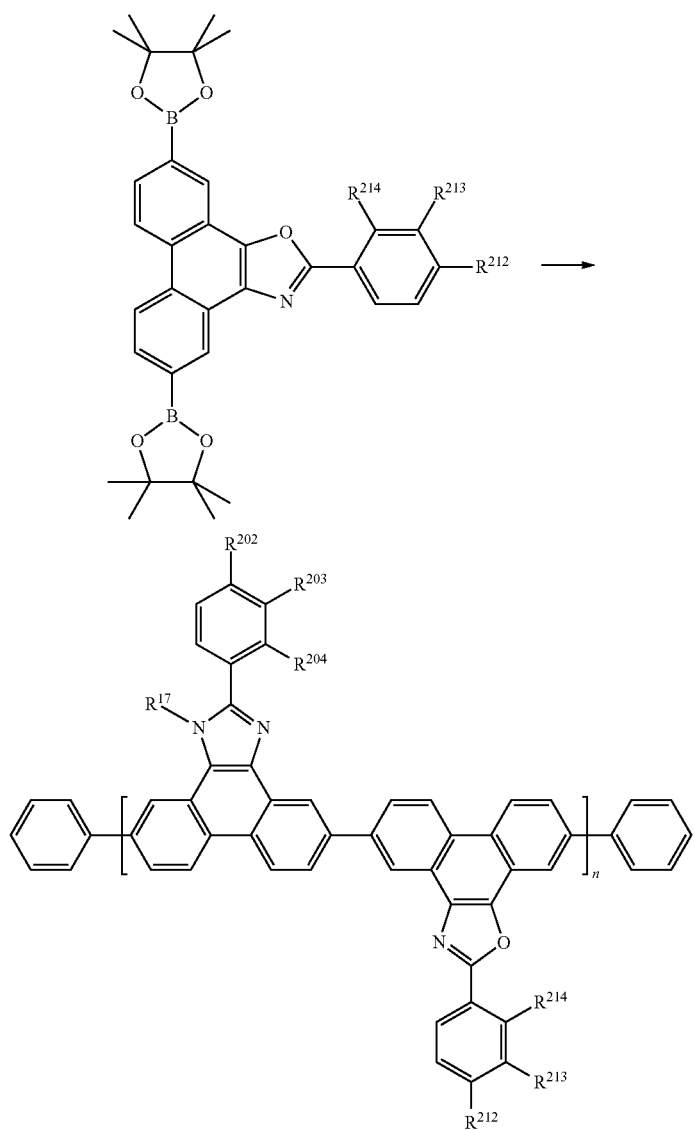

The orientation of the 5-ring heteroaromatic ring in the polymer chain is randomly.

| Polymer No. | $R^{17}$ | $R^{202}$ | $R^{203}$ | $R^{204}$ | $R^{212}$ | $R^{213}$ | $R^{214}$ |
|---|---|---|---|---|---|---|---|
| 12-1 | n-octyl | O-n-octyl | H | O-n-octyl | O-n-octyl | H | O-n-octyl |
| 12-2 | n-octyl | O-n-octyl | H | O-n-octyl | O-n-hexyl | H | O-n-hexyl |
| 12-3 | n-octyl | O-n-octyl | H | O-n-octyl | O-n-butyl | H | O-n-butyl |
| 12-4 | n-octyl | O-n-octyl | H | O-n-octyl | H | O-n-octyl | O-n-octyl |
| 12-5 | n-octyl | O-n-octyl | H | O-n-octyl | H | O-n-hexyl | O-n-hexyl |
| 12-6 | n-octyl | O-n-octyl | H | O-n-octyl | H | O-n-butyl | O-n-butyl |
| 12-7 | n-octyl | O-n-octyl | H | O-n-octyl | H | H | O-n-octyl |
| 12-8 | n-octyl | O-n-octyl | H | O-n-octyl | H | H | O-n-hexyl |
| 12-9 | n-octyl | O-n-octyl | H | O-n-octyl | H | H | O-n-butyl |
| 12-10 | n-octyl | H | H | O-n-octyl | O-n-octyl | H | O-n-octyl |
| 12-11 | n-octyl | H | H | O-n-octyl | O-n-hexyl | H | O-n-hexyl |
| 12-12 | n-octyl | H | H | O-n-octyl | O-n-butyl | H | O-n-butyl |
| 12-13 | n-octyl | H | H | O-n-octyl | H | O-n-octyl | O-n-octyl |

-continued

| | | | | | | | |
|---|---|---|---|---|---|---|---|
| 12-14 | n-octyl | H | H | O-n-octyl | H | O-n-hexyl | O-n-hexyl |
| 12-15 | n-octyl | H | H | O-n-octyl | H | O-n-butyl | O-n-butyl |
| 12-16 | n-octyl | H | H | O-n-octyl | H | H | O-n-octyl |
| 12-17 | n-octyl | H | H | O-n-octyl | H | H | O-n-hexyl |
| 12-18 | n-octyl | H | H | O-n-octyl | H | H | O-n-butyl |
| 12-19 | n-octyl | H | O-n-octyl | O-n-octyl | O-n-octyl | H | O-n-octyl |
| 12-20 | n-octyl | H | O-n-octyl | O-n-octyl | O-n-hexyl | H | O-n-hexyl |
| 12-21 | n-octyl | H | O-n-octyl | O-n-octyl | O-n-butyl | H | O-n-butyl |
| 12-22 | n-octyl | H | O-n-octyl | O-n-octyl | H | O-n-octyl | O-n-octyl |
| 12-23 | n-octyl | H | O-n-octyl | O-n-octyl | H | O-n-hexyl | O-n-hexyl |
| 12-24 | n-octyl | H | O-n-octyl | O-n-octyl | H | O-n-butyl | O-n-butyl |
| 12-25 | n-octyl | H | O-n-octyl | O-n-octyl | H | H | O-n-octyl |
| 12-26 | n-octyl | H | O-n-octyl | O-n-octyl | H | H | O-n-hexyl |
| 12-27 | n-octyl | H | O-n-octyl | O-n-octyl | H | H | O-n-butyl |
| 12-28 | n-octyl | O-n-octyl | H | H | O-n-octyl | H | O-n-octyl |
| 12-29 | n-octyl | O-n-octyl | H | H | O-n-hexyl | H | O-n-hexyl |
| 12-30 | n-octyl | O-n-octyl | H | H | O-n-butyl | H | O-n-butyl |
| 12-31 | n-octyl | O-n-octyl | H | H | H | O-n-octyl | O-n-octyl |
| 12-32 | n-octyl | O-n-octyl | H | H | H | O-n-hexyl | O-n-hexyl |
| 12-33 | n-octyl | O-n-octyl | H | H | H | O-n-butyl | O-n-butyl |
| 12-34 | n-octyl | O-n-octyl | H | H | H | H | O-n-octyl |
| 12-35 | n-octyl | O-n-octyl | H | H | H | H | O-n-hexyl |
| 12-36 | n-octyl | O-n-octyl | H | H | H | H | O-n-butyl |

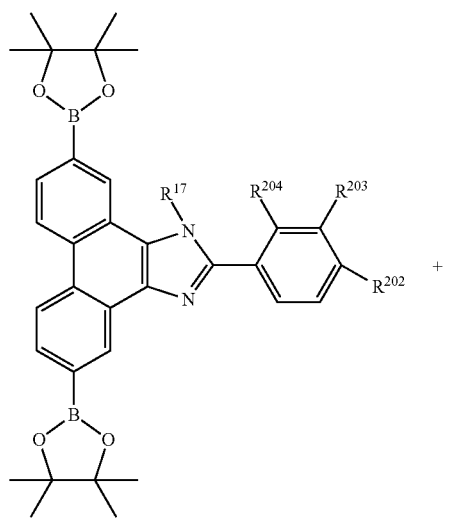

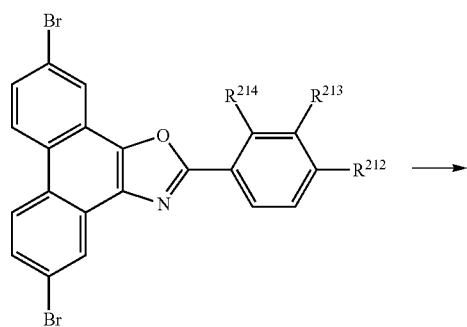

-continued

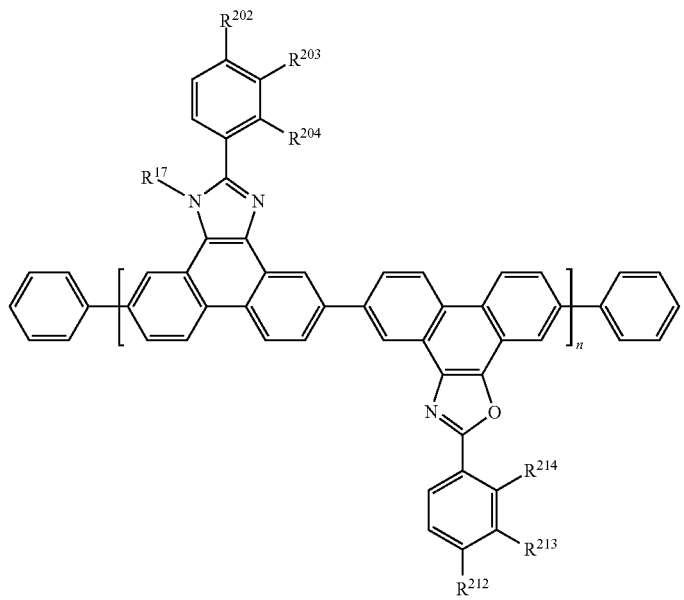

The orientation of the 5-ring heteroaromatic ring in the polymer chain is randomly.

| Polymer No. | $R^{17}$ | $R^{202}$ | $R^{203}$ | $R^{204}$ | $R^{212}$ | $R^{213}$ | $R^{214}$ |
|---|---|---|---|---|---|---|---|
| 13-1 | n-octyl | O-n-octyl | H | O-n-octyl | O-n-octyl | H | n-octyl |
| 13-2 | n-octyl | O-n-octyl | H | O-n-octyl | O-n-hexyl | H | n-hexyl |
| 13-3 | n-octyl | O-n-octyl | H | O-n-octyl | O-n-butyl | H | n-butyl |
| 13-4 | n-octyl | O-n-octyl | H | O-n-octyl | H | O-n-octyl | n-octyl |
| 13-5 | n-octyl | O-n-octyl | H | O-n-octyl | H | O-n-hexyl | n-hexyl |
| 13-6 | n-octyl | O-n-octyl | H | O-n-octyl | H | O-n-butyl | n-butyl |
| 13-7 | n-octyl | O-n-octyl | H | O-n-octyl | H | H | n-octyl |
| 13-8 | n-octyl | O-n-octyl | H | O-n-octyl | H | H | n-hexyl |
| 13-9 | n-octyl | O-n-octyl | H | O-n-octyl | H | H | n-butyl |
| 13-10 | n-octyl | H | H | O-n-octyl | O-n-octyl | H | n-octyl |
| 13-11 | n-octyl | H | H | O-n-octyl | O-n-hexyl | H | n-hexyl |
| 13-12 | n-octyl | H | H | O-n-octyl | O-n-butyl | H | n-butyl |
| 13-13 | n-octyl | H | H | O-n-octyl | H | O-n-octyl | n-octyl |
| 13-14 | n-octyl | H | H | O-n-octyl | H | O-n-hexyl | n-hexyl |
| 13-15 | n-octyl | H | H | O-n-octyl | H | O-n-butyl | n-butyl |
| 13-16 | n-octyl | H | H | O-n-octyl | H | H | n-octyl |
| 13-17 | n-octyl | H | H | O-n-octyl | H | H | n-hexyl |
| 13-18 | n-octyl | H | H | O-n-octyl | H | H | n-butyl |
| 13-19 | n-octyl | H | O-n-octyl | O-n-octyl | O-n-octyl | H | n-octyl |
| 13-20 | n-octyl | H | O-n-octyl | O-n-octyl | O-n-hexyl | H | n-hexyl |
| 13-21 | n-octyl | H | O-n-octyl | O-n-octyl | O-n-butyl | H | n-butyl |
| 13-22 | n-octyl | H | O-n-octyl | O-n-octyl | H | O-n-octyl | n-octyl |
| 13-23 | n-octyl | H | O-n-octyl | O-n-octyl | H | O-n-hexyl | n-hexyl |
| 13-24 | n-octyl | H | O-n-octyl | O-n-octyl | H | O-n-butyl | n-butyl |
| 13-25 | n-octyl | H | O-n-octyl | O-n-octyl | H | H | n-octyl |
| 13-26 | n-octyl | H | O-n-octyl | O-n-octyl | H | H | n-hexyl |
| 13-27 | n-octyl | H | O-n-octyl | O-n-octyl | H | H | n-butyl |
| 13-28 | n-octyl | O-n-octyl | H | H | O-n-octyl | H | n-octyl |
| 13-29 | n-octyl | O-n-octyl | H | H | O-n-hexyl | H | n-hexyl |
| 13-30 | n-octyl | O-n-octyl | H | H | O-n-butyl | H | n-butyl |
| 13-31 | n-octyl | O-n-octyl | H | H | H | O-n-octyl | n-octyl |
| 13-32 | n-octyl | O-n-octyl | H | H | H | O-n-hexyl | n-hexyl |
| 13-33 | n-octyl | O-n-octyl | H | H | H | O-n-butyl | n-butyl |
| 13-34 | n-octyl | O-n-octyl | H | H | H | H | n-octyl |
| 13-35 | n-octyl | O-n-octyl | H | H | H | H | n-hexyl |
| 13-36 | n-octyl | O-n-octyl | H | H | H | H | n-butyl |

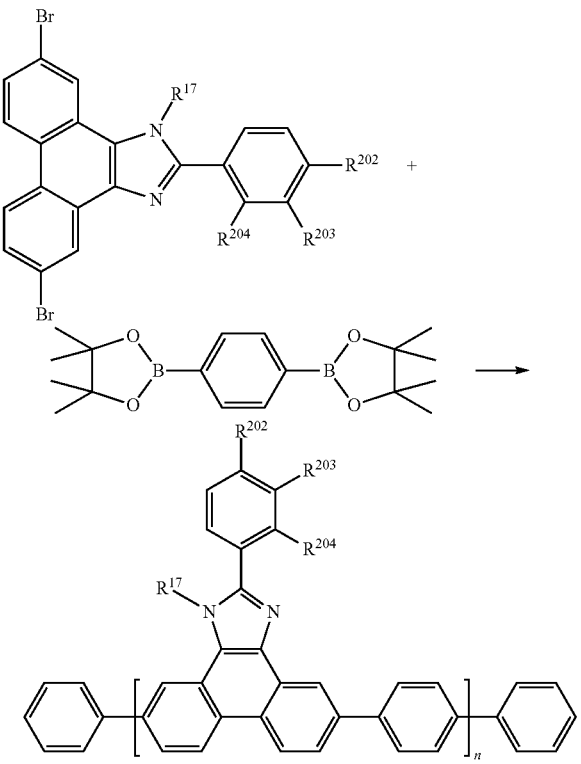

| Polymer No. | R$^{17}$ | R$^{202}$ | R$^{203}$ | R$^{204}$ |
|---|---|---|---|---|
| 14-1 | n-octyl | —O-n-octyl | H | H |
| 14-2 | n-octyl | —O-n-octyl | H | H |
| 14-3 | n-octyl | —O-n-octyl | H | H |
| 14-4 | n-octyl | —O-n-octyl | H | —O-n-octyl |
| 14-5 | n-octyl | —O-n-octyl | H | —O-n-octyl |
| 14-6 | n-octyl | —O-n-octyl | H | —O-n-octyl |
| 14-7 | n-octyl | H | H | —O-n-octyl |
| 14-8 | n-octyl | H | H | —O-n-octyl |
| 14-9 | n-octyl | H | H | —O-n-octyl |
| 14-10 | n-octyl | H | —O-n-octyl | —O-n-octyl |
| 14-11 | n-octyl | H | —O-n-octyl | —O-n-octyl |
| 14-12 | n-octyl | H | —O-n-octyl | —O-n-octyl |
| 14-13 | n-hexyl | —O-n-hexyl | H | H |
| 14-14 | n-hexyl | —O-n-hexyl | H | H |
| 14-15 | n-hexyl | —O-n-hexyl | H | H |
| 14-16 | n-hexyl | —O-n-hexyl | H | —O-n-hexyl |
| 14-17 | n-hexyl | —O-n-hexyl | H | —O-n-hexyl |
| 14-18 | n-hexyl | —O-n-hexyl | H | —O-n-hexyl |
| 14-19 | n-hexyl | H | H | —O-n-hexyl |
| 14-20 | n-hexyl | H | H | —O-n-hexyl |
| 14-21 | n-hexyl | H | H | —O-n-hexyl |
| 14-22 | n-hexyl | H | —O-n-hexyl | —O-n-hexyl |
| 14-23 | n-hexyl | H | —O-n-hexyl | —O-n-hexyl |
| 14-24 | n-hexyl | H | —O-n-hexyl | —O-n-hexyl |
| 14-25 | n-butyl | —O-n-butyl | H | H |
| 14-26 | n-butyl | —O-n-butyl | H | H |
| 14-27 | n-butyl | —O-n-butyl | H | H |
| 14-28 | n-butyl | —O-n-butyl | H | —O-n-butyl |
| 14-29 | n-butyl | —O-n-butyl | H | —O-n-butyl |
| 14-30 | n-butyl | —O-n-butyl | H | —O-n-butyl |
| 14-31 | n-butyl | H | H | —O-n-butyl |
| 14-32 | n-butyl | H | H | —O-n-butyl |
| 14-33 | n-butyl | H | H | —O-n-butyl |
| 14-34 | n-butyl | H | —O-n-butyl | —O-n-butyl |
| 14-35 | n-butyl | H | —O-n-butyl | —O-n-butyl |
| 14-36 | n-butyl | H | —O-n-butyl | —O-n-butyl |
| 14-37 | 2-ethylhexyl | —O-2-ethylhexyl | H | H |
| 14-38 | 2-ethylhexyl | —O-2-ethylhexyl | H | H |
| 14-39 | 2-ethylhexyl | —O-2-ethylhexyl | H | H |
| 14-40 | 2-ethylhexyl | —O-2-ethylhexyl | H | —O-2-ethylhexyl |

-continued

| | | | | |
|---|---|---|---|---|
| 14-41 | 2-ethylhexyl | —O-2-ethylhexyl | H | —O-2-ethylhexyl |
| 14-42 | 2-ethylhexyl | —O-2-ethylhexyl | H | —O-2-ethylhexyl |
| 14-43 | 2-ethylhexyl | H | H | —O-2-ethylhexyl |
| 14-44 | 2-ethylhexyl | H | H | —O-2-ethylhexyl |
| 14-45 | 2-ethylhexyl | H | H | —O-2-ethylhexyl |
| 14-46 | 2-ethylhexyl | H | —O-2-ethylhexyl | —O-2-ethylhexyl |
| 14-47 | 2-ethylhexyl | H | —O-2-ethylhexyl | —O-2-ethylhexyl |
| 14-48 | 2-ethylhexyl | H | —O-2-ethylhexyl | —O-2-ethylhexyl |
| 14-49 | n-octyl | O-n-octyl | H | H |
| 14-50 | n-octyl | O-n-octyl | H | H |
| 14-51 | n-octyl | O-n-octyl | H | H |
| 14-52 | n-octyl | O-n-octyl | H | O-n-octyl |
| 14-53 | n-octyl | O-n-octyl | H | O-n-octyl |
| 14-54 | n-octyl | O-n-octyl | H | O-n-octyl |
| 14-55 | n-octyl | H | H | O-n-octyl |
| 14-56 | n-octyl | H | H | O-n-octyl |
| 14-57 | n-octyl | H | H | O-n-octyl |
| 14-58 | n-octyl | H | O-n-octyl | O-n-octyl |
| 14-59 | n-octyl | H | O-n-octyl | O-n-octyl |
| 14-60 | n-octyl | H | O-n-octyl | O-n-octyl |
| 14-61 | Ph | —O-2-ethylhexyl | H | H |
| 14-62 | Ph | —O-2-ethylhexyl | H | H |
| 14-63 | Ph | —O-2-ethylhexyl | H | H |
| 14-64 | Ph | —O-2-ethylhexyl | H | —O-2-ethylhexyl |
| 14-65 | Ph | —O-2-ethylhexyl | H | —O-2-ethylhexyl |
| 14-66 | Ph | —O-2-ethylhexyl | H | —O-2-ethylhexyl |
| 14-67 | Ph | H | H | —O-2-ethylhexyl |
| 14-68 | Ph | H | H | —O-2-ethylhexyl |
| 14-69 | Ph | H | H | —O-2-ethylhexyl |
| 14-70 | Ph | H | —O-2-ethylhexyl | —O-2-ethylhexyl |
| 14-71 | Ph | H | —O-2-ethylhexyl | —O-2-ethylhexyl |
| 14-72 | Ph | H | —O-2-ethylhexyl | —O-2-ethylhexyl |
| 14-73 | m-$C_6H_4CF_3$ | —O-2-ethylhexyl | H | H |
| 14-73 | m-$C_6H_4CF_3$ | —O-2-ethylhexyl | H | H |
| 14-75 | m-$C_6H_4CF_3$ | —O-2-ethylhexyl | H | H |
| 14-76 | m-$C_6H_4CF_3$ | —O-2-ethylhexyl | H | —O-2-ethylhexyl |
| 14-77 | m-$C_6H_4CF_3$ | —O-2-ethylhexyl | H | —O-2-ethylhexyl |
| 14-78 | m-$C_6H_4CF_3$ | —O-2-ethylhexyl | H | —O-2-ethylhexyl |
| 14-79 | m-$C_6H_4CF_3$ | H | H | —O-2-ethylhexyl |
| 14-80 | m-$C_6H_4CF_3$ | H | H | —O-2-ethylhexyl |
| 14-81 | m-$C_6H_4CF_3$ | H | H | —O-2-ethylhexyl |
| 14-82 | m-$C_6H_4CF_3$ | H | —O-2-ethylhexyl | —O-2-ethylhexyl |
| 14-83 | m-$C_6H_4CF_3$ | H | —O-2-ethylhexyl | —O-2-ethylhexyl |
| 14-84 | m-$C_6H_4CF_3$ | H | —O-2-ethylhexyl | —O-2-ethylhexyl |

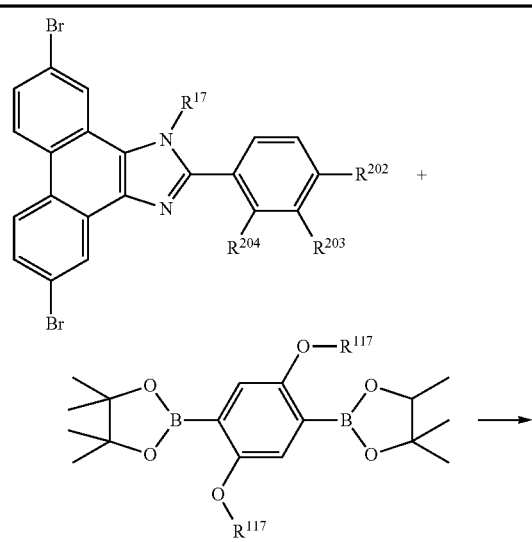

-continued

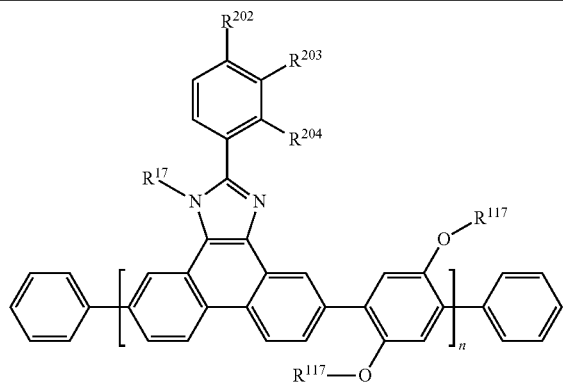

R$^{117}$ = n-octyl

| Polymer No. | R$^{17}$ | R$^{202}$ | R$^{203}$ | R$^{204}$ |
|---|---|---|---|---|
| 15-1 | n-octyl | —O-n-octyl | H | H |
| 15-2 | n-octyl | —O-n-octyl | H | H |
| 15-3 | n-octyl | —O-n-octyl | H | H |
| 15-4 | n-octyl | —O-n-octyl | H | —O-n-octyl |
| 15-5 | n-octyl | —O-n-octyl | H | —O-n-octyl |
| 15-6 | n-octyl | —O-n-octyl | H | —O-n-octyl |
| 15-7 | n-octyl | H | H | —O-n-octyl |
| 15-8 | n-octyl | H | H | —O-n-octyl |
| 15-9 | n-octyl | H | H | —O-n-octyl |
| 15-10 | n-octyl | H | —O-n-octyl | —O-n-octyl |
| 15-11 | n-octyl | H | —O-n-octyl | —O-n-octyl |
| 15-12 | n-octyl | H | —O-n-octyl | —O-n-octyl |
| 15-13 | n-hexyl | —O-n-hexyl | H | H |
| 15-14 | n-hexyl | —O-n-hexyl | H | H |
| 15-15 | n-hexyl | —O-n-hexyl | H | H |
| 15-16 | n-hexyl | —O-n-hexyl | H | —O-n-hexyl |
| 15-17 | n-hexyl | —O-n-hexyl | H | —O-n-hexyl |
| 15-18 | n-hexyl | —O-n-hexyl | H | —O-n-hexyl |
| 15-19 | n-hexyl | H | H | —O-n-hexyl |
| 15-20 | n-hexyl | H | H | —O-n-hexyl |
| 15-21 | n-hexyl | H | H | —O-n-hexyl |
| 15-22 | n-hexyl | H | —O-n-hexyl | —O-n-hexyl |
| 15-23 | n-hexyl | H | —O-n-hexyl | —O-n-hexyl |
| 15-24 | n-hexyl | H | —O-n-hexyl | —O-n-hexyl |
| 15-25 | n-butyl | —O-n-butyl | H | H |
| 15-26 | n-butyl | —O-n-butyl | H | H |
| 15-27 | n-butyl | —O-n-butyl | H | H |
| 15-28 | n-butyl | —O-n-butyl | H | —O-n-butyl |
| 15-29 | n-butyl | —O-n-butyl | H | —O-n-butyl |
| 15-30 | n-butyl | —O-n-butyl | H | —O-n-butyl |
| 15-31 | n-butyl | H | H | —O-n-butyl |
| 15-32 | n-butyl | H | H | —O-n-butyl |
| 15-33 | n-butyl | H | H | —O-n-butyl |
| 15-34 | n-butyl | H | —O-n-butyl | —O-n-butyl |
| 15-35 | n-butyl | H | —O-n-butyl | —O-n-butyl |
| 15-36 | n-butyl | H | —O-n-butyl | —O-n-butyl |
| 15-37 | 2-ethylhexyl | —O-2-ethylhexyl | H | H |
| 15-38 | 2-ethylhexyl | —O-2-ethylhexyl | H | H |
| 15-39 | 2-ethylhexyl | —O-2-ethylhexyl | H | H |
| 15-40 | 2-ethylhexyl | —O-2-ethylhexyl | H | —O-2-ethylhexyl |
| 15-41 | 2-ethylhexyl | —O-2-ethylhexyl | H | —O-2-ethylhexyl |
| 15-42 | 2-ethylhexyl | —O-2-ethylhexyl | H | —O-2-ethylhexyl |
| 15-43 | 2-ethylhexyl | H | H | —O-2-ethylhexyl |
| 15-44 | 2-ethylhexyl | H | H | —O-2-ethylhexyl |
| 15-45 | 2-ethylhexyl | H | H | —O-2-ethylhexyl |
| 15-46 | 2-ethylhexyl | H | —O-2-ethylhexyl | —O-2-ethylhexyl |
| 15-47 | 2-ethylhexyl | H | —O-2-ethylhexyl | —O-2-ethylhexyl |
| 15-48 | 2-ethylhexyl | H | —O-2-ethylhexyl | —O-2-ethylhexyl |
| 15-49 | n-octyl | O-n-octyl | H | H |
| 15-50 | n-octyl | O-n-octyl | H | H |
| 15-51 | n-octyl | O-n-octyl | H | H |
| 15-52 | n-octyl | O-n-octyl | H | O-n-octyl |
| 15-53 | n-octyl | O-n-octyl | H | O-n-octyl |
| 15-54 | n-octyl | O-n-octyl | H | O-n-octyl |
| 15-55 | n-octyl | H | H | O-n-octyl |

| | | | | |
|---|---|---|---|---|
| 15-56 | n-octyl | H | H | O-n-octyl |
| 15-57 | n-octyl | H | H | O-n-octyl |
| 15-58 | n-octyl | H | O-n-octyl | O-n-octyl |
| 15-59 | n-octyl | H | O-n-octyl | O-n-octyl |
| 15-60 | n-octyl | H | O-n-octyl | O-n-octyl |
| 15-61 | Ph | —O-2-ethylhexyl | H | H |
| 15-62 | Ph | —O-2-ethylhexyl | H | H |
| 15-63 | Ph | —O-2-ethylhexyl | H | H |
| 15-64 | Ph | —O-2-ethylhexyl | H | —O-2-ethylhexyl |
| 15-65 | Ph | —O-2-ethylhexyl | H | —O-2-ethylhexyl |
| 15-66 | Ph | —O-2-ethylhexyl | H | —O-2-ethylhexyl |
| 15-67 | Ph | H | H | —O-2-ethylhexyl |
| 15-68 | Ph | H | H | —O-2-ethylhexyl |
| 15-69 | Ph | H | H | —O-2-ethylhexyl |
| 15-70 | Ph | H | —O-2-ethylhexyl | —O-2-ethylhexyl |
| 15-71 | Ph | H | —O-2-ethylhexyl | —O-2-ethylhexyl |
| 15-72 | Ph | H | —O-2-ethylhexyl | —O-2-ethylhexyl |
| 15-73 | m-C$_6$H$_4$CF$_3$ | —O-2-ethylhexyl | H | H |
| 15-73 | m-C$_6$H$_4$CF$_3$ | —O-2-ethylhexyl | H | H |
| 15-75 | m-C$_6$H$_4$CF$_3$ | —O-2-ethylhexyl | H | H |
| 15-76 | m-C$_6$H$_4$CF$_3$ | —O-2-ethylhexyl | H | —O-2-ethylhexyl |
| 15-77 | m-C$_6$H$_4$CF$_3$ | —O-2-ethylhexyl | H | —O-2-ethylhexyl |
| 15-78 | m-C$_6$H$_4$CF$_3$ | —O-2-ethylhexyl | H | —O-2-ethylhexyl |
| 15-79 | m-C$_6$H$_4$CF$_3$ | H | H | —O-2-ethylhexyl |
| 15-80 | m-C$_6$H$_4$CF$_3$ | H | H | —O-2-ethylhexyl |
| 15-81 | m-C$_6$H$_4$CF$_3$ | H | H | —O-2-ethylhexyl |
| 15-82 | m-C$_6$H$_4$CF$_3$ | H | —O-2-ethylhexyl | —O-2-ethylhexyl |
| 15-83 | m-C$_6$H$_4$CF$_3$ | H | —O-2-ethylhexyl | —O-2-ethylhexyl |
| 15-84 | m-C$_6$H$_4$CF$_3$ | H | —O-2-ethylhexyl | —O-2-ethylhexyl |

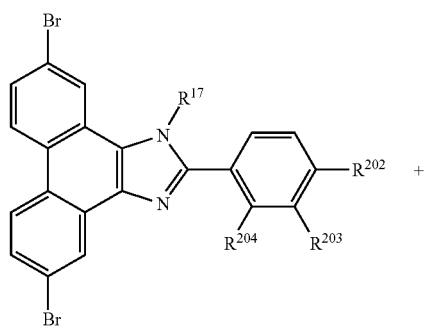

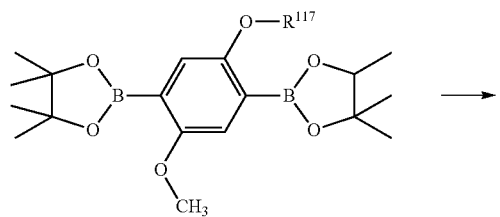

-continued

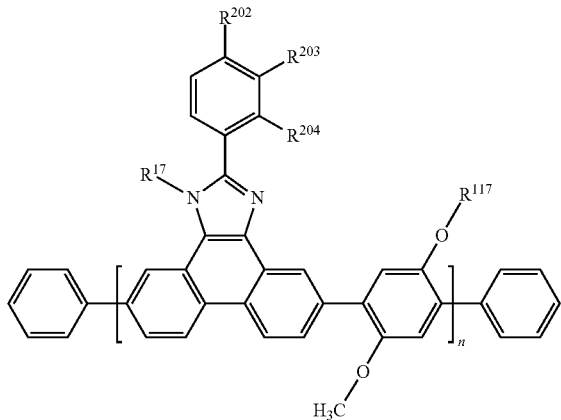

R$^{117}$ = n-octyl

| Polymer No. | R$^{17}$ | R$^{202}$ | R$^{203}$ | R$^{204}$ |
| --- | --- | --- | --- | --- |
| 16-1 | n-octyl | —O-n-octyl | H | H |
| 16-2 | n-octyl | —O-n-octyl | H | H |
| 16-3 | n-octyl | —O-n-octyl | H | H |
| 16-4 | n-octyl | —O-n-octyl | H | —O-n-octyl |
| 16-5 | n-octyl | —O-n-octyl | H | —O-n-octyl |
| 16-6 | n-octyl | —O-n-octyl | H | —O-n-octyl |
| 16-7 | n-octyl | H | H | —O-n-octyl |
| 16-8 | n-octyl | H | H | —O-n-octyl |
| 16-9 | n-octyl | H | H | —O-n-octyl |
| 16-10 | n-octyl | H | —O-n-octyl | —O-n-octyl |
| 16-11 | n-octyl | H | —O-n-octyl | —O-n-octyl |
| 16-12 | n-octyl | H | —O-n-octyl | —O-n-octyl |
| 16-13 | n-hexyl | —O-n-hexyl | H | H |
| 16-14 | n-hexyl | —O-n-hexyl | H | H |
| 16-15 | n-hexyl | —O-n-hexyl | H | H |
| 16-16 | n-hexyl | —O-n-hexyl | H | —O-n-hexyl |
| 16-17 | n-hexyl | —O-n-hexyl | H | —O-n-hexyl |
| 16-18 | n-hexyl | —O-n-hexyl | H | —O-n-hexyl |
| 16-19 | n-hexyl | H | H | —O-n-hexyl |
| 16-20 | n-hexyl | H | H | —O-n-hexyl |
| 16-21 | n-hexyl | H | H | —O-n-hexyl |
| 16-22 | n-hexyl | H | —O-n-hexyl | —O-n-hexyl |
| 16-23 | n-hexyl | H | —O-n-hexyl | —O-n-hexyl |
| 16-24 | n-hexyl | H | —O-n-hexyl | —O-n-hexyl |
| 16-25 | n-butyl | —O-n-butyl | H | H |
| 16-26 | n-butyl | —O-n-butyl | H | H |
| 16-27 | n-butyl | —O-n-butyl | H | H |
| 16-28 | n-butyl | —O-n-butyl | H | —O-n-butyl |
| 16-29 | n-butyl | —O-n-butyl | H | —O-n-butyl |
| 16-30 | n-butyl | —O-n-butyl | H | —O-n-butyl |
| 16-31 | n-butyl | H | H | —O-n-butyl |
| 16-32 | n-butyl | H | H | —O-n-butyl |
| 16-33 | n-butyl | H | H | —O-n-butyl |
| 16-34 | n-butyl | H | —O-n-butyl | —O-n-butyl |
| 16-35 | n-butyl | H | —O-n-butyl | —O-n-butyl |
| 16-36 | n-butyl | H | —O-n-butyl | —O-n-butyl |
| 16-37 | 2-ethylhexyl | —O-2-ethylhexyl | H | H |
| 16-38 | 2-ethylhexyl | —O-2-ethylhexyl | H | H |
| 16-39 | 2-ethylhexyl | —O-2-ethylhexyl | H | H |
| 16-40 | 2-ethylhexyl | —O-2-ethylhexyl | H | —O-2-ethylhexyl |
| 16-41 | 2-ethylhexyl | —O-2-ethylhexyl | H | —O-2-ethylhexyl |
| 16-42 | 2-ethylhexyl | —O-2-ethylhexyl | H | —O-2-ethylhexyl |
| 16-43 | 2-ethylhexyl | H | H | —O-2-ethylhexyl |
| 16-44 | 2-ethylhexyl | H | H | —O-2-ethylhexyl |
| 16-45 | 2-ethylhexyl | H | H | —O-2-ethylhexyl |
| 16-46 | 2-ethylhexyl | H | —O-2-ethylhexyl | —O-2-ethylhexyl |
| 16-47 | 2-ethylhexyl | H | —O-2-ethylhexyl | —O-2-ethylhexyl |
| 16-48 | 2-ethylhexyl | H | —O-2-ethylhexyl | —O-2-ethylhexyl |
| 16-49 | n-octyl | O-n-octyl | H | H |
| 16-50 | n-octyl | O-n-octyl | H | H |
| 16-51 | n-octyl | O-n-octyl | H | H |
| 16-52 | n-octyl | O-n-octyl | H | O-n-octyl |

-continued

| | | | | |
|---|---|---|---|---|
| 16-53 | n-octyl | O-n-octyl | H | O-n-octyl |
| 16-54 | n-octyl | O-n-octyl | H | O-n-octyl |
| 16-55 | n-octyl | H | H | O-n-octyl |
| 16-56 | n-octyl | H | H | O-n-octyl |
| 16-57 | n-octyl | H | H | O-n-octyl |
| 16-58 | n-octyl | H | O-n-octyl | O-n-octyl |
| 16-59 | n-octyl | H | O-n-octyl | O-n-octyl |
| 16-60 | n-octyl | H | O-n-octyl | O-n-octyl |
| 16-61 | Ph | —O-2-ethylhexyl | H | H |
| 16-62 | Ph | —O-2-ethylhexyl | H | H |
| 16-63 | Ph | —O-2-ethylhexyl | H | H |
| 16-64 | Ph | —O-2-ethylhexyl | H | —O-2-ethylhexyl |
| 16-65 | Ph | —O-2-ethylhexyl | H | —O-2-ethylhexyl |
| 16-66 | Ph | —O-2-ethylhexyl | H | —O-2-ethylhexyl |
| 16-67 | Ph | H | H | —O-2-ethylhexyl |
| 16-68 | Ph | H | H | —O-2-ethylhexyl |
| 16-69 | Ph | H | H | —O-2-ethylhexyl |
| 16-70 | Ph | H | —O-2-ethylhexyl | —O-2-ethylhexyl |
| 16-71 | Ph | H | —O-2-ethylhexyl | —O-2-ethylhexyl |
| 16-72 | Ph | H | —O-2-ethylhexyl | —O-2-ethylhexyl |
| 16-73 | m-C$_6$H$_4$CF$_3$ | —O-2-ethylhexyl | H | H |
| 16-73 | m-C$_6$H$_4$CF$_3$ | —O-2-ethylhexyl | H | H |
| 16-75 | m-C$_6$H$_4$CF$_3$ | —O-2-ethylhexyl | H | H |
| 16-76 | m-C$_6$H$_4$CF$_3$ | —O-2-ethylhexyl | H | —O-2-ethylhexyl |
| 16-77 | m-C$_6$H$_4$CF$_3$ | —O-2-ethylhexyl | H | —O-2-ethylhexyl |
| 16-78 | m-C$_6$H$_4$CF$_3$ | —O-2-ethylhexyl | H | —O-2-ethylhexyl |
| 16-79 | m-C$_6$H$_4$CF$_3$ | H | H | —O-2-ethylhexyl |
| 16-80 | m-C$_6$H$_4$CF$_3$ | H | H | —O-2-ethylhexyl |
| 16-81 | m-C$_6$H$_4$CF$_3$ | H | H | —O-2-ethylhexyl |
| 16-82 | m-C$_6$H$_4$CF$_3$ | H | —O-2-ethylhexyl | —O-2-ethylhexyl |
| 16-83 | m-C$_6$H$_4$CF$_3$ | H | —O-2-ethylhexyl | —O-2-ethylhexyl |
| 16-84 | m-C$_6$H$_4$CF$_3$ | H | —O-2-ethylhexyl | —O-2-ethylhexyl |

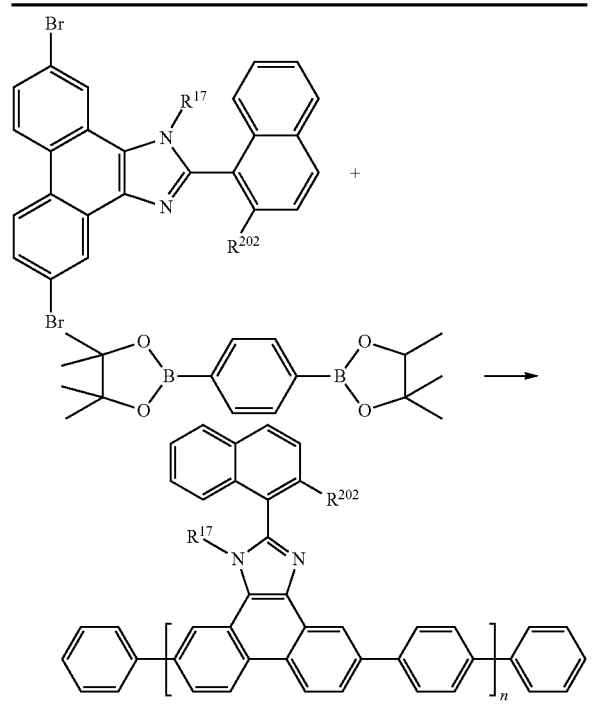

| Polymer No. | R$^{17}$ | R$^{202}$ |
|---|---|---|
| 16-1 | n-octyl | —O-n-octyl |
| 16-2 | n-hexyl | —O-n-hexyl |
| 16-3 | n-butyl | —O-n-butyl |
| 16-4 | —O-2-ethylhexyl | —O-2-ethylhexyl |
| 16-5 | Ph | —O-2-ethylhexyl |

-continued

| | | |
|---|---|---|
| 16-6 | Ph | —O-n-octyl |
| 16-7 | Ph | —O-n-hexyl |
| 16-8 | m-C$_6$H$_4$CF$_3$ | —O-2-ethylhexyl |
| 16-9 | m-C$_6$H$_4$CF$_3$ | —O-n-octyl |
| 16-10 | m-C$_6$H$_4$CF$_3$ | —O-n-hexyl |

Application Example 1

An organic luminescence device having a single organic layer is prepared in the following manner: On a glass substrate, a 100 nm thick ITO film is formed by sputtering and subsequently patterned. Onto the oxygen-plasma treated ITO film a 80 nm thick hole-injection layer using PEDOT:PSS (Baytron P) is formed by spin-coating followed by heating at 200° C. (5 minutes). A solution containing 4 mg of a diamine derivative (TPD) as hole transporting material and 6 mg of the compound of example 39 in 1 ml toluene is applied by spin coating (1500 rep. 10 sec.) to obtain a thickness of 80 nm. Then the thus treated substrate is set in a vacuum deposition chamber and a cathode having two-layer electrode structure is formed by depositing 5 nm barium followed by 100 nm aluminum.

When the device is driven at a current density of 10 mA/cm$^2$ (at 4V) the resultant emission shows a deep blue color (CIE 0.19, 0.14) with an efficacy of 0.6 cd/A.

Application Example 2

A device is fabricated as described in application example 1, except that the compound of example 68 is used. The resultant efficacy is 0.2 cd/A when driving the device at 10 mA/cm$^2$.

The invention claimed is:

1. A polymer comprising a repeating unit(s) of the formula

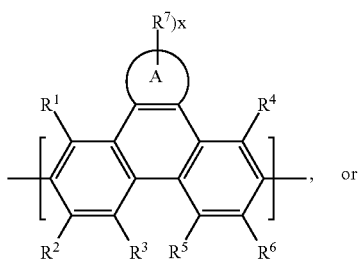
(Ia)

or

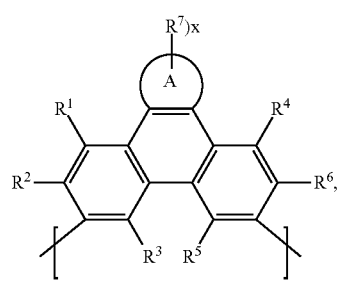
(Ib)

wherein A is a 5-, 6-, or 7-membered heteroaromatic ring selected from the group consisting of

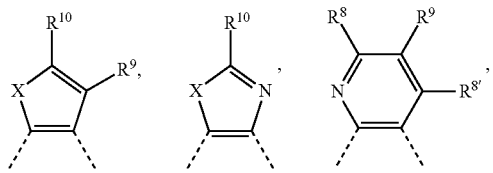

and

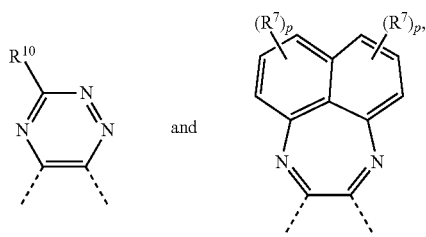

wherein

X is O, S or N—$R^{17}$; p is 0, 1, 2, or 3; the dotted line - - - indicates bonding to the benzene ring, $R^7$, $R^8$, $R^{8'}$ and $R^9$ are independently of each other H, $C_1$-$C_{18}$alkyl, $C_1$-$C_{18}$ which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, or

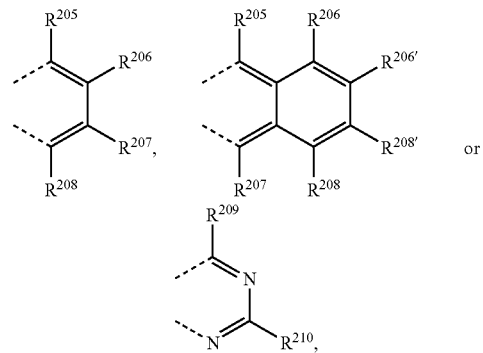

$R^8$ and $R^9$ together form a group wherein $R^{206'}$, $R^{208'}$, $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_7$-$C_{25}$aralkyl, CN, or —CO—$R^{28}$, and $R^{10}$ is H, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, —CO—$R^{28}$, or a group

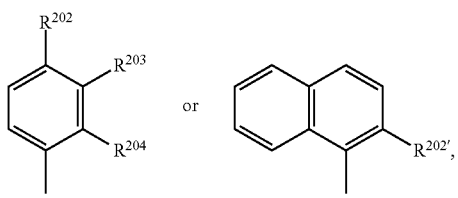

wherein $R^{202'}$ is $C_1$-$C_{18}$alkyl, $C_1$-$C_{18}$alkyl which is substituted by E and/or interrupted by D, $C_1$-$C_{18}$perfluoroalkyl, $C_1$-$C_{18}$alkoxy, or $C_1$-$C_{18}$alkoxy which is substituted by E and/or interrupted by D; one of $R^{202}$, $R^{203}$, or $R^{204}$ is $R^{202'}$, and the other groups are H or $R^{202'}$;

$R^1$, $R^2$, $R^3$, $R^4$, $R^5$ and $R^6$ are independently of each other hydrogen, halogen, or an organic substituent, or $R^1$ and $R^2$, $R^4$ and $R^6$, $R^2$ and $R^3$, $R^5$ and $R^3$ and/or $R^5$ and $R^6$, which are adjacent to each other, together form a group

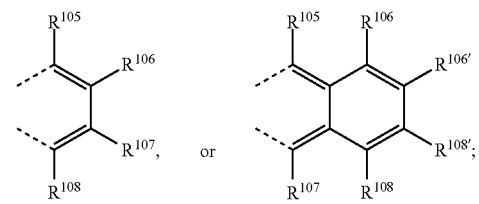

or two substituents $R^5$ and $R^3$, which are adjacent to each other, together form a group

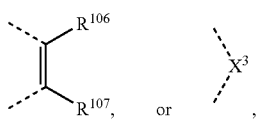

wherein $X^3$ is O, S, $C(R^{119})(R^{120})$, or $NR^{17}$, $R^{17}$ is H; $C_6$-$C_{18}$aryl; $C_2$-$C_{20}$heteroaryl; $C_6$-$C_{18}$aryl, or $C_2$-$C_{20}$heteroaryl, which are substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—;

$R^{105}$, $R^{106}$, $R^{107}$, $R^{108}$, $R^{106'}$ and $R^{108'}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $R^{119}$ and $R^{120}$ together form a group of formula $=CR^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=C)—$R^{127}$, and $R^{127}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—; —COO—; —S—; —SO—; —$SO_2$—; —O—; —$NR^{25}$—; —$SiR^{30}R^{31}$—; —$POR^{32}$—; —$CR^{23}$=$CR^{24}$—; or —C≡C—;

E is —$OR^{29}$; —$SR^{29}$; —$NR^{25}R^{26}$; —$COR^{28}$; —$COOR^{27}$; —$CONR^{25}R^{26}$; —CN; or halogen;

G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{23}$, $R^{24}$, $R^{25}$ and $R^{26}$ are independently of each other H; $C_6$-$C_{18}$aryl; $C_6$-$C_{18}$aryl substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, $R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy, $C_1$-$C_{18}$alkyl; or $C_1$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl and $R^{32}$ is $C_1$-$C_{18}$alkyl, $C_6$-$C_{18}$aryl, or $C_6$-$C_{18}$aryl, which is substituted by $C_1$-$C_{18}$alkyl;

x is 0, or an integer of 1 to 5;

wherein the polymer has a weight average molecular weight of 10,000 to 1,000,000 Daltons.

2. A polymer according to claim 1, comprising a repeating unit(s) of the formula

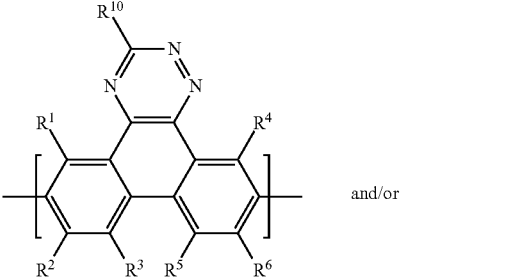

and/or

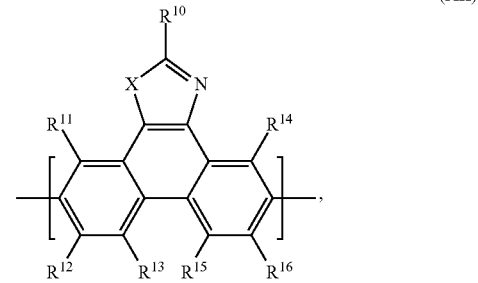

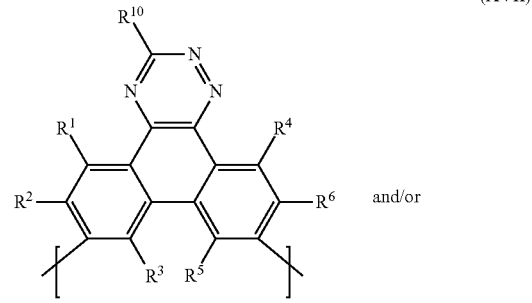

and/or

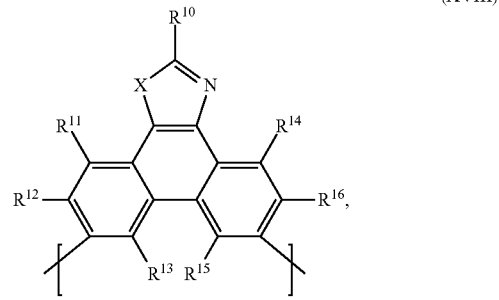

wherein $R^1$ and $R^4$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^2$, $R^3$, $R^5$ and $R^6$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, $R^{10}$ is H, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, —CO—$R^{28}$ or a group

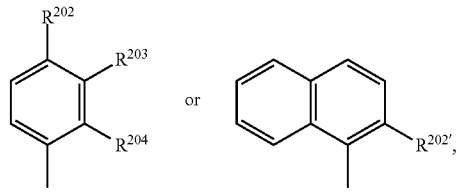

wherein $R^{202'}$ is $C_1$-$C_{18}$alkyl, $C_1$-$C_{18}$alkyl which is substituted by E and/or interrupted by D, $C_1$-$C_{18}$perfluoroalkyl, $C_1$-$C_{18}$alkoxy, or $C_1$-$C_{18}$alkoxy which is substituted by E and/or interrupted by D; one of $R^{202}R^{203}$, or $R^{204}$ is $R^{202'}$, and the other groups are H or $R^{202'}$, $R^{11}$ and $R^{14}$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^{12}$, $R^{13}$, $R^{15}$ and $R^{16}$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN or —CO—$R^{28}$, X is O, S, or $NR^{17}$, wherein $R^{17}$ is H; $C_6$-$C_{18}$aryl; $C_2$-$C_{20}$heteroaryl; $C_6$-$C_{18}$aryl, or $C_2$-$C_{20}$heteroaryl, which are substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—;

or two substituents $R^1$ and $R^2$, $R^4$ and $R^6$, $R^{11}$ and $R^{12}$, and/or $R^{14}$ and $R^{16}$, $R^2$ and $R^3$, $R^5$ and $R^6$, $R^{12}$ and $R^{13}$, and/or $R^{15}$ and $R^{16}$, which are adjacent to each other, together form a group

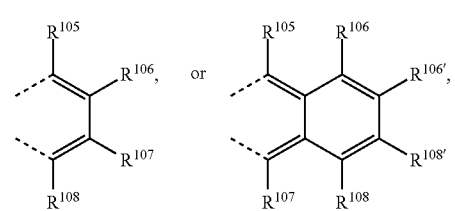

or two substituents $R^{15}$ and $R^{13}$, and/or $R^5$ and $R^3$, which are adjacent to each other, together form a group

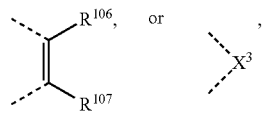

wherein $X^3$ is O, S, $C(R^{119})(R^{120})$, or $NR^{17}$, wherein $R^{17}$ is as defined above, $R^{105}$, $R^{106}$, $R^{107}$, $R^{108}$, $R^{106'}$ and $R^{108'}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $R^{119}$ and $R^{120}$ together form a group of formula =$CR^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{127}$, and $R^{127}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—; —COO—; —S—; —SO—; —SO$_2$—; —O—; —$NR^{25}$—; —$SiR^{30}R^{31}$—; —$POR^{32}$—; —$CR^{23}$=$CR^{24}$—; or —C≡C—; and E is —$OR^{29}$; —$SR^{29}$; —$NR^{25}R^{26}$; —$COR^{28}$; —$COOR^{27}$; —$CONR^{25}R^{26}$; —CN; or halogen; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, $R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{32}$ is $C_1$-$C_{18}$alkyl, $C_6$-$C_{18}$aryl, or $C_6$-$C_{18}$aryl, which is substituted by $C_1$-$C_{18}$alkyl.

3. A polymer according to claim 2, comprising a repeating unit of the formula XI, wherein $R^1$ and $R^4$ are hydrogen, $R^2$, $R^3$, $R^5$ and $R^6$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $C_7$-$C_{25}$aralkyl, or a group —$X^2$—$R^{18}$, or two substituents $R^2$ and $R^3$ and/or $R^5$ and $R^6$, which are adjacent to each other, together form a group

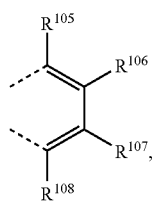

or two substituents $R^5$ and $R^3$, which are adjacent to each other, together form a group

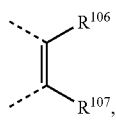

wherein $R^{105}$, $R^{106}$, $R^{107}$ and —$R^{108}$ are independently of each other H, or $C_1$-$C_8$alkyl, $R^{10}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group

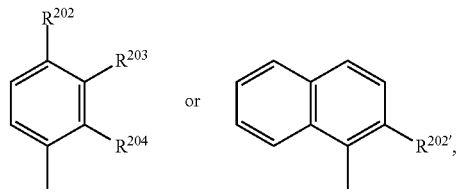

wherein $R^{202'}$ is $C_1$-$C_{18}$alkyl, $C_1$-$C_{18}$alkyl which is substituted by E and/or interrupted by D, $C_1$-$C_{18}$perfluoroalkyl, $C_1$-$C_{18}$alkoxy, or $C_1$-$C_{18}$alkoxy which is substituted by E and/or interrupted by D, one of $R^{202}$, $R^{203}$, or $R^{204}$ is $R^{202'}$, and the other groups are H or $R^{202'}$, D is —CO—; —COO—; —S—; —SO—; —$SO_2$—; —O—; —$NR^{25}$—; —$CR^{23}$=$CR^{24}$—; or —C≡C—; wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or $R^{25}$ and $R^{26}$ together form a five or six membered ring.

4. A polymer according to claim 2, comprising a repeating unit of the formula

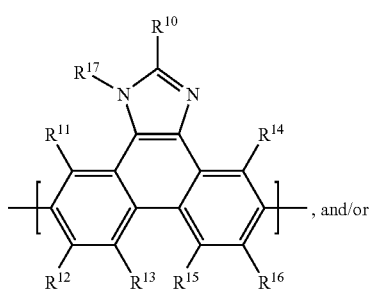

(XIIa)

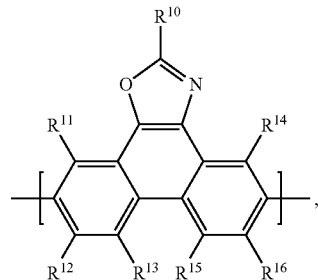

(XIIb)

$R^{10}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group

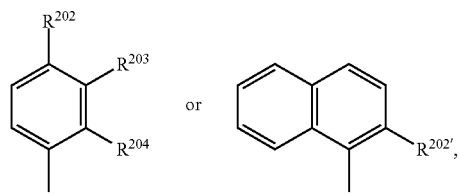

wherein $R^{202'}$ is $C_1$-$C_{18}$alkyl, $C_1$-$C_{18}$alkyl which is substituted by E and/or interrupted by D, $C_1$-$C_{18}$perfluoroalkyl, $C_1$-$C_{18}$alkoxy, or $C_1$-$C_{18}$alkoxy which is substituted by E and/or interrupted by D, one of $R^{202}$, $R^{203}$, or $R^{204}$ is $R^{202'}$, and the other groups are H or $R^{202'}$, $R^{11}$ and $R^{14}$ are hydrogen, $R^{12}$, $R^{13}$, $R^{15}$ and $R^{16}$ are hydrogen, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; or two substituents $R^5$ and $R^3$, $R^{12}$ and $R^{13}$, and/or $R^{15}$ and $R^{16}$, which are adjacent to each other, together form a group

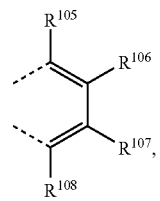

or two substituents $R^{15}$ and $R^{13}$, which are adjacent to each other, together form a group

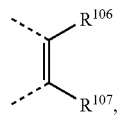

wherein $R^{105}$, $R^{106}$, $R^{107}$ and $R^{108}$ are independently of each other H, or $C_1$-$C_8$alkyl, D is —S—; —O—; or —NR²⁵—;

E is —OR²⁹; —SR²⁹; —NR²⁵R²⁶; —CN; or F; G is E, C₁-C₁₈alkyl, C₁-C₁₈alkyl which is interrupted by D, C₁-C₁₈perfluoroalkyl, C₁-C₁₈alkoxy, or C₁-C₁₈alkoxy which is substituted by E and/or interrupted by D, wherein R²⁵ and R²⁶ are independently of each other H; C₆-C₁₈aryl; C₆-C₁₈aryl which is substituted by C₁-C₈alkyl, or C₁-C₈alkoxy; C₁-C₈alkyl; or C₁-C₈alkyl which is interrupted by —O—, or R²⁵ and R²⁶ together form a five or six membered ring, and R²⁹ is C₆-C₁₈aryl; C₆-C₁₈aryl, which is substituted by C₁-C₁₈alkyl, or C₁-C₁₈alkoxy; C₁-C₁₈alkyl; or C₁-C₁₈alkyl which is interrupted by —O—.

5. The polymer according to claim 1, comprising one or more repeating unit Ar³ which is selected from the group consisting of

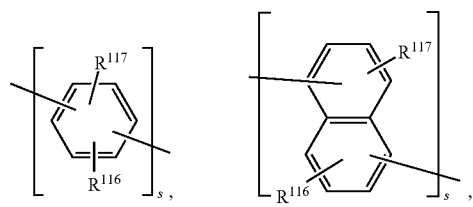

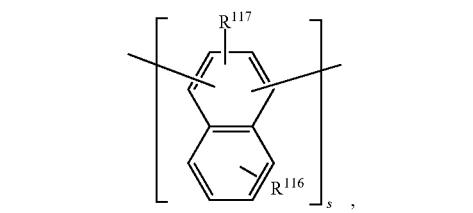

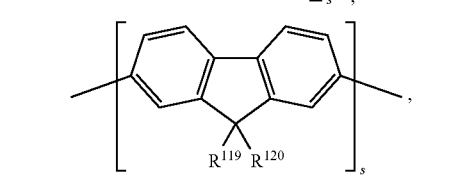

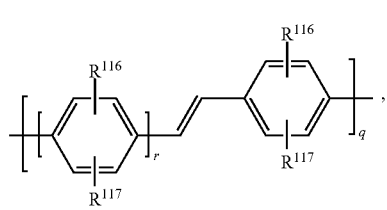

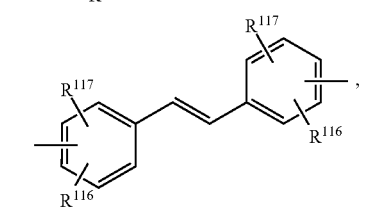

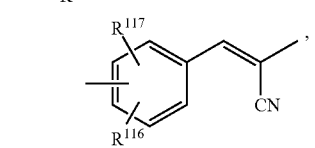

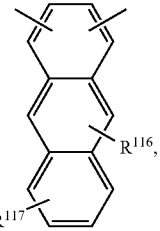
(Vg)

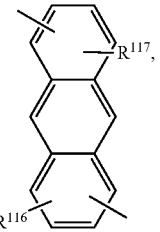
(Vh)

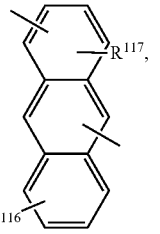
(Vi)

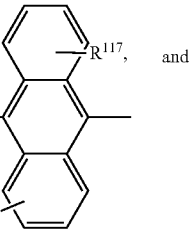
(Vj)

and

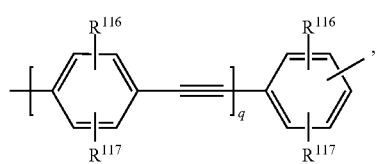
(Vn)

wherein
r is an integer from 1 to 10,
q is an integer from 1 to 10,
s is an integer from 1 to 10,
R¹¹⁶ and R¹¹⁷ are independently of each other H, halogen, —CN, C₁-C₁₈alkyl, C₁-C₁₈alkyl which is substituted by E and/or interrupted by D, C₆-C₂₄aryl, C₆-C₂₄aryl which is substituted by G, C₂-C₂₀heteroaryl, C₂-C₂₀heteroaryl which is substituted by G, C₂-C₁₈alkenyl, C₂-C₁₈alkynyl, C₁-C₁₈alkoxy, C₁-C₁₈alkoxy which is substituted by E and/or interrupted by D, C₇-C₂₅aralkyl, —C(=O)—R¹²⁷, —C(=O)OR¹²⁷, or —C(=O)NR¹²⁷R¹²⁶, R¹¹⁹ and R¹²⁰ are independently of each other H, C₁-C₁₈alkyl, C₁-C₁₈alkyl which is substituted by E and/or interrupted by D, C₆-C₂₄aryl, C₆-C₂₄aryl which is substituted by G, C₂-C₂₀heteroaryl, C₂-C₂₀heteroaryl which is substituted by G, C₂-C₁₈alkenyl, C₂-C₁₈alkynyl, C₁-C₁₈alkoxy, C₁-C₁₈alkoxy which is substituted by E and/or interrupted by D, or C₇-C₂₅aralkyl, or R$^{119}$ and R$^{120}$ together form a group of formula =CR$^{121}$R$^{122}$, wherein R$^{121}$ and R$^{122}$ are independently of each other H, C$_1$-C$_{18}$alkyl, C$_1$-C$_{18}$alkyl which is substituted by E and/or interrupted by D, C$_6$-C$_{24}$aryl, C$_6$-C$_{24}$aryl which is substituted by G, or C$_2$-C$_{20}$heteroaryl, or C$_2$-C$_{20}$heteroaryl which is substituted by G, or R$^{119}$ and R$^{120}$ together form a five or six membered ring, which optionally can be substituted by C$_1$-C$_{18}$alkyl, C$_1$-C$_{18}$alkyl which is substituted by E and/or interrupted by D, C$_6$-C$_{24}$aryl, C$_6$-C$_{24}$aryl which is substituted by G, C$_2$-C$_{20}$heteroaryl, C$_2$-C$_{20}$heteroaryl which is substituted by G, C$_2$-C$_{18}$alkenyl, C$_2$-C$_{18}$alkynyl, C$_1$-C$_{18}$alkoxy, C$_1$-C$_{18}$alkoxy which is substituted by E and/or interrupted by D, C$_7$-C$_{25}$aralkyl, or —C(=O)—R$^{127}$, and R$^{126}$ and R$^{127}$ are independently of each other H; C$_6$-C$_{18}$aryl; C$_6$-C$_{18}$aryl which is substituted by C$_1$-C$_{18}$alkyl, or C$_1$-C$_{18}$alkoxy; C$_1$-C$_{18}$alkyl; or C$_1$-C$_{18}$alkyl which is interrupted by —O—, D is —CO—, —COO—, —S—, —SO—, —SO$_2$—, —O—, —NR$^{65}$—, —SiR$^{70}$R$^{71}$—, —POR$^{72}$—, —CR$^{63}$=CR$^{64}$—, or —C≡C—, and E is —OR$^{69}$, —SR$^{69}$, —NR$^{65}$R$^{66}$, —COR$^{68}$, —COOR$^{67}$, —CONR$^{65}$R$^{66}$, —CN, or halogen, G is E, C$_1$-C$_{18}$alkyl, C$_1$-C$_{18}$alkyl which is interrupted by D, C$_1$-C$_{18}$perfluoroalkyl, C$_1$-C$_{18}$alkoxy, or C$_1$-C$_{18}$alkoxy which is substituted by E and/or interrupted by D, R$^{63}$, R$^{64}$, R$^{65}$ and R$^{66}$ are independently of each other H; C$_6$-C$_{18}$aryl; C$_6$-C$_{18}$aryl which is substituted by C$_1$-C$_{18}$alkyl, C$_1$-C$_{18}$alkoxy; C$_1$-C$_{18}$alkyl; or C$_1$-C$_{18}$alkyl which is interrupted by —O—; or R$^{65}$ and R$^{66}$ together form a five or six membered ring, R$^{67}$ and R$^{68}$ are independently of each other H; C$_6$-C$_{18}$aryl; C$_6$-C$_{18}$aryl which is substituted by C$_1$-C$_{18}$alkyl, or C$_1$-C$_{18}$alkoxy; C$_1$-C$_{18}$alkyl; or C$_1$-C$_{18}$alkyl which is interrupted by —O—, R$^{69}$ is H; C$_6$-C$_{18}$aryl; C$_6$-C$_{18}$aryl, which is substituted by C$_1$-C$_{18}$alkyl, C$_1$-C$_{18}$alkoxy; C$_1$-C$_{18}$alkyl; or C$_1$-C$_{18}$alkyl which is interrupted by —O—, R$^{70}$ and R$^{71}$ are independently of each other C$_1$-C$_{18}$alkyl, C$_6$-C$_{18}$aryl, or C$_6$-C$_{18}$aryl, which is substituted by C$_1$-C$_{18}$alkyl, and R$^{72}$ is C$_1$-C$_{18}$alkyl, C$_6$-C$_{18}$aryl, or C$_6$-C$_{18}$aryl, which is substituted by C$_1$-C$_{18}$alkyl;

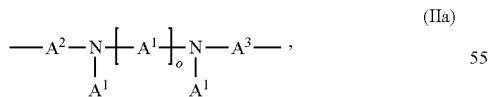

(IIa)

(IIb)

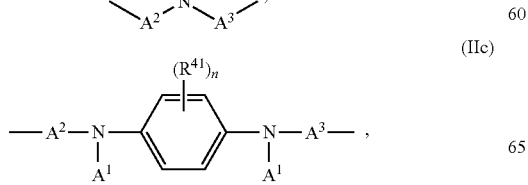

(IIc)

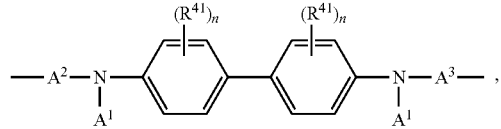

(IId)

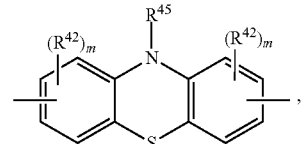

(IIe)

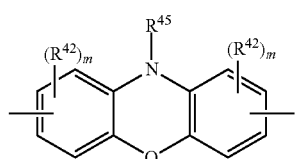

(IIf)

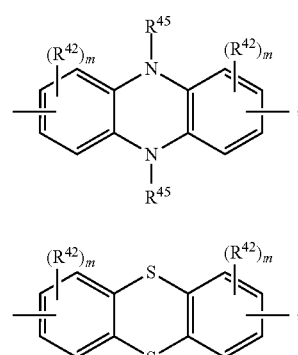

(IIg)

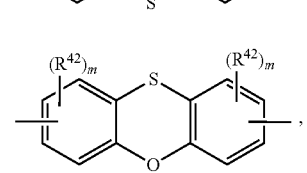

(IIh)

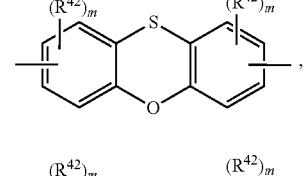

(IIi)

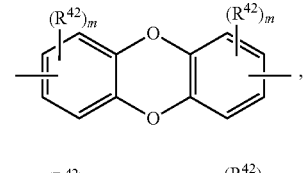

(IIj)

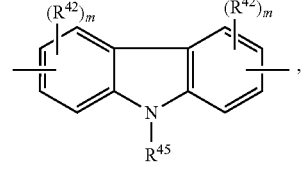

(IIk)

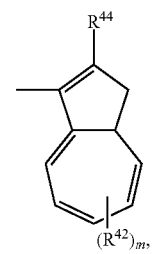

(III)

-continued

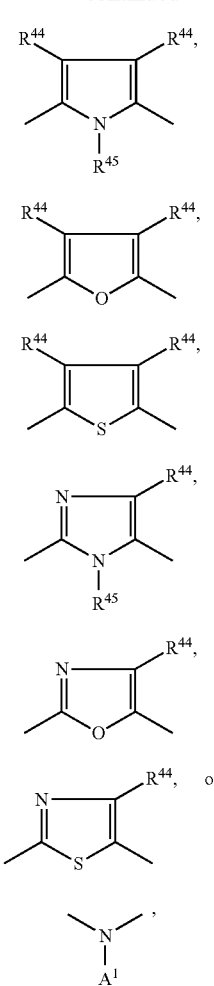

(IIm)

(IIn)

(IIo)

(IIp)

(IIq)

(IIr)

(IIs)

wherein $R^{41}$ can be the same or different at each occurrence and is Cl, F, CN, N(R$^{45}$)$_2$, a C$_1$-C$_{25}$alkyl group, a C$_4$-C$_{18}$cycloalkyl group, a C$_1$-C$_{25}$alkoxy group, in which one or more carbon atoms which are not in neighbourhood to each other could be replaced by —NR$^{45}$—, —O—, —S—, —C(=O)—O—, or —O—C(=O)—O—, and/or wherein one or more hydrogen atoms can be replaced by F, a C$_6$-C$_{24}$aryl group, or a C$_6$-C$_{24}$aryloxy group, wherein one or more carbon atoms can be replaced by O, S, or N, and/or which can be substituted by one or more non-aromatic groups R$^{41}$, or two or more groups R$^{41}$ form a ring system;

$R^{42}$ can be the same or different at each occurrence and is CN, a C$_1$-C$_{25}$alkyl group, a C$_4$-C$_{18}$cycloalkyl group, a C$_1$-C$_{25}$alkoxy group, in which one or more carbon atoms which are not in neighbourhood to each other could be replaced by —NR$^{45}$—, —O—, —S—, —C(=O)—O—, or —O—C(=O)—O—, and/or wherein one or more hydrogen atoms can be replaced by F, a C$_6$-C$_{24}$aryl group, or a C$_8$-C$_{24}$aryloxy group, wherein one or more carbon atoms can be replaced by O, S, or N, and/or which can be substituted by one or more non-aromatic groups R$^{41}$, or two or more groups R$^{41}$ form a ring system;

$R^{44}$ can be the same or different at each occurrence and are a hydrogen atom, a C$_1$-C$_{25}$alkyl group, a C$_4$-C$_{18}$cycloalkyl group, a C$_1$-C$_{25}$alkoxy group, in which one or more carbon atoms which are not in neighbourhood to each other could be replaced by —NR$^{45}$—, —O—, —S—, —C(=O)—O—, or —O—C(=O)—O—, and/or wherein one or more hydrogen atoms can be replaced by F, a C$_6$-C$_{24}$aryl group, or a C$_6$-C$_{24}$aryloxy group, wherein one or more carbon atoms can be replaced by O, S, or N, and/or which can be substituted by one or more non-aromatic groups R$^{41}$, or CN, or two or more groups R$^{44}$, which are in neighbourhood to each other, form a ring;

$R^{45}$ is H, a C$_1$-C$_{25}$alkyl group, a C$_4$-C$_{18}$cycloalkyl group, in which one or more carbon atoms which are not in neighbourhood to each other could be replaced by —NR$^{45'}$—, —O—, —S—, —C(=O)—O—, or, —O—C(=O)—O—, and/or wherein one or more hydrogen atoms can be replaced by F, a C$_6$-C$_{24}$aryl group, or a C$_6$-C$_{24}$aryloxy group, wherein one or more carbon atoms can be replaced by O, S, or N, and/or which can be substituted by one or more non-aromatic groups R$^{41}$;

$R^{45'}$ is H, a C$_1$-C$_{25}$alkyl group, or a C$_4$-C$_{18}$cycloalkyl group, m can be the same or different at each occurrence and is 0, 1, 2, or 3, n can be the same or different at each occurrence and is 0, 1, 2, or 3, o is 1, 2, or 3, $A^1$ is a C$_6$-C$_{24}$aryl group, a C$_2$-C$_{30}$heteroaryl group, which can be substituted by one or more non-aromatic groups R$^{41}$, or NO$_2$, $A^2$ and $A^3$ are independently of each other

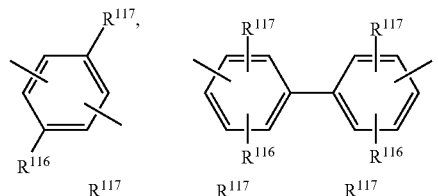

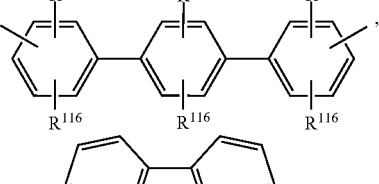

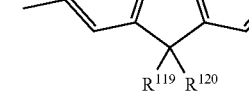

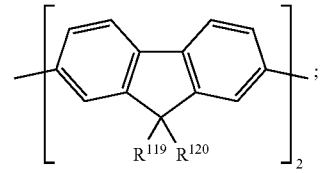

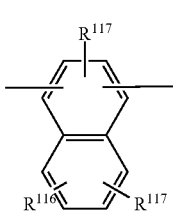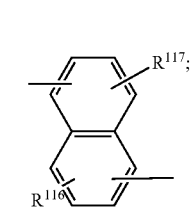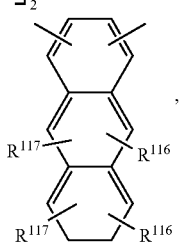

-continued

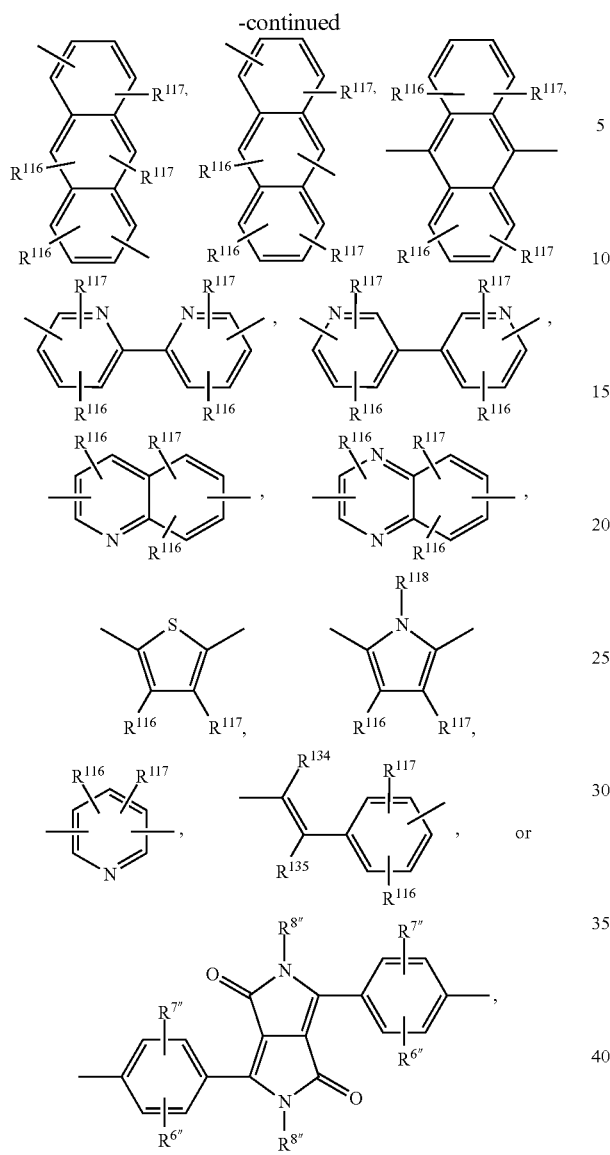

wherein $R^{116}$, $R^{117}$, $R^{119}$ and $R^{120}$ are as defined above, $R^{6''}$ and $R^{7''}$ are have independently of each other the meaning of $R^{116}$, $R^{118}$, and $R^{8''}$ are H, $C_1$-$C_{18}$alkyl, $C_1$-$C_{18}$alkyl which is substituted by E and/or interrupted by D, $C_6$-$C_{24}$ aryl, or $C_7$-$C_{25}$aralkyl, which are optionally substituted by G, $R^{134}$ and $R^{135}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, or $C_2$-$C_{20}$heteroaryl, $C_2$-$C_{20}$heteroaryl which is substituted by E, wherein D, E and G are as defined above, -continued

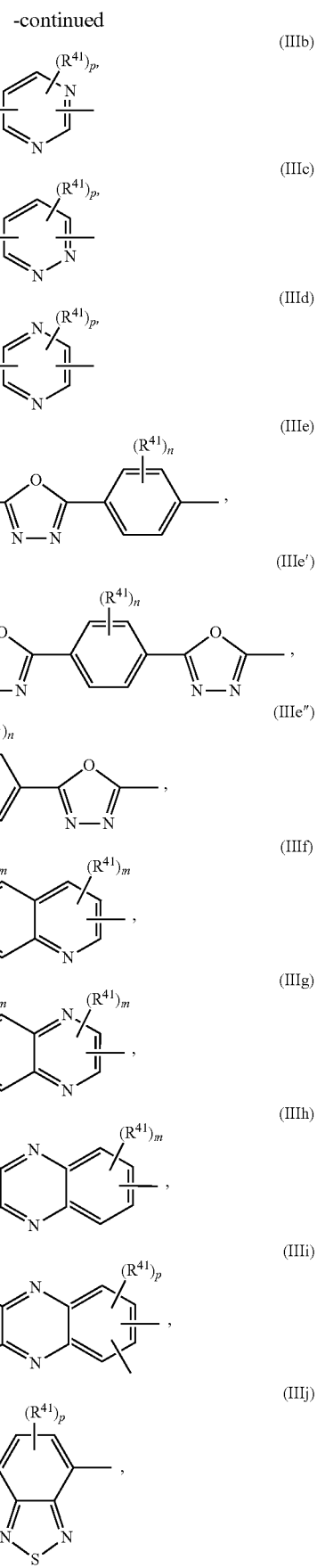

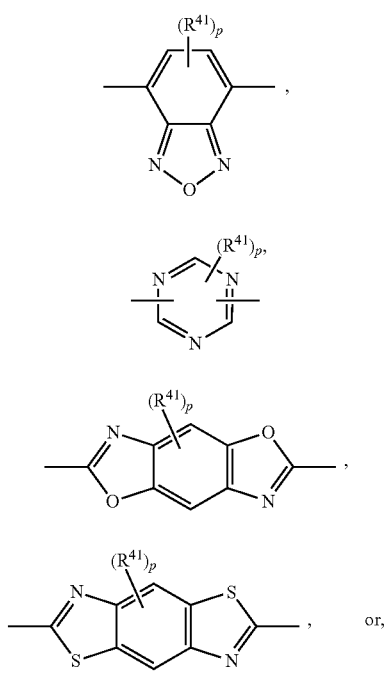
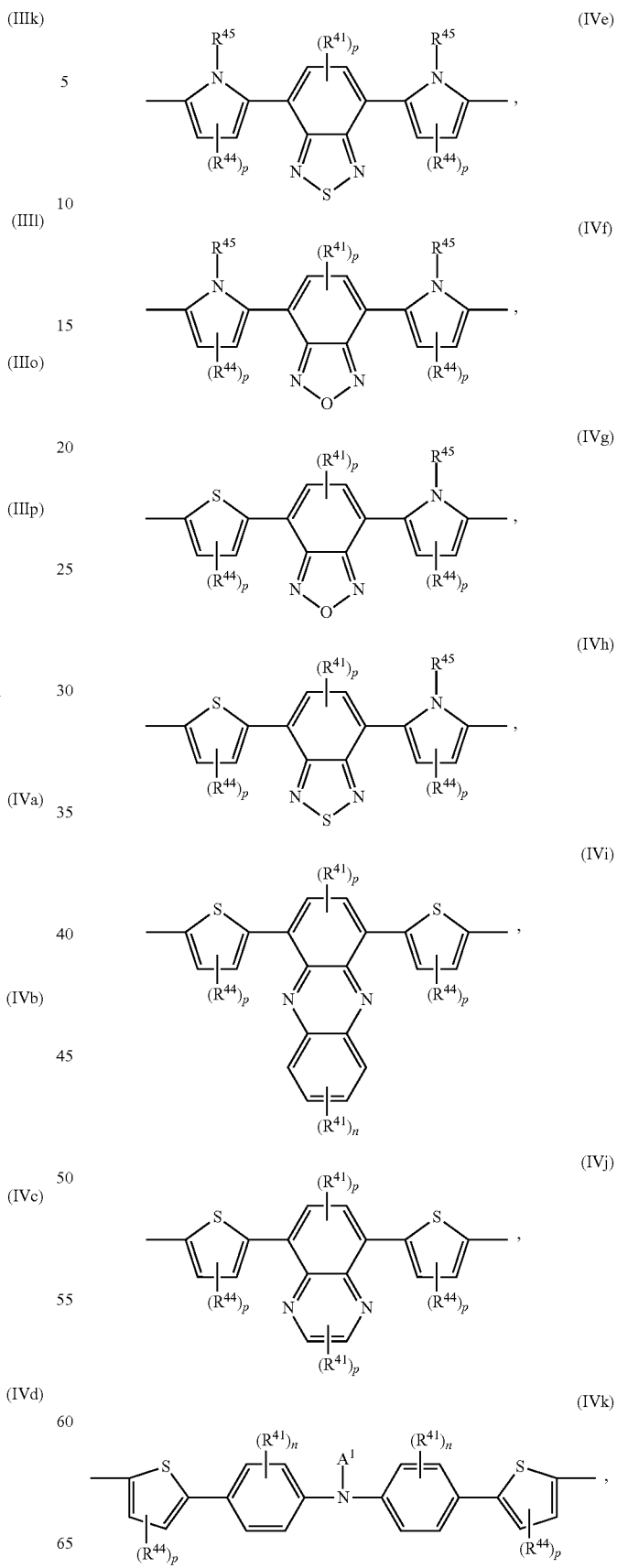
wherein R[41] and m and n are as defined above and p is 0, 1 or 2;

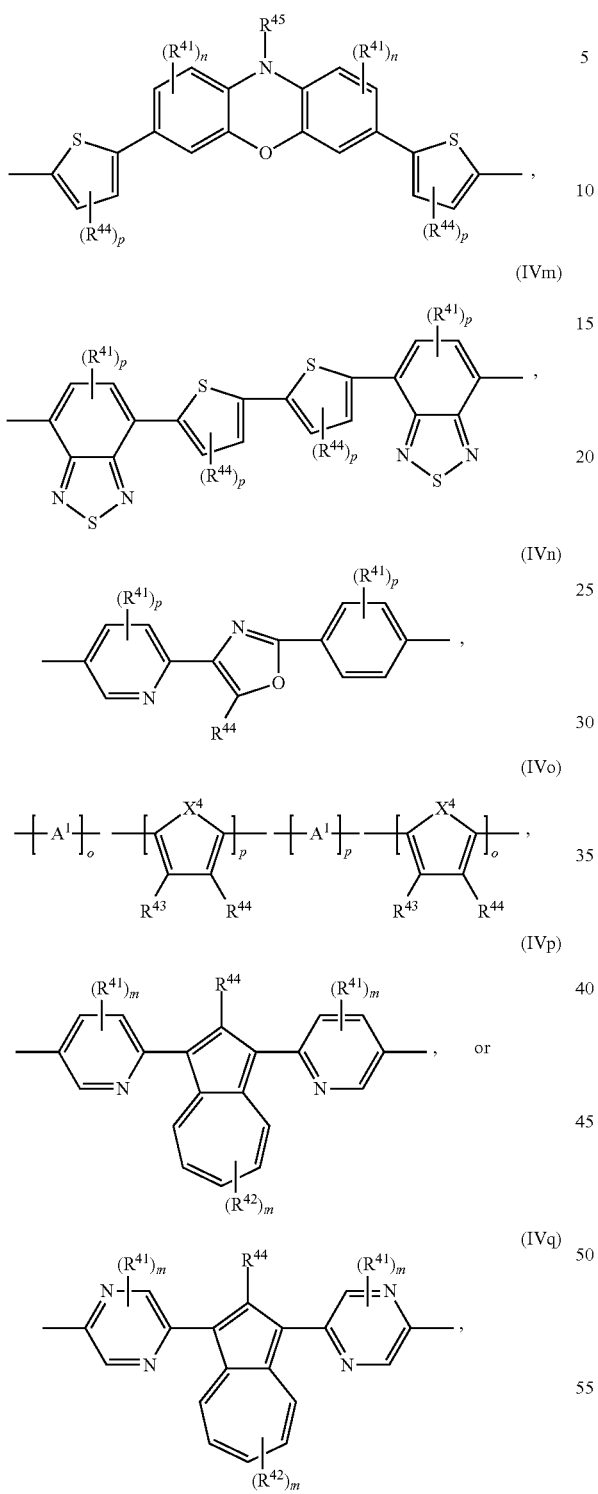

wherein X⁴ is O, S, or NR⁴⁵,

R⁴³ is a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —NR⁴⁵—, —O—, —S—, —C(=O)—O—, or, —O—C(=O)— O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups R⁴¹, or CN, or two or more groups R⁴³ and/or R⁴⁴, which are in neighbourhood to each other, form a ring;

and A¹, R⁴¹, R⁴², R⁴⁴, R⁴⁵, m, n, o and p are as defined above;

and/or one or more repeating unit(s) -T- which is selected from the group consisting of

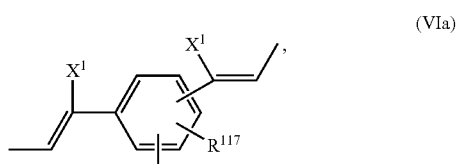

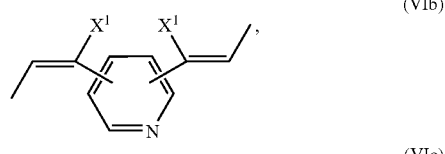

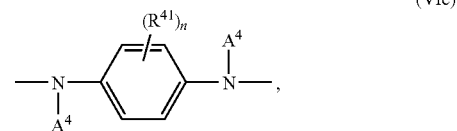

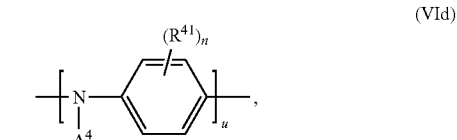

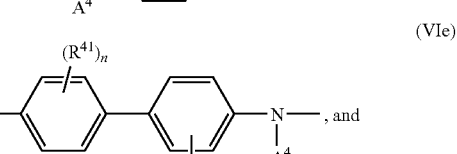

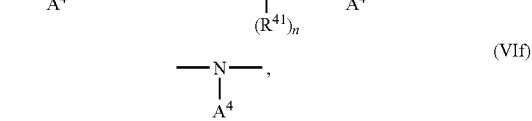

wherein

X¹ is a hydrogen atom, or a cyano group, u is 1, 2, 3, or 4; R¹¹⁶, R¹¹⁷, R⁴¹ and n are as defined above; and A⁴ is a $C_6$-$C_{24}$aryl group, a $C_2$-$C_{30}$heteroaryl group, especially phenyl, naphthyl, anthryl, biphenylyl, 2-fluorenyl, phenanthryl, or perylenyl, which can be substituted by one or more non-aromatic groups R⁴¹.

6. The polymer according to claim 1, wherein the polymer is a copolymer which contain at least two different repeating units of formula Ia or formula Ib.

7. An electronic device or a component therefore, comprising a polymer according to claim 1.

8. A polymer light emitting diode comprising a polymer according to claim 1 as electroluminescent material.

9. A PLED, an organic integrated circuit (O-IC), an organic field effect transistor (OFET), an organic thin film transistor (OTFT), an organic solar cell (O-SC), a thermoelectric device, or an organic laser diode comprising one or more of the polymers according to claim 1.
10. A polymer according to claim 5, comprising one or more repeating unit Ar³ which is selected from the group consisting of
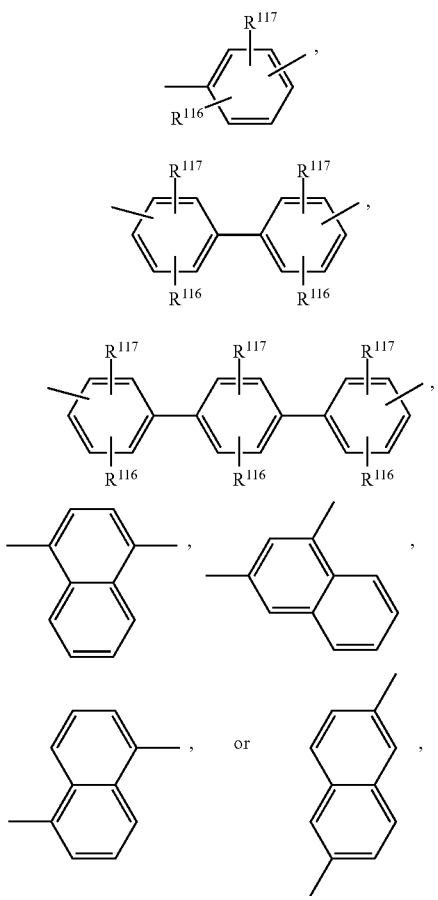
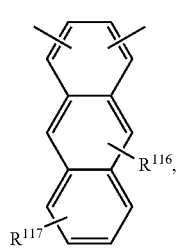
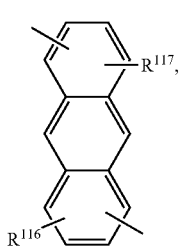
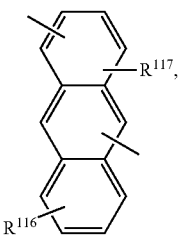
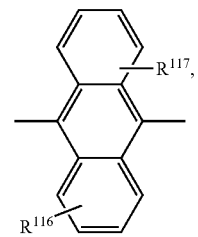
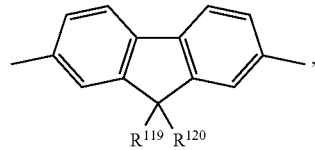
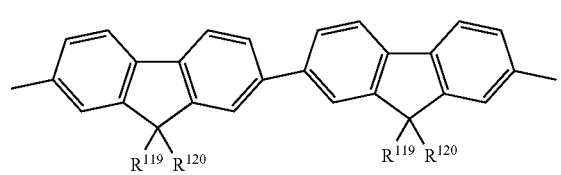
and
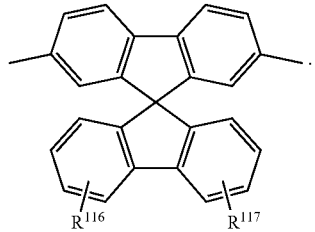
11. A polymer according to claim 4 which comprises at least one repeating unit of formula XIIa or XIIb and at least one repeating unit of formula X or XI
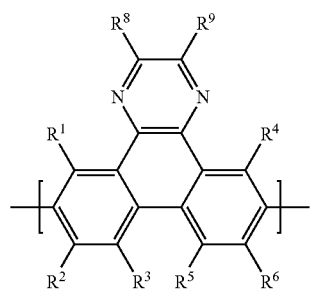

-continued

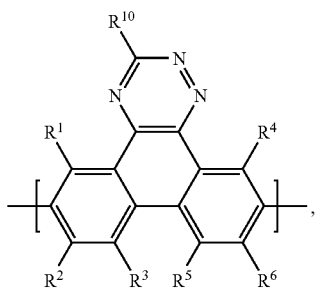
(XI)

wherein $R^1$ and $R^4$ are hydrogen, $R^2$, $R^3$, $R^5$ and $R^6$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $C_7$-$C_{25}$aralkyl, or a group —$X^2$—$R^{18}$, $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, wherein $X^2$ is $C_6$-$C_{12}$aryl or $C_6$-$C_{12}$heteroaryl which can be substituted one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$—; or two substituents $R^2$ and $R^3$ and/or $R^5$ and $R^6$, which are adjacent to each other, together form a group

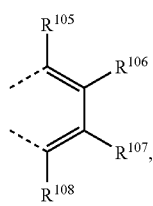

or two substituents $R^5$ and $R^3$, which are adjacent to each other, together form a group

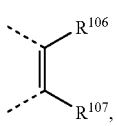

wherein $R^{105}$, $R^{106}$, $R^{107}$ and —$R^{108}$ are independently of each other H, or $C_1$-$C_8$alkyl, or $R^8$ and $R^9$ together form a group

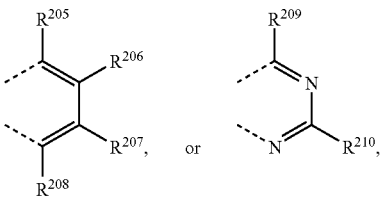

wherein $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is $C_6$-$C_{12}$aryl or $C_6$-$C_{12}$heteroaryl which can be substituted one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$;

D is —CO—; —COO—; —S—; —SO—; —$SO_2$—; —O—; —$NR^{25}$—; —$CR^{23}$=$CR^{24}$—; or —C≡C—; wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or $R^{25}$ and $R^{26}$ together form a five or six membered ring.

12. A polymer according to claim 2, comprising a repeating unit of formula

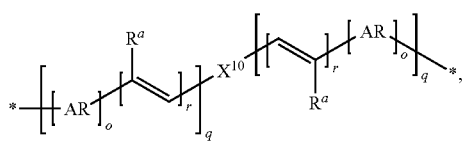
XX wherein $X^{10}$ is a repeating unit of formula XI or XII;

q is an integer 0, 1, or 2, o is 0, 1, or 2, r is 0, or 1,

AR is $C_6$-$C_{24}$aryl, $C_6$-$C_{24}$aryl which is substituted by G, $C_2$-$C_{20}$heteroaryl, or $C_2$-$C_{20}$heteroaryl which is substituted by G, $R^a$ is H, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, wherein E, D and G are as defined above.

* * * * *

UNITED STATES PATENT AND TRADEMARK OFFICE
CERTIFICATE OF CORRECTION

PATENT NO. : 8,445,630 B2
APPLICATION NO. : 11/886138
DATED : May 21, 2013
INVENTOR(S) : Schäfer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 326 days.

Signed and Sealed this
Eighth Day of September, 2015

Michelle K. Lee
*Director of the United States Patent and Trademark Office*